US011428548B2

(12) United States Patent
Sobukawa et al.

(10) Patent No.: US 11,428,548 B2
(45) Date of Patent: Aug. 30, 2022

(54) CAPACITANCE MEASURING CIRCUIT AND ELECTROSTATIC CAPACITIVE DISPLACEMENT METER

(71) Applicant: NF HOLDINGS CORPORATION, Kanagawa (JP)

(72) Inventors: Shingo Sobukawa, Kanagawa (JP); Keita Murase, Tokyo (JP); Takehito Kamimura, Kanagawa (JP)

(73) Assignee: NF HOLDINGS CORPORATION, Kanagawa (JP)

( * ) Notice: Subject to any disclaimer, the term of this patent is extended or adjusted under 35 U.S.C. 154(b) by 192 days.

(21) Appl. No.: 17/082,015

(22) Filed: Oct. 28, 2020

(65) Prior Publication Data

US 2021/0072048 A1 Mar. 11, 2021

Related U.S. Application Data

(63) Continuation of application No. PCT/JP2019/017984, filed on Apr. 26, 2019.

(30) Foreign Application Priority Data

May 8, 2018 (JP) .............................. JP2018-089945

(51) Int. Cl.
  *G01D 5/241* (2006.01)
  *G01R 27/26* (2006.01)
  (Continued)

(52) U.S. Cl.
  CPC ........... *G01D 5/2417* (2013.01); *G01B 7/023* (2013.01); *G01R 27/2605* (2013.01); *G01B 7/02* (2013.01); *G01D 5/24* (2013.01)

(58) Field of Classification Search
  CPC ........ G01R 27/00; G01R 27/02; G01R 27/26; G01R 27/2605; G01D 5/00; G01D 5/12;
  (Continued)

(56) References Cited

U.S. PATENT DOCUMENTS 4,059,797 A * 11/1977 Gay .................... G01R 17/10
324/680
5,798,664 A 8/1998 Nagahori
(Continued)

FOREIGN PATENT DOCUMENTS

EP 3017276 A1 5/2016
JP H07229941 A 8/1995
(Continued)

OTHER PUBLICATIONS

Supplementary International Search Report for International Application No. PCT/JP2019/017984, mailed by the European Patent Office dated Jul. 17, 2020.
(Continued)

*Primary Examiner* — Hoai-An D. Nguyen

(57) ABSTRACT

A capacitance measuring circuit measures an electrostatic capacitance formed between a first conductor that receive an AC signal and a second conductor. The capacitance measuring circuit includes an amplifier including an input and an output; signal detection means including a negative feedback unit that has a feedback capacitance and applies a negative feedback from an output of the amplifier to an input of the amplifier, wherein an input of the amplifier is connected to the second conductor and is virtually grounded by the negative feedback unit and an AC signal of an amplitude in a functional relation with the electrostatic capacitance is output; and measuring means that is connected to an output of the signal detection means and has a function of measuring at least an amplitude of an AC signal output of the signal detection means.

27 Claims, 104 Drawing Sheets

(51) Int. Cl.
*G01B 7/02* (2006.01)
*G01D 5/24* (2006.01)

(58) Field of Classification Search
CPC ............ G01D 5/14; G01D 5/24; G01D 5/241;
G01D 5/2417; G01B 7/00; G01B 7/02;
G01B 7/023; G01B 7/06; G01B 7/08;
G01B 7/082; G01B 7/10; G01B 7/102
See application file for complete search history.

(56) References Cited

U.S. PATENT DOCUMENTS

| | | | |
|---|---|---|---|
| 5,844,415 | A | 12/1998 | Gershenfeld |
| 6,331,780 | B1 | 12/2001 | Hiroshima |
| 6,348,862 | B1 | 2/2002 | McDonnell |
| 8,044,735 | B2 * | 10/2011 | Gaede ..................... H03L 1/022 331/111 |
| 8,564,301 | B2 * | 10/2013 | Ashton .............. G01R 27/2605 324/519 |
| 9,316,673 | B2 * | 4/2016 | Ashton .............. G01R 27/2605 |
| 9,594,387 | B2 * | 3/2017 | Gakhar .................. G05F 1/575 |
| 10,506,318 | B2 * | 12/2019 | Polo ........................ H04R 3/00 |
| 2004/0183398 | A1 | 9/2004 | Kashiwase |
| 2006/0261969 | A1 | 11/2006 | Takaku |
| 2006/0273805 | A1 | 12/2006 | Peng |
| 2009/0051656 | A1 | 2/2009 | Saito |
| 2012/0105080 | A1 | 5/2012 | Iwasawa |
| 2013/0057341 | A1 | 3/2013 | Sobukawa |
| 2013/0063183 | A1 | 3/2013 | Nakane |
| 2013/0257536 | A1 | 10/2013 | Sharma |
| 2014/0132342 | A1 | 5/2014 | Sobukawa |
| 2014/0266263 | A1 | 9/2014 | Wurzinger |
| 2014/0327455 | A1 | 11/2014 | Steiner Vanha |
| 2014/0338449 | A1 | 11/2014 | Durston |
| 2015/0180431 | A1 | 6/2015 | Abe |
| 2018/0017598 | A1 | 1/2018 | Hebiguchi |
| 2018/0332377 | A1 * | 11/2018 | Polo ........................ H03F 3/505 |

FOREIGN PATENT DOCUMENTS

| | | |
|---|---|---|
| JP | H09145760 A | 6/1997 |
| JP | H09280806 A | 10/1997 |
| JP | 2000505550 A | 5/2000 |
| JP | 2002538469 A | 11/2002 |
| JP | 2004347493 A | 12/2004 |
| JP | 2006253764 A | 9/2006 |
| JP | 2006320979 A | 11/2006 |
| JP | 2010239587 A | 10/2010 |
| JP | 2013061278 A | 4/2013 |
| JP | 2013066176 A | 4/2013 |
| JP | 2013247396 A | 12/2013 |
| JP | 2014041110 A | 3/2014 |
| WO | 2011024576 A1 | 3/2011 |
| WO | 2018062956 A1 | 4/2018 |

OTHER PUBLICATIONS (ISA/237) Written Opinion of the International Search Authority for International Patent Application No. PCT/JP2019/017984, mailed by the Japan Patent Office dated Jul. 16, 2019.

Keyence Corporation., "specification comparison table," [online], [retrieved on Feb. 28, 2019], Internet, <Japanese URL: https://www.keyence.co.jp/ss/measure/selection/spec_select/#2>.

Kouji Takimoto, "principle and feature of eddy current displacement sensor vol. 1—principle and feature outline)," [online], Shinkawa Electric Co., Ltd., [retrieved on Feb. 28, 2019], Internet <Japanese URL: http://www.shinkawa.co.jp/magazine/vol.11_column_sst.html>.

Shinkawa Electric Co., Ltd., "Eddy current non-contact type displacement and vibration meter VC series," [online], [retrieved on Feb. 28, 2019], Internet <Japanese URL: https://www.shinkawaelectric.com/products/non_contact/vc.html><English URL: https://www.shinkawaelectric.com/en/products/non_contact/vc.html>.

Ono Sokki Co.,Ltd, "Electrostatic capacitance type non-contact displacement meter VT-5200 series," [online], [retrieved on Feb. 28, 2019], Internet, <Last updated Sep. 2, 2016, Japanese URL: https://www.onosokki.co.jp/HP-WK/products/keisoku/thickness/vt5200.html><Revised: Dec. 1, 2010, English URL: https://www.onosokki.co.jp/English/hp_e/products/keisoku/dimension/vt5200.html>.

Unipulse Corporation, "PS IA electrostatic capacitance type non contact displacement meter," particularly sections of "measurement principle," [online], [retrieved on Feb. 28, 2019], Internet <Japanese URL: http://www.unipulse.com/jp/products/PS-IA.html><English URL: https://www.unipulse.tokyo/en/product/ps-ia/>.

Office Action issued for counterpart Japanese Application No. 2019-556728, issued by the Japanese Patent Office dated Dec. 3, 2019 (drafted dated Nov. 26, 2019).

Office Action for European Patent Application No. 19800167.9, issued by the European Patent Office dated Aug. 16, 2021.

* cited by examiner

CAPACITANCE MEASURING CIRCUIT AND ELECTROSTATIC CAPACITIVE DISPLACEMENT METER

CROSS REFERENCE TO RELATED APPLICATION

This is a continuation application of International Application No. PCT/JP2019/017984, filed on Apr. 26, 2019, which claims priority to Japanese Patent Application No. 2018-089945, filed on May 8, 2018, the contents of each of which are incorporated herein by reference.

BACKGROUND

1. Technical Field

The present invention relates to a capacitance measuring circuit that can measure a very small electrostatic capacitance and an electrostatic capacitive displacement meter having the capacitance measuring circuit.

2. Related Art

As one of means for measuring the distance to an object or the like, a displacement meter is used. As major non-contact displacement meters, laser displacement meters, eddy current displacement meters, and an electrostatic capacitive displacement meters are commonly used, and thus, features of the laser displacement meter, the eddy current displacement meter, and the electrostatic capacitive displacement meter are compared first.

The laser displacement meter irradiates an object with laser light and measures the distance to the object by receiving reflected light from the object. As specific methods for measuring a distance to an object, various methods such as a triangulation type, a confocal type, a spectral interference type, a 2D triangulation type, and a white light interference type are used for example, but detailed descriptions thereof are omitted.

The laser displacement meter needs to receive reflected light from the object, and thus, the laser displacement meter has a problem of requiring that the object reflects laser light, for example, the object has a small surface roughness, and desirably an object has a mirror surface. The laser displacement meter also has a problem that if the object is inclined from a predetermined orientation, an object may not receive reflected light. The laser displacement meter has further problems of large power consumption and high cost.

On the other hand, as one example, the laser displacement meter has an advantage of being able to measure a long distance of 1000 mm at maximum. (See Non-Patent Document 1).

The eddy current displacement meter may cause, for example a high frequency current of several MHz to flow through a coil to generate a high frequency magnetic field. When a high frequency magnetic field is generated, an eddy current perpendicular to the passage of a magnetic flux flows on a surface of an object by an electromagnetic induction effect of an object (metal) in a magnetic field. A magnitude of an eddy current changes depending on a distance between a coil and an object, and thus, a distance is measured based on changes in the impedance of the coil (see Non-Patent Document 2.)

An eddy current displacement meter has a problem that an object needs to be metal and additionally a problem that sensitivities differ depending on a type of metal. A magnitude of an eddy current differs depending on a surface roughness, and thus, an eddy current displacement meter also contains a problem that sensitivities differ depending on a surface roughness.

As one example, a maximum distance measurable by an eddy current displacement meter is about 25 mm (see Non-Patent Document 3).

An electrostatic capacitive displacement meter measures a distance to an object based on an electrostatic capacitance formed with an object. If a distance to an object is short, an electrostatic capacitance becomes large and if a distance to an object is long, an electrostatic capacitance becomes small. Measuring a distance based on an electrostatic capacitance formed with an object in this way is hereinafter referred to as "distance measurement". An electrostatic capacitive displacement meter of the prior art will be described later in details.

The biggest problem of an electrostatic capacitive displacement meter of the prior art resides in that, as one example, a measurable distance is short, that is 8 mm at maximum. (see Non-Patent Document 4.)

On the other hand, an electrostatic capacitive displacement meter of the prior art has a great advantage that an object affecting an electrostatic capacitance formed with a grounded conductor can be detected and an object which is not a conductor can be detected in addition to being able to measure a distance to a grounded conductor. For example, if an object having a larger dielectric constant than air is provided between an electrostatic capacitive displacement meter and a grounded conductor, an electrostatic capacitance increases, and thus, an amount, a thickness and the like of a dielectric can be obtained. As one example, if an object such as a human body (which often behaves like an imperfectly grounded conductor) enters between an electrostatic capacitive displacement meter and a grounded conductor, an electrostatic capacitance decreases, and thus, a state of the object can be obtained. A method for detecting an object affecting an electrostatic capacitance is hereinafter referred to as "the object detection".

A device performing the distance measurement and the object detection by using an electrostatic capacitance is hereinafter referred to as "electrostatic capacitive displacement meter". Further, an electrostatic capacitive displacement meter has an advantage of not being affected by a surface roughness of an object.

Table 1 summarizes advantages and disadvantages of a laser displacement meter, an eddy current displacement meter, and an electrostatic capacitive displacement meter. In Table 1, "VG" represents very good, "G" represents good, "A" represents average, and "P" represents poor.

TABLE 1

| Type of displacement meter | Object | One example of distance measurement |
|---|---|---|
| Laser displacement meter | P Need be able to reflect laser light<br>P Cannot be measured when inclined<br>P Power consumption is large and price is high<br>P Affected by surface roughness | VG 1000 mm at maximum |
| Eddy current displacement meter | A Only metal<br>P Sensitivities differ depending on a type of metal<br>P Sensitivities differ depending on surface roughness | A 25 mm at maximum |

TABLE 1-continued

| Type of displacement meter | Object | One example of distance measurement |
|---|---|---|
| Electrostatic capacitance displacement meter | VG No limitation of target part in the object detection<br>A Only conductor for distance measurement<br>G Not being affected by surface roughness | P 8 mm at maximum |

Example of electrostatic capacitive displacement meters of the prior art are shown in a section of a measurement principle shown in Patent Document 1 (FIG. 1 and paragraph 0008 to paragraph 0018 in Patent Document 1) and a section of a measurement principle in Non-Patent Document 5.

That is, if an electrode is driven by a constant current AC source and known values (the dielectric constant of air, the frequency and the output current of the constant current AC source, and the electrode area) are considered, a distance between an electrode and a grounded object (conductor) can be obtained based on a voltage generated in an electrode. (Equation 1 to Equation 4 in Patent Document 1 or equations in Non-Patent Document 5.)

A measurement principle of an electrostatic capacitive displacement meter of the prior art in this way is hereinafter referred to as "constant current method".

However, in a constant current method, a stray capacitance becomes a measurement error factor, and thus, as one example, it is extremely difficult to apply such method to an application in which a measurement capacitance is 1 pF or less. (In a constant current method, a capacitance between electrode and object and a stray capacitance may not be separated and an output current of a constant current AC source is shunted to a stray capacitance, and thus, when a measurement capacitance is particularly small, a large measurement error factor is caused.)

To reduce an influence of a stray capacitance, the invention of Patent Document 1 and Non-Patent Document 5 it is attempted to reduce an influence of a stray capacitance of a center electrode by using in combination a guard electrode which is driven by a buffer amplifier to have the same potential as the center electrode (center electrode and guard electrode are names mentioned in Non-Patent Document 5.) As shown in in a figure of a measurement principle of Non-Patent Document 5, a guard electrode can further improve the linearity of a relationship between a distance and a measurement voltage because it can adjust an electric field between electrode and object.

However, a buffer amplifier in Non-Patent Document 5 and an input capacitance of an operational amplifier or the like in Patent Document 1 (usually several pF or more) become measurement error factors because they operate in the same way as a stray capacitance of an electrode, and the error factors may not be eliminated even if a guard electrode or the like is used. Such input capacitance changes with by ambient temperature, a power supply voltage of a buffer amplifier or an operational amplifier or the like. Even if a guard electrode is used in combination, it is extremely difficult to apply to an application in which a measurement capacitance is significantly smaller than 1 pF. Depending on a circuit configuration, an output capacitance of a constant current AC source may similarly become a measurement error factor.

For example, a maximum measurable distance of 8 mm in Non-Patent Document 4 is realized by using a large detector (electrode) having a diameter of 40 mm. A capacitance of a parallel plate with a diameter of 40 mm and an inter electrode distance of 8 mm is about 1.39 pF, and this shows that it is difficult to realize the measurement capacitance of 1 pF or less in an electrostatic capacitive displacement meter of the prior art.

Patent Document 1: Japanese Patent Application Publication No. 9-280806

Non-Patent Document

Non-Patent Document 1: "specification comparison table," [online], KEYENCE CORPORATION, [retrieved on Feb. 28, 2019], Internet, <Japanese URL: https://www.keyence.co.jp/ss/measure/selection/spec_select/#2>

Non-Patent Document 2: Kouji TAKIMOTO, "principle and feature of eddy current displacement sensor vol. 1—principle and feature (outline)," [online], SHINKAWA Electric Co., Ltd., [retrieved on Feb. 28, 2019], Internet <Japanese URL: http://www.shinkawa.co.jp/magazine/vol.11_column_sst.html>

Non-Patent Document 3: "Eddy current non-contact type displacement and vibration meter VC series," [online], SHINKAWA Electric Co., Ltd., [retrieved on Feb. 28, 2019], Internet <Japanese URL: https://www.shinkawaclectric.com/products/non_contact/vc.html><English URL: https://www.shinkawaclectric.com/en/products/non_contact/vc.html>

Non-Patent Document 4: "Electrostatic capacitance type non-contact displacement meter VT-5200 series," [online], ONO SOKKI CO., LTD, [retrieved on Feb. 28, 2019], Internet, <Last updated Sep. 2, 2016, Japanese URL: https://www.onosokki.co.jp/HP-WK/products/keisoku/thickness/vt5200.html><Revised: Dec. 1, 2010, English URL: https://www.onosokki.co.jp/English/hp_e/products/keisoku/dimension/vt5200.html>

Non-Patent Document 5: "PS-IA electrostatic capacitance type non-contact displacement meter," particularly sections of "measurement principle," [online], UNIPULSE CORPORATION, [retrieved on Feb. 28, 2019], Internet <Japanese URL: http://www.unipulse.com/jp/products/PS-IA.html><English URL: https://www.unipulse.tokyo/en/product/ps-ia/>

SUMMARY

An object of the present invention is to achieve a circuit in which an electrode is selected highly freely and a small electrostatic capacitance is measured.

A first aspect of the present invention is a capacitance measuring circuit for measuring an electrostatic capacitance formed between a first conductor that receive an AC signal and a second conductor. The capacitance measuring circuit may include an amplifier including an input and an output. The capacitance measuring circuit may include signal detection means including a negative feedback unit that has a feedback capacitance and applies a negative feedback from an output of the amplifier to an input of the amplifier, wherein an input of the amplifier is connected to the second conductor and is virtually grounded by the negative feedback unit and an AC signal of an amplitude in a functional relation with the electrostatic capacitance is output. The capacitance measuring circuit may include measuring means that is connected to an output of the signal detection means and has a function of measuring at least an amplitude of an AC signal output from the signal detection means.

According to a capacitance measuring circuit disclosed in the specification, the drawings or the specification and the drawings of the present application (hereinafter referred to as "the present disclose"), one or more of the following effects can be obtained. (The capacitance measuring circuit of the present disclosure is hereinafter referred to as "the CM circuit".)

In the present disclosure, a "drive electrode" is one example of a first conductor. A "detection electrode" is one example of a second conductor. A shape or a size of each of a drive electrode and a detection electrode in the CM circuit of the present disclosure may be optional as long as it is a conductor and an electrode can be selected highly freely.

An AC signal is not generated because an input of an amplifier of signal detection means to which a detection electrode is connected is virtually grounded, and thus, an influence of a stray capacitance between a detection electrode and ground does not occur and an input capacitance of an amplifier does not affect a measurement as well.

In the CM circuit, a drive electrode also does not receive an influence of a stray capacitance and an output capacitance of drive signal generating means itself for generating an AC signal input to a drive electrode does not affect the measurement. In other words, if drive signal generating means is a constant voltage output, it is not affected by a stray capacitance or an output capacitance. Even if the drive signal generating means is not a constant voltage output, an influence does not occur if means for obtaining an amplitude of an AC signal in a drive electrode is provided.

This allows the CM circuit measuring a capacitance significantly smaller than an electrostatic capacitive displacement meter of the prior art. As one example, a capacitance of 1 fF (0.001 pF) or less can be measured.

While the use of a large electrode allows achieving an effect of high sensitivity, an influence of hum or ambient noise is more likely to be received. However, the CM circuit further includes various methods for eliminating an influence of hum or ambient noise, and thus, the circuit can easily achieve an effect of high sensitivity by using a large electrode.

If such CM circuit is applied to an electrostatic capacitive displacement meter, the distance measurement of, as one example, 1000 mm or more is possible. The most disadvantage of an electrostatic capacitive displacement meter of the prior art resides in that the measurable distance is short. However, according to an electrostatic capacitive displacement meter including such CM circuit, such disadvantage can be greatly improved.

Although an electrostatic capacitive displacement meter of the prior art has a feature of performing the object detection without the object limitation and a feature of not being affected by a surface roughness of an object, the electrostatic capacitive displacement meter of the present disclosure may have the features similarly.

According to an electrostatic capacitive displacement meter of the prior art, a distance between an electrode and a ground object needs to be short because a measurable maximum distance is short, and accordingly, only the detection of a small object has been allowed. However, in the electrostatic capacitive displacement meter of the present disclosure, a distance between a drive electrode and a detection electrode can be increased, that is the measurement of the significantly larger distance can be realized, and thus, the object detection of large objects can be realized.

Specific examples of the above object detection include an application of detecting a capacitance of liquid filled in each of a plurality of liquid containers even if the plurality of liquid containers are packed and unseen from the outside. As one example, the high of a 2 liter PET bottle is a little over 300 mm and even if the plurality of 2 liter PET bottles are in a packed state, an inner capacity of each of the PET bottles is detectable, and thus, such the object detection is especially effective for an final shipment inspection. Laser displacement meters, eddy current displacement meters, and electrostatic capacitive displacement meters of the prior art have been unable to perform such inspection.

An example of measuring a capacitance of 1 fF (0.001 pF) or less or an example of measuring a distance of 1000 mm or more of the present disclosure is merely one example confirmed at the time of filing, and the present invention is not limited to these.

When the distance measurement of a plurality of points and the object detection are performed by an electrostatic capacitive displacement meter of the prior art, the number of electrodes and circuits used needs to correspond to the number of the plurality of points. On the other hand, the electrostatic capacitive displacement meter of the present disclosure has an effect that a part of electrodes and circuits can be simplified by a plurality of frequencies, a phase difference of 90 degrees unit, heterodyne detection means or switching.

DESCRIPTION OF EXEMPLARY EMBODIMENTS

Hereinafter, embodiments are described with reference to drawings. In the description of the embodiments, a "drive electrode" is one example of a first conductor. A "detection electrode" is one example of a second conductor. The "drive signal generating means" is one example of means for generating an AC signal input to the first conductor.

First Embodiment

Figure 1:
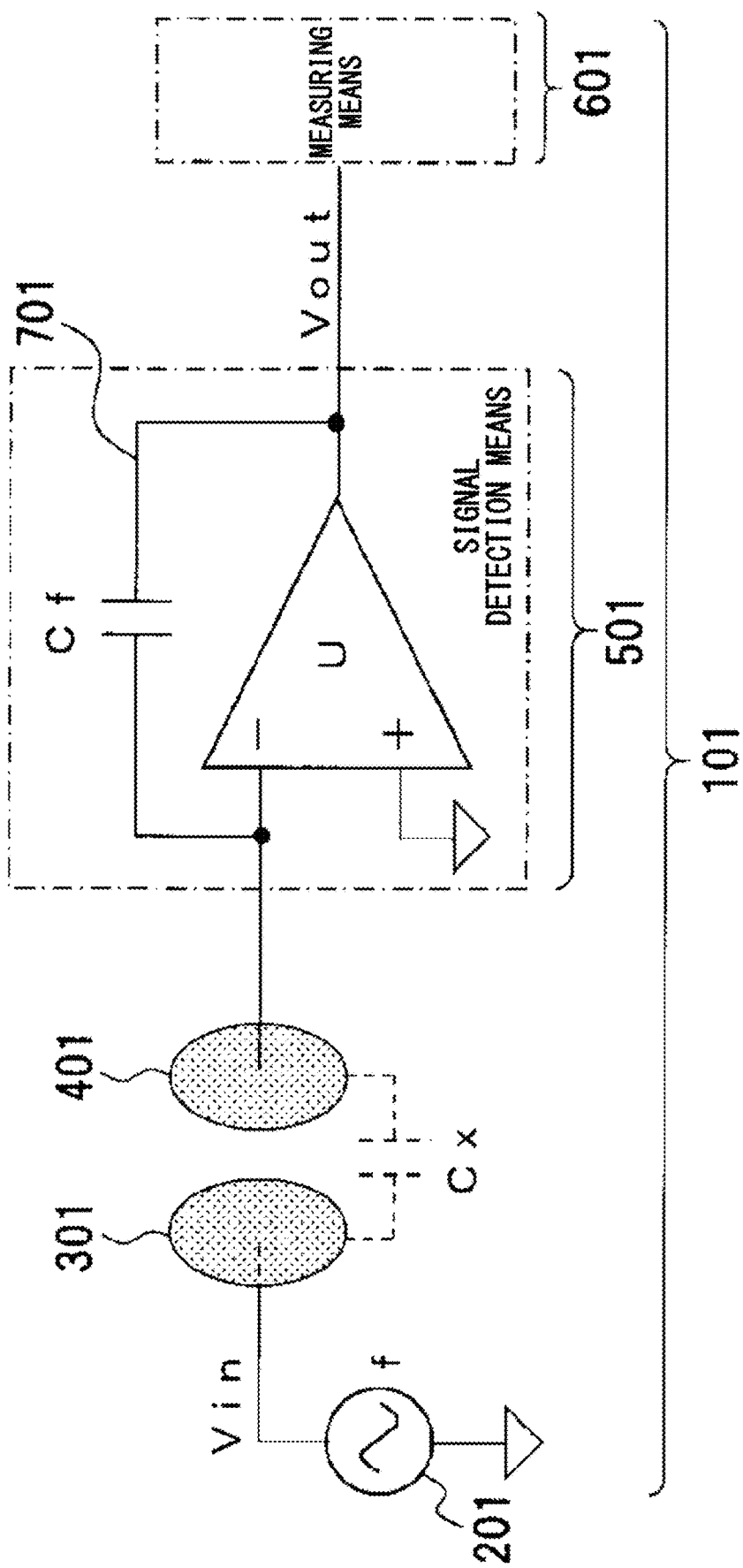
FIG. 1 illustrates one example of a CM circuit according to the first embodiment.

In a first embodiment, a basic configuration of a CM circuit is described. The CM circuit is one example of a CM circuit of the present disclosure. FIG. 1 illustrates one example of a CM circuit according to a first embodiment. The first embodiment is described in details below.

The CM circuit illustrated in FIG. 1 includes drive signal generating means 201, a drive electrode 301, a detection electrode 401, a signal detection means 501, and measuring means 601. The drive signal generating means 201 generates an AC signal to apply the AC signal to the drive electrode 301. The drive signal generating means 201 is a signal generator, for example. The drive electrode 301 is connected to an output of the drive signal generating means 201. The detection electrode 401 forms an inter electrode capacitance Cx with the drive electrode 301. The signal detection means 501 is a signal detection circuit, for example, and includes an amplifier U having an input and an output and a negative feedback unit 701 that includes a feedback capacitance Cf and applies a negative feedback to the input from the output of the amplifier U. The input of the amplifier U is virtually grounded by an operation of the amplifier U and the detection electrode 401 is connected to the input of the amplifier U that serves as virtual ground point. The signal detection means 501 outputs an AC signal having an amplitude indicating an inter electrode capacitance Cx between the drive electrode 301 and the detection electrode 401. The amplitude of the AC signal output from the signal detection means 501 has a functional relation with a capacitance between the drive electrode 301 and the detection electrode 401. The measuring means 601 is an AC voltage measuring circuit, for example, and is connected to an output of the signal detection means 501. The measuring means 601 measures an amplitude of an AC signal that is an output of the signal detection means 501 and obtains information such as an inter electrode capacitance Cx between the drive electrode 301 and the detection electrode 401 or the like.

An expression "inter electrode capacitance Cx" used below is assumed to indicate an electrostatic capacitance itself generated between the drive electrode and the detection electrode and also indicates the value of the electrostatic capacitance, and the expression is used without any distinguishing. The same applies to other capacitances, resistances, voltages and the like, and there is no distinction in expressing between their substance and value. A distance between the drive electrode 301 and the detection electrode 401 is abbreviated as an inter electrode distance.

In the CM circuit 101, an output signal having an amplitude that is substantially proportional to the inter electrode capacitance Cx can be obtained from the signal detection means 501. (If the amplifier U included in the signal detection means 501 is an ideal amplifier and the inter electrode capacitance Cx and the feedback capacitance Cf are ideal elements, the inter electrode capacitance Cx and an amplitude of a signal output from the signal detection means 501 are in a completely proportional relationship.) On the other hand, when the drive electrode 301 and the detection electrode 401 are parallel plates, the inter electrode capacitance Cx and the inter electrode distance are in a substantially inversely proportional relation in a region where an edge effect is small (when size of parallel plate electrode is larger than distance between parallel plate electrodes). Accordingly in a region where an edge effect is in a negligible level, if a measurement error is not considered, the inter electrode distance and an amplitude of a signal output from the signal detection means 501 are inversely proportional when the electrodes are parallel plates. (Details of an influence of the edge effect will be described later in a twenty-second embodiment.)

The measuring means 601 obtains the inter electrode capacitance Cx based on the amplitude of the signal output from the signal detection means 501 and obtains information on inter electrode distance and information on a state of an object that affects the inter electrode capacitance Cx based on the inter electrode capacitance Cx.

Some or all of components of the CM circuit 101 may be implemented on an integrated circuit (IC). Details of the implementation to the IC are described in a twentieth embodiment.

Each component of the CM circuit 101 is described below.

First Embodiment—Drive Signal Generating Means

An AC signal generated by the drive signal generating means 201 is abbreviated as a "drive signal" below. An amplitude of the drive signal at the drive electrode 301 is abbreviated as a "drive signal amplitude" below. A frequency a waveform and the like of an AC signal generated by the drive signal generating means 201 are abbreviated as a "drive signal frequency" a "drive signal waveform," and the like respectively below.

Although selection of drive signal frequency is optional, the drive signal frequency may be preferably selected by considering a frequency band of the signal detection means 501, a frequency of ambient noise, a frequency characteristic of a dielectric constant of an object, a shape of the drive electrode 301 that is unlikely to radiate an AC signal as an electromagnetic wave and the like. As one example, in performing the object detection, when a dielectric constant of the object has a frequency characteristic that is not flat, if a frequency at which a dielectric constant becomes high is selected, a high sensitivity can be obtained.

Further, it is possible to use a plurality of drive signals having a phase difference. A 90 degrees phase difference will be described in a fifteenth embodiment. Further, a 180 degrees phase difference will be described in a sixteenth embodiment. Generation of a drive signal having a phase difference will be described in an eighteenth embodiment.

As a drive signal amplitude is larger, a measurement with a high sensitivity is possible, but as the amplitude is larger, a drive signal is more likely to be radiated as an electromagnetic wave and as an amplitude is larger, a possibility of an occurrence of an electric shock becomes high, and thus, it is preferable to select the drive signal amplitude in consideration of above.

A drive signal waveform can also be any waveform. Preferred examples of waves other than a sine wave include a square wave, a trapezoidal wave, a square wave of a limited frequency band, a waveform obtained by superimposing a plurality of frequency components (hereinafter referred to as "the frequency superposition waveform"). The square wave has a large effective value relative to a peak voltage and its generation is easy. The trapezoidal wave or the square wave of a limited frequency band has a smaller influence of a transient state than the square wave.

A specific AC signal generation method of the drive signal generating means 201 can be selected arbitrarily as one example, various oscillation circuits and the like can be considered, and a frequency can be stabilized by using a phase lock loop (PLL) when necessary. The use of a DDS (Direct Digital Synthesizer) is especially preferable because an accurate frequency can be obtained and it is easy to generate a plurality of AC signals having a frequency superposition waveform by any waveform or a phase difference. If the plurality of DDSs with the same clock are used, it is possible to obtain drive signals having a plurality of frequencies such that relative errors are not caused among the plurality of drive signal frequencies.

An output impedance of a drive signal is also arbitrary. If the output impedance is a constant voltage output having a sufficiently smaller impedance than an impedance of the inter electrode capacitance Cx at the drive signal frequency, an output amplitude of the drive signal generating means 201 directly becomes a drive signal amplitude as it is. If the output impedance is higher, an accurate drive signal amplitude can be obtained by providing means for measuring or calculating the drive signal amplitude in the drive electrode 301.

An output of the drive signal generating means 201 may be a transformer coupling or a capacitive coupling (unillustrated). By use of the transformer coupling, the drive signal generating means 201 having a small amplitude can be boosted to a large amplitude or a high output impedance of a drive signal can be lowered for usage as a practical constant voltage. If there is a possibility of an electric shock is caused because an output voltage of the drive signal generating means 201 has a DC component, a DC component can be removed by using the capacitive coupling.

First Embodiment—Drive Electrode, Detection Electrode

The drive electrode 301 and the detection electrode 401 are made of conductors. It is not necessary that one of electrodes is a dedicated electrode having a special structure as an electrostatic capacitive displacement meter of a prior art.

As areas of the drive electrode 301 and the detection electrode 401 are larger, the inter electrode capacitance Cx becomes larger and a highly sensitive capacitance measurement becomes possible. Accordingly, it is preferable to increase an area as much as possible. Although FIG. 1 illustrates a circular electrode having the same area, the drive electrode 301 and the detection electrode 401 may have a different area or shape when necessary.

Shapes of the drive electrode 301 and the detection electrode 401 are arbitrary and examples of the shape include circle, a rectangle, a rounded rectangle, and a polygon. If both of the drive electrode 301 and the detection electrode 401 are flat, inter electrode capacitances Cx may differ between when flat opposite surfaces are parallel to each other and centers match each other and in some other cases. As one example, if one of or both of the drive electrode 301 and the detection electrode 401 is/are made spherical, an influence of a positional relationship between the drive electrode 301 and the detection electrode 401 on the inter electrode capacitance Cx can be reduced.

States of surfaces of the drive electrode 301 and the detection electrode 401 are also arbitrary. An electrostatic capacitive displacement meter using a CM circuit 101 has a feature of not being affected by a surface roughness of an electrode. The drive electrode 301 and the detection electrode 401 may be made only of conductors or may be subjected to a surface treatment such as plating or coating, for example.

When the electrodes are not subjected to a surface treatment or is subjected to a surface treatment with a conductor, if the drive electrode 301 and the detection electrode 401 are erroneously in contact to, an output of the drive signal generating means 201 is directly connected to an inverting input of the amplifier U of the signal detection means 501. At this time, if an output impedance of the drive signal generating means 201 is low, an input allowable voltage of the amplifier U of the signal detection means 501 may be exceeded, and a failure of the amplifier U may be caused. To prevent this, an unillustrated protective element or an appropriate protection circuit may be additionally connected to an input of the amplifier U of the signal detection means 501. As one example of the protective element, an element may be used that has an impedance at the drive signal frequency that is sufficiently smaller than the impedance of the inter electrode capacitance Cx and is sufficiently large to the extent to be able to protect the input of the amplifiers U (for example, resistance or capacitor).

In the case of distance measurement, if a dielectric is added to an opposite surface of one or both of the drive electrode 301 and the detection electrode 401, the inter electrode capacitance Cx can be increased and the measurement with high sensitivity can be performed. However, in this case, in principle, a total thickness of a dielectric needs to be equal to or less than a minimum distance possible between the drive electrode 301 and the detection electrode 401. When the dielectric is elastic, the dielectric can be caused to have a shock absorption effect by setting a total thickness of the dielectric to be larger than the minimum distance between the drive electrode 301 and the detection electrode 401. In the case of the object detection also, the same applies to a distance between an electrode and an object.

The drive signal generating means 201 and the drive electrode 301, or the detection electrode 401 and the signal detection means 501 may be detachable by means of a connector or the like such that it can be easily disconnected when not in use.

When the detection electrode 401 is affected by picking up ambient noise, a shield can be provide on the opposite side of the detection electrode 401 from the drive electrode 301. A measurement result is hardly affected by a capacitance between the detection electrode 401 and the shield because the CM circuit 101 is hardly affected by a stray capacitance between the detection electrode 401 and a ground. The shield or the like will be described in details later in a sixth embodiment.

First Embodiment—Signal Detection Means

The signal detection means 501 includes the amplifier U and the feedback capacitance Cf.

In the following description, an "amplifier" may be an operational amplifier and indicates an amplifier for realizing an amplification function by adding an external part such as, for example, operational amplifier IC. Further, an "amplifier circuit" indicates a circuit having an amplification function as an entire circuit by adding an external part to an amplifier.

The detection electrode 401 and an end of the feedback capacitance Cf are connected to an inverting input of the amplifier U and the other end of the feedback capacitance Cf is connected to an output of the amplifier U. A non-inverting input of the amplifier U is grounded.

An expression that the non-inverting input of the amplifier U is grounded indicates that a non-inverting input of the amplifier U is AC-grounded and the non-inverting input may have a DC voltage. (Hereinafter, the same applies.) As one example, when an amplifier operates with a power source of a single polarity instead of a positive/negative power source, a DC voltage that is half a power supply voltage may be applied to a non-inverting input for example. (In an example of FIG. 1, the amplifier U operates with an unillustrated positive/negative power source and the amplifier U is AC-grounded and DC-grounded because the non-inverting input of the amplifier U is directly connected to a reference potential.)

A drive signal amplitude is defined as Vin, a drive signal frequency is defined as f, and an output amplitude of signal detection means 501 is defined as Vout. In this case, an impedance of the inter electrode capacitance Cx is $1/(2\pi \cdot f \cdot Cx)$, an impedance of the feedback capacitance Cf is $1/(2\pi \cdot f \cdot Cf)$, and the amplifier U constitutes an inverting amplifier. From an input/output relation when the amplifier U is an inverting amplifier, an input/output relation in which the amplifier U is an ideal amplifier is expressed as Equation 1.

[Equation 1]

$$Vout = -\frac{1/(2\pi \cdot f \cdot Cf)}{1/(2\pi \cdot f \cdot Cx)}Vin \quad (1)$$
$$= -\frac{Cx}{Cf}Vin$$

The inter electrode capacitance Cx can be informed from the output amplitude Vout of the signal detection means 501 because values of the drive signal amplitude Vin and the feedback capacitance Cf are known.

It is possible to know the inter electrode capacitance Cx based on the output amplitude Vout of the signal detection means as follows; the inter electrode capacitance Cx is 1 pF when, for example, the drive signal amplitude Vin is 1Vrms and the feedback capacitance Cf is 1 pF, and if the output amplitude Vout of the signal detection means 501 is 1Vrms; and the inter electrode capacitance Cx is 0.1 pF when the output amplitude Vout of the signal detection means is 0.1Vrms.

When the amplifier U is a so-called ideal amplifier, the output amplitude Vout of the signal detection means 501 is proportional to the inter electrode capacitance Cx and is inversely proportional to the feedback capacitance Cf. Although slight errors are caused in this proportional/inverse proportional relationship depending on an actual amplifier U, it can be said that the output amplitude Vout and the inter electrode capacitance Cx are in a "functional relationship". If this functional relationship can be known by a calibration or the like, it is possible to know the more accurate inter electrode capacitance Cx by a correction. In the following, a discussion on such accuracy is omitted in principle, and explanation is made based on an assumption that Equation 1 holds.

The inverting input of the amplifier U connected to the detection electrode 401 operates to have the same potential as the non-inverting input so as to be in a so-called virtually grounded state, and accordingly the detection electrode 401 is kept at ground potential. This prevents a voltage of a drive signal frequency or the like from being applied to a stray capacitance between the detection electrode 401 and a ground or causes a DC voltage to become constant. Accordingly an influence of the stray capacitance in the CM circuit 101 is suppressed.

In the case of the actual amplifier U, if an open-loop gain at a drive signal frequency is defined as Av, an influence of a stray capacitance can be 1/Av. (By the effect of the amplifier U, a stray capacitance appears to be 1/Av of an actual capacitance.) That is, a necessary effect of reducing a stray capacitance can be obtained by appropriately selecting a drive signal frequency by considering a bandwidth of the amplifier U and an influence of a stray capacitance can be more effectively reduced if an amplifier U having a large open-loop gain Av at a drive signal frequency can be used.

Here, as an output of the signal detection means 501, a voltage output having a low impedance is exemplified, but a current output having a high impedance or an output having an appropriate impedance may be used when necessary.

Further improvements, modifications and the like of the signal detection means 501 will be described later in eighth to eleventh embodiments.

First Embodiment—Measuring Means

As described above, the output amplitude Vout of the signal detection means 501 is proportional to the inter electrode capacitance Cx, and thus, the measuring means 601 is configured to obtain at least the output amplitude Vout of the signal detection means 501.

The measuring means 601 may be a digital multimeter or an AC voltmeter having, for example, an AC voltage measurement function. The digital multimeter or the AC voltmeter is connected to an output of the signal detection means 501 so that the measuring means 601 can be informed of the output amplitude Vout of the signal detection means 501.

The measuring means 601 may include AC voltage measuring means and convert an output of the signal detection means 501 into a direct current so as to be informed of the output amplitude Vout of the signal detection means 501 from the DC voltage. Examples of AC voltage measuring means include the following.

Rectifying an output of the signal detection means 501, averaging the output, and converting the output into a direct current (average detection). (When a forward voltage ($V_F$) of a diode used as rectifying means becomes an error factor in non-negligible level, a commonly used ideal diode circuit can be used.)

Converting an output into a direct current by an effective value detection element or circuit of a thermal conversion type or the like (effective value detection).

Performing an effective value conversion by an analog operation circuit and converting an output into a direct current (effective value detection).

When an output of the signal detection means 501 is converted into a direct current, if noise is included in the output of the signal detection means 501, the noise is convert into a DC voltage together with the output and errors are caused. Therefore, it is desirable to extract only a drive signal frequency by a method of a twelfth embodiment or a thirteenth embodiment described later.

An A/D converter (analog/digital converter) may be connected to an output of the signal detection means 501 to know the output amplitude Vout of the signal detection means 501 through various kinds of digital processing. In this case, it is possible to insert a low-pass filter or a bandpass filter between the output of the signal detection means 501 and the A/D converter when necessary.

Particularly when digital processes are used in combination, it is easy to calculate the inter electrode capacitance Cx by using a CPU (Central Processing Unit) based on the output amplitude Vout of the signal detection means 501. Further, various parameters such as an inter electrode distance and an object state can be calculated as measurement results based on the inter electrode capacitance Cx.

By having comparison determination means and threshold setting means, the measuring means 601 can perform various determinations and details will be described in a nineteenth embodiment described later.

The measuring means 601 includes output means and outputs pieces of information on various measurement results such as the output amplitude Vout of the signal detection means 501, the inter electrode capacitance Cx, the inter electrode distance and the object state and results obtained by performing determinations by appropriate means. The output means widely includes displaying and printing of various pieces of information (including printing and graph output of values), an alarm indicating an abnormality or the like found by determination, and a contact output, but is not limited to these. The measuring means 601 may include communication means to transmit the pieces of information to necessary places via the communication means. Details of the measuring means are described in a nineteenth embodiment described later.

As one example, the following improvements and modifications can be considered for a combination including the measuring means 601, but the details will be described in respective embodiments.

In the signal detection means 501, the measurement with higher sensitivity is performed by using a circuit in which the feedback capacitance Cf is an equivalent and smaller capacitance. (Ninth embodiment)

The measurement with higher sensitivity is performed by additionally connecting an amplifier circuit to an output of the signal detection means 501. (Tenth embodiment)

Reducing an influence of noise and the like by adding a filter that attenuates a frequency component other than a drive signal frequency between the measuring means 601 and the signal detection means 501. (Twelfth embodiment)

An influence of noise and the like is reduced by using an AC voltage measurement method that is hardly affected by a frequency other than a drive signal frequency (as one example, phase-detection means). (Thirteenth embodiment)

Simultaneously performing distance measurement or the object detection of a plurality of points. (Fourteenth embodiment)

Simultaneously performing distance measurement or the object detection of two points using two drive signals having 90 degrees phase difference. (Fifteenth embodiment)

First Embodiment—Outline of Application to Electrostatic Capacitive Displacement Meter As described above, in the CM circuit 101, the inter electrode capacitance Cx can be known based on the output amplitude Vout of the signal detection means 501. In the case of a parallel plate, in a region where an edge effect is in a negligible level, the inter electrode distance and the inter electrode capacitance Cx are in an inversely proportional relationship, and thus, the inter electrode distance can be known by knowing the inter electrode capacitance Cx. Even when an edge effect is in a non-negligible level or an electrode is not parallel plate, if a relationship between the inter electrode distance and the inter electrode capacitance Cx is know in advance, the inter electrode distance can be known from the inter electrode capacitance Cx. In this case also, the inter electrode distance and the inter electrode capacitance Cx are in a certain functional relationship, and thus, by knowing the inter electrode capacitance Cx, the inter electrode distance can be known.

If the CM circuit 101 is applied such that one of or both of the drive electrode 301 and the detection electrode 401 become an object to be measured, it is possible to realize an electrostatic capacitive displacement meter that can performs the distance measurement between an electrode and an object to be measured or a distance between objects to be measured. In the case of distance measurement, an object to be measured that is the drive electrode 301 or the detection electrode 401 needs to be a conductor. However, if an electrode is attached to a non-conductive object, it is possible to perform distance measurement.

The use of the CM circuit 101 enables the object detection that affects the inter electrode capacitance Cx, and the object in this case does not need to be a conductor. For example, if an object having a larger dielectric constant than air is provided between the drive electrode 301 and the detection electrode 401, the inter electrode capacitance Cx increases, and thus, it is possible to know an amount, a thickness and the like of a dielectric based on the degree of increase. If an electrically floating (insulated) conductor (such conductor is hereinafter referred to as "floating conductor") is provided between the drive electrode 301 and the detection electrode 401, the inter electrode capacitance Cx increases, and thus, a size, a thickness and the like of the floating conductor can be known depending on the degree of increase. On the other hand, if an object such as a grounded conductor is provided between or approaches between the drive electrode 301 and the detection electrode 401, a line of electric force between the drive electrode 301 and the detection electrode 401 is blocked, and thus, the inter electrode capacitance Cx is reduced. Thus, an object state can be known from the degree of change of the inter electrode capacitance Cx and it is possible to realize an electrostatic capacitive displacement meter that can perform the object detection by using the CM circuit 101.

Classifications of a dielectric, a floating conductor, and a grounded conductor is just one example, and such classification may not be applied in some cases. For example, a human body has somewhat too large impedance to be called as a conductor, but the human body often behaves like a grounded conductor in the object detection. However, if an impedance of a grounding part (for example, shoes) is large or if the drive electrode 301 and the detection electrode 401 are sufficiently large relative to the human body the human body may behave like the floating conductor. Further, the human body may behave like a dielectric because most of the human body is water and water is dielectric.

If the CM circuit 101 is applied to the electrostatic capacitive displacement meter, a minute capacitance of, for example, 1 fF (0.001 pF) or less can be measured without receiving an influence of a stray capacitance in a detection electrode or the like. For this reason, an electrostatic capacitive displacement meter using the CM circuit 101 can measure an inter electrode distance of, for example, 1000 mm or more.

The electrostatic capacitive displacement meter using the CM circuit 101 has both an effect of the large distance measurement and an advantage specific to the electrostatic capacitive displacement meter that an object to be measured does not need to be a conductor in the object detection. This allows the object detection of a large object that has not been detected by using a conventional electrostatic capacitive displacement meter.

Second Embodiment

In the signal detection means of the first embodiment, if a DC component is present in an input, the DC component is amplified by an open-loop gain in a direct current of the used amplifier U. That is, due to a DC offset voltage, a bias current, noise and the like, a DC component of an output of signal detection means may become unstable or an output may be saturated.

Figure 2:
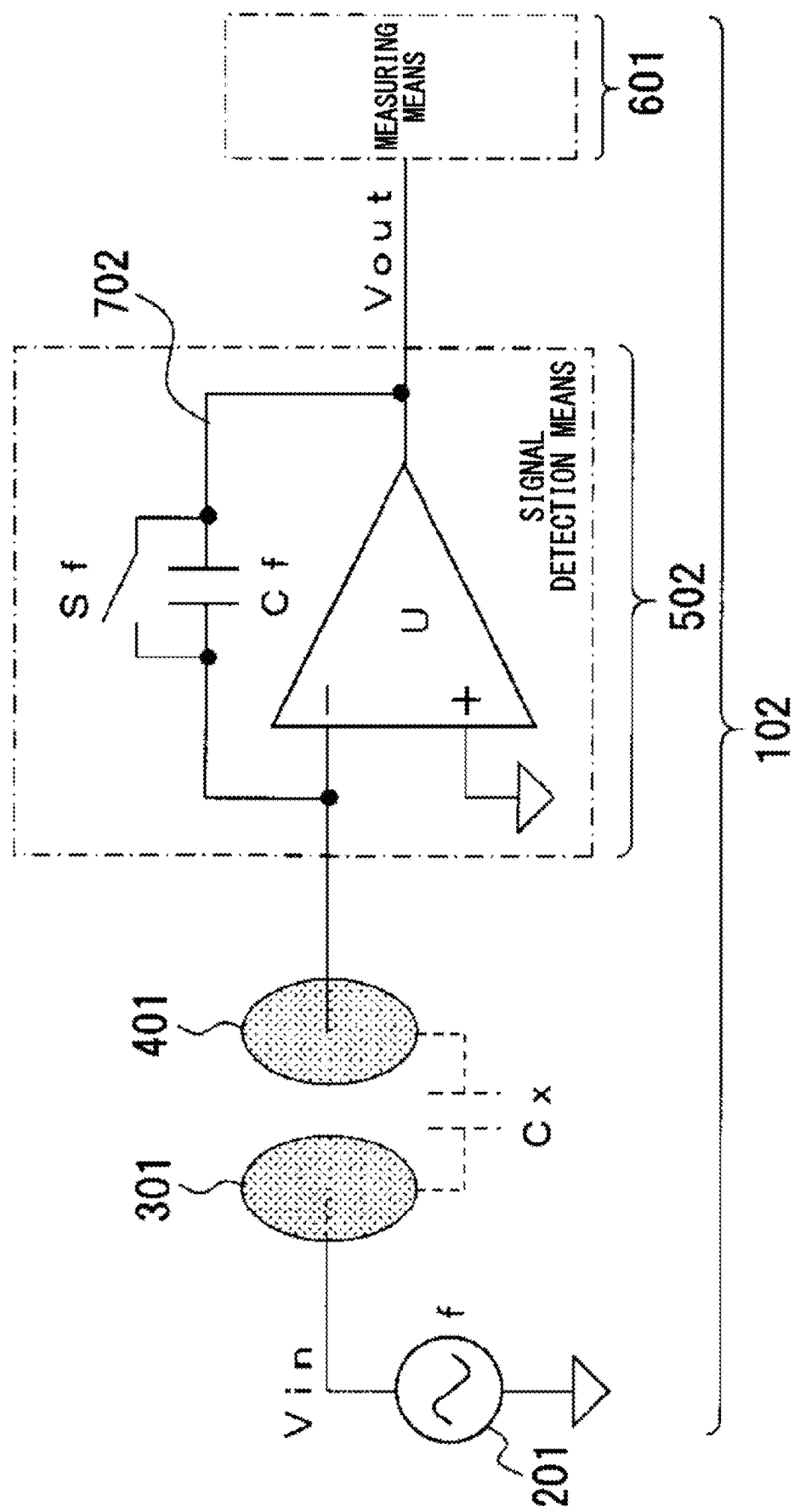
FIG. 2 illustrates one example of a CM circuit according to the second embodiment.

The second embodiment shows an example of suppressing the instability of the DC component of the output of the signal detection means and the saturation of the output. FIG. 2 illustrates one example of a CM circuit according to a second embodiment. The same reference numerals are denoted to the same part as FIG. 1. Descriptions of the same parts as the first embodiment are omitted.

ACM circuit 102 according to the second embodiment includes signal detection means 502 instead of signal detection means 501. The signal detection means 502 includes the previously described amplifier U and negative feedback unit 702. The negative feedback unit 702 includes the previously described feedback capacitance Cf and a discharge switch Sf that is connected in parallel to the feedback capacitance Cf. When the discharge switch Sf is turned on, the feedback capacitance Cf is discharged and a voltage across terminals of the negative feedback unit 702 becomes zero. As a result, an output of the amplifier U included in the signal detection means 502 comes to have the same potential as an inverting input. On the other hand, an output of the amplifier U comes to have the same potential as a reference potential to which a non-inverting input is connected because the amplifier U operates such that the inverting input and the non-inverting input have the same potential. This suppresses an amplification of a DC component of an input by an open-loop gain in a direct current of the amplifier U even when a DC component is present in an input of the signal detection means 502. That is, an instability of a DC component of an output of the signal detection means 502 and a saturation of an output due to a DC offset voltage, a bias current, noise and the like are suppressed.

Examples of timings for temporarily turning on the discharge switch Sf include a timing at which a DC component of an output of the amplifier U exceeds a predetermined value, a timing at which a sum of a peak of an AC component and a DC component approaches an output saturation voltage of the amplifier U, a timing at which a power source of the signal detection means 502 is turned on (power-on reset), and a fixed timing or an arbitrary timing at which an output of the amplifier U is not saturated.

The discharge switch Sf is, for example, a semiconductor switch, a semiconductor relay and a mechanical relay. An inter-terminal capacitance of the semiconductor switch, the semiconductor relay or the mechanical relay is generally several pF or more, and thus, the discharge switch Sf is usable when the feedback capacitance Cf is not affected by the inter-terminal capacitance (as one example, when feedback capacitance Cf is 10 pF or more).

One type of mechanical relay is a high frequency relay. In a high frequency relay an inter-terminal capacitance is reduced by a special contact structure such as grounding a contactor when the high frequency relay is turned off and an isolation performance is significantly improved. If such high frequency relay is used, a feedback capacitance Cf having a smaller capacitance (as one example, 1 pF) may be used.

Third Embodiment

Figure 3A:
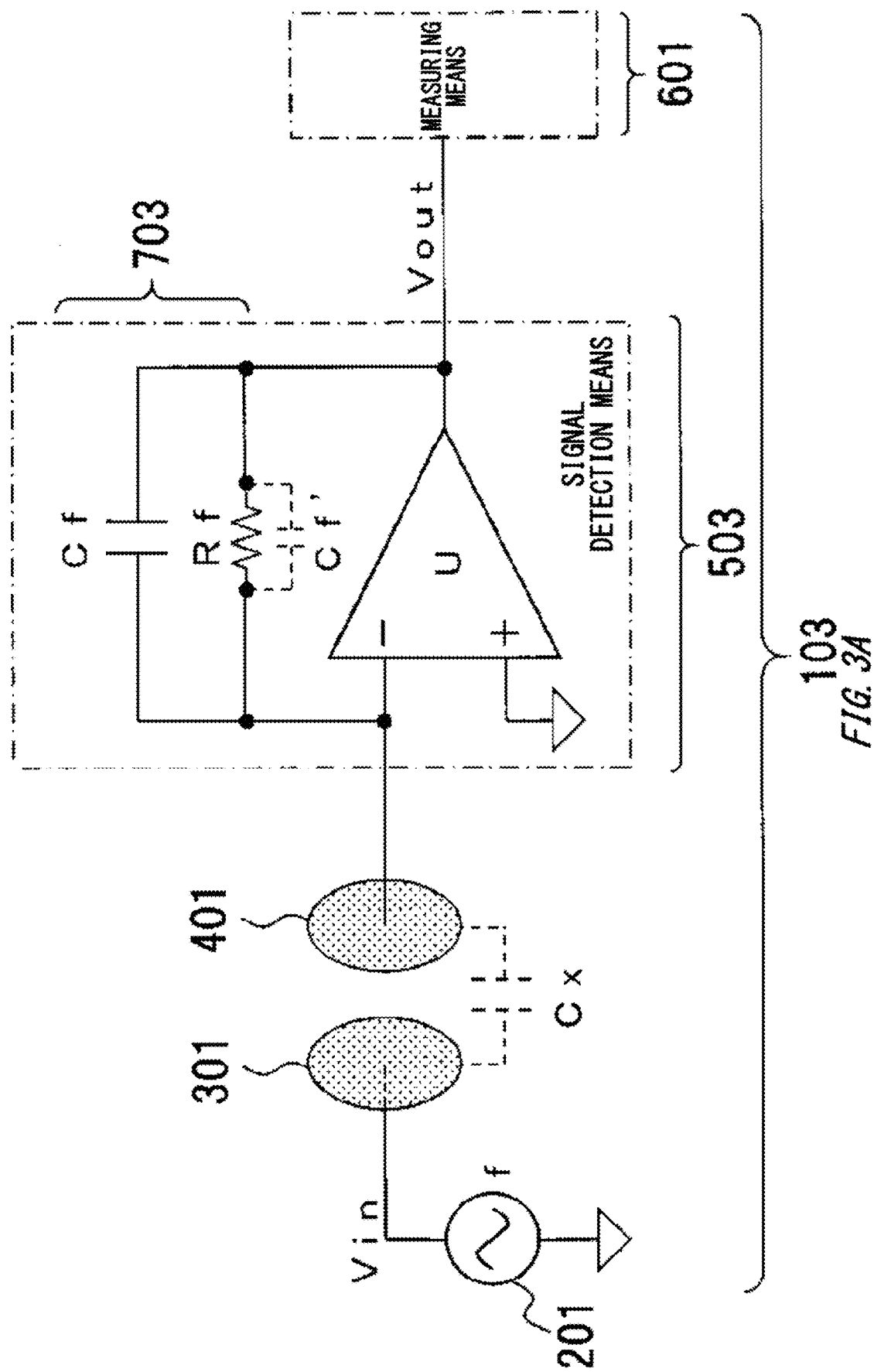
FIG. 3A illustrates one example of a CM circuit according to the third embodiment.
Figure 3B:
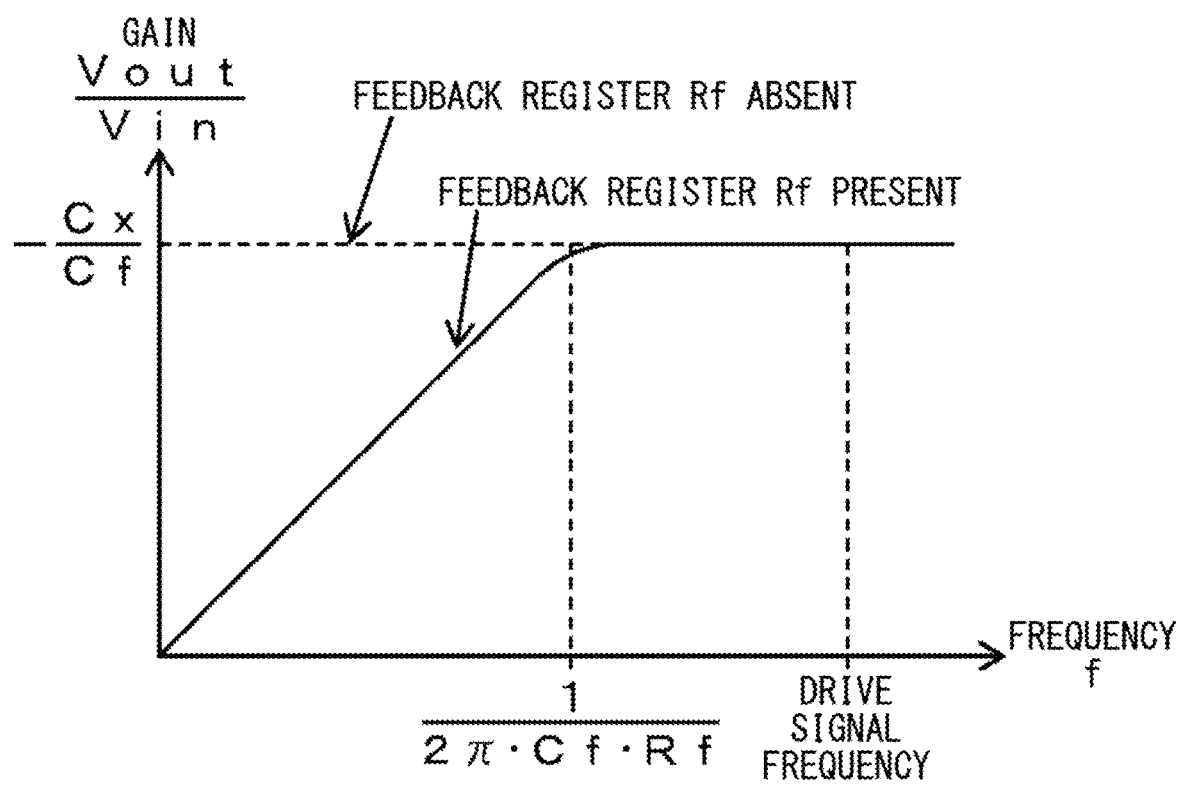
FIG. 3B illustrates a gain of an amplifier U in a CM circuit according to the third embodiment.
Figure 3C:
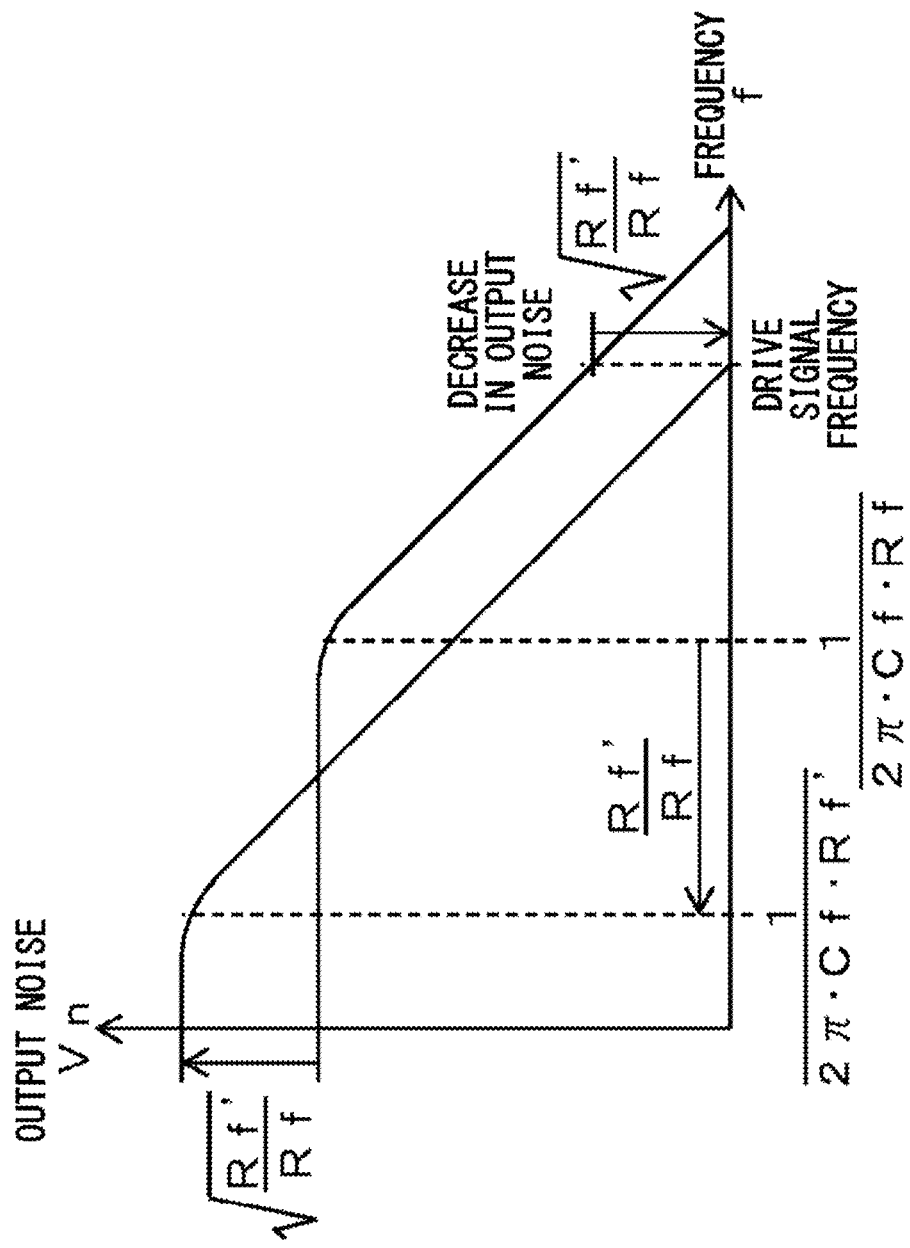
FIG. 3C illustrates noise in a CM circuit according to the third embodiment.

The third embodiment shows another example of suppressing an instability of a DC component of an output of signal detection means and an output saturation. FIG. 3A to FIG. 3C illustrate one example of a CM circuit, a frequency characteristic, an output noise characteristic according to the third embodiment and FIG. 4A to FIG. 4D illustrate a modified example of signal detection means of the CM circuit according to the third embodiment. The same reference numerals are denoted to the same parts as FIG. 1 and FIG. 2. Descriptions of a part that is the same as that of either the first embodiment or the second embodiment is omitted.

ACM circuit 103 according to the third embodiment includes signal detection means 503 instead of the signal detection means 501, 502. The signal detection means 503 includes the previously described amplifier U and negative feedback unit 703. As illustrated in FIG. 3A, the negative feedback unit 703 includes the previously described feedback capacitance Cf and a feedback resistance Rf that is connected in parallel to the feedback capacitance Cf. The feedback resistance Rf is one example of a first feedback resistance and is a resistance for discharging. By having the feedback resistance Rf, the CM circuit 103 suppresses the instability of the DC component of the output of the signal detection means 503 and the output saturation.

At a frequency lower than a frequency corresponding to a time constant of the feedback capacitance Cf and the feedback resistance Rf (including direct current), an impedance of the feedback resistance Rf is lower than an impedance of the feedback capacitance Cf, and thus, a gain of the amplifier U is lowered. (See FIG. 3B. A frequency corresponding to a time constant by the feedback capacitance Cf and the feedback resistance Rf is $1/(2\pi \cdot Cf \cdot Rf)$.) As a result, the instability of the DC component of the output of the signal detection means 503 and the output saturation are suppressed. On the other hand, at a frequency higher than a frequency corresponding to a time constant by the feedback capacitance Cf and the feedback resistance Rf, an impedance of the feedback capacitance Cf is lower than an impedance of the feedback resistance Rf, and thus, as the frequency increases, an influence of the feedback resistance Rf decreases to be approximated to Equation 1. That is, the frequency corresponding to the time constant by the feedback capacitance Cf and the feedback resistance Rf is preferably sufficiently lower than the drive signal frequency and, as one example, is preferably about 1/10 of the drive signal frequency.

The feedback resistance Rf generally has a large resistance value and as one example, has a resistance value of 100 MΩ. This is to reduce the frequency corresponding to the time constant by the feedback capacitance Cf and the feedback resistance Rf to be lower than the drive signal frequency. This is because noise of the signal detection means 503 caused by the feedback resistance Rf can be reduced if the feedback resistance Rf is large. Reasons thereof are described with reference to FIG. 3C.

The feedback capacitance Cf is connected in parallel to the feedback resistance Rf, and thus, at or above the frequency corresponding to the time constant by the feedback capacitance Cf and the feedback resistance Rf, thermal noise caused by the feedback resistance Rf appearing in the signal detection means 503 decrease in proportion to a frequency. As one example, if a feedback resistance Rf' having a 100 times larger resistance value is used, a frequency corresponding to the time constant becomes 1/100. On the other hand, thermal noise caused by the feedback resistance Rf increases if the feedback resistance Rf is increased. As one example, if a feedback resistance Rf' having a 100 times larger resistance value is used, thermal noise becomes $\sqrt{100}$ times (10 times). The thermal noise at the drive signal frequency is reduced to 1/10 because the frequency corresponding to the time constant becomes 1/100 and the thermal noise become 10 times. That is, noise of the signal detection means 503 caused by the feedback resistance Rf can be reduced if the feedback resistance Rf is large.

In the CM circuit 103, at a frequency lower than the frequency corresponding to the time constant by the feedback capacitance Cf and the feedback resistance Rf, a gain of the amplifier U continuously decreases, and thus, the instability of the DC component of the output of the signal detection means 503 and the output saturation can be suppressed and the capacitance measurement can be performed continuously.

The signal detection means 503 may further include a discharge switch Sf illustrated in FIG. 2. For example, when the signal detection means 503 is powered on, a discharge switch Sf is turned on to discharge the feedback capacitance Cf and after the discharge switch Sf is turned off, the signal detection means 503 can be stabilized in a current manner by an effect of the feedback resistance Rf.

The inter-terminal capacitance Cf' is present in an actual resistive element used as the feedback resistance Rf and is connected in parallel to the feedback resistance Rf and the feedback capacitance Cf. As one example, an inter-terminal capacitance of a chip resistance is about 0.1 pF, and thus, the feedback capacitance Cf is usable if the feedback capacitance Cf is large enough to be not affected by the capacitance (as one example, when feedback capacitance Cf is 1 pF or more). The inter-terminal capacitance Cf' of an actual resistive element has a lower Q-factor (quality factor) than an actual capacitative element, varies largely in a capacitance, and its capacitance value is not guaranteed, and thus, the inter-terminal capacitance Cf' may cause a performance degradation of the signal detection means 503.

The signal detection means 503 may be any of signal detection means 503-1, 503-2, 503-3, 503-4 illustrated in FIG. 4A to FIG. 4D respectively for example. FIG. 4A to FIG. 4D illustrate an example of signal detection means additionally including a circuit that cancels an influence of an inter-terminal capacitance of a feedback resistance Rf and improves the degree of freedom of selection of a feedback capacitance Cf.

Figure 4A:
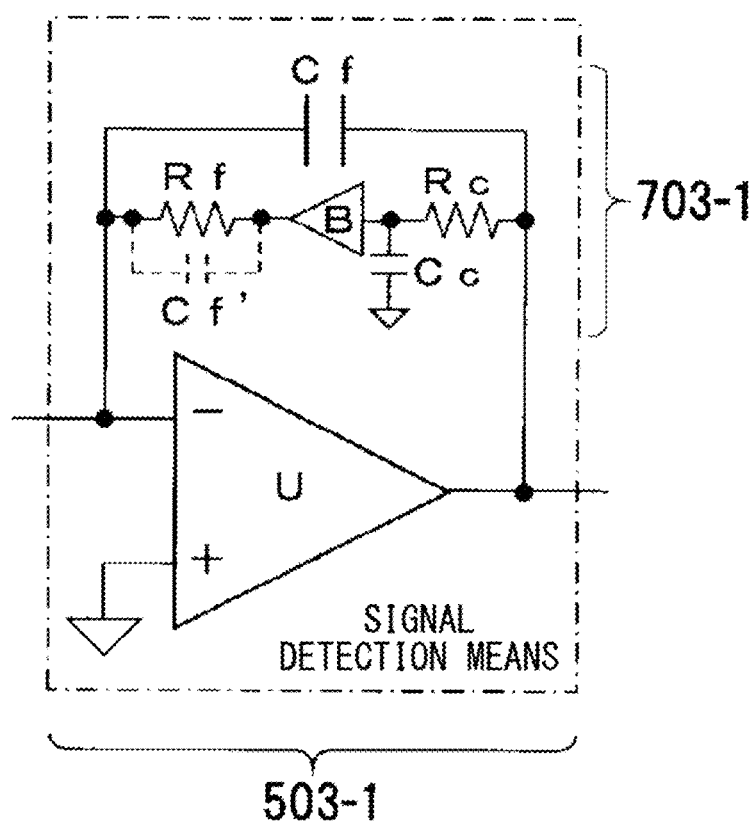
FIG. 4A illustrates one example of signal detection means in a CM circuit.

A negative feedback unit 703-1 of the signal detection means 503-1 illustrated in FIG. 4A includes a buffer amplifier B connected in series to the feedback resistance Rf and a cancel circuit. The cancel circuit includes a resistance Rc and a capacitance Cc and cancels an influence of the inter-terminal capacitance of the feedback resistance Rf that is a feedback capacitance Cf'. A buffer amplifier B is represented by a triangle symbol in FIG. 4A and is a buffer amplifier of a gain 1. The buffer amplifier B and the cancel circuit are connected in parallel to the feedback capacitance Cf together with the feedback resistance Rf. At this time, an influence of the inter-terminal capacitance of the feedback resistance Rf can be cancelled by selecting values of the resistance Rc, the capacitance Cc, the feedback resistance Rf, and the feedback capacitance Cf' as in following Equation 2.

[Equation 2]

$$Rc \cdot Cc \approx Rf \cdot Cf' \quad (2)$$

Most of actually available capacitative elements are larger than the feedback capacitance Cf', and thus, in many cases, Cc>Cf' and Rc<Rf hold. To compensate for a variation in capacitance values of the feedback capacitance Cf', either one of the resistance Rc and capacitance Cc or a part of the values may be a variable element. Generally a variable resistance is more inexpensive and more easily available, and thus, it is preferable to use a variable resistance or use in combination a fixed resistance and a variable resistance for the resistance Rc as appropriate.

An unillustrated fixed capacitance element having a larger capacitance than the feedback capacitance Cf (as one example, 10 times the capacitance) is connected in parallel to the feedback capacitance Cf and the parallel capacitances can be applied to Equation 2 as Cf. A method of using the fixed capacitance element in combination can achieve an effect of alleviating or solving a problem that the inter-terminal capacitance of the actual resistive element has a lower Q-factor than the actual capacitative element, varies largely in the capacitance, and its capacitance value is not guaranteed.

Figure 4B:
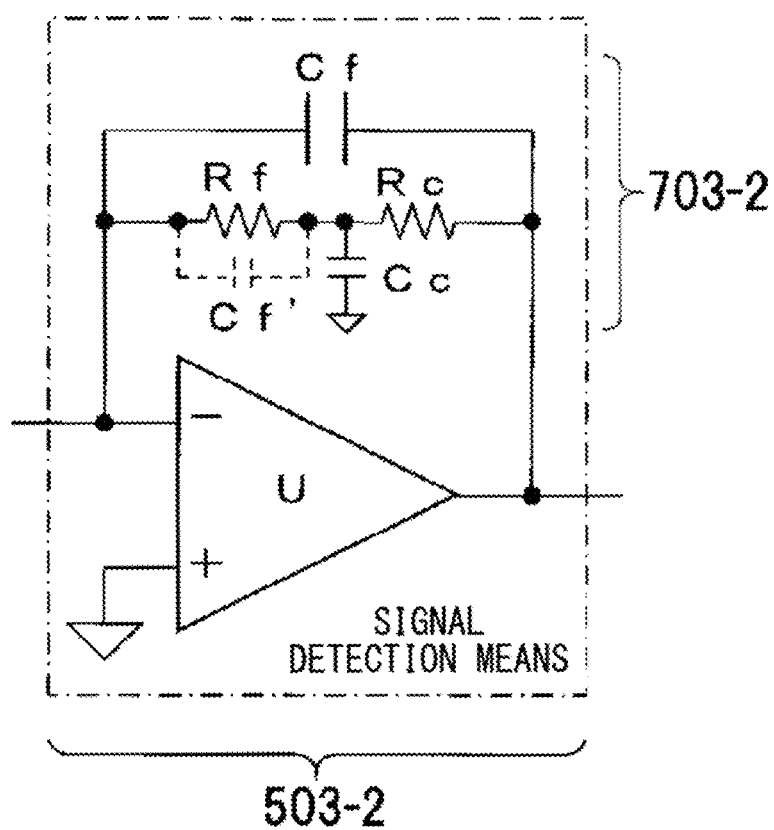
FIG. 4B illustrates one example of signal detection means in a CM circuit.

When a resistance value of the feedback resistance Rf is sufficiently larger than a resistance value of the resistance Rc, an effect similar to that of the signal detection means 503-1 of FIG. 4A can be obtained even if adopting a configuration of the signal detection means 503-2 of FIG. 4B obtained by omitting the buffer amplifier B from the signal detection means 503-1.

Figure 4C:
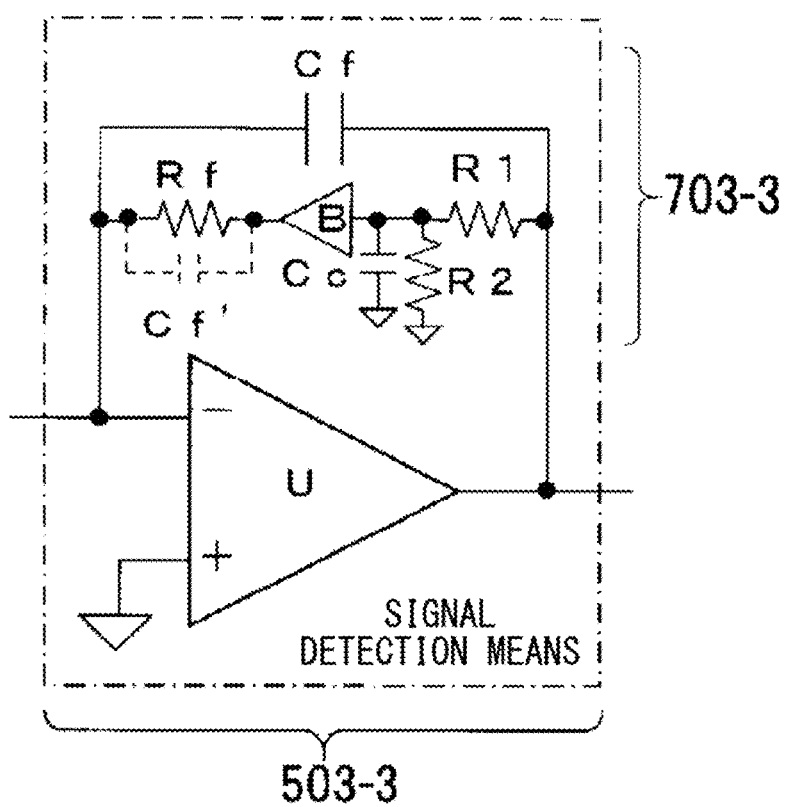
FIG. 4C illustrates one example of signal detection means in a CM circuit.

When a resistance value of the feedback resistance Rf is reduced due to problems of availability and parts cost, it is possible to adopt a configuration of the signal detection means 503-3 as illustrated in FIG. 4C. A negative feedback unit 703-3 of the signal detection means 503-3 includes a buffer amplifier B connected in series to the feedback resistance Rf and an attenuator. The attenuator includes a resistance R1 and a resistance R2. In this case, a resistance value of the feedback resistance Rf can be reduced by an attenuation factor of the attenuator. For example, when the resistance R1 is 9 k Ω, the resistance R2 is 1 k Ω, and an attenuation factor of an attenuator is 20 dB (¹/₁₀), the negative feedback unit 703-3 operates with a time constant similar to the feedback resistance Rf of 1 GΩ by using a resistance of 100 M Ω as the feedback resistance Rf. However, noise of the signal detection means 503-3 when a resistance of 100 MΩ is used becomes larger than noise when the feedback resistance Rf is 1 GΩ, and noise corresponds to noise when a resistance of 100 MΩ is actually used.

In the signal detection means 503-3 illustrated in FIG. 4C, a parallel resistance value of a resistance R1 and a resistance R2 is set as a resistance Rc and previously described Equation 2 is satisfied.

Figure 4D:
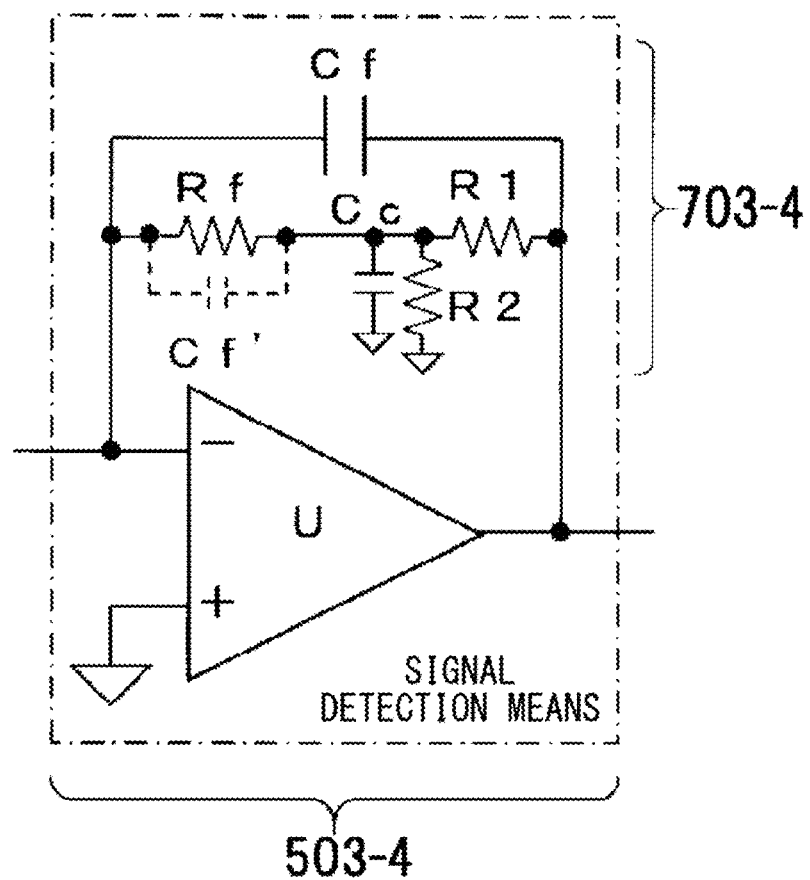
FIG. 4D illustrates one example of signal detection means in a CM circuit.

When a resistance value of the feedback resistance Rf is sufficiently larger than the parallel resistance value of the resistance R1 and the resistance R2, an effect similar to that of the signal detection means 503-3 of FIG. 4C can be obtained even if adopting a configuration of the signal detection means 503-4 of FIG. 4D obtained by omitting the buffer amplifier B of the signal detection means 503-3.

In FIG. 4C, if a gain of a buffer amplifier is lower than one, an attenuation factor of an attenuator by the resistance R and the resistance R2 may be decreased by the gain for compensation. When a non-inverting amplifier circuit in which a gain is larger than one is used instead of a buffer amplifier, an attenuation factor of an attenuator may be increased by the gain.

In a CM circuit 103 of FIG. 3A, an effect similar to that of the CM circuit 103 of FIG. 3A can be obtained by connecting an output of the amplifier U of the signal detection means 503 to an input of another unillustrated buffer amplifier even if another buffer amplifier is inserted between an output of the amplifier U and the feedback resistance Rf. When an amplification factor of the another buffer amplifier is smaller than one, a resistance value of the feedback resistance Rf may be decreased by an amount corresponding to the amplification factor. The same applies even if another unillustrated buffer amplifier is inserted between the output of the amplifier U and the resistance Rc in FIG. 4A and FIG. 4B and the same applies even if another unillustrated buffer amplifier is inserted between the output of the amplifier U and the resistance R1 in FIG. 4C and FIG. 4D.

Fourth Embodiment

Figure 5A:
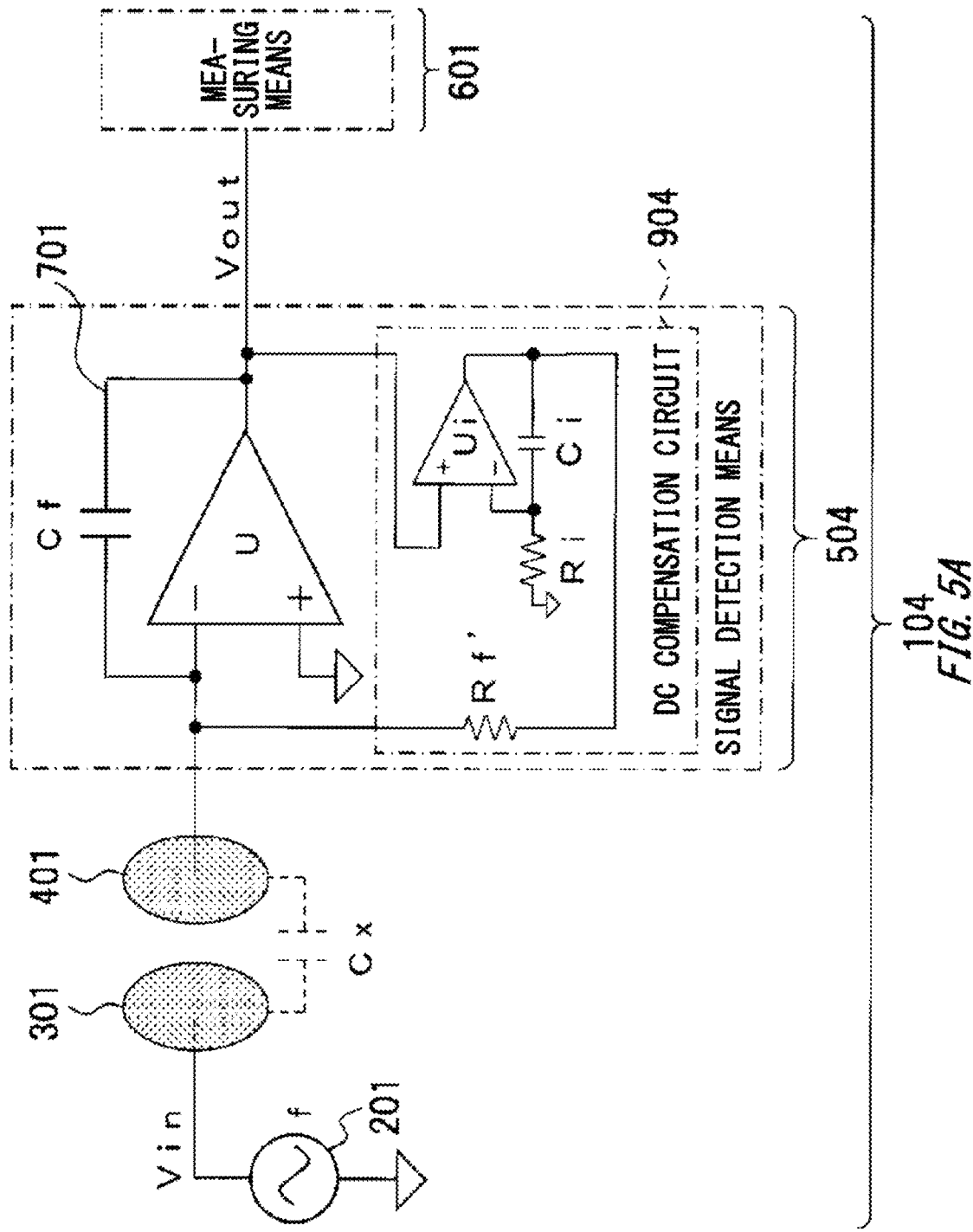
FIG. 5A illustrates one example of a CM circuit according to the fourth embodiment.
Figure 5B:
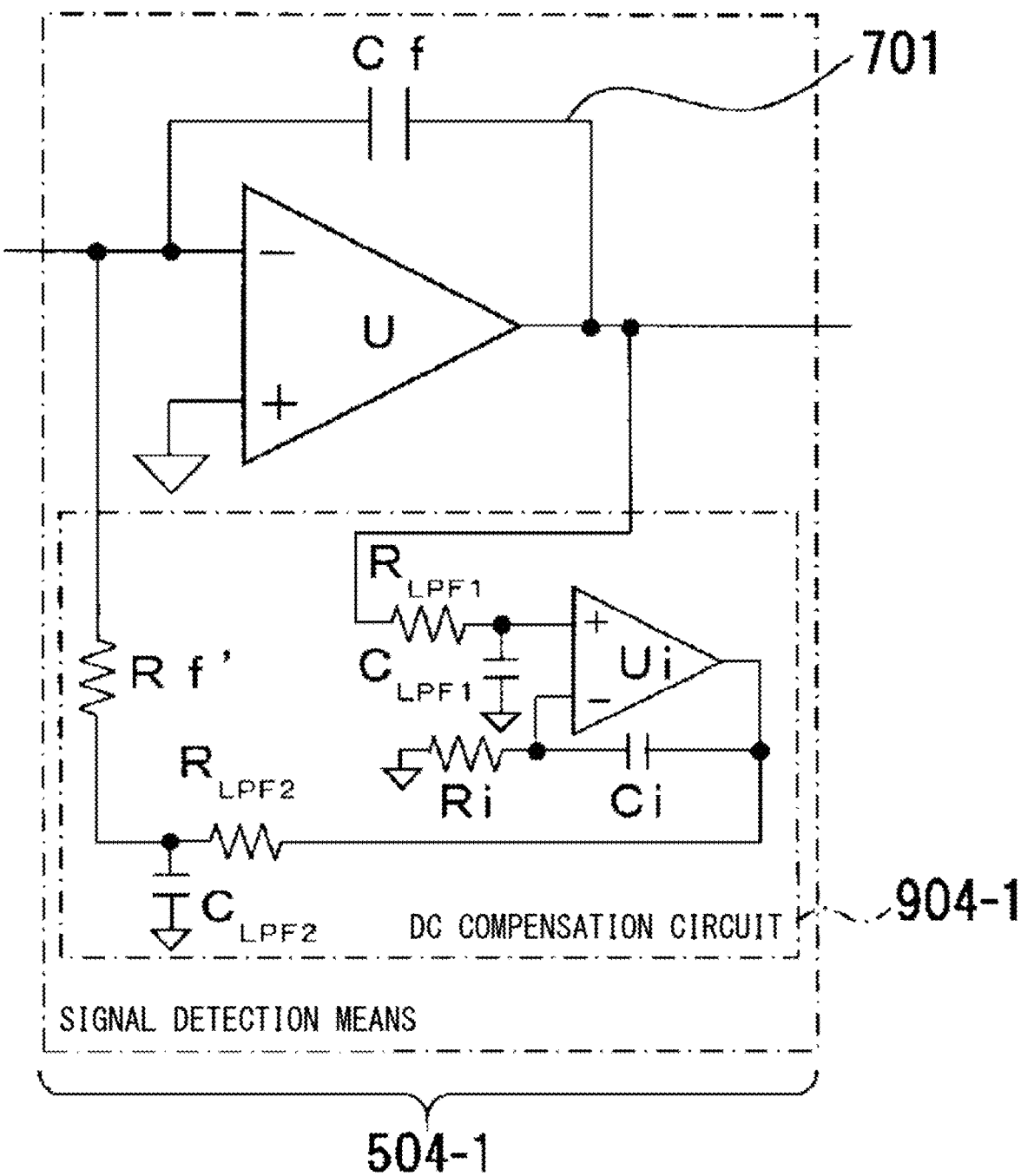
FIG. 5B illustrates one example of signal detection means in a CM circuit according to the fourth embodiment.

The fourth embodiment shows another example of suppressing an instability of a DC component of an output of signal detection means and an output saturation. FIG. 5A illustrates one example of a CM circuit according to the fourth embodiment and FIG. 5B illustrates one example of signal detection means of a CM circuit. In FIG. 5A, the same reference numerals are denoted to the same parts as FIG. 1, FIG. 2 and FIG. 3A. Descriptions of the same parts as those in any of the first embodiment to the third embodiment are omitted.

A CM circuit 104 illustrated in FIG. 5A includes signal detection means 504 instead of signal detection means 501, 502, and 503. The signal detection means 504 includes a DC compensation circuit 904 connected to an input and an output of an amplifier U and suppresses an instability of a DC component of an output of signal detection means 504 and an output saturation. ADC compensation circuit 904 includes an integrating circuit including an amplifier Ui, an integral capacity Ci, and an integrator resistance Ri, and a feedback resistance Rf that is one example of a second feedback resistance, extracts a DC component and a low frequency component in an output signal of an amplifier U by using the integrating circuit, and stabilizes signal detection means 504 in a direct current manner by applying a negative feedback to perform a direct current compensation of the signal detection means 504.

In FIG. 5A, an integrating circuit and a feedback resistance Rf connected to an output of the amplifier Ui of the integrating circuit are connected between an output and an inverting input of an amplifier U in the signal detection means 504 (that is, parallel to feedback capacitance Cf). A time constant of an integrating circuit determined by the integral capacity Ci and the integrator resistance Ri is preferably smaller than a time constant determined by the feedback resistance Rf and the feedback capacitance Cf.

ADC component and a low frequency component are amplified by gains obtained by adding an open-loop gain of the amplifier U in the signal detection means 504 and an open-loop gain of the amplifier Ui, and a negative feedback is applied, and thus, the DC compensation circuit 904 can achieve an effect of more accurately cancelling the DC component than in the third embodiment.

Signal detection means 504 may be the signal detection means 504-1 illustrated in FIG. 5B for example. The signal detection means 504-1 of FIG. 5B includes a DC compensation circuit 904-1 connected to an input and an output of the amplifier U. The DC compensation circuit 904-1 includes the previously described integrating circuit, feedback resistance Rf, first low-pass filter, and second low-pass filter, and suppresses noise and a high frequency component from returning to an input of the amplifier U via an unillustrated inter electrode capacitance Cf' of a feedback resistance Rf.

The first low-pass filter is formed of a resistance $R_{LPF1}$ and a capacitance $C_{LPF1}$, is provided between an output of the amplifier U and an input of an integrating circuit, and reduces noise and a high frequency component that prevents a sufficient operation of the amplifier Ui. A cutoff frequency of the first low-pass filter is desirably selected so as to be sufficiently lower than a unity gain bandwidth of the amplifier Ui (as one example, about 1/10) and sufficiently higher than a frequency corresponding a time constant by the integrator resistance Ri and the integral capacity Ci (as one example, 10 times or more).

The second low-pass filter is formed of a resistance $R_{LPF2}$ and a capacitance $C_{LPF2}$, is provided between an output of an integrating circuit and the feedback resistance Rf, and reduces noise and a high frequency component that prevent a sufficient operation of the amplifier U. A cutoff frequency of the second low-pass filter is desirably selected so as to be sufficiently lower than a unity gain bandwidth of the amplifier U (as one example, about 1/10).

Although FIG. 5B illustrates an example of having both of the first low-pass filter and the second low-pass filter, either one of them may be provided when necessary, or no low-pass filter may be provided if noise and a high frequency component are sufficiently small to have almost no influence.

Although FIG. 5B illustrates an example of using a first order low-pass filter based on a resistance and a capacitance, a filter is not limited to this, and a high-order low-pass filter, an LC filter and the like are freely selectable.

Fifth Embodiment

The fifth embodiment shows an example of removing ambient noise by an LC resonance circuit. FIG. 6A, FIG. 6B, FIG. 8A, FIG. 8B, and FIG. 8C illustrate one example of a CM circuit according to the fifth embodiment and FIG. 7 illustrates a simulation example of a frequency characteristic of an output of signal detection means. The same reference numerals are denoted to the same parts as those in FIG. 1, FIG. 2, FIG. 3A, and FIG. 5A. Descriptions of the same parts as those in any of the first embodiment to the fourth embodiment are omitted. Signal detection means 505 may be any of the signal detection means already described in the first embodiment to the fourth embodiment.

Figure 6A:
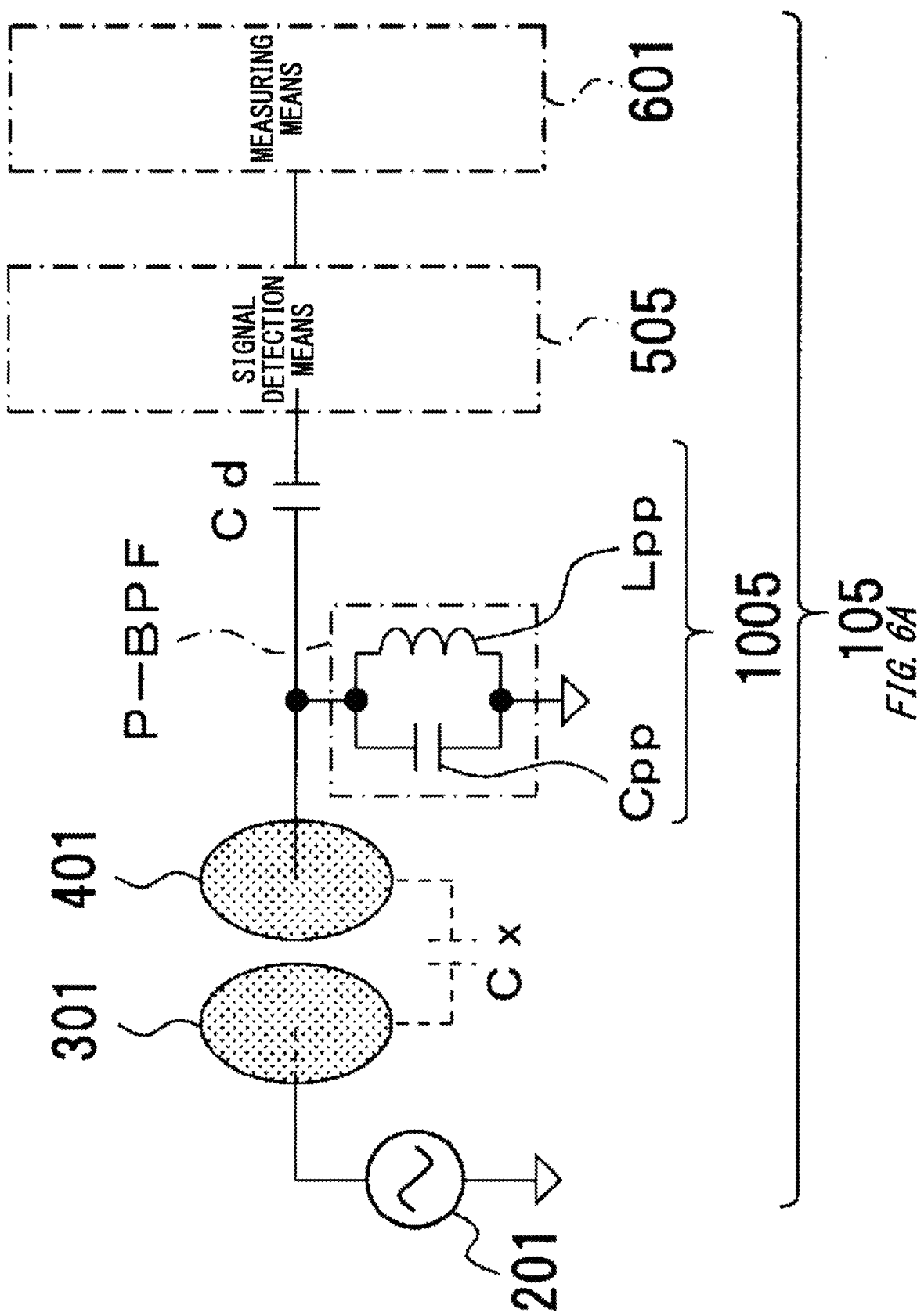
FIG. 6A illustrates one example of a CM circuit according to the fifth embodiment.
Figure 7:
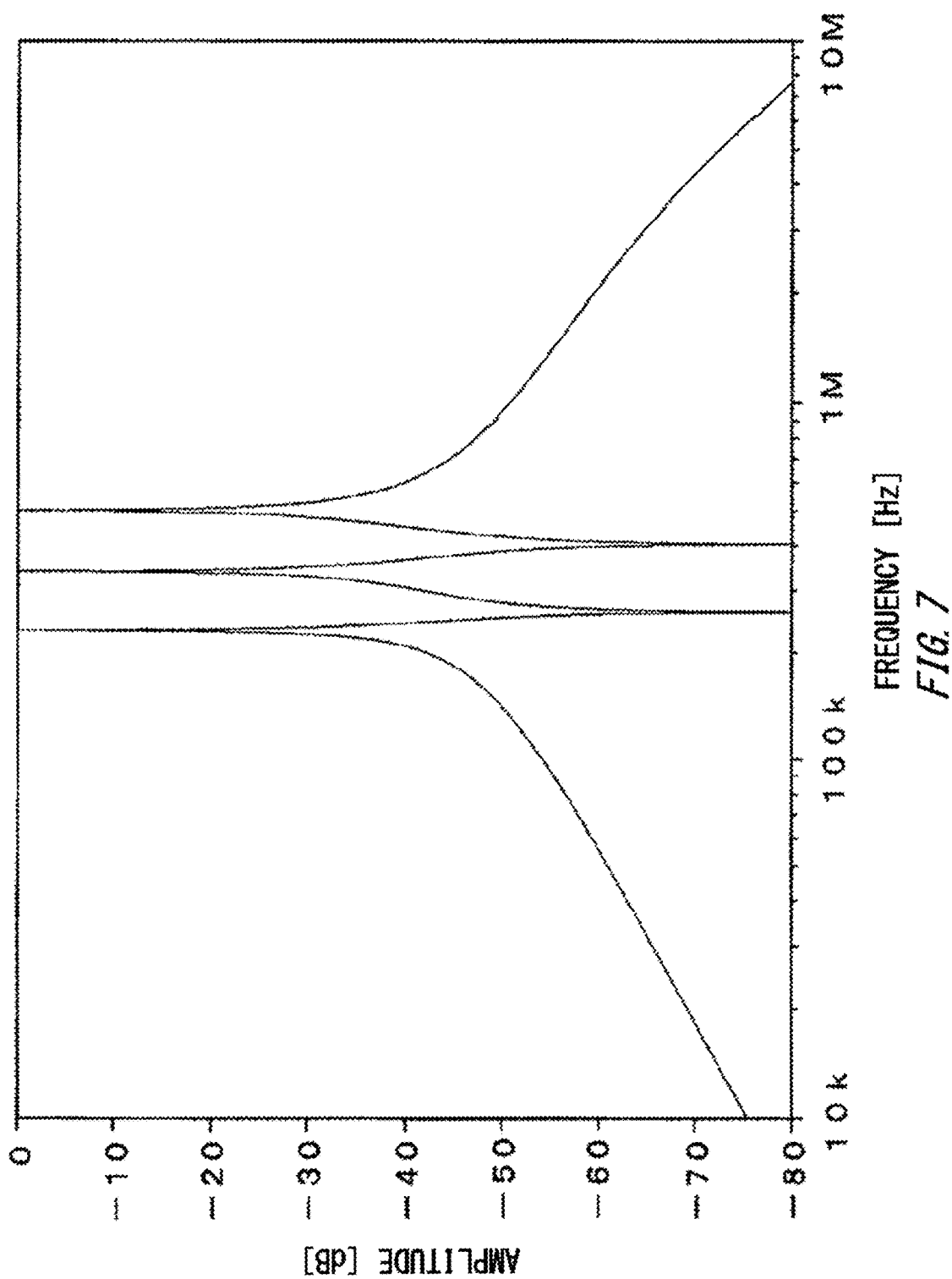
FIG. 7 illustrates a simulation example of a frequency characteristic of an output of signal detection means.

A CM circuit 105 of FIG. 6A includes a noise elimination circuit 1005 provided between a detection electrode 401 and signal detection means 505. The noise elimination circuit 1005 includes a parallel bandpass filter (P-BPF) (hereinafter referred to as "parallel BPF") and a capacitance Cd and is provided between the detection electrode 401 and the signal detection means 505. The parallel BPF is one example of a first resonance circuit and a bandpass filter by a parallel resonance circuit. The parallel resonance circuit is formed of, for example, a parallel resonant capacitor Cpp and a parallel resonant inductor Lpp. A resonance frequency of the parallel BPF is matched to a drive signal frequency.

In the parallel BPF, an AC signal of a drive signal frequency generated in drive signal generating means 201 is not attenuated because an impedance becomes high at a resonance frequency and an impedance becomes infinite for a parallel resonance circuit using an ideal element. On the other hand, in the parallel BPF, an impedance becomes low at a frequency other than a resonance frequency, and thus, for example, a hum of a utility frequency, external noise due to an electromagnetic wave and the like can be attenuated, and accordingly the parallel BPF can operate as a bandpass filter.

More specifically, when the amplifier U included in the signal detection means 505 is an ideal amplifier, an input of the signal detection means 505 to which the detection electrode 401 is connected is completely virtually grounded and a voltage is not generated, and thus, the parallel BPF does not operate as a bandpass filter. However, in an actual amplifier U, the parallel BPF operates as a bandpass filter because a slight voltage is generated at an input of the signal detection means 505.

An impedance at a direct current of the parallel resonant inductor Lpp included in the parallel BPF becomes zero, and thus, if the capacitance Cd illustrated in FIG. 6A is not present and the parallel BPF is directly connected to the means, at a direct current, an inverting input of the amplifier U included in the signal detection means 505 is grounded. On the other hand, a non-inverting input of the amplifier U included in the signal detection means 505 is grounded also. In an actual amplifier U, a DC offset voltage is not always zero, and thus, if both of an inverting input and a non-inverting input are grounded, a DC offset voltage is amplified by an open-loop gain at a direct current when the capacitance Cd is absent. As a result, a DC component may occur in an output of the amplifier U included in the signal detection means 505 or an output saturation may occur. The capacitance Cd illustrated in FIG. 6A is added to prevent the above and a capacitance sufficiently larger than the inter electrode capacitance Cx is selected. Note that, the capacitance can be considered as one type of a protective element described in sections of the drive electrode and the detection electrode in the first embodiment.

If a size of the detection electrode 401 is increased to perform the measurement with higher sensitivity, by that amount, means is likely to receive an influence of a hum or external noise. However, the above can be removed by use of the parallel BPF, and thus, the parallel BPF has an effect of performing the measurement with high sensitivity by increasing a size of the detection electrode 401.

Even if a drive signal waveform is a wave other than sine wave, when, for example, a square wave that facilitates a signal generation is used, a harmonic component is attenuated by the parallel resonance circuit, and thus, the drive signal waveform can be regarded as a sine wave (when Q-factor of resonance circuit is low, waveform close to sine wave) when the drive signal generating means 201 is not a constant voltage output. However, in this case, a drive signal voltage of a sine wave is desirably measured or calculated.

Figure 6B:
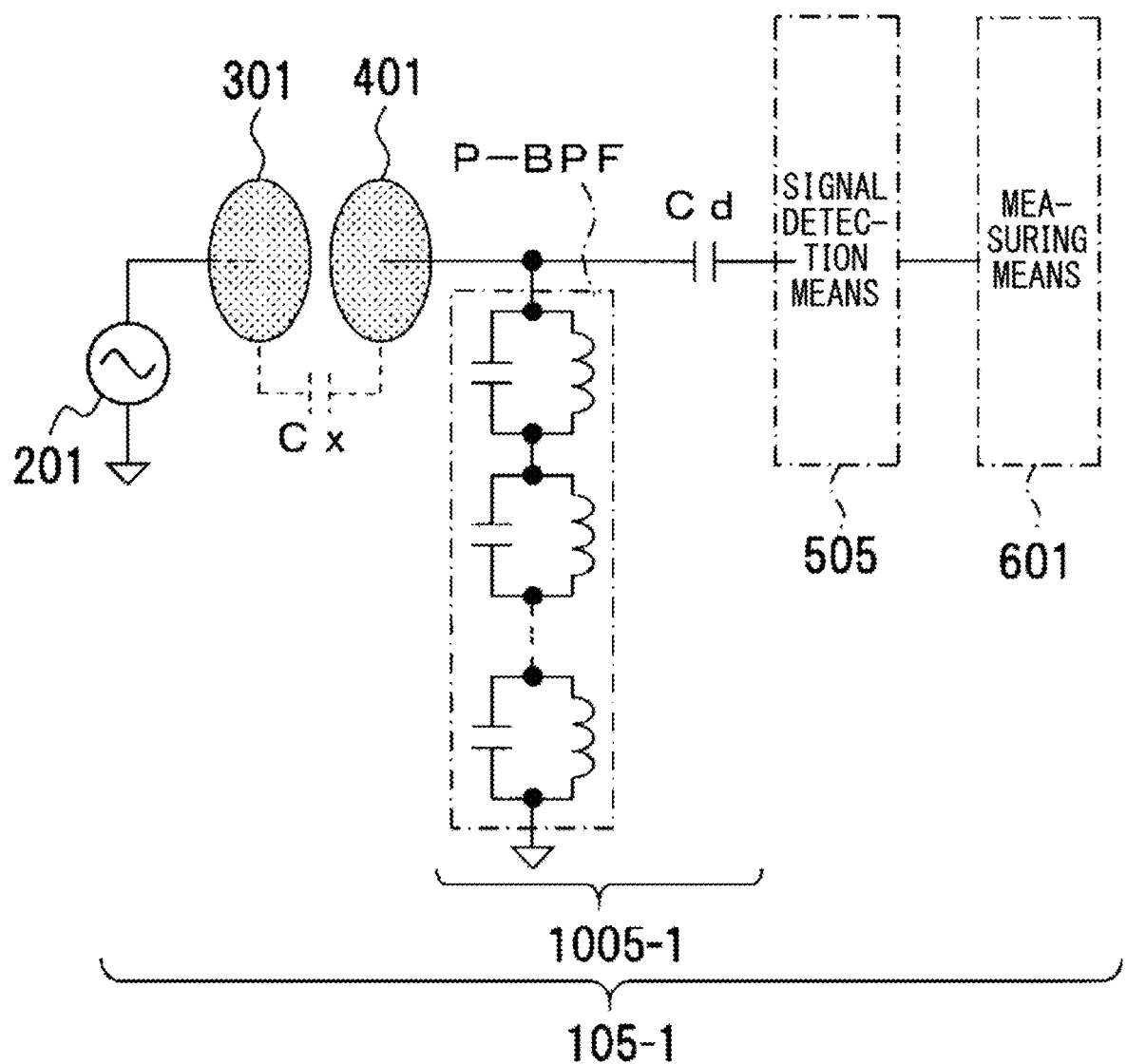
FIG. 6B illustrates one example of a CM circuit according to the fifth embodiment.

FIG. 6B illustrates an example in which a plurality of resonance circuits is connected in series in a parallel BPF of a noise elimination circuit 1005-1 in a CM circuit 105-1. As one example, as in the fourteenth embodiment described later, when a plurality of drive signal frequencies is used, a resonance frequency of each of parallel BPFs connected in series is matched to each of a plurality of frequencies to be used. This can attenuate frequency components other than each of a plurality of drive signal frequencies without attenuating each of a plurality of drive signal frequencies. An anti-resonance frequency occurs between resonance frequencies of parallel BPFs connected in series, and thus, frequencies are attenuated with a particularly steep frequency characteristic. As one example, the noise elimination circuit 1005-1 includes a first parallel BPF having a parallel resonant capacitor Cpp of 4700 pF and a parallel resonant inductor Lpp of 100 µH, a second parallel BPF having a parallel resonant capacitor Cpp of 2200 pF and a parallel resonant inductor Lpp of 100 pH, and a third parallel BPF having a parallel resonant capacitor Cpp of 1000 pF and a parallel resonant inductor Lpp of 100 pH, and FIG. 7 illustrates a simulation example of a frequency characteristic of an output of the signal detection means 505 when these three parallel BPFs are connected in series. A resonance frequency of the first parallel BPF is about 232 kHz, a resonance frequency of the second parallel BPF is about 339 kHz, and a resonance frequency of the third parallel BPF is about 503 kHz.

Figure 8A:
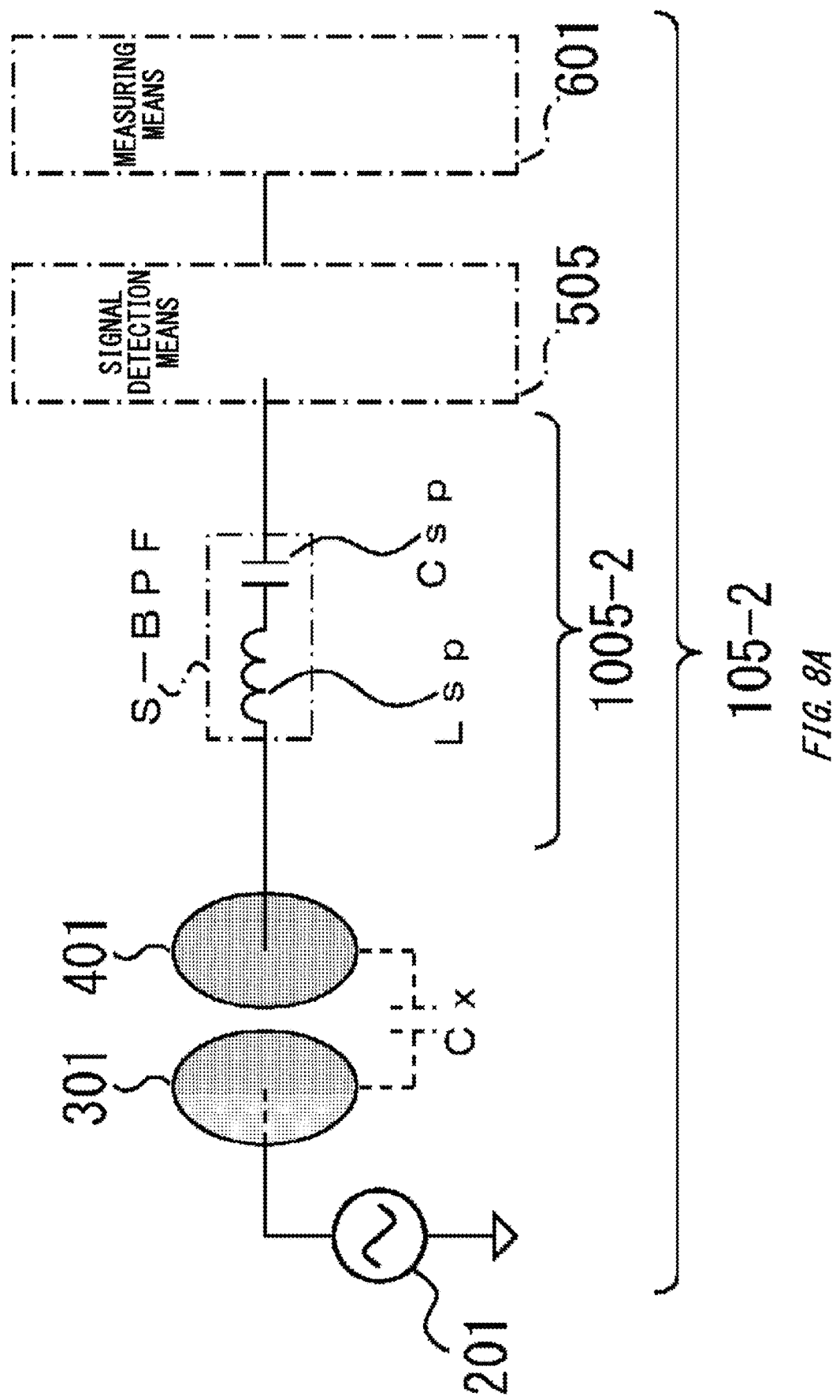
FIG. 8A illustrates one example of a CM circuit according to the fifth embodiment.

A CM circuit 105-2 of FIG. 8A according to the fifth embodiment includes a noise elimination circuit 1005-2 instead of the noise elimination circuit 1005. The noise elimination circuit 1005-2 includes a series bandpass filter (S-BPF) (hereinafter referred to as "series BPF"). The series BPF is one example of a first resonance circuit, is a bandpass filter by a series resonant circuit, and is provided between a detection electrode 401 and signal detection means 505. The series resonant circuit includes, for example, a series resonant capacitor Csp and a series resonant inductor Lsp. A resonance frequency of the series resonant circuit is also matched to a drive signal frequency.

In the series BPF, an impedance becomes low at a resonance frequency (impedance becomes zero if series resonant circuit is by ideal element), and thus, an AC signal of a drive signal frequency generated at drive signal generating means 201 is not attenuated and the signal is transmitted to signal detection means 505. On the other hand, at a frequency other than a resonance frequency in the series BPF, an impedance at a resonance frequency becomes high, and thus, for example, a hum of a utility frequency and external noise due to an electromagnetic wave are unlikely to be transmitted to the signal detection means 505. As a result, the series BPF operates as a bandpass filter for attenuating a hum and external noise.

An effect of the series BPF and an influence on a drive signal waveform are the same as those of the above described parallel BPF, and thus, descriptions thereof are omitted. When a plurality of drive signal frequencies are used, if a plurality of series BPFs is connected in parallel, as in the case of the serial connection of the above described parallel BPFs, a plurality of frequency components to be used can be passed and the remaining frequency components can be attenuated. When a series BPF is used, a series resonant capacitor Csp does not allow a DC component to be passed, and thus, the above described capacitance Cd is unnecessary.

In FIG. 8A, a bandpass filter may be a higher-order bandpass filter by a method of adding a parallel BPF between a detection electrode 401 and a series BPF or between a series BPF and an input of signal detection means 505 or alternately having a plurality of parallel BPFs and a plurality of series BPFs. (When a parallel BPF is provided immediately before an input of signal detection means 505, the above described capacitance Cd is necessary.)

Figure 8B:
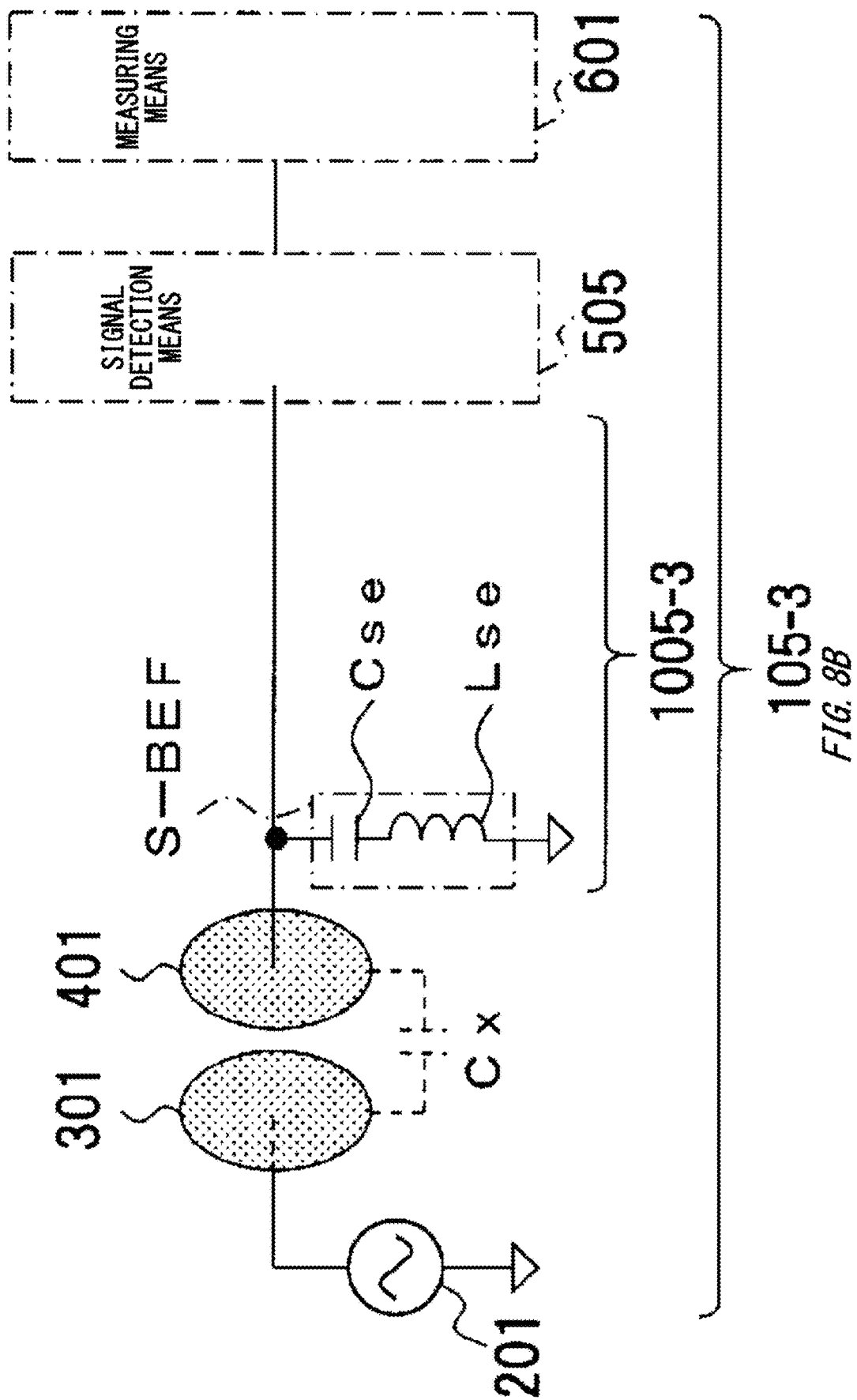
FIG. 8B illustrates one example of a CM circuit according to the fifth embodiment.

A CM circuit 105-3 of FIG. 8B according to the fifth embodiment includes a noise elimination circuit 1005-3 instead of the noise elimination circuit 1005. The noise elimination circuit 1005-3 includes a series band elimination filter (S-BEF) (hereinafter referred to as "series BEF"). The series BEF is one example of a second resonance circuit, is a band elimination filter based on a series resonant circuit (band-reject filter), and is provided between a detection electrode 401 and signal detection means 505. The series resonant circuit includes, for example, a series resonance capacitor Cse and a series resonant inductor Lse. A resonance frequency of the series resonant circuit is matched to a frequency of a hum or external noise to be removed.

In the series BEF, an impedance becomes low at a resonance frequency (impedance becomes zero if series resonant circuit is by ideal element), and thus, only a frequency component to be removed can be attenuated, that is, for example, only a predetermined frequency component such as a hum of a utility frequency or external noise due to an electromagnetic wave can be attenuated. On the other hand, an impedance of the series BEF becomes high at a frequency other than a resonance frequency, and thus, a frequency component at a drive signal frequency is not attenuated, and the series BEF operates as a band elimination filter.

Figure 8C:
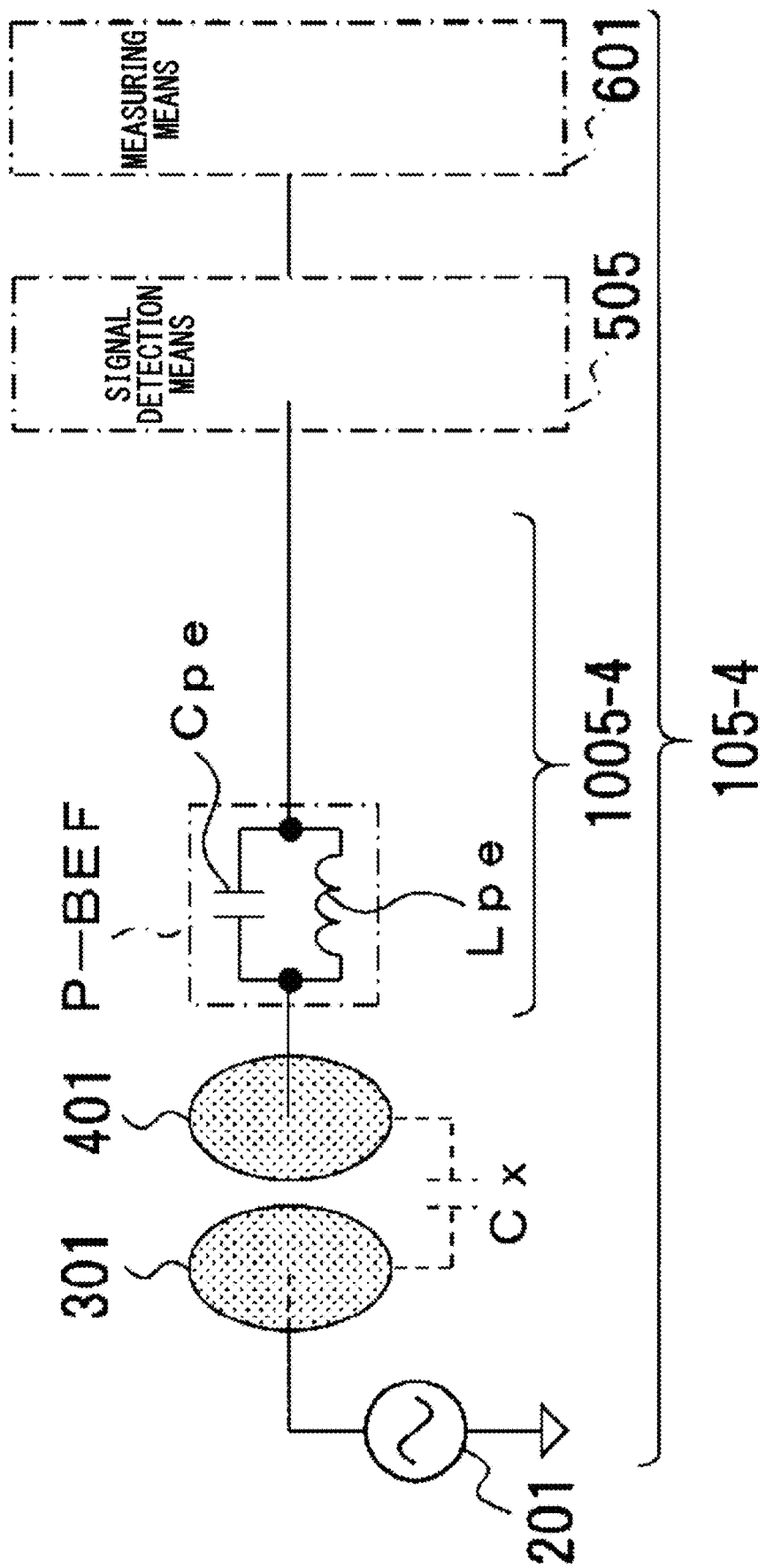
FIG. 8C illustrates one example of a CM circuit according to the fifth embodiment.

A CM circuit 105-4 of FIG. 8C according to the fifth embodiment includes a noise elimination circuit 1005-4 instead of the noise elimination circuit 1005. The noise elimination circuit 1005-4 includes a parallel band elimination filter (P-BEF) (hereinafter referred to as "parallel BEF"). The parallel BEF is one example of a second resonance circuit, is a band elimination filter based on a parallel resonance circuit, and is provided between a detection electrode 401 and signal detection means 505. The parallel resonance circuit includes, for example, a parallel resonance capacitor Cpe and a parallel resonance inductor Lpe. A resonance frequency of the parallel resonance circuit is matched to a frequency of a hum or external noise to be removed.

In the parallel BEF, an impedance becomes high at a resonance frequency (impedance becomes infinite for a parallel resonance circuit using an ideal element), and thus, a frequency component to be removed is unlikely to be transmitted to signal detection means 505. On the other hand, in the parallel BEF, at a frequency other than a resonance frequency, an impedance becomes low, and thus, a frequency component of a drive signal frequency is not attenuated and is transmitted to signal detection means 505. As a result, the parallel BEF operates as a band elimination filter for attenuating only a hum or external noise.

A plurality of frequency components can be attenuated by connecting series BEFs in parallel or connecting parallel BEFs in series.

The noise elimination circuits 1005, 1005-1, and 1005-2 use a parallel BPF or a series BPF that allows only a frequency component of a drive signal frequency to be passed. If only a specific frequency component needs to be attenuated, the series BEF or the parallel BEF illustrated in the noise elimination circuits 1005-3 and 1005-4 can be used.

If an unnecessary frequency component may not be completely removed by use of either one of the parallel BPF and the series BPF, the series BEF and the parallel BEF can be used in combination. However, in this case, a resonance frequency or passing and attenuation characteristics change due to a mutual influence. As one example, if the parallel BPF and the series BEF are used in parallel, two pass frequencies and a single attenuation frequency there between appear. In this manner, if an appropriate design is performed by using a parallel BPF, a series BPF, a series BEF, and a parallel BEF in combination as appropriate, desired passing and attenuation characteristics can be obtained, and thus, exemplifications of further combinations are omitted.

Sixth Embodiment

Figure 9A:
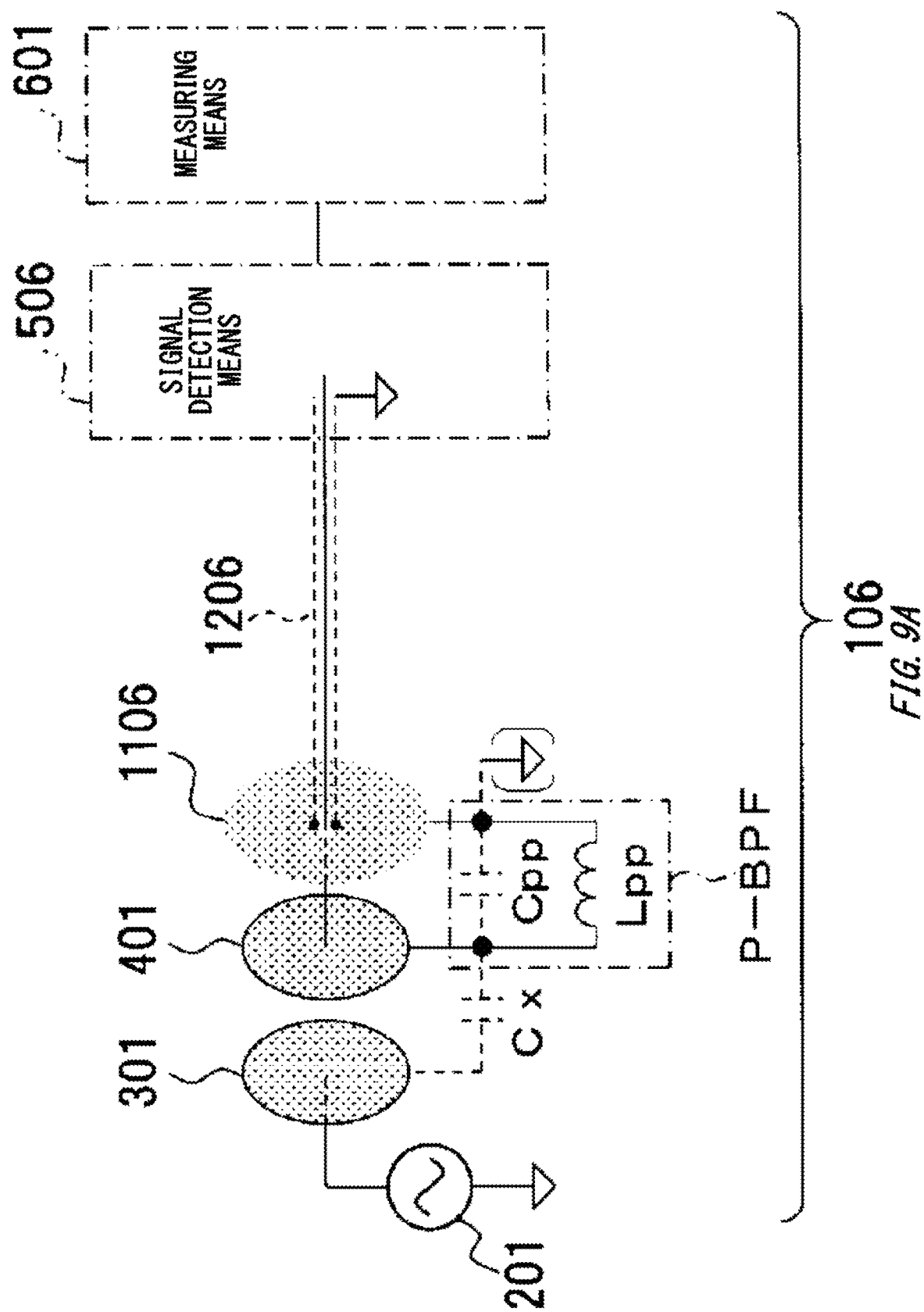
FIG. 9A illustrates one example of a CM circuit according to the sixth embodiment.
Figure 9B:
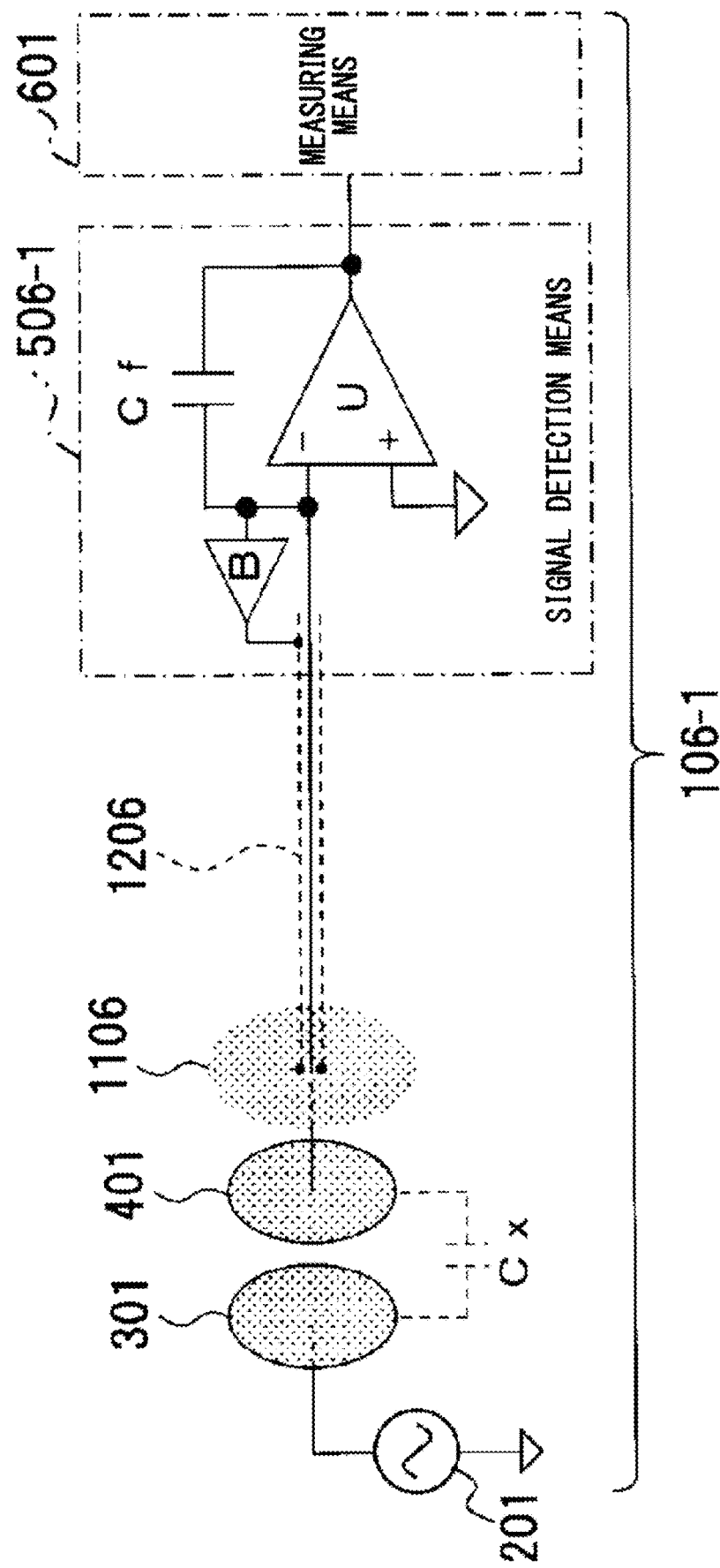
FIG. 9B illustrates one example of a CM circuit according to the sixth embodiment.

The sixth embodiment shows an example of preventing entering of a hum or external noise by a shield and an example of using a capacitance between a grounded shield and a detection electrode as a parallel resonant capacitor Cpp of a parallel BPF. Further, the sixth embodiment shows an example of using a printed circuit board as a drive electrode, a detection electrode, or a shield electrode. FIG. 9A and FIG. 9B illustrate one example of a CM circuit according to the sixth embodiment. The same reference numerals are denoted to the same parts as those in FIG. 1, FIG. 2, FIG. 3A, FIG. 5A and FIG. 5B. Descriptions of the same parts as those in any of the first embodiment to the fifth embodiment are omitted. Signal detection means 506 may be any of the signal detection means previously described in the first embodiment to the fourth embodiment.

A CM circuit 106 of FIG. 9A according to the sixth embodiment is unlikely to receive an influence of a hum and external noise by having a grounded shield electrode 1106 in the vicinity of a detection electrode 401 and having a shielding wire 1206 that has a grounded outer conductor and is used for connection to signal detection means 506. Either one of a shield electrode 1106 and a shielding wire 1206 may be used or as illustrated in FIG. 9A, each of the shield electrode 1106 and the shielding wire 1206 may be independently grounded for use, and the shield electrode 1106 and the shielding wire 1206 are hereinafter collectively referred to as "shield". An expression "grounding" of the shield electrode 1106 and the shielding wire 1206 indicates an AC-ground, and may include a DC voltage. (The same applies hereinafter.)

Electrostatic capacitances are present between the detection electrode 401 and the shield electrode 1106 or between a core wire and an external coat of the shielding wire 1206. When a parallel BPF is used, the capacitances can be used as all or a part of a parallel resonant capacitor Cpp. (In FIG. 9A, only an electrostatic capacitance Cpp between the detection electrode 401 and the shield electrode 1106 is illustrated and illustration of an electrostatic capacitance between the core wire and the external coat of the shielding wire 1206 is omitted.) If an electrostatic capacitance is not enough with this the capacitance alone, a desired capacitance can be obtained by further connecting unillustrated capacitative elements in parallel. If a parallel resonant inductor Lpp is connected between the detection electrode 401 and the shield electrode 1106, a parallel resonance circuit is formed to operate as a parallel BPF. A resonance frequency of the parallel BPF is matched to a drive signal frequency.

As described above, a technique of the present disclosure has a feature of not being affected by a stray capacitance between the detection electrode 401 and a ground. An electrostatic capacitance between the detection electrode 401 and the shield electrode 1106 and an electrostatic capacitance of the shielding wire 1206 can be considered as one type of a stray capacitance, and thus, in the sixth embodiment, an influence of an electrostatic capacitance by a shield is not received. An impedance becomes high at a drive signal frequency by using the electrostatic capacitance as a parallel BPF, and thus, an influence of the electrostatic capacitance is further reduced.

In a CM circuit 106-1 of FIG. 9B according to the sixth embodiment, the shield electrode 1106 and the external coat of the shielding wire 1206 are driven via a buffer amplifier B such that the shield electrode 1106 and the external coat of the shielding wire 1206 have the same potential as an input of the signal detection means 506-1. Such a shield is hereinafter referred to as an "active shield". Signal detection means 506-1 of the CM circuit 106-1 includes a buffer amplifier B. An input of the buffer amplifier B is connected to an input of the amplifier U and an output of the buffer amplifier B is connected to the shielding wire 1206 and the shield electrode 1106.

As already described in the first embodiment, by the action of the amplifier U, a stray capacitance appears to be 1/Av of an actual capacitance. However, if a stray capacitance due to a shield is large and an influence of an apparent stray capacitance is in unnegligible level, a stray capacitance due to a shield can be cancelled by an active shield. That is, by driving the shield such that a level of potential of the shield is equal to a potential of an input of signal detection means 506-1 (=detection electrode 401), a potential difference is not caused, and thus, a stray capacitance due to a shield apparently becomes zero.

An influence of a stray capacitance due to a shield can be significantly reduced even when a real buffer amplifier B is used although a stray capacitance does not seem to become zero completely because a gain of the real buffer amplifier B is slightly smaller than one and a slight delay is caused.

When an active shield is used, it is not possible to adopt a method of using a capacitance between the detection electrode 401 and the shield as a parallel resonance capacitance Cpp of the parallel BPF illustrated in FIG. 9A. In this case, the parallel BPF according to the fifth embodiment illustrated in FIG. 6A may be used. As long as a capacitance between a detection electrode 401 and a shield is not used for a resonance circuit, such configuration can be used in combination with an active shield. For example, all of a series connection of resonance circuits of parallel BPFs according to the fifth embodiment as in FIG. 6B, the series BPF as in the FIG. 8A, the series BEF as in FIG. 8B, and the parallel BEF as in FIG. 8C can be used in combination with an active shield.

Figure 10A:
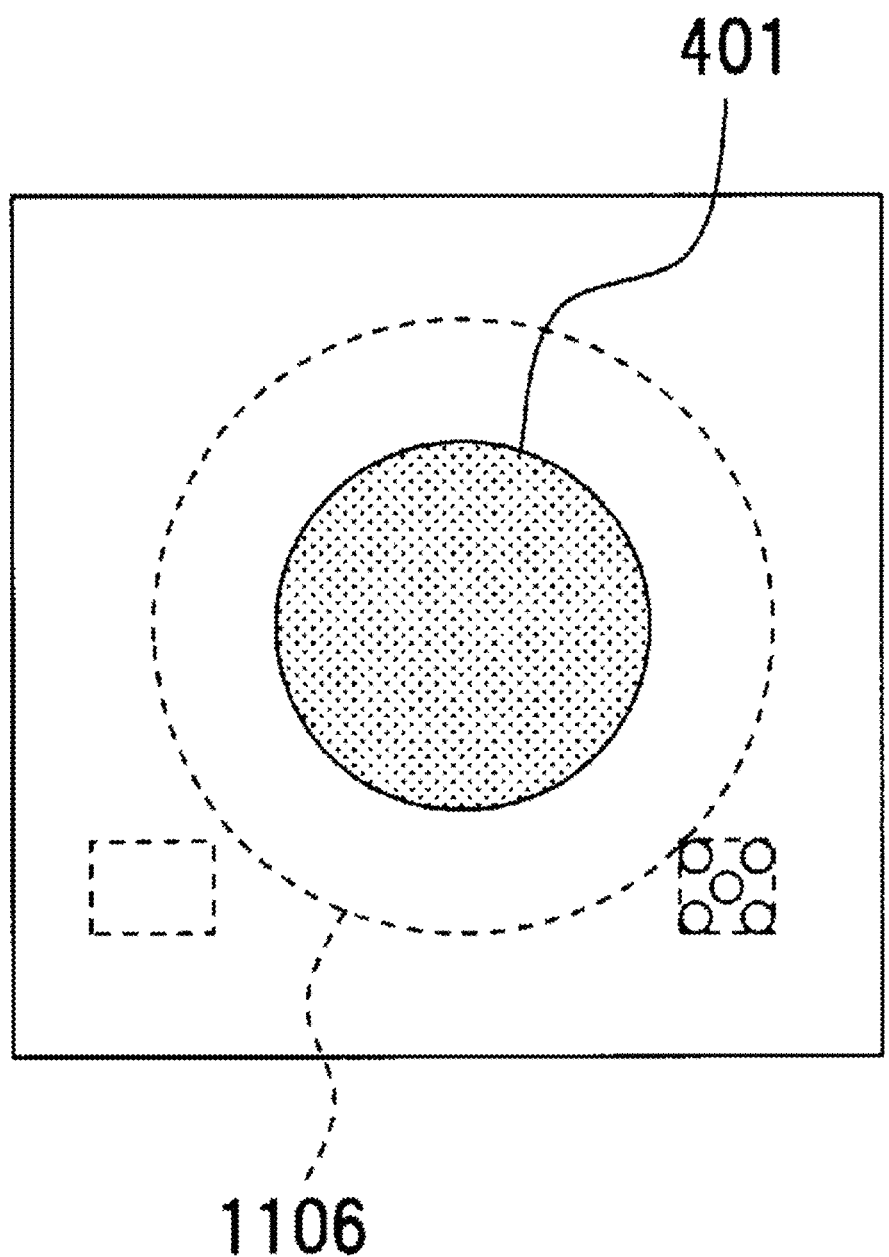
FIG. 10A illustrates one example of a detection electrode and a shield electrode using a printed circuit board.
Figure 10B:
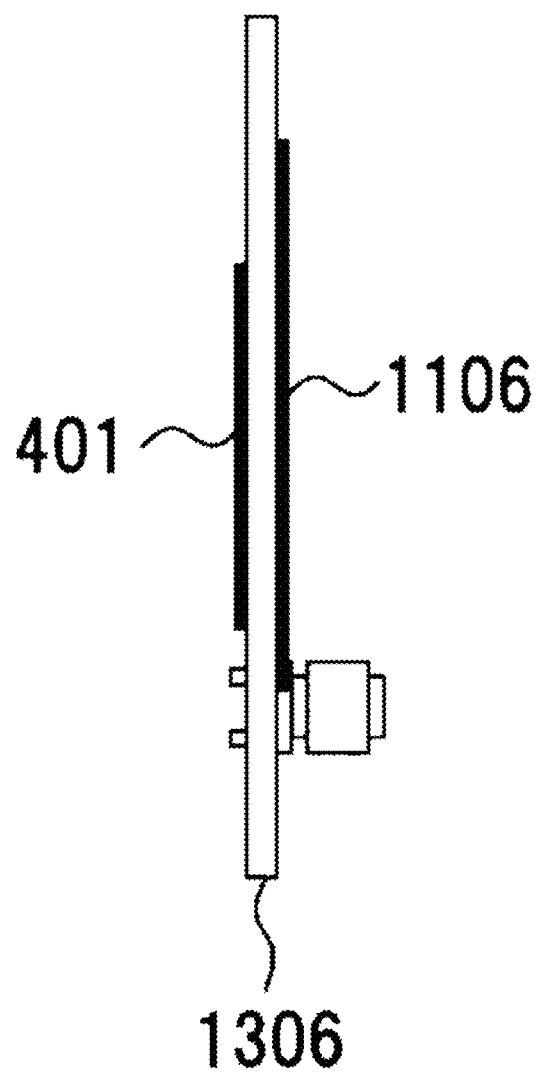
FIG. 10B illustrates one example of a detection electrode and a shield electrode using a printed circuit board.
Figure 10C:
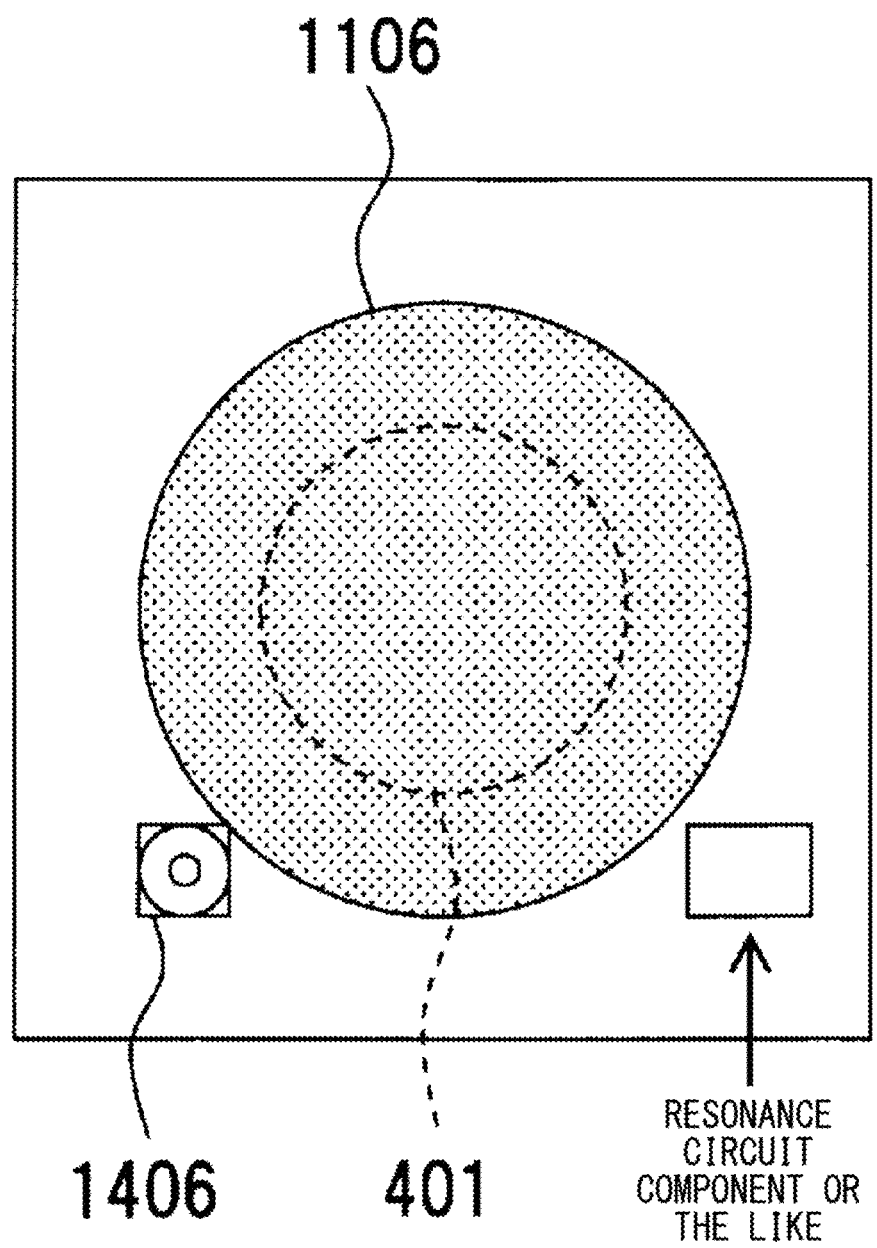
FIG. 10C illustrates one example of a detection electrode and a shield electrode using a printed circuit board.

As one example of a more specific method of realizing the detection electrode 401 and the shield electrode 1106, a printed circuit board may be used. FIG. 10A to FIG. 10C illustrate one example of using a printed circuit board as a detection electrode and a shield electrode. In FIG. 10A to FIG. 10C, illustration of a wiring pattern or the like is omitted.

A detection electrode 401 is provided as a conductor pattern on one surface of a printed circuit board 1306. A shield electrode 1106 may be provided on a surface different from the surface on which the detection electrode 401 is provided as a conductor pattern. To obtain a more effective shield effect, a conductor pattern of the shield electrode 1106 is preferably larger than a conductor pattern of the detection electrode 401 to completely cover a conductor pattern of the detection electrode 401 as illustrated in FIG. 10A to FIG. 10C. A electrostatic capacitance generated between the detection electrode 401 and the shield electrode 1106 is determined based on areas of conductor patterns of the detection electrode 401 and the shield electrode 1106 and a thickness and a dielectric constant of an insulator of the printed circuit board 1306 to be used as a parallel resonant capacitor Cpp or a part thereof. The same applies to a capacitance of the shielding wire 1206 and it can be used as a parallel resonant capacitor Cpp or a part thereof.

The parallel resonant inductor Lpp and capacitative elements to be added can be implemented on the printed circuit board 1306 as illustrated in FIG. 10A to FIG. 10C to contribute to reduction in workload and size.

Similarly to the detection electrode 401 of FIG. 10A to FIG. 10C, the printed circuit board 1306 may be used as the drive electrode 301. When an output impedance of drive signal generating means 201 is high, it is likely that a hum or external noise enters the drive electrode 301, but this can be prevented by providing the shield electrode 1106 on a surface opposite to the drive electrode 301 of the printed circuit board 1306 and grounding it.

When the printed circuit board 1306 is used as the drive electrode 301, the detection electrode 401, or the shield electrode 1106, the shielding wire 1206 and the printed circuit board 1306 are easily connected via a connector 1406 provided on the printed circuit board 1306. For the connector 1406, it is preferable to use a shielded connector or a coaxial connector as illustrated in FIG. 10A to FIG. 10C.

A shield or an electrode using the printed circuit board 1306 can also be adopted in a CM circuit 105 according to the fifth embodiment of FIG. 6A, the CM circuit 105-1 of FIG. 6B, the CM circuit 105-2 of FIG. 8A, the CM circuit 105-3 of FIG. 8B, and the CM circuit 105-4 of FIG. 8C.

When the detection electrode 401 is realized by the printed circuit board 1306, signal detection means 506 or the like can be implemented on the printed circuit board 1306 and further, measuring means 601 or the like can be implemented on the printed circuit board 1306. When the drive electrode 301 is realized by the printed circuit board 1306, drive signal generating means 201 or the like can be implemented on the printed circuit board 1306.

Seventh Embodiment

The seventh embodiment shows an example of detecting by a resonance circuit that an inter electrode capacitance Cx is a specific value. FIG. 11A to FIG. 12B illustrate one example of a CM circuit according to the seventh embodiment. The same reference numerals are denoted to the same parts as those in FIG. 1, FIG. 2, FIG. 3A, FIG. 5A and FIG. 5B. Descriptions of the same parts as those in any of the first embodiment to the fourth embodiment are omitted. Signal detection means 507 may be any of the signal detection means previously described in the first embodiment to the fourth embodiment.

Figure 11A:
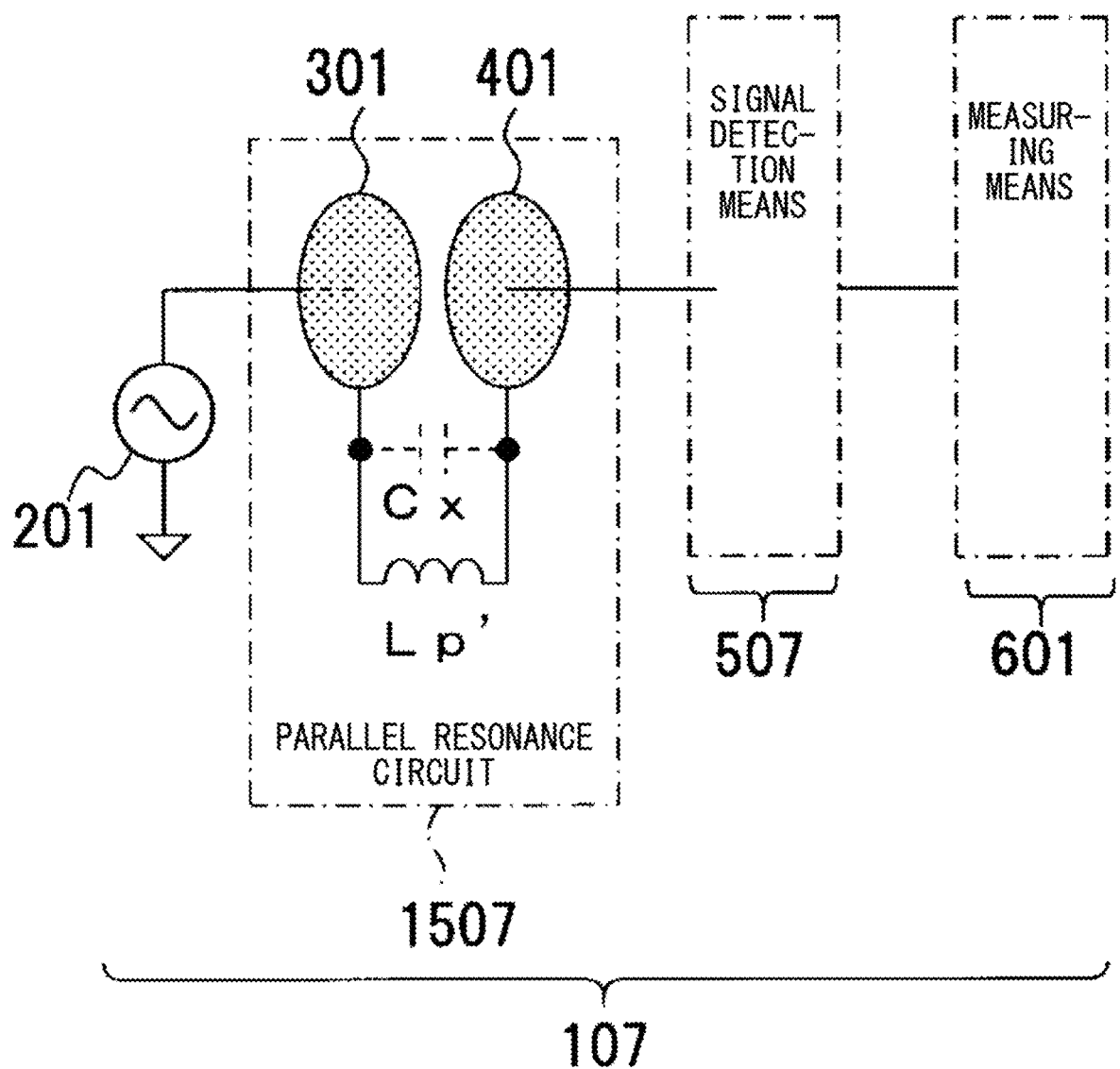
FIG. 11A illustrates one example of a CM circuit according to the seventh embodiment.
Figure 11B:
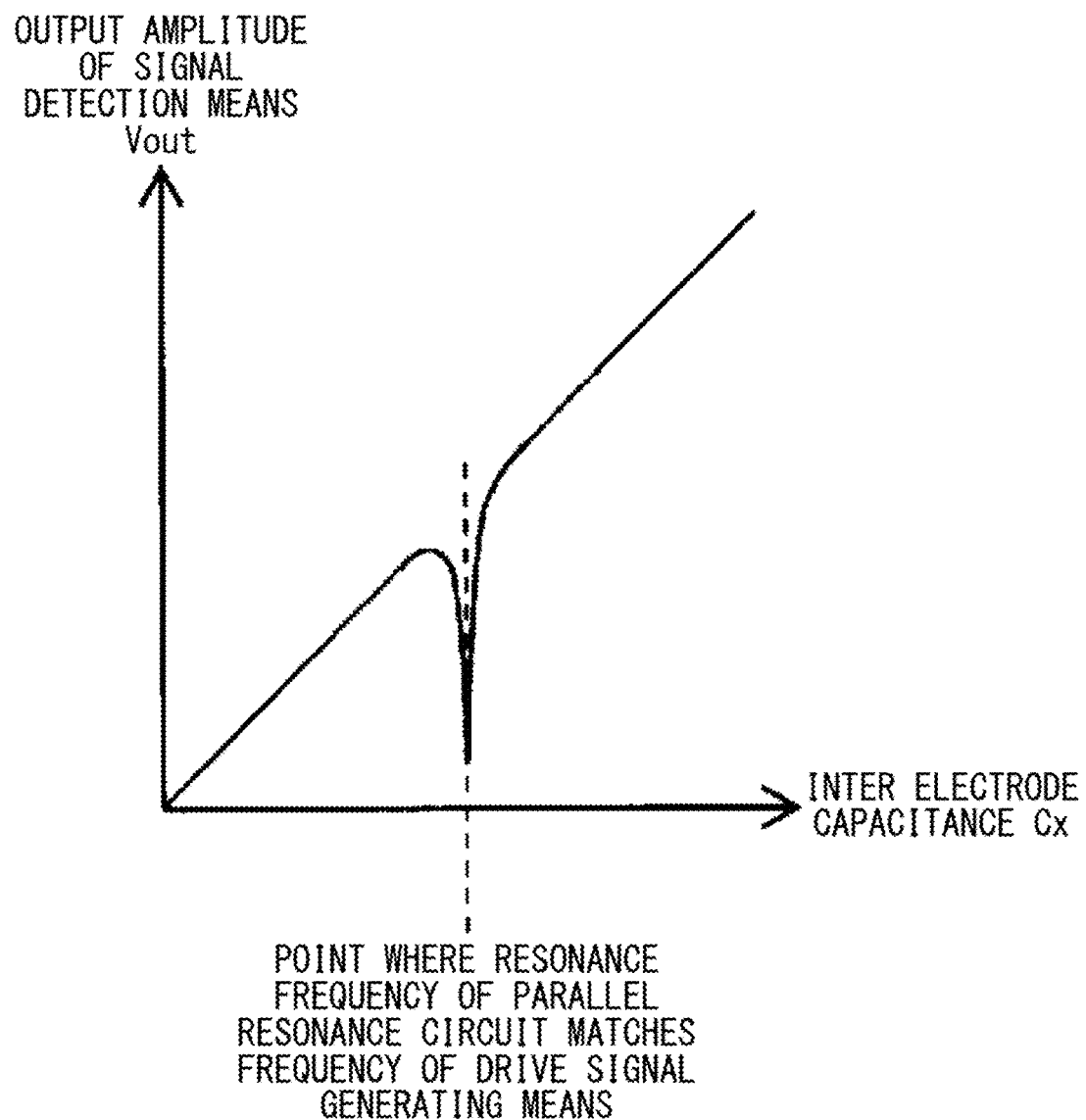
FIG. 11B is a graph showing an output amplitude of signal detection means in a CM circuit according to the seventh embodiment.

A CM circuit 107 according to the seventh embodiment of FIG. 11A includes a parallel resonant inductor Lp' provided between a drive electrode 301 and a detection electrode 401. The parallel resonant inductor Lp' is connected in parallel to an inter electrode capacitance Cx to configure a parallel resonance circuit 1507.

The inter electrode capacitance Cx changes depending on an inter electrode distance in the case of distance measurement or an object state affecting the inter electrode capacitance Cx in the case of the object detection, and thus, a resonance frequency of a parallel resonance circuit 1507 changes accordingly. On the other hand, the drive signal frequency is constant.

When a resonance frequency of the parallel resonance circuit 1507 changes to be matched to a drive signal frequency an impedance of the parallel resonance circuit 1507 becomes high, and an AC current from the drive electrode 301 to the detection electrode 401 unlikely to flow. On the other hand, when a resonance frequency of the parallel resonance circuit 1507 does not match a drive signal frequency, an AC current from the drive electrode 301 to the detection electrode 401 is hardly affected.

As in the above described Equation 1, an output amplitude Vout of signal detection means 507 is proportional to an inter electrode capacitance Cx. However, when the parallel resonance circuit 1507 according to the seventh embodiment is used, if a capacitance becomes a specific inter electrode capacitance Cx such that the resonance frequency matches the drive signal frequency, the AC current from the drive electrode 301 to the detection electrode 401 hardly flows. As a result, the output amplitude Vout of the signal detection means 507 decreases, and thus, a "dip" as shown in a graph of FIG. 11B occurs. (In FIG. 11B, a horizontal axis represents an inter electrode capacitance Cx and a vertical axis represents an output amplitude Vout of signal detection means 507.)

That is, when an inter electrode distance becomes a specific distance in the case of distance measurement or when an object affecting an inter electrode capacitance Cx becomes a specific state in the case of the object detection, a dip occurs to the output amplitude Vout of signal detection means 507. By using this, adjusting to a specific distance or a specific object state, that is tuning becomes possible. As one example of using an electrostatic capacitive displacement meter for the object detection, if the output amplitude Vout of the signal detection means 507 is set to be minimum by putting in and out a tablet in a container arranged between the drive electrode 301 and the detection electrode 401, the number of tablets in the container can be adjusted to a specific number.

Figure 12A:
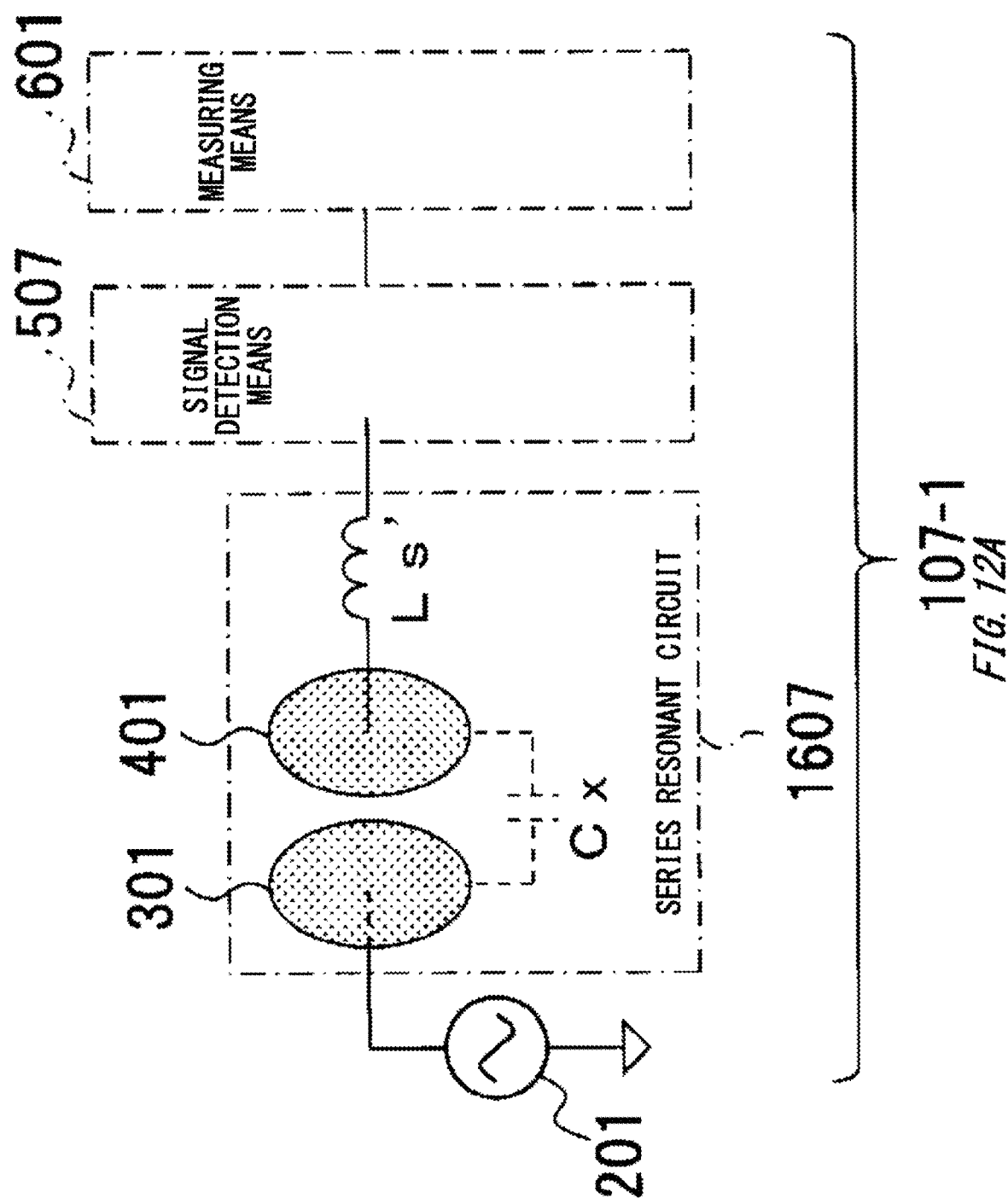
FIG. 12A illustrates one example of a CM circuit according to the seventh embodiment.

A CM circuit 107-1 according to the seventh embodiment of FIG. 12A includes a series resonant inductor Ls' provided between a detection electrode 401 and signal detection means 507. The series resonant inductor Ls' is connected in series with the inter electrode capacitance Cx to configure a series resonant circuit 1607.

A resonance frequency of the series resonant circuit 1607 changes by change in the inter electrode capacitance Cx, and if the resonance frequency is matched to the drive signal frequency, an impedance of the series resonant circuit 1607 becomes low and an AC current from the drive electrode 301 to the detection electrode 401 easily flows. When a resonance frequency of the series resonant circuit 1607 does not match the drive signal frequency, the AC current from the drive electrode 301 to the detection electrode 401 is hardly affected and an AC current proportional to the inter electrode capacitance Cx flows.

Figure 12B:
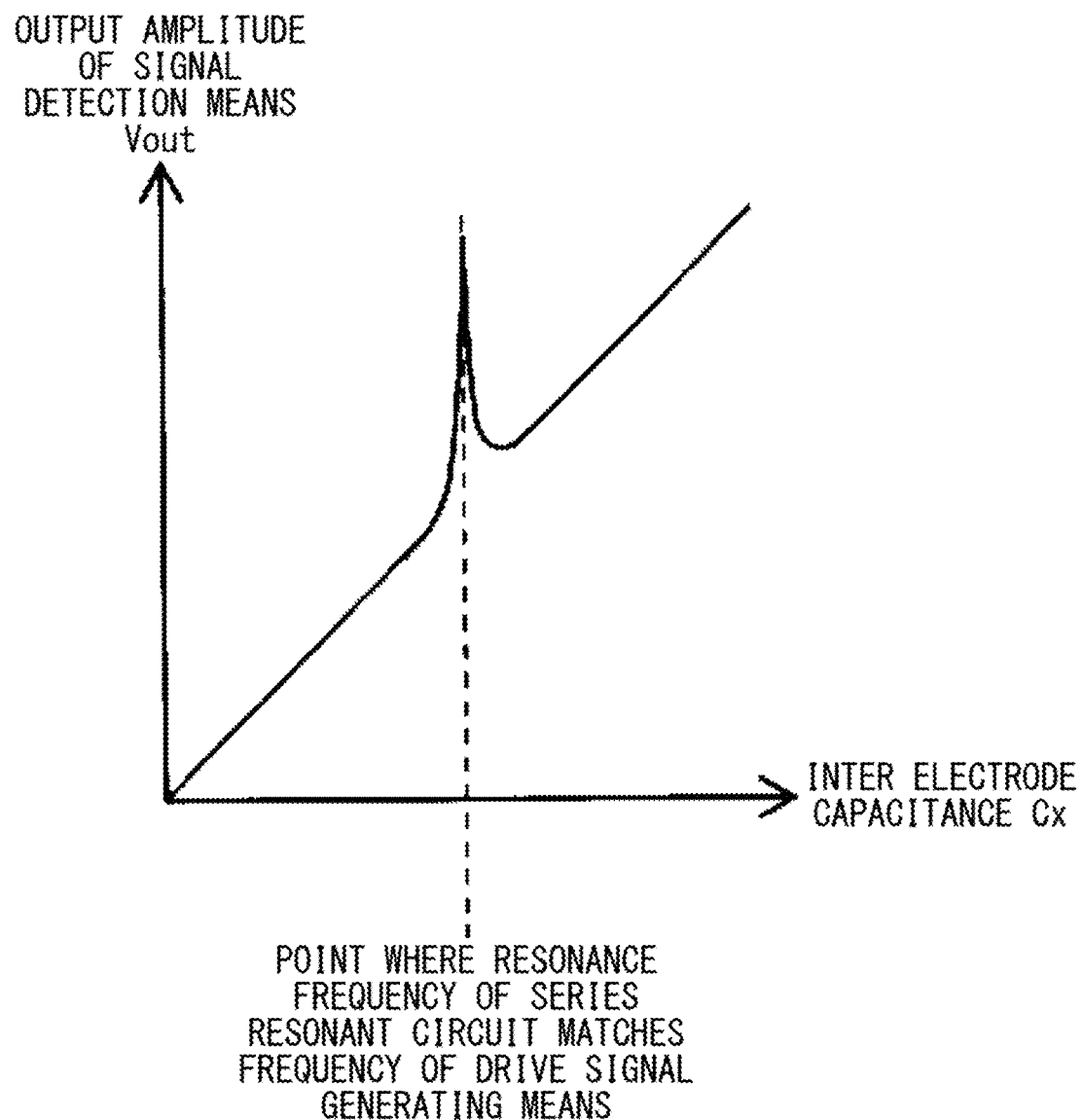
FIG. 12B illustrates an output amplitude of signal detection means in a CM circuit according to the seventh embodiment.

If the series resonant circuit 1607 of the seventh embodiment is used, only when a capacitance becomes a specific inter electrode capacitance Cx such that the resonance frequency matches the drive signal frequency, the AC current from the drive electrode 301 to the detection electrode 401 easily flows, the output amplitude Vout of the signal detection means 507 increases, and thus, a "peak" as shown in a graph of FIG. 12B occurs. (As similar to the graph of FIG. 11B, in a graph of FIG. 12B also, a horizontal axis represents an inter electrode capacitance Cx and a vertical axis represents an output amplitude Vout of signal detection means 507.)

That is, when an inter electrode distance becomes a specific distance in the case of distance measurement or an object affecting an inter electrode capacitance Cx is in a specific state in the case of the object detection, a peak occurs in the output amplitude Vout of the signal detection means 507. By using this, adjusting to a specific distance or a specific object state, that is tuning becomes possible. As one example of using an electrostatic capacitive displacement meter for the distance measurement, if an output amplitude Vout of signal detection means 507 is arranged to be maximum by adjusting a distance between a detection electrode 401 that is an object and a drive electrode 301 that is an object, adjusting an interval between objects to a specific distance becomes possible.

If an unillustrated resistance is connected to any one or more positons between the drive signal generating means 201 and the drive electrode 301, between the detection electrode 401 and the series resonant inductor Ls', and between the series resonant inductor Ls' and the signal detection means 507, an effect of reducing the sharpness of the peak can be obtained. However, in this case, a relationship between the inter electrode capacitance Cx at a frequency away from the resonance frequency and the output amplitude Vout of the signal detection means 507 deviates from Equation 1 due to an influence of a resistance, but a correction can be performed. A direct current resistance of the series resonant inductor Ls' has the same effect as such resistance.

Although FIG. 12A illustrates an example of providing the series resonant inductor Ls' between the detection electrode 401 and the signal detection means 507, the same effect can be obtained even if the series resonant inductor Ls' is provided between the drive signal generating means 201 and the drive electrode 301. If inductors are provided both between the detection electrode 401 and the signal detection means 507 and between the drive signal generating means 201 and the drive electrode 301, a sum of the inductances operate as an inductance of the series resonant inductor Ls'.

A parallel resonance circuit 1507 and a series resonant circuit 1607 of the seventh embodiment can be used in combination with the circuits in the fifth embodiment as appropriate. However, there are some combinations that may not be used together, such as the series resonant circuit 1607 of the seventh embodiment and the series BPF of the fifth embodiment.

Eighth Embodiment

The eighth embodiment shows an example of using an amplifier configured by a discrete device as an amplifier U included in signal detection means. The eighth embodiment can be configured as similarly to the first embodiment to the seventh embodiment except that an amplifier configured by a discrete device is used as an amplifier U. The illustration of a CM circuit and descriptions on devices other than an amplifier configured by a discrete device are omitted.

A sufficient ("deep") phase compensation is applied to a commercially available operational amplifier IC such that the amplifier IC does not oscillate even in various negative feedback circuits and the amplifier IC has a feature of a differential input.

By applying the deep phase compensation as did to a commercially available operational amplifier IC, a bandwidth becomes narrow accordingly. However, an amplifier configured by a discrete device can be designed so as to be optimal for a feedback capacitance Cf actually used and to be applied with ("shallow") phase compensation, and accordingly a broadband of the amplifier is possible. A broadband of an amplifier is also possible by using a high speed discrete device or designing a circuit configuration and an operation point. If a broadband amplifier can be used, an open-loop gain of an amplifier at a drive signal frequency increases, and thus, an influence of a stray capacitance can be reduced more reliably.

By setting an input of an amplifier configured by a discrete device to be a single input amplifier instead of the differential input amplifier, noise can be reduced and an amplifier having a high S/N ratio can be realized. The single input amplifier can reduce noise caused at an input stage to $1/(\sqrt{2})$ compared to the differential input amplifier. On the other hand, if the single input amplifier is adopted, DC potentials between an input and an output differ and a potential difference may change depending on an ambient temperature or a power supply voltage. However, even in such a case, DC compensation circuits 904, 904-1 of the fourth embodiment can correct an influence of a potential difference.

As described above, if an appropriate amplifier configured by a discrete device is used, it is possible to realize a high performance signal detection means with a broader band and lower noise. The signal detection means of the eighth embodiment can also be applied to signal detection means of other embodiments.

Ninth Embodiment

Figure 13A:
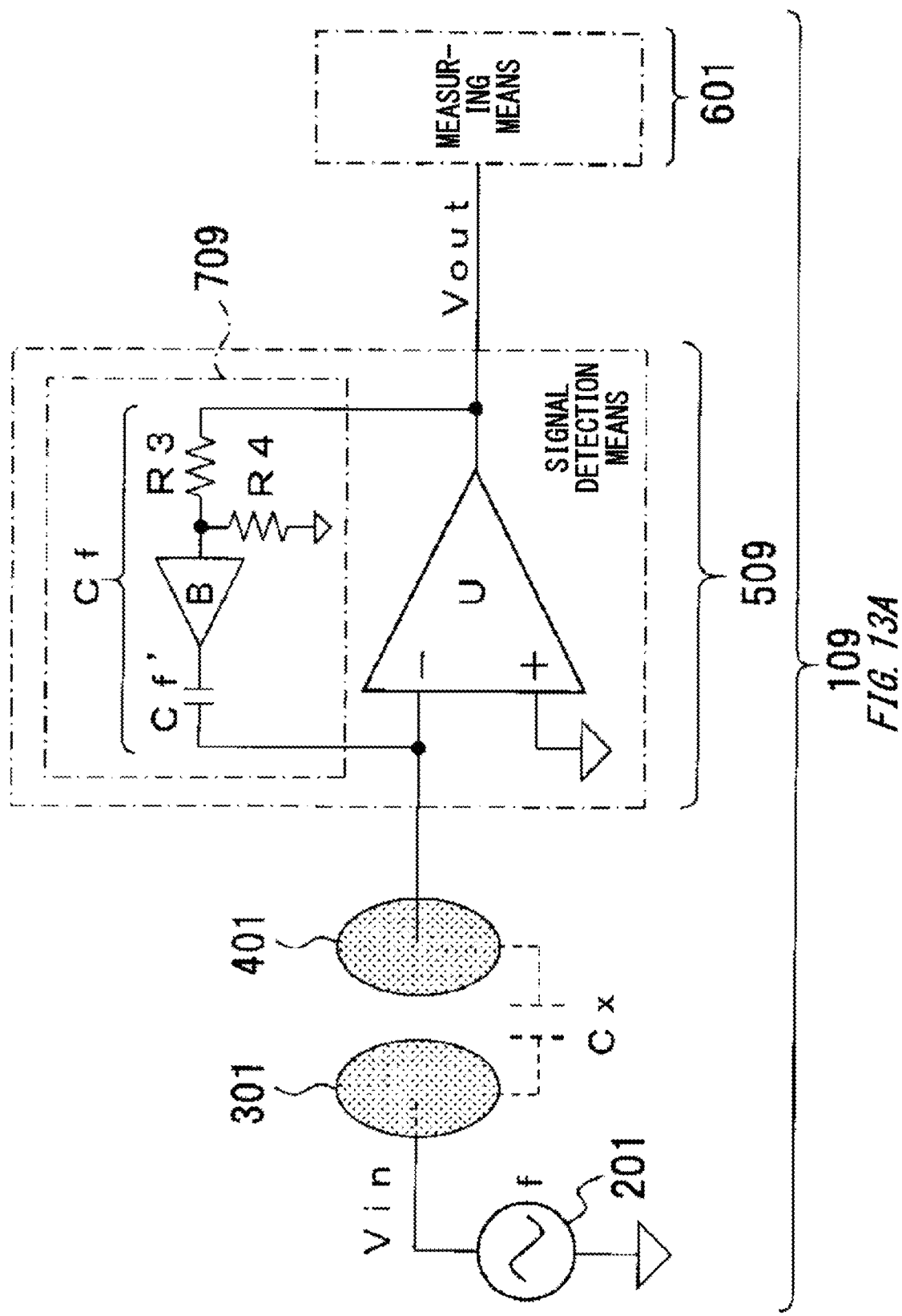
FIG. 13A illustrates one example of a CM circuit according to the ninth embodiment.
Figure 13B:
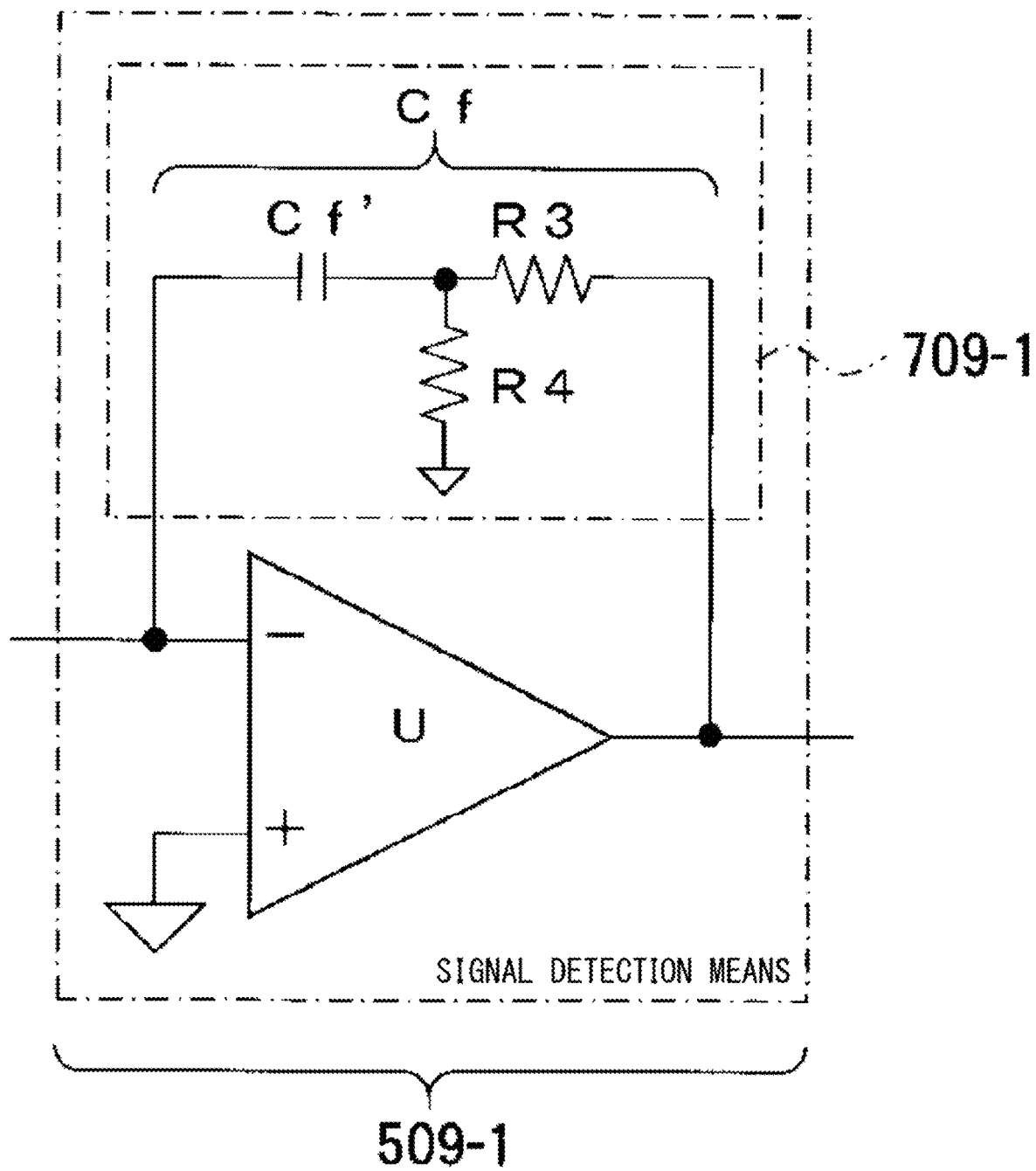
FIG. 13B illustrates one example of signal detection means in a CM circuit according to the ninth embodiment.

The ninth embodiment shows an example of achieving high sensitivity by setting a feedback capacitance Cf of an amplifier of signal detection means to an equivalent small capacitance. FIG. 13A illustrates one example of a CM circuit according to the ninth embodiment and FIG. 13B illustrates one example of signal detection means of a CM circuit. The same reference numerals are denoted to the same parts as those in FIG. 1, FIG. 2, FIG. 3A, FIG. 5A and FIG. 5B. Descriptions of the same parts as those in any of the first embodiment to the fourth embodiment are omitted.

As can be seen from Equation 1, as a feedback capacitance Cf of an amplifier U of signal detection means 509 is smaller, the sensitivity is higher. That is, in the case of a certain drive signal amplitude Vin, the larger output amplitude Vout of the signal detection means 509 can be obtained.

However, a generally available actual capacitative element is, as one example, a minimum of 0.1 pF and contains a problem that as a capacitance is smaller, a relative error is larger. An error of an actual capacitative element of 0.1 pF is relatively large, as one example, ±0.05 pF, that is ±50%. As one example, in the case of several pF or less, an element of an absolute error of the same ±0.05 pF is available, and thus, if, for example, 1 pF can be used, an error is ±5%, and if 5 pF is used, an error is sufficiently relatively small, such as ±1%.

The ninth embodiment shows an example of realizing higher sensitivity signal detection means 509 by realizing a feedback capacitance Cf that is equivalently small by using a capacitative element having a large capacitance and a small relative error.

A CM circuit 109 according to the ninth embodiment of FIG. 13A includes signal detection means 509, a series circuit of a resistance R3 and a resistance R4 is connected to an output of an amplifier U included in the signal detection means 509, and an input of a buffer amplifier B having a gain of one is connected to a connection point between a resistance R3 and a resistance R4. An output of the buffer amplifier B is connected to an input of the amplifier U included in the signal detection means 509 via the feedback capacitance Cf.

A circuit configured by the resistance R3, the resistance R4, the buffer amplifier B, and the feedback capacitance Cf forms a negative feedback unit 709 and is connected to the amplifier U in place of the feedback capacitance Cf in the signal detection means of other embodiments. A gain of a general buffer amplifier is slightly smaller than one, but if a buffer amplifier has a positive gain (non-inverting amplifier circuit), such buffer amplifier can be used as the buffer amplifier B.

The resistance R3 and the resistance R4 constitute an attenuator, and an output signal of the amplifier U included in the signal detection means 509 is attenuated by an attenuation factor of the attenuator and given to an input of the buffer amplifier B. If a gain of the buffer amplifier B is assumed to be $A_B$, an output of the buffer amplifier B is expressed as the following Equation 3.

[Equation 3]

$$\frac{R4}{R3+R4} A_B \quad (3)$$

For this reason, an amount of a negative feedback by a feedback capacitance Cf that passes through an output of the buffer amplifier B is attenuated as shown in Equation 3, and thus, an equivalent feedback capacitance Cf is expressed as the following Equation 4.

[Equation 4]

$$Cf = \frac{R4}{R3+R4} A_B \cdot Cf' \quad (4)$$

If an impedance of the feedback capacitance Cf' at the drive signal frequency is sufficiently larger than a parallel resistance value of the resistance R3 and the resistance R4, an amplifier operates as similar to when the buffer amplifier B having a gain of one is present even if the buffer amplifier B is absent. That is, in such a case, the same effect can be obtained by the signal detection means 509-1 in FIG. 13B. If a gain of the buffer amplifier B is smaller than one, an attenuation factor of an attenuator is decreased by that amount, and if a gain is larger than one, an attenuation factor of an attenuator is increase by that amount, and accordingly, the same effect can be obtained.

As a specific example, when the feedback capacitance Cf' is 2.5 pF, an impedance of the feedback capacitance Cf' when the drive signal frequency is 318 kHz is about 200 kΩ. If the resistance R3 is 24 kΩ and the resistance R4 is 1 kΩ, a parallel resistance value of the resistances R3 and R4 is 0.96 kΩ, which is sufficiently smaller than about 200 kΩ. When these values are applied to Equation 4, an equivalent feedback capacitance Cf of 0.1 pF having a small relative error can be obtained by the feedback capacitance Cf' of 2.5 pF having a small relative error.

Although FIG. 13A and FIG. 13B exemplify an attenuator by the resistance R3 and the resistance R4, even if, for example, an attenuator of another method is used such as an attenuator using a capacitance, the same effect can be obtained.

When CM circuits 101 to 107 are applied to an electrostatic capacitive displacement meter, to appropriately measure various objects, that are, various inter electrode capacitances Cx, sensitivities of signal detection means 501 to 507 of CM circuits 101 to 107 may need to be switched over a wide range. If sensitivities are switched by switching feedback capacitances Cf of signal detection means 501 to 507, an influence of a stray capacitance of the switching circuit is received, and thus, particularly switching of feedback capacitances Cf having small capacitances may often be difficult. On the other hand, in the ninth embodiment, it is only necessary to switch at least one of the resistance R3 or the resistance R4, and thus, sensitivities can be switched easily. Switching is also possible by using the ninth embodiment for the feedback capacitance Cf having a small capacitance or using a capacitative element as it is for the feedback capacitance Cf having a larger capacitance.

In the above described second embodiment, the feedback capacitance Cf needs to be relatively large so as not to be affected by the inter-terminal capacitance of the discharge switch Sf and a selection of a capacitance for the feedback capacitance Cf is limited, but the ninth embodiment is effective in such a case also. The discharge switches Sf of the second embodiment may be connected to both ends of the feedback capacitance Cf and in the ninth embodiment, a larger feedback capacitance Cf than the necessary feedback capacitance Cf can be used, and thus, the limitation of the capacitance selection can be avoided.

Tenth Embodiment

Figure 14:
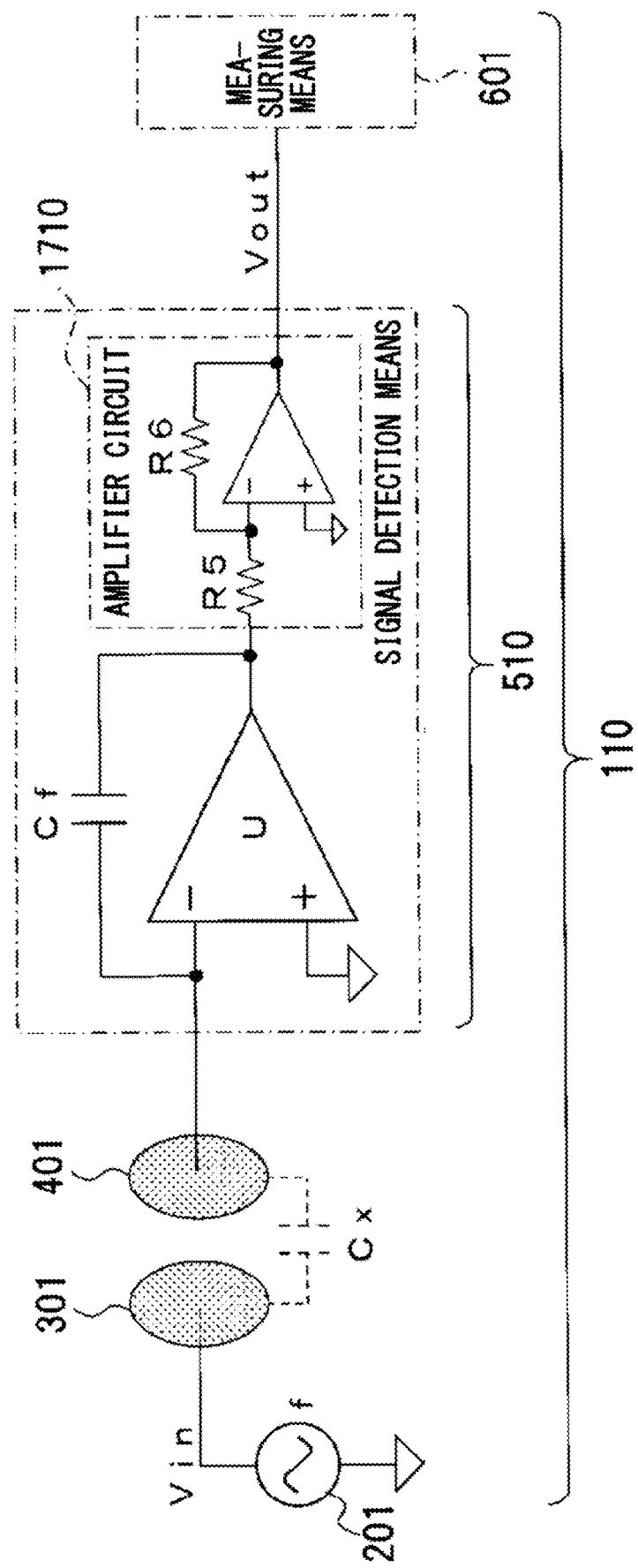
FIG. 14 illustrates one example of a CM circuit according to the tenth embodiment.

The tenth embodiment shows an example of achieving high sensitivity by adding an amplifier circuit for amplifying an output of signal detection means. FIG. 14 illustrates one example of a CM circuit according to a tenth embodiment. The same reference numerals are denoted to the same parts as those in FIG. 1, FIG. 2, FIG. 3A, FIG. 5A and FIG. 5B. Descriptions of the same parts as those in any of the first embodiment to the fourth embodiment are omitted.

ACM circuit 110 includes signal detection means 510 having an amplifier circuit 1710. An input of the amplifier circuit 1710 is connected to an output of an amplifier U included in the signal detection means 510 and an output of the amplifier circuit 1710 is connected to measuring means 601. By adding the amplifier circuit 1710, a CM circuit 110 with higher sensitivity can be realized. When an amplification factor of an added amplifier circuit 1710 is defined as A, an output amplitude of an amplifier U included in the signal detection means 510 is defined as Vout', and an output amplitude of the signal detection means 510 is defined as Vout, Vout is as follows:

[Equation 5]

$$Vout = A \cdot Vout' \qquad (5)$$

The highly sensitive signal detection means 510 with an amplification factor A can be realized.

FIG. 14 illustrates an inverting amplifier circuit by an operational amplifier as one example of an amplifier circuit 1710 and an amplification factor A takes a negative value {−(resistance value R6/resistance value R5)}, and thus, an output phase of the signal detection means 510 is inverted compared to when the amplifier circuit 1710 is not added. However, in the measuring means 601, in principle, it is sufficient if an output amplitude of the signal detection means 510 can be informed, and thus, even if a phase is inverted, a problem is not caused. For example, as in the thirteenth embodiment and the like as described later, when phase-detection means is used, a polarity of an output voltage of the phase-detection means is inverted by a phase inversion, and thus, the means may be applied by considering this.

An amplifier circuit 1710 to be added is sufficient if it is an amplifier circuit that can amplify a necessary frequency component in an output signal of an amplifier U included in the signal detection means 510, a non-inverting amplifier circuit using an operational amplifier and an amplifier circuit of other circuit types are widely applicable.

When a DC offset voltage is included in an output of the amplifier U included in the signal detection means 510 as an error, if an amplifier circuit 1710 to be added is an amplifier circuit that can also amplify a direct current, a DC offset voltage is multiplied by an amplification factor A, and thus, the error may become large or the amplifier circuit 1710 may be saturated. In such a case, as one example, a capacitative element may be added to an input side of an amplifier circuit 1710 to be added for capacitive coupling.

As already described in the ninth embodiment, it is difficult to switch sensitivities by directly switching feedback capacitances Cf of signal detection means 509, and 509-1. On the other hand, in the tenth embodiment, sensitivities can be switched by switching an amplification factor A of an amplifier circuit 1710 to be added, and thus, sensitivities can be switched easily by switching resistances.

The tenth embodiment can be freely combined with other embodiments for use and can be freely combined with the ninth embodiment having an effect of high sensitivity for application.

Eleventh Embodiment

Figure 15:
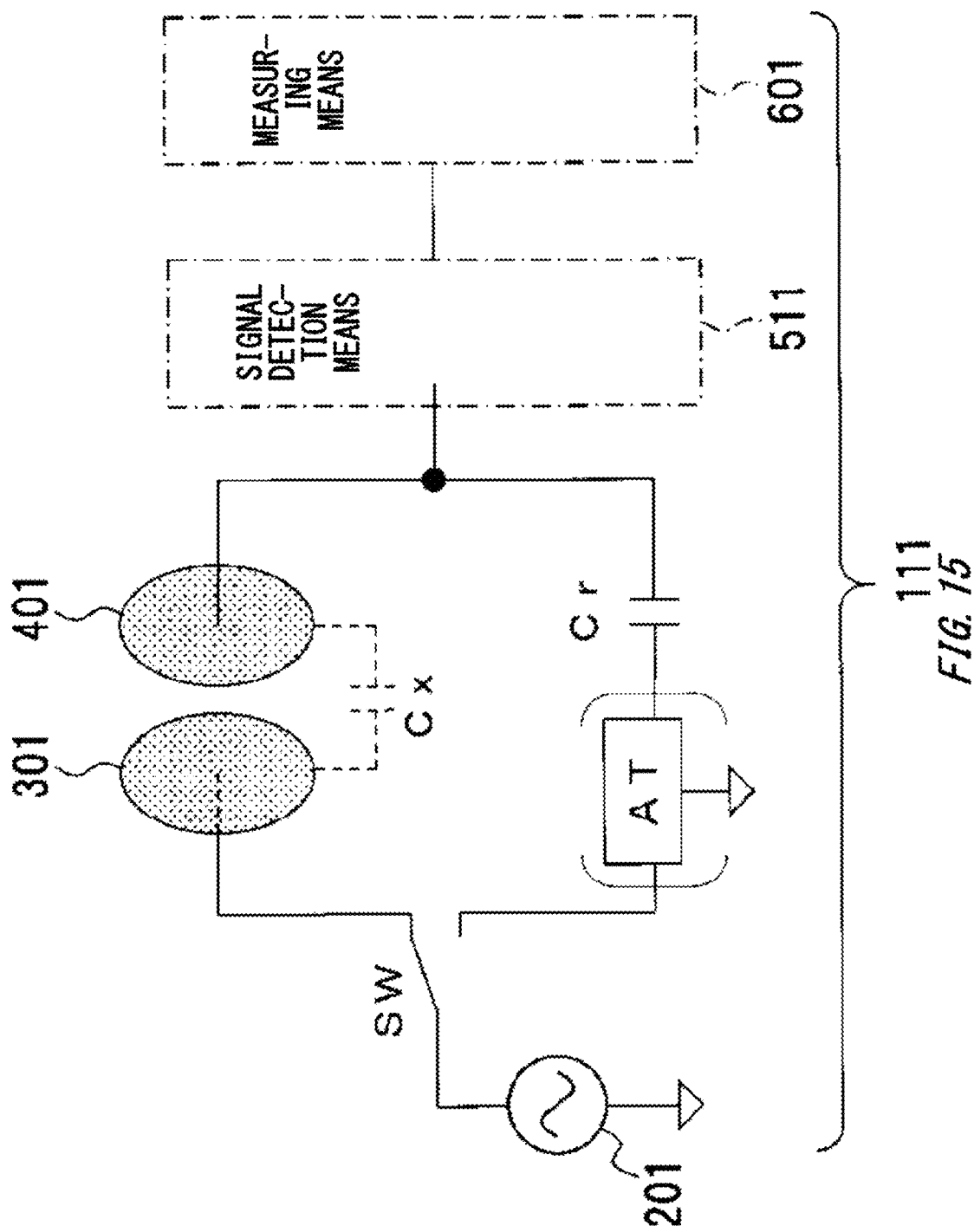
FIG. 15 illustrates one example of a CM circuit according to the eleventh embodiment.

The eleventh embodiment shows an example of improving an accuracy of a capacitance measurement by comparing with a reference capacitance Cr. FIG. 15 illustrates one example of a CM circuit according to the eleventh embodiment. The same reference numerals are denoted to the same parts as those in FIG. 1, FIG. 2, FIG. 3A, FIG. 5A and FIG. 5B. Descriptions of the same parts as those in any of the first embodiment to the fourth embodiment are omitted. Signal detection means 511 may be any of the signal detection means previously described in the first embodiment to the fourth embodiment.

A CM circuit 111 in FIG. 15 includes a changeover switch SW and a reference capacitance Cr. The changeover switch SW is one example of switching means, is provide behind drive signal generating means 201, and a drive signal is connected to a common contact of the changeover switch SW. The changeover switch SW has one contact connected to a drive electrode 301 and the other contact connected to one terminal of a reference capacitance Cr. That is, the changeover switch SW is arranged between the drive signal generating means 201, and the drive electrode 301 and the reference capacitance Cr and connects the drive signal generating means 201 to the drive electrode 301 or the reference capacitance Cr in a switchable manner. The attenuator AT can be insert between the other contact and the reference capacitance Cr. The other terminal of the reference capacitance Cr is connected to the detection electrode 401 and the input of the signal detection means 511. That is, the reference capacitance Cr is connected between the other contact of the changeover switch and an input of the signal detection means.

In the case where the output of the drive signal generating means 201 is connected to the drive electrode 301 via the changeover switch SW, similar operations as those in other embodiments can be obtained, and thus, the output amplitude Vout of the signal detection means 511 is proportional to the inter electrode capacitance Cx. In the case where an output of the drive signal generating means 201 is connected to the reference capacitance Cr via the changeover switch, the output amplitude Vout of the signal detection means 511 is proportional to the reference capacitance Cr. As described above, when the attenuator AT is connected, the output amplitude Vout of the signal detection means 511 is proportional to (attenuation factor of attenuator AT×reference capacity Cr).

As a specific one example, it is assumed that the drive signal amplitude Vin is 10 Vrms, the inter electrode capacitance Cx is 0.11 pF, the attenuation factor of the attenuator AT is 1/100, the reference capacitance Cr is 10 pF, the amplifier circuit 1710 as described in the tenth embodiment is not added to the signal detection means 511, and an unillustrated feedback capacitance Cf is 1 pF. In this case, when the output of the drive signal generating means 201 is connected to the drive electrode 301 by the changeover switch SW, from Equation 1, the output amplitude Vout of the signal detection means 511 is 1.1 Vrms. On the other hand, by the changeover switch SW, in the case where the output of the drive signal generating means 201 is connected to the reference capacitance Cr via the attenuator AT, the output amplitude Vout of the signal detection means 511 becomes 1.0 Vrms by applying 0.1 pF (attenuation factor of attenuator AT×reference capacity Cr) to Equation 1 instead of the inter electrode capacitance Cx of Equation 1.

If the feedback capacitance Cf changes dues to an error, an aged deterioration or the like, the output amplitude Vout of the signal detection means 511 changes accordingly. For example, in the above example, if the feedback capacitance Cf changes to 0.9 pF, the output amplitude Vout of the signal detection means 511 changes to 0.99 Vrms and 0.9 Vrms accordingly. However, as long as the attenuation factor of the attenuator AT and the reference capacitance Cr are accurate, a ratio 1.1 Vrms to 1.0 Vrms that is 1.1 and a ratio of 0.99 Vrms to 0.9 Vrms that is 1.1 are kept constant. That is, the inter electrode capacitance Cx can be accurately known based on the output amplitude Vout of the signal detection means 511 when the attenuation factor of the attenuator AT and the reference capacitance Cr are selected.

Switching the attenuation factors of the attenuator AT is relatively easy and there is almost no performance degradation or the like when application is made to the signal detection means of the present disclosure, and thus, to perform the more accurate capacitance measurement, the attenuation factor of the attenuator AT is preferably selected such that differences in the output amplitude Vout of the signal detection means when the changeover switch is switched are small.

A timing at which the changeover switch SW is switched to the reference capacitance Cr side is arbitrary. In the case where the changeover switch SW is used for the distance measurement, the object detection or the like for example, the changeover switch SW can be switched during the movement of an object. Switching at a timing at which a calibration based on the reference capacitance is necessary is possible and for example, during a time period after turning on a power source until when a circuit operation or an ambient temperature is stabilized, switching may be performed frequently and after stabilization, switch frequency may be lowered. Switching may be performed periodically.

The eleventh embodiment may be freely combined with other embodiments for use. However, the above described seventh embodiment contains a portion where a proportional relationship between the inter electrode capacitance Cx and the output amplitude Vout of the signal detection means does not hold, and thus, there is a case where it is inappropriate to combine the embodiment for use.

Twelfth Embodiment

Figure 16:
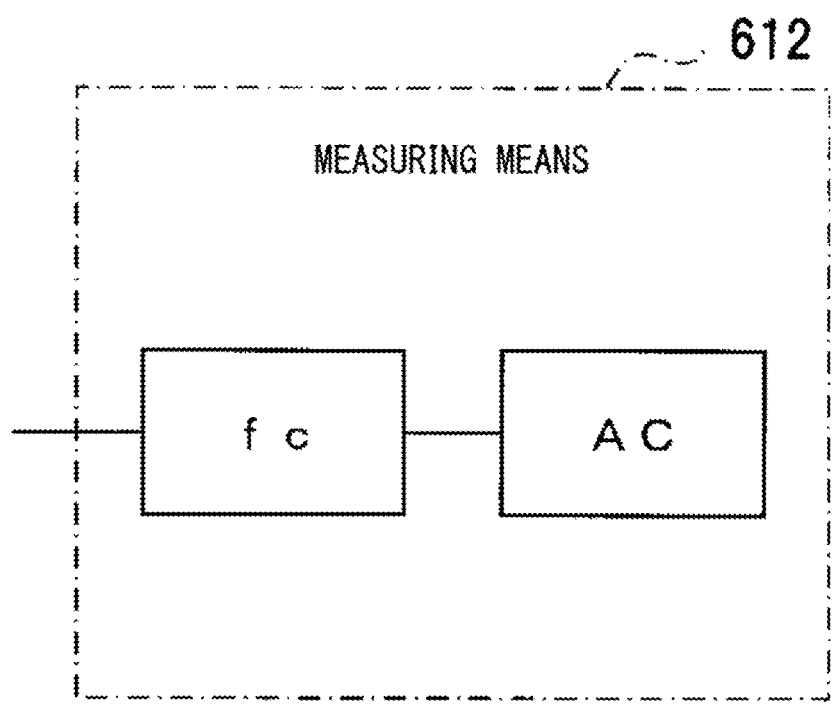
FIG. 16 illustrates one example of measuring means including a filter according to the twelfth embodiment.

The twelfth embodiment shows an example of reducing an influence of noise and the like by providing a filter at an input side of measuring means. For example, the measuring means includes the filter. FIG. 16 illustrates one example of the measuring means including the filter.

The above described fifth embodiment shows an example of reducing an influence of noise and the like by providing noise elimination circuits 1005, 1005-1, 1005-2, 1005-3, and 1005-4 including a resonance circuit between the detection electrode 401 and the signal detection means 505 when the capacitance measurement is performed based on a single frequency (sine wave). On the other hand, the twelfth embodiment achieves the same effect by providing the filter at the input side of the measuring means. By using the above described fifth embodiment and the twelfth embodiment in combination, an influence of noise and the like can be reduced more reliably.

With respect to a filter fc illustrated in FIG. 16, any filter is applicable as long as it can reduce an influence of noise and the like. As one example, it is possible to freely use a parallel resonance circuit or a series resonant circuit based on an inductor and a capacitor, a CR filter based on a resistance and a capacitor, an LR filter based on a resistance and an inductor, various active filters, a mechanical filter, a crystal filter and the like. It is also possible to use a digital filter by performing an A/D conversion. When an active filter is used, it is also possible to cause a filter circuit to have a gain to be used also as the amplifier circuit 1710 of the tenth embodiment.

As attenuation characteristics, a bandpass filter (BPF) that allows only a drive signal frequency to be passed, a band elimination filter (BEF) that removes a frequency of noise and the like are often useful, but depending on a frequency component of noise and the like, a low-pass filter (LPF), a high-pass filter (HPF) and a combination thereof may be selected appropriately.

A necessary frequency component extracted by the filter fc is provided to AC amplitude measurement means AC that measures an AC amplitude based on various methods described in a section of a measuring circuit in the above described first embodiment. As a specific method of implementing the AC signal measurement means AC, various methods described in a section of the measuring means in the first embodiment can be used.

The comparison determination means described in a section of a measuring circuit in the above described first embodiment can use the thus obtained AC amplitude information for the determination of the measurement result.

The twelfth embodiment can be freely combined with other embodiments for use.

Thirteenth Embodiment

Figure 17A:
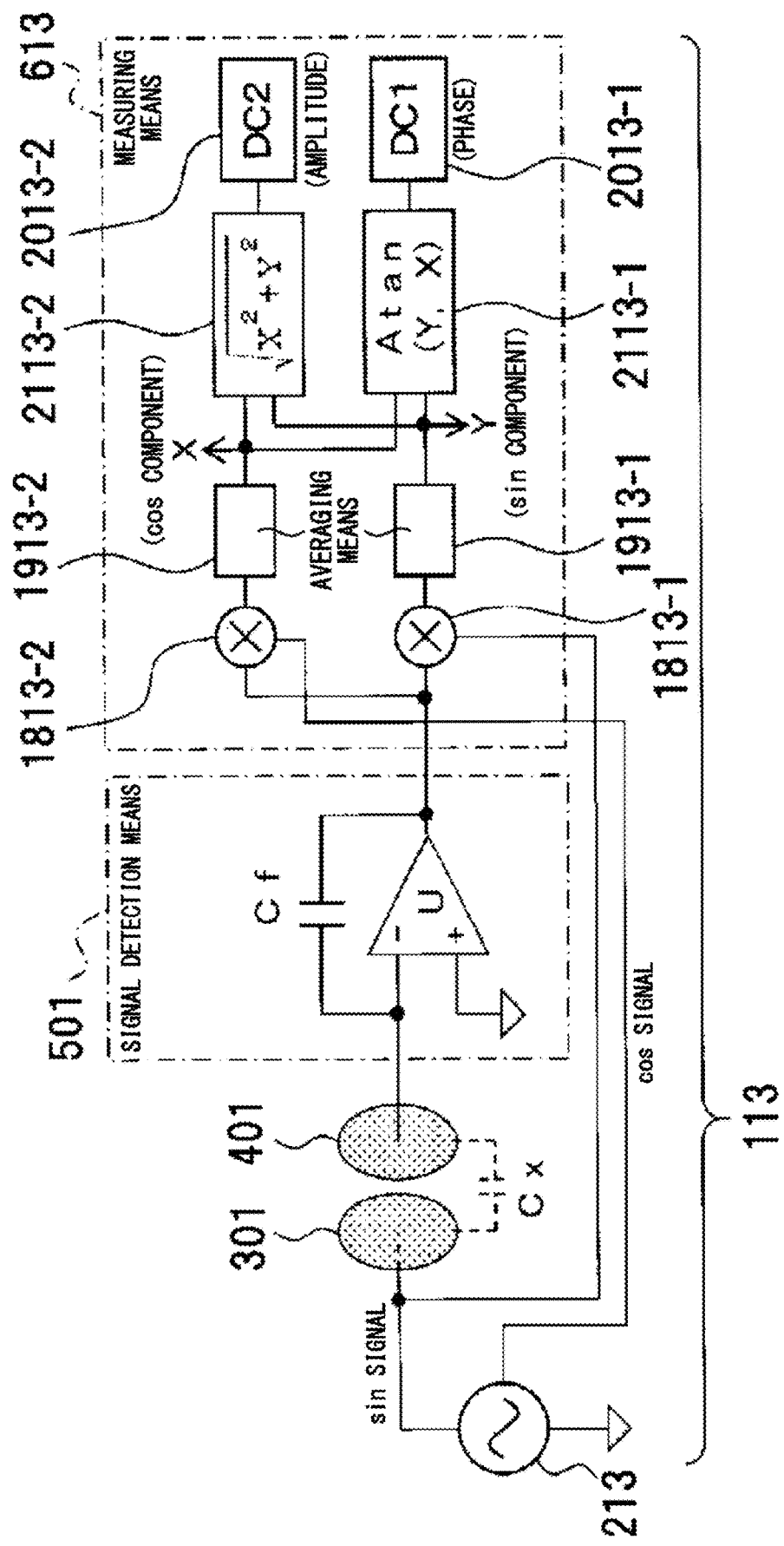
FIG. 17A illustrates one example of a CM circuit according to the thirteenth embodiment.
Figure 17B:
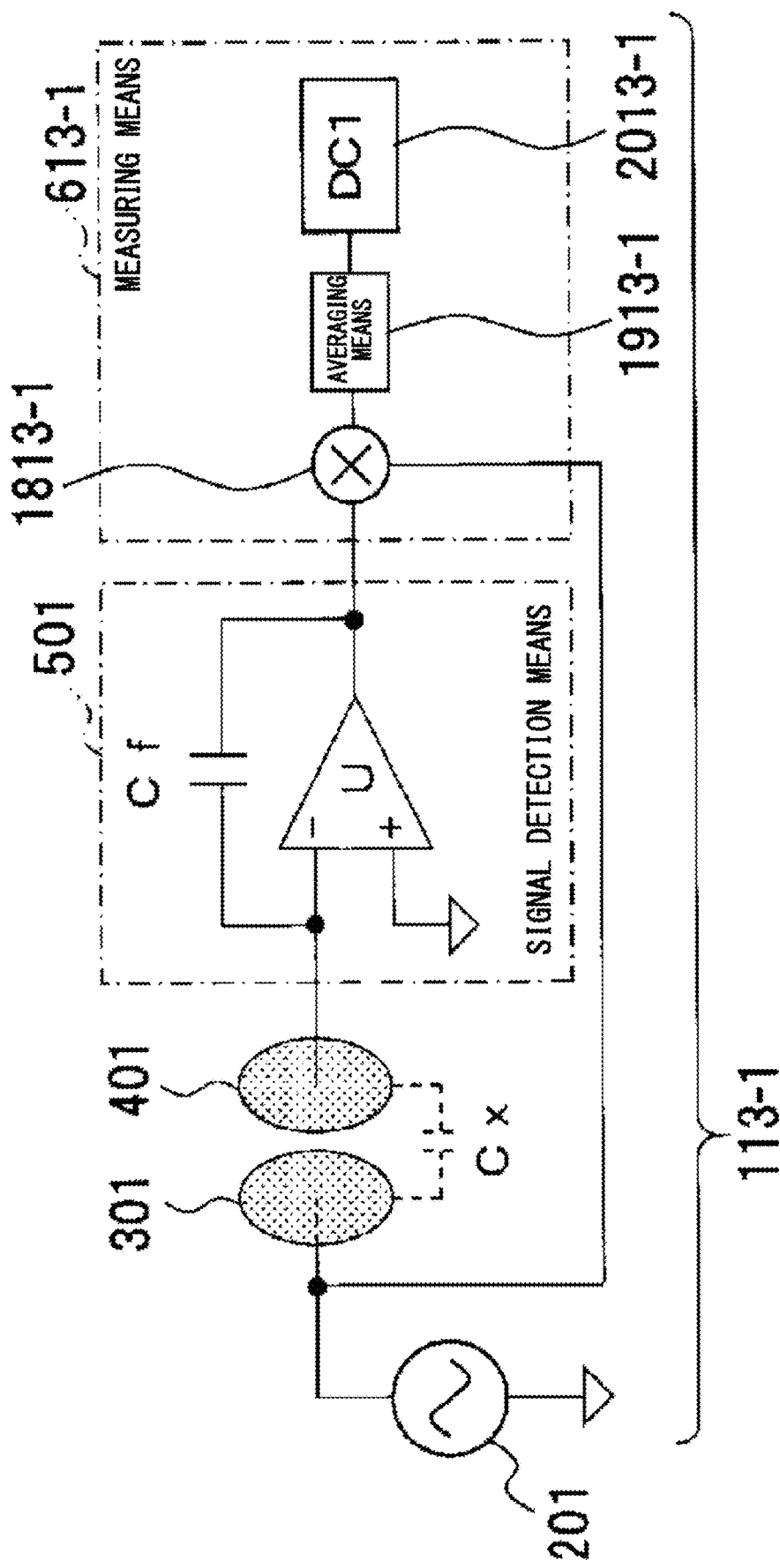
FIG. 17B illustrates one example of a CM circuit according to the thirteenth embodiment.
Figure 17C:
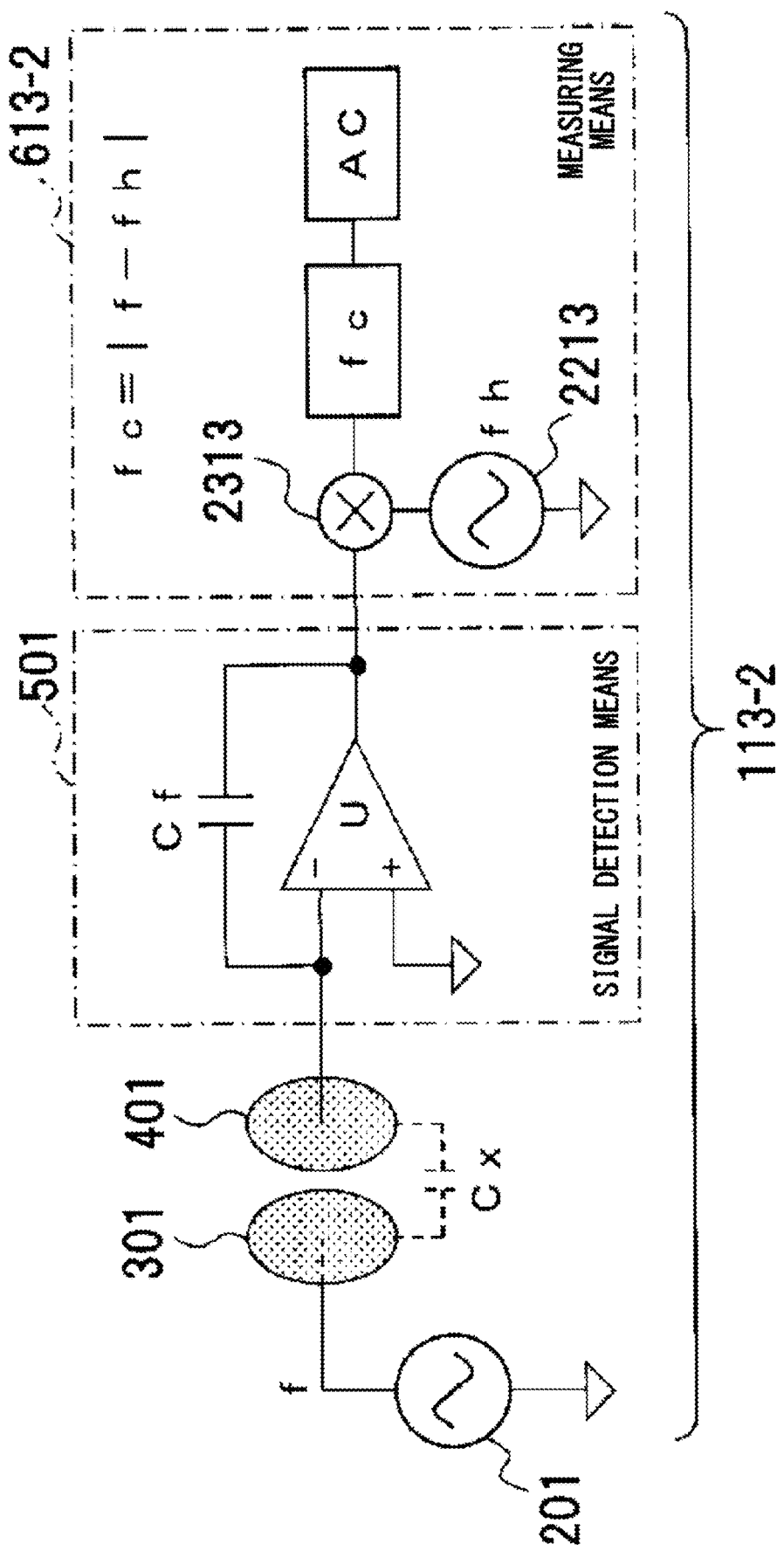
FIG. 17C illustrates one example of a CM circuit according to the thirteenth embodiment.

The thirteenth embodiment shows an example of using phase-detection means as measuring means. According to the phase-detection means, it is possible to extract only a drive signal frequency component and further know a phase. FIG. 17A to FIG. 17C illustrate one example of a CM circuit according to the thirteenth embodiment. The same reference numerals are denoted to the same parts as those in FIG. 1, FIG. 2, FIG. 3A, FIG. 5A and FIG. 5B. Descriptions of the same parts as those in any of the first embodiment to the fourth embodiment are omitted. Although examples of a drive electrode 301, a detection electrode 401, and signal detection means 501 are the same as those in the above described first embodiment (FIG. 1), those in other embodiments can be used as appropriate.

A CM circuit 113 in FIG. 17A includes drive signal generating means 213 and measuring means 613. The drive signal generating means 213 outputs two signals having 90 degrees phase difference, that is, as one example, a sine signal (hereinafter referred to as "sin signal") and a cosine signal (hereinafter referred to as "cos signal"). One of the two signals (as one example, sin signal) is connected to the drive electrode 301 and also to the measuring means 613. The other signal (as one example, cos signal) is connected to the measuring means 613. The measuring means 613 includes two phase-detection means 1813-1 and 1813-2 and each of the two phase-detection means 1813-1 and 1813-2 two inputs. The phase-detection means 1813-1 has one input, provided with, for example, the sin signal as a reference signal and the other input connected to the output of the signal detection means 501. The phase-detection means 1813-2 has one input provided with, for example, the cos signal as a reference signal and the other input connected to the output of the signal detection means 501. The phase-detection means 1813-1 and 1813-2 are, for example, phase detectors.

To obtain two signals having a 90 degrees phase difference, in the case of an analog signal, a 90 degrees phase shift circuit may be used in combination. If a direct digital synthesizer (DDS) is used as drive signal generating means 213, it is expected to obtain two signals having a more accurate 90 degrees phase difference, and thus, details thereof are described in the eighteenth embodiment later.

The phase-detection means 1813-1 and 1813-2 multiply two inputs. The phase-detection means 1813-1 has an output connected to averaging means 1913-1 and the phase-detection means 1813-2 has an output connected to averaging means 1913-2.

A case where a sin signal given to a drive electrode 301 appears to the output of the signal detection means 501 without delays at the detection electrode 401 and the signal detection means 501, that is a case where the output of the signal detection means 501 and the sin signal are in phase are considered. The phase-detection means 1813-1 and 1813-2 multiply two inputs. According to a sum-of-products formula, the phase-detection means 1813-1 provided with the sin signal as a reference signal can provide an output as in Equation 6.

It is assumed that sin α is an output of the signal detection means 501 and sin ββ is a reference signal. To simplify equations, amplitudes of sin α and sin β are both one.

[Equation 6]

$$\sin\alpha \cdot \sin\beta = -\tfrac{1}{2}\{\cos(\alpha+\beta) - \cos(\alpha-\beta)\} \quad (6)$$

The α=β holds, and thus, a frequency (cos (α+β)) twice the drive signal frequency and a DC component (cos (α·β)) can be obtained, but since the twice frequency components are removed by the averaging means 1913-1 (low-pass filter), only the DC component can be obtained. For this reason, the phase-detection means extracts only a frequency component of a reference signal frequency and has an effect of removing a frequency component of a frequency other than a reference signal frequency (for example, a hum or noise).

To improve an effect of removing a frequency component of a frequency other than a reference signal frequency (for example, a hum or noise), the filter as in the above described twelfth embodiment can be provided to inputs of the phase-detection means 1813-1 and 1813-2.

Since cos (0)=1 holds, in this example, ½, that is a direct current of a half of the product of the output amplitude of the signal detection means 501 and the amplitude of the reference signal can be obtained. This is "Y (sin component)" in FIG. 17A.

On the other hand, the phase-detection means 1813-2 provided with the cos signal as a reference signal can provide an output as in Equation 7. (It is assumed that sin α is an output of the signal detection means 501 and cos β is a reference signal.)

[Equation 7]

$$\sin\alpha \cdot \cos\beta = \tfrac{1}{2}\{\sin(\alpha+\beta) + \sin(\alpha-\beta)\} \quad (7)$$

Since sin (0)=0 holds, a direct current of zero can be obtained. This is "X (cos component)" in FIG. 17A.

From outputs of the phase-detection means provided with the sin signal as a reference signal-averaging means, a DC voltage Y proportional to a sin component from output signals of the signal detection means 501 can be obtained and from outputs of the phase-detection means provided with a cos signal as a reference signal-averaging means, a DC voltage X proportional to a cos component from output signals of the signal detection means 501 can be obtained.

When a phase delay due to the signal detection means 501 or the like is in unnegligible level, the operation means 2113-2 that performs an operation as in Equation 8 may be provided between the averaging means 1913-2 and the DC voltage measuring means 2013-2 as necessary, and the obtained DC voltages X and Y may be provided to the operation means 2113-2 so as to obtain the output amplitude Vout of the signal detection means 501. The operation means 2113-1 that performs an operation as in Equation 9 may be provided between the averaging means 1913-1 and the DC voltage measuring means 2013-1 when necessary, the obtained DC voltages X and Y may be provided to the operation means 2113-1, and a phase based on a sin signal that is an output of the drive signal generating means 213 can be obtained.

[Equation 8]

$$\sqrt{X^2 + Y^2} \quad (8)$$

[Equation 9]

$$A\tan(Y, X) \quad (9)$$

A tan (Y, X) in Equation 9 is a four-quadrant tangent function for obtaining a declination of a positive side of an X axis with respect to a vector on an XY plane in an XY coordinates.

The DC voltage measuring means 2013-1 is connected to an output of the operation means 2113-1 and a phase value based on a sin signal that is an output of the drive signal generating means 213 can be obtained. The DC voltage measuring means 2013-21 is connected to an output of the operation means 2113-2 and a value of the output amplitude Vout of the signal detection means 501 can be obtain.

When a phase delay due to the signal detection means 501 is in a negligible level or when it is not necessary to know a phase between a drive signal by the drive signal generating means 213 and a output signal of the signal detection means 501, a drive signal at a cos signal side, the phase-detection means 1813-2, the averaging means 1913-2, and the operation means 2113-1 and 2113-2 are unnecessary and a configuration like the circuit 113-1 in FIG. 17B can be adopted. That is, the averaging means 1913-1 is connected to an output of the phase-detection means 1813-1 and the DC voltage measuring means 2013-1 is connected to an output of the averaging means 1913-1.

The averaging means 1913-1 and 1913-2 may be configured by a low-pass filter and the like when being realized in an analog fashion. The DC voltage measuring means 2013-1 and 2013-2 may be analog means or may use digital means by performing an A/D conversion. When both averaging means 1913-1 and 1913-2 and DC voltage measuring means 2013-1 and 2013-2 are digitally realized, the DC voltage measuring means 2013-1 and 2013-2 may be used as means for appropriately knowing various digitally realized averaging means 1913-1 and 1913-2 and resultant digital values as DC voltage values.

If a DC component is included in both of an output signal and a reference signal of the signal detection means 501, an error is caused in a direct current obtained by Equation 6 and Equation 7, and thus, it is necessary to remove the DC component by appropriate means of setting at least one of the output of the signal detection means 501 and an input of a reference signal to be a capacitive coupling.

A CM circuit 113-2 in FIG. 17C includes drive signal generating means 201 and measuring means 613-2. A reference signal generator 2213 in the measuring means 613-2 outputs a frequency fh that is different from a frequency f of the drive signal generating means 201 by a frequency fc. That is, a frequency relationship is fc=|f·fh|. In this case, a frequency component of f+fh and a frequency component of |f·fh|(=fc) appear in an output of the phase-detection means 2313 as expressed in the above described Equation 6 and Equation 7. It is possible to know an inter electrode capacitance Cx by extracting a frequency component fc through a filter fc and providing the component to AC amplitude measurement means AC. Such a configuration is referred to as heterodyne detection means. In the present disclosure, the heterodyne detection means is one example of the phase-detection means.

Specific means for realizing the filter fc for extracting the frequency fc and the AC signal measurement means AC are the same as those in the above described twelfth embodiment.

A frequency f of the drive signal generating means 201 and a frequency fh of the reference signal generator 2213 are preferably selected such that a frequency fc is lower than f and fh. As one example, if a bandpass filter having the same configuration is used as a filter fc, it is general to have the same relative bandwidth (value obtained by dividing bandwidth by center frequency), independently of the center frequency. That is, as the center frequency fc of the filter fc that is the bandpass filter is lower, the bandwidth is narrower. If a filter is selected such that the frequency fc is low, a narrow bandwidth can be realized, and thus, an effect of further improving an ability of removing an unnecessary frequency component such as noise is generated.

In a CM circuit 113-2 in FIG. 17C, an alternating current of the frequency fc is extracted through the filter fc for use and a direct current is attenuated, and thus, the circuit contains an effect that a DC component does not become an error factor even if the DC component is included in both of an output signal of the signal detection means 501 and a reference signal.

The phase-detection means 1813-1, 1813-2, and 2313, the averaging means 1913-1 and 1913-2, the filter fc, the AC amplitude measurement means AC, the drive signal generating means 213 and 201, and the reference signal generator 2213 may use either an analog circuit or a digital circuit or use an analog circuit and a digital circuit in combination.

If the phase-detection means 1813-1, 1813-2, and 2313 are realized by an analog circuit, a reference signal may be a sine wave for example and an analog multiplier may be used as phase-detection means 1813-1, 1813-2, and 2313.

A reference signal provided from the drive signal generating means 201 and 213 and the reference signal generator 2213 may be a square wave and the phase-detection means 1813-1, 1813-2, and 2313 with an analog circuit that switches positive/negative of a gain by the square wave may be used. When the averaging means 1913-1 and 1913-2 are realized by an analog circuit, a DC component may be extracted by using an appropriate low-pass filter and the extracted DC component may be provided to DC voltage measuring means 2013-1 and 2013-2.

When the phase-detection means 1813-1, 1813-2, and 2313 are realized by digital circuits, an A/D conversion may be applied to reference signals given from the drive signal generating means 201 and 213 and the reference signal generator 2213 and the phase-detection means may be realized through digital multiplication and the like. An anti-aliasing filter for A/D conversion may have a function of a filter of the above described twelfth embodiment.

If a direct digital synthesizer (DDS) is used as the drive signal generating means 201 and 213 and the reference signal generator 2213, a reference signal can be obtained as a digital signal and it is easy to obtain a signal having a 90 degrees phase difference. When the averaging means 1913-1 and 1913-2 are realized by digital circuits, DC components may be extracted by using appropriate averaging methods such as moving average, integration by digital operation, and a low-pass filter by a digital filter and a digital value thereof may be known as a DC voltage.

An operation may be performed by using an analog operation circuit or a digital circuit as similar to the case where an operation for knowing an amplitude and a phase is performed based on Equation 8 and Equation 9.

The comparison determination means described in the measuring circuit section of the above described first embodiment can use the thus obtained measurement result for the determination of the measurement result.

The phase-detection means 1813-1, 1813-2, 2313 operate even if a drive signal frequency changes, and thus, the means are also usable for measuring a frequency characteristic of an inter electrode capacitance Cx. For example, when a dielectric is present between the drive electrode 301 and the detection electrode 401 and a relative dielectric constant thereof changes depending on a frequency, the means can measure a frequency characteristic of the relative dielectric constant. A frequency characteristic of an inter electrode capacitance Cx may be measured by appropriately changing a drive signal frequency of the drive signal generating means 213 in the example of FIG. 17A and by appropriately changing a drive signal frequency of the drive signal generating means 201 in the example of FIG. 17B. In the example of the heterodyne detection means in FIG. 17C, a frequency characteristic of an inter electrode capacitance Cx may be measured by appropriately changing a drive signal frequency of the drive signal generating means 201 and a reference signal frequency of the reference signal generator 2213 while keeping a difference between both frequencies at a frequency fc.

The thirteenth embodiment can be freely combined with other embodiments for implementation. For example, CM circuits 113, 113-1, and 113-2 may include the signal detection means previously described in the first embodiment to the fourth embodiment instead of signal detection means 501.

Fourteenth Embodiment

The fourteenth embodiment shows an example of measuring a plurality of points. FIG. 18A to FIG. 23B illustrate one example of a CM circuit according to the fourteenth embodiment. The same reference numerals are denoted to the same parts as those in FIG. 1, FIG. 2, FIG. 3A, FIG. 5A and FIG. 5B. Descriptions of the same parts as those in any of the first embodiment to the fourth embodiment, the twelfth embodiment, and the thirteenth embodiment are omitted.

When a plurality of points are measured, the simplest is to use a plurality of sets of drive signal generating means, drive electrode, detection electrode, signal detection means and measuring means, but the fourteenth embodiment shows an example of simplifying some of them.

Figure 18A:
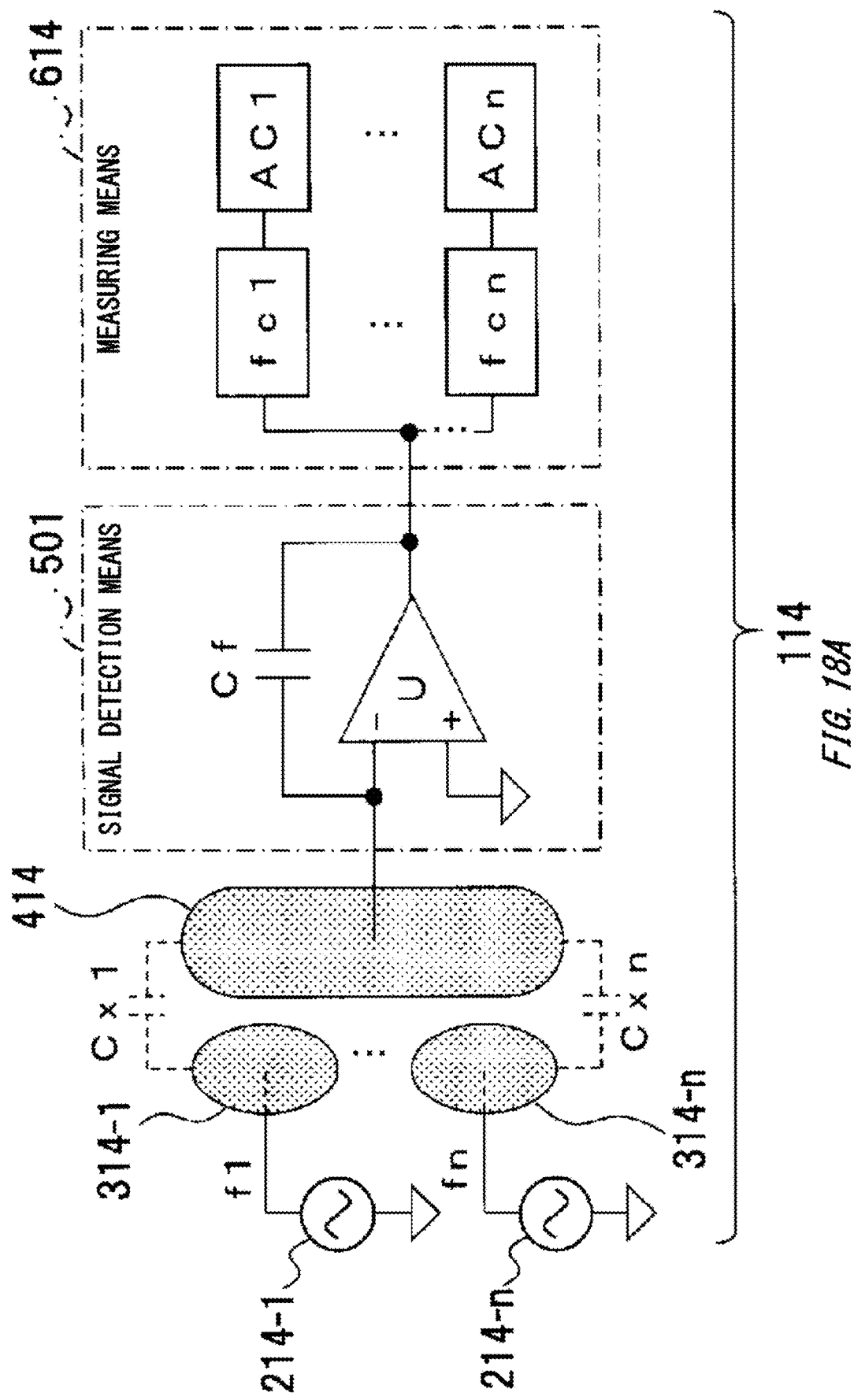
FIG. 18A illustrates one example of a CM circuit according to the fourteenth embodiment.
Figure 18B:
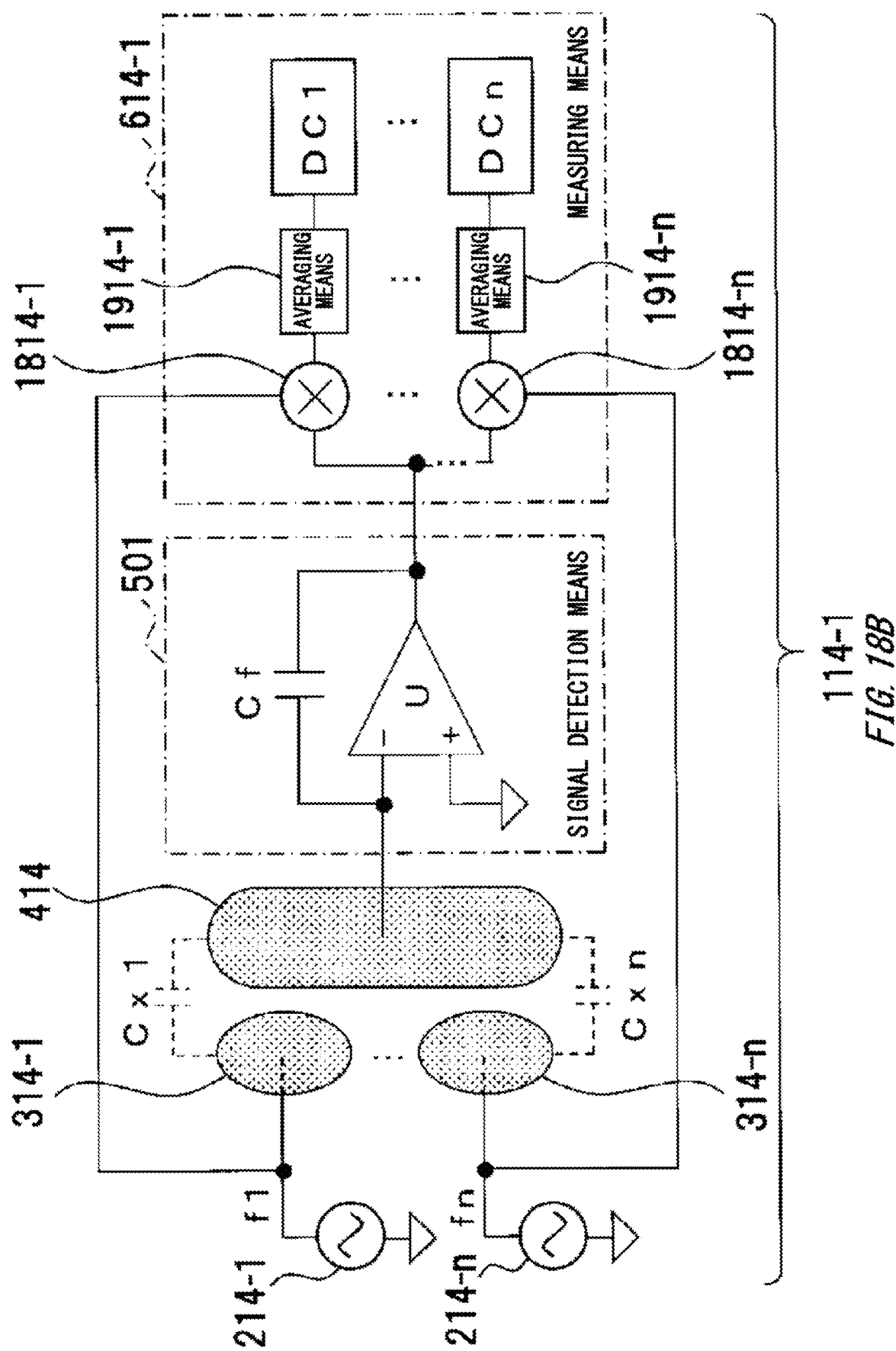
FIG. 18B illustrates one example of a CM circuit according to the fourteenth embodiment.
Figure 19:
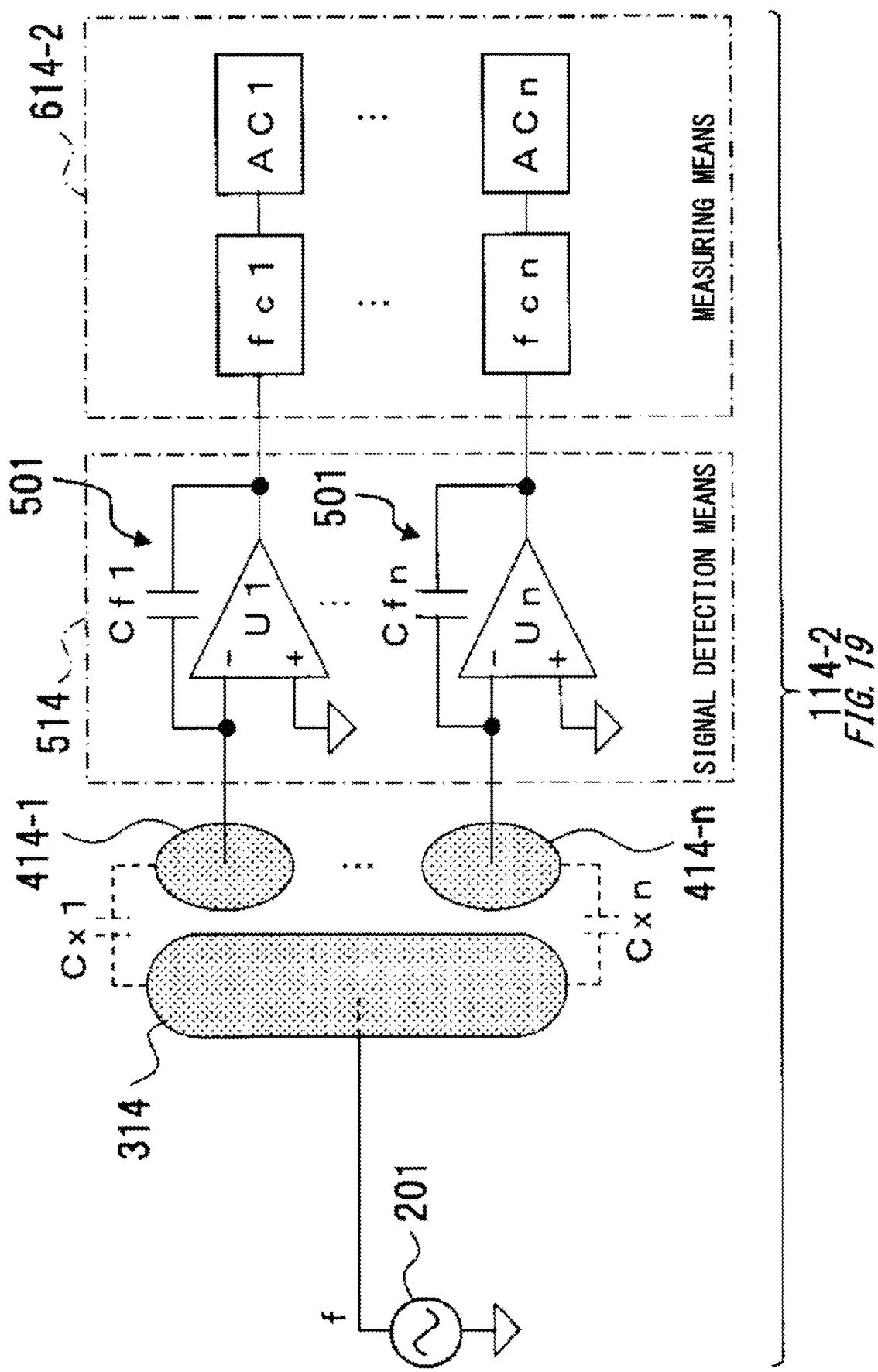
FIG. 19 illustrates one example of a CM circuit according to the fourteenth embodiment.
Figure 20A:
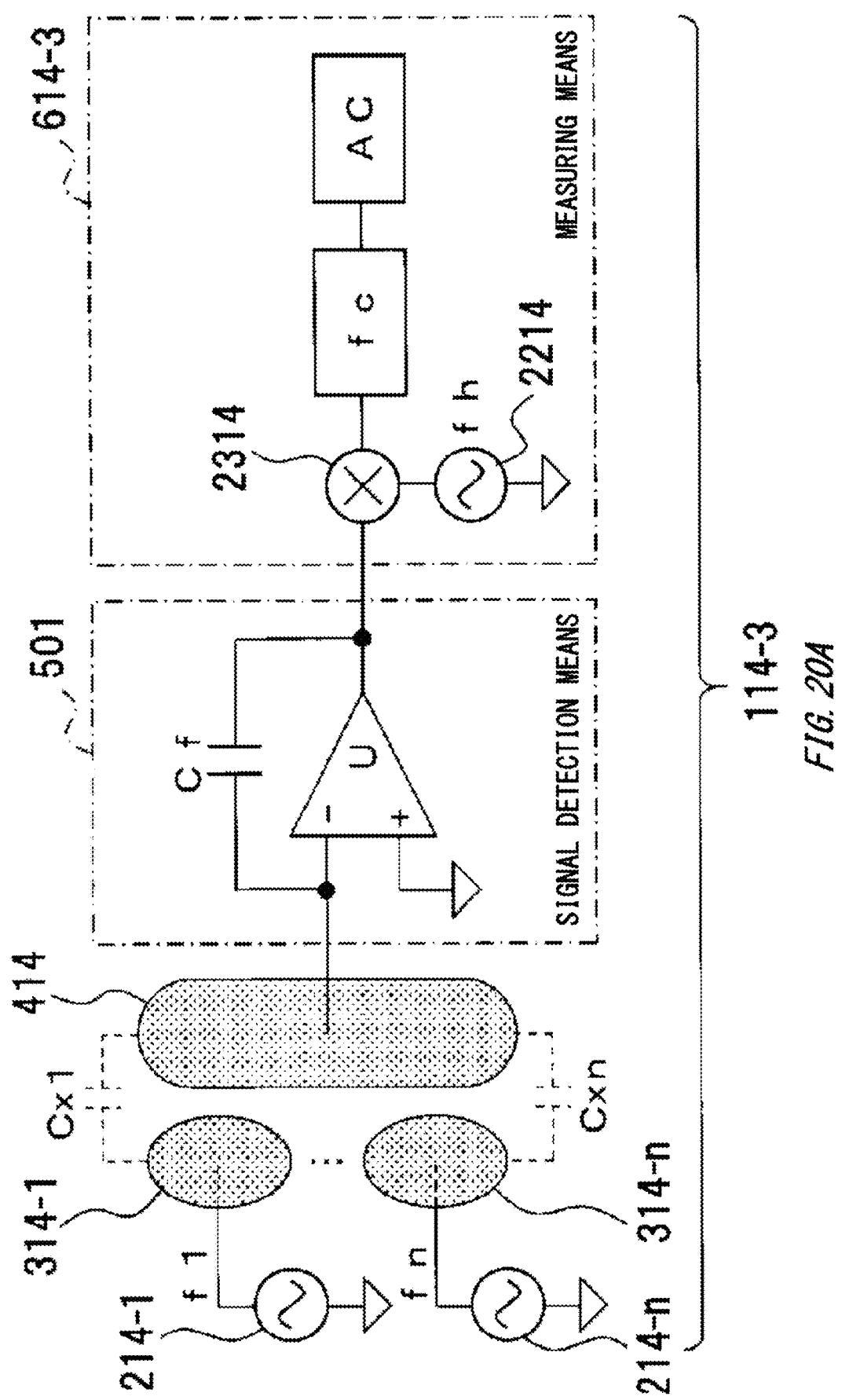
FIG. 20A illustrates one example of a CM circuit according to the fourteenth embodiment.
Figure 20B:
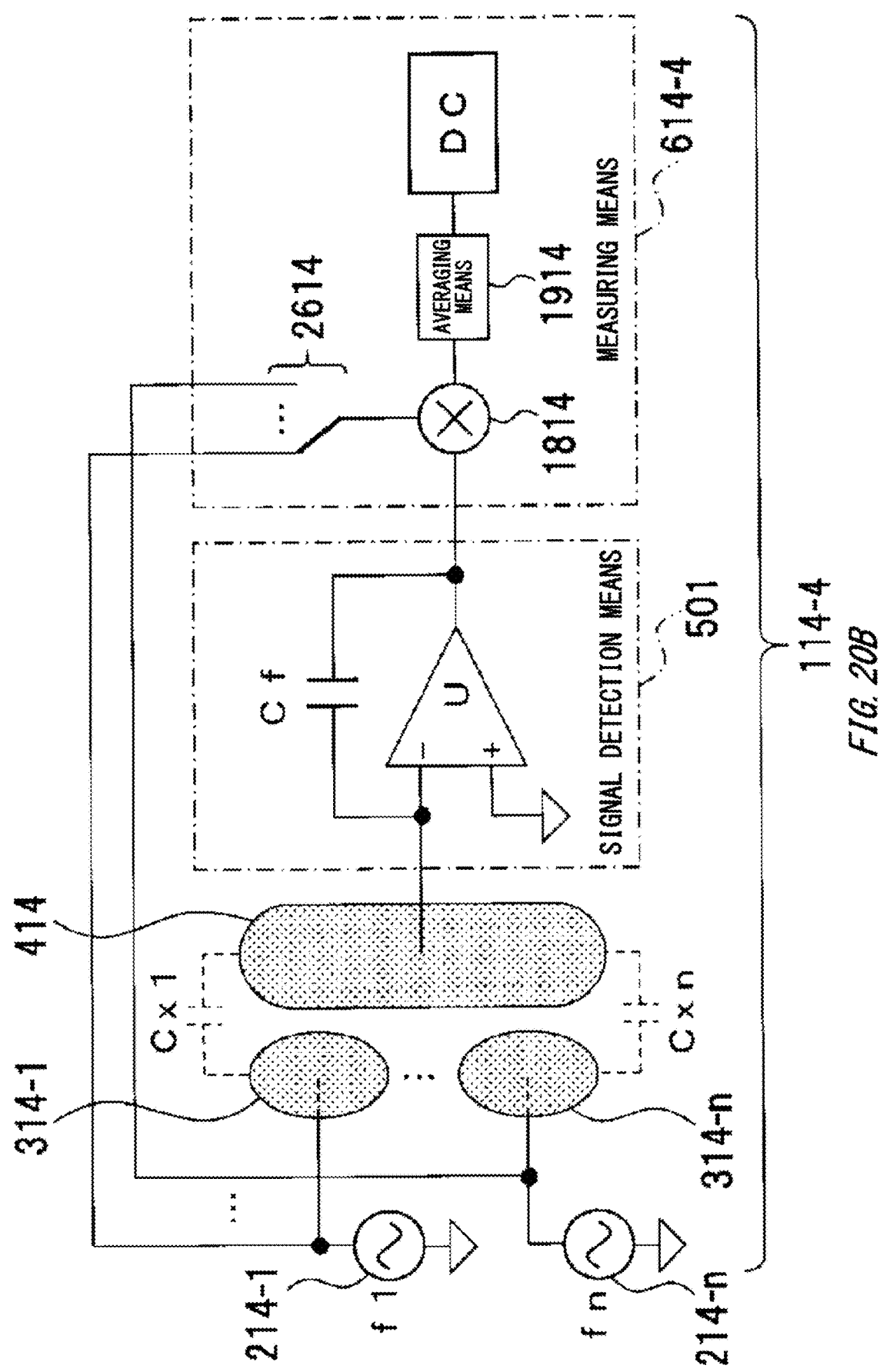
FIG. 20B illustrates one example of a CM circuit according to the fourteenth embodiment.

In FIG. 18A and FIG. 18B, an example is illustrated in which it is sufficient that the number of detection electrodes is one and the number of signal detection means is one. In FIG. 19, it is sufficient that the number of drive signal generating means is one and the number of drive electrode is one. In FIG. 20A and FIG. 20B, the number of single detection electrode can be one and the number of single signal detection means can be one, and additionally the number of measuring means can be one. In FIG. 20B, switching means is used in combination.

Figure 21:
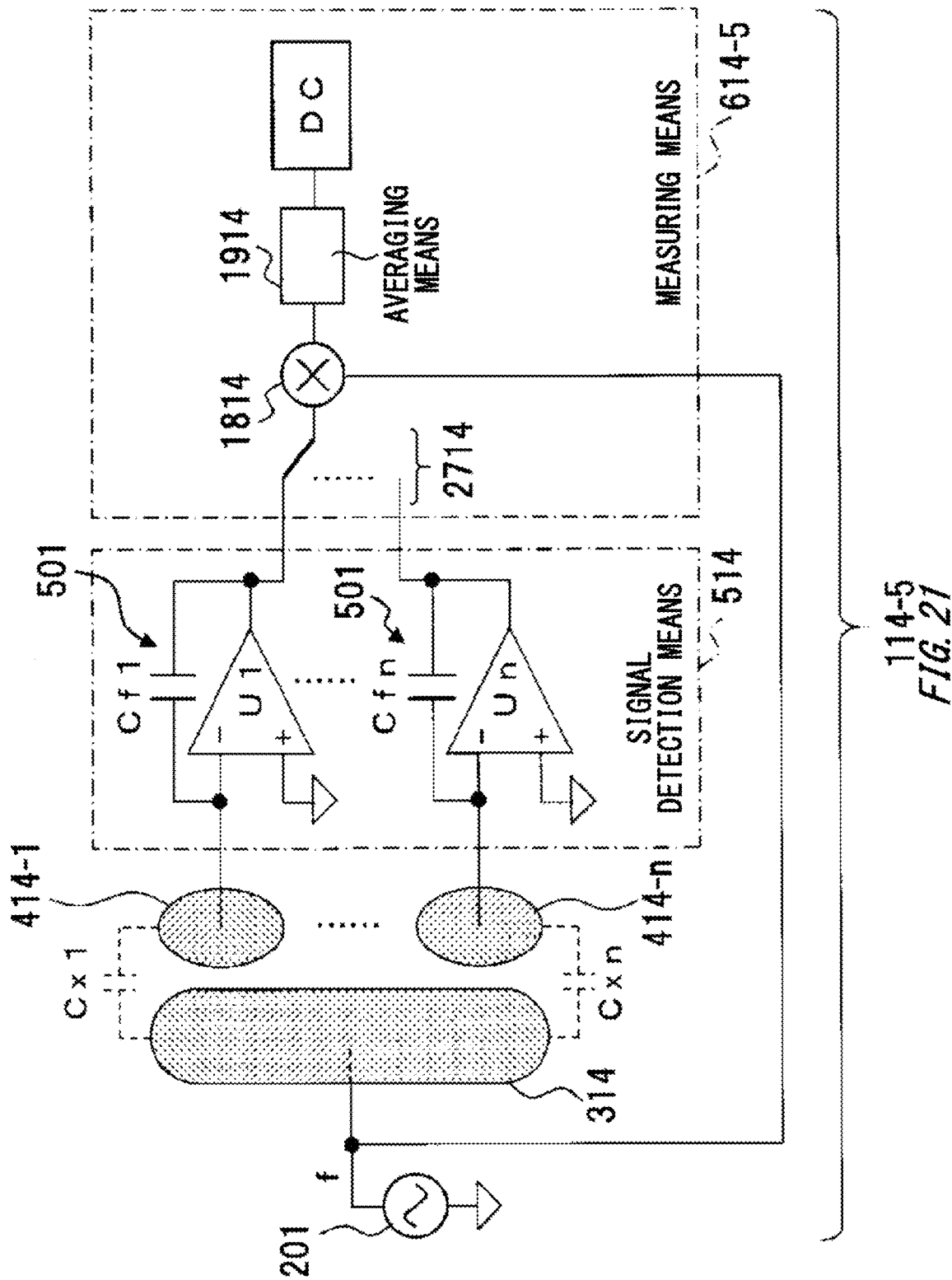
FIG. 21 illustrates one example of a CM circuit according to the fourteenth embodiment.
Figure 22:
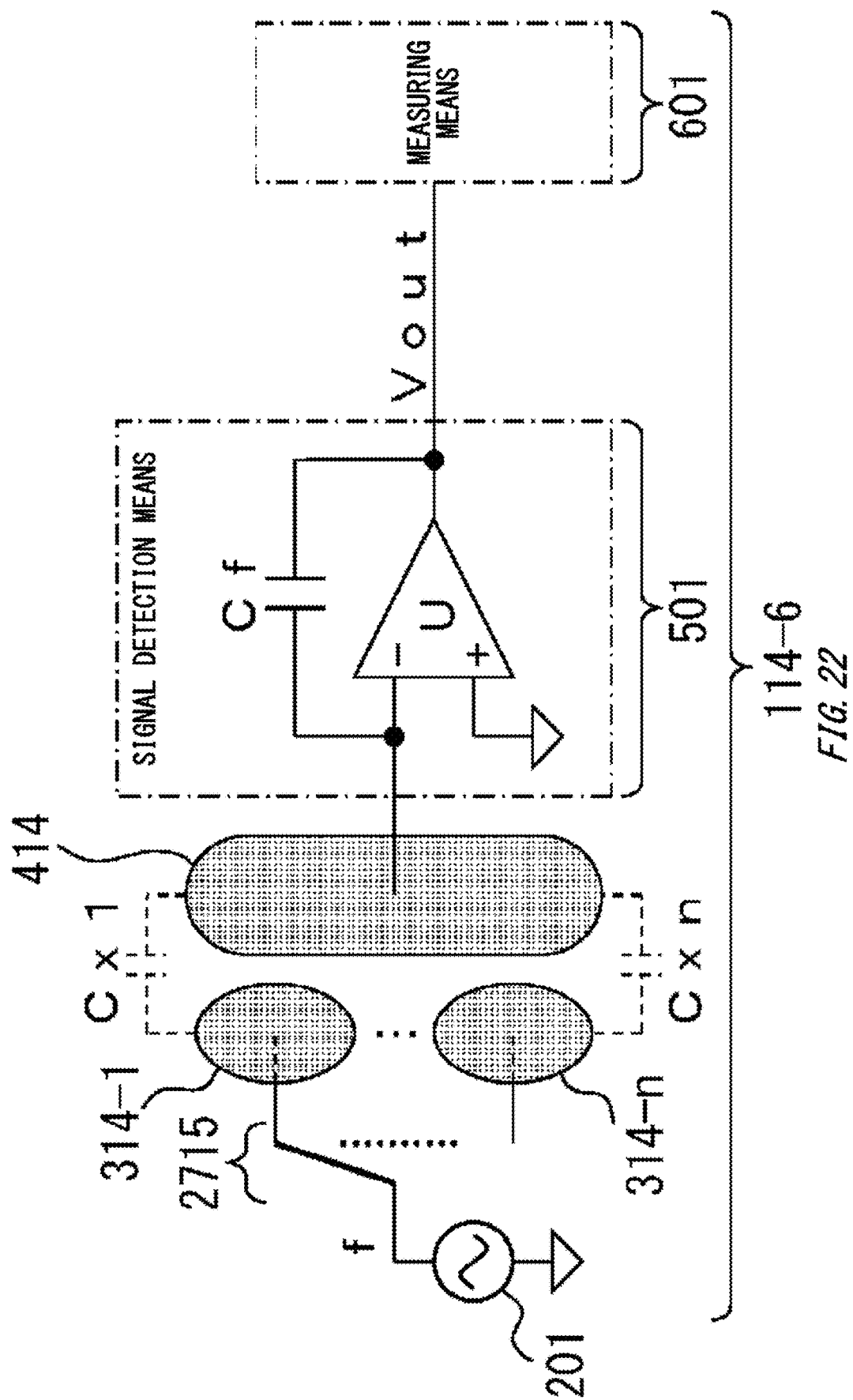
FIG. 22 illustrates one example of a CM circuit according to the fourteenth embodiment.
Figure 23A:
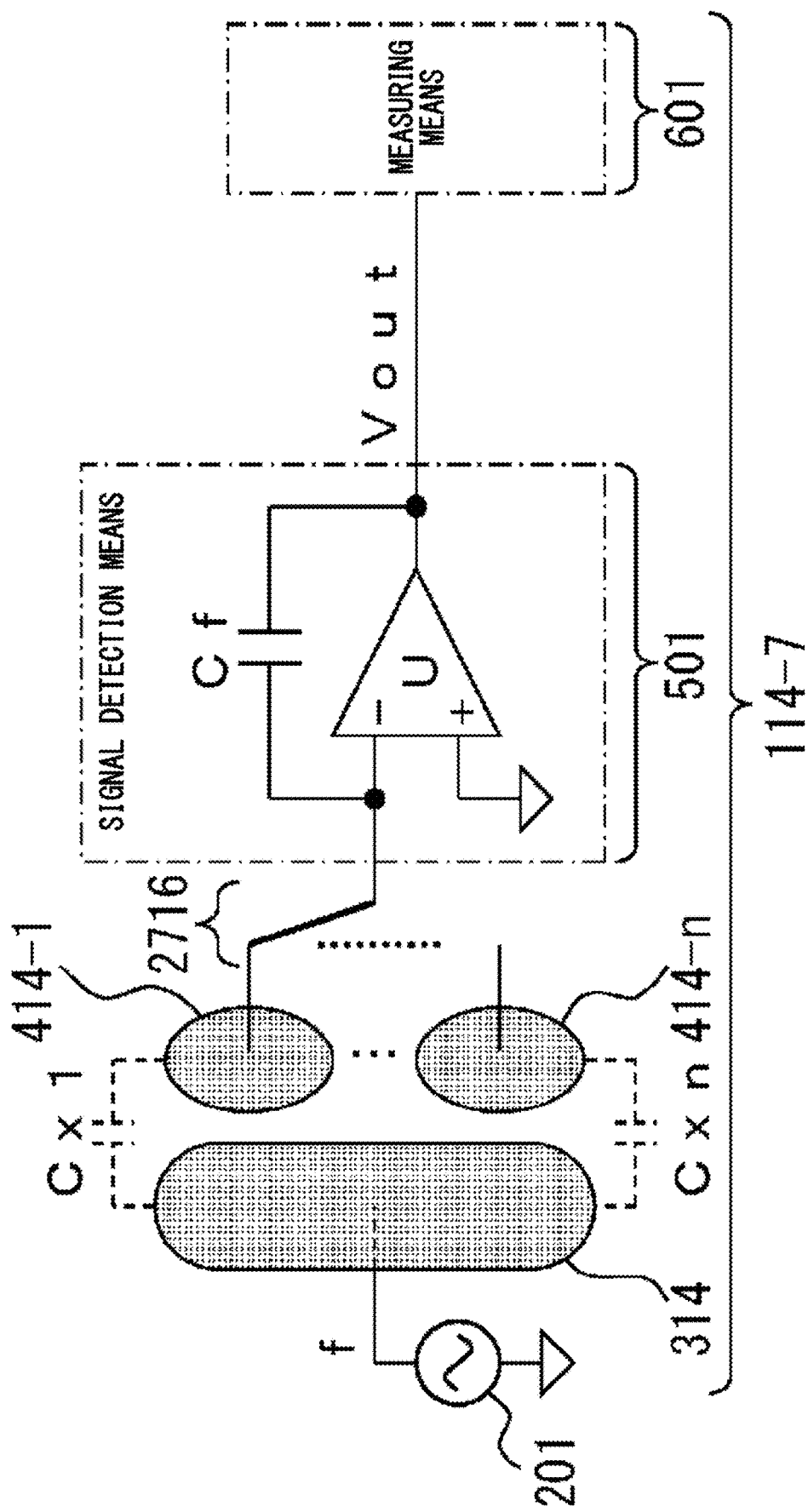
FIG. 23A illustrates one example of a CM circuit according to the fourteenth embodiment.
Figure 23B:
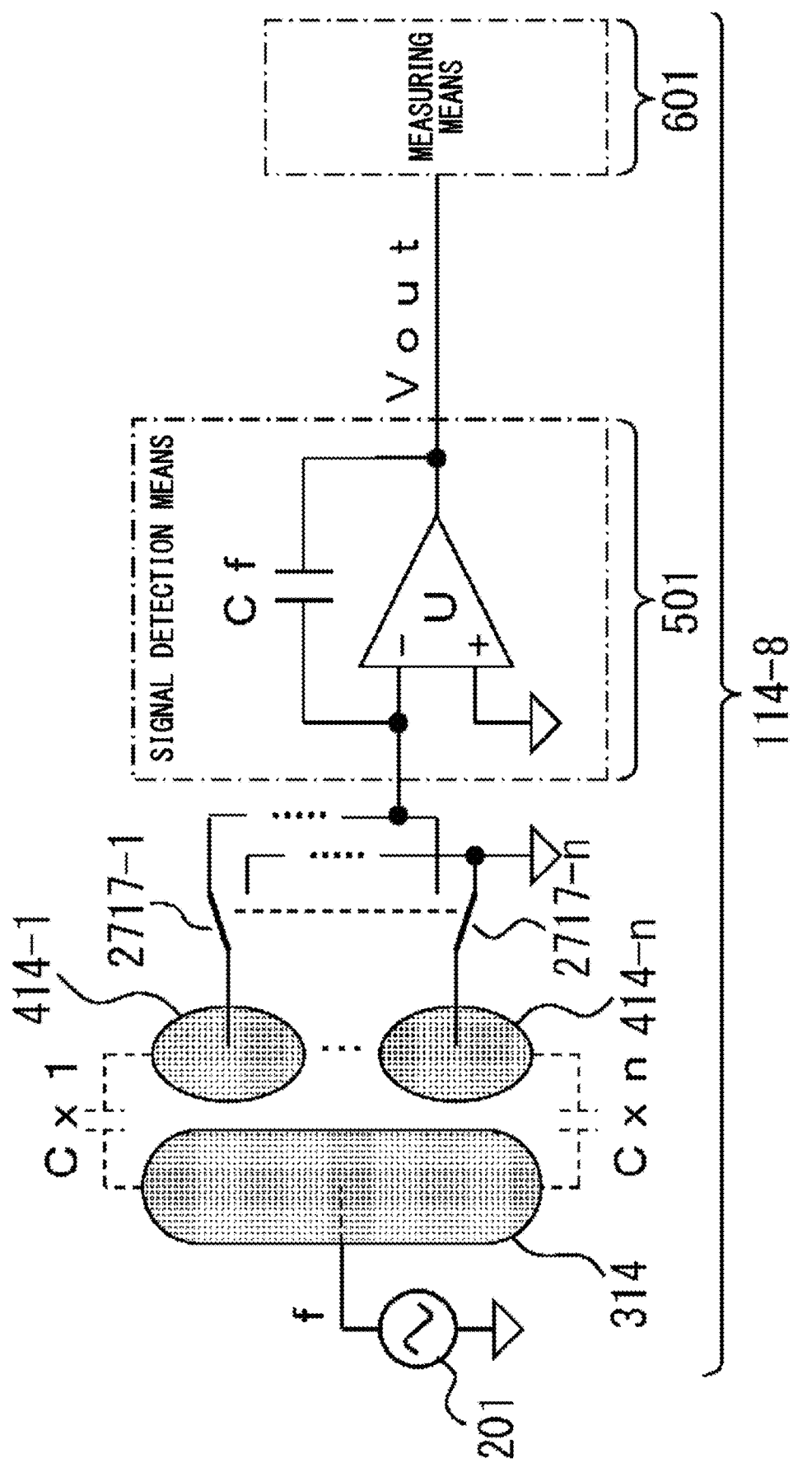
FIG. 23B illustrates one example of a CM circuit according to the fourteenth embodiment.

FIG. 21 to FIG. 23B also use switching means in combination. In FIG. 21, the number of drive signal generating means can be one and the number of drive electrode can be one, and additionally the number of measuring means can be one. In FIG. 22, the number of drive electrode is more than one and the number of the remaining components can be one respectively. In FIG. 23A and FIG. 23B, the number of detection electrode is more than one and the number of the remaining components may be one respectively.

Each of a CM circuit 114 in FIG. 18A and a CM circuit 114-1 in FIG. 18B includes drive signal generating means 214-1 . . . 214-n, drive electrodes 314-1 . . . 314-n and a detection electrode 414. Each of the drive signal generating means 214-1 . . . 214-n is the same as the drive signal generating means 201 previously described in the first embodiment and each of the drive electrodes 314-1 . . . 314-n is the same as the drive electrode 301 previously described in the first embodiment. The drive signal generating means 214-1 . . . 214-n are connected to the drive electrodes 314-1 . . . 314-n on a one-to-one basis respectively. The detection electrode 414 forms inter electrode capacitances Cx1 . . . Cxn with each of the drive electrodes 314-1 . . . 314-n. The CM circuit 114 includes measuring means 614 having the filters fc1 . . . fcn and the AC voltage measuring means AC . . . ACn previously described in the twelfth embodiment and the CM circuit 114-1 includes measuring means 614-1 having the phase-detection means 1814-1 . . . 1814-n, the averaging means 1914-1 . . . 1914-n, and the DC voltage measuring means DC1 . . . DCn previously described in the thirteenth embodiment.

A drive signal of a frequency f1 generated by the drive signal generating means 214-1 is supplied to a first drive electrode 314-1, a drive signal of an unillustrated frequency f2 is supplied to a second unillustrated drive electrode, and in the same manner, a drive signal of a frequency fn is supplied to a n-th drive electrode 314-n. Here, n is an arbitrary natural number of two or more. Frequencies f1 to fn are different from each other and selected are frequencies separated to the extent the frequencies can be separated by the filters fc1 . . . fcn and the phase-detection means 1814-1 . . . 1814-n. A inter electrode capacitance between the detection electrode 414 and the first drive electrode 314-1 is defined as Cx1 and in the similar manner, an inter electrode capacitance between the detection electrode 414 and the n-th drive electrode 314-n is defined as Cxn.

The n filters fc described in the twelfth embodiment are connected to an input of the measuring means 614. The AC voltage measuring means AC is connected to an output of the filter fc1 for extracting only the frequency f1, unillustrated AC voltage measuring means AC2 is connected to the filter fc2 for extracting only an unillustrated frequency f2, and in the similar manner, the AC voltage measuring means ACn is connected to a filter fcn for extracting only the frequency fn. The inter electrode capacitances Cx1 . . . Cxn can be obtained based on the filters fc1 . . . fcn and the AC voltage measuring means AC1 . . . ACn respectively. In the CM circuit 114, measuring means using a plurality of AC voltage measuring means corresponding to respective filters is exemplified, but outputs of n filters may be switched by using one (or less than n) AC voltage measuring means. One (or less than n) filter that can switch frequencies to be extracted and the AC voltage measuring means may be used.

In the CM circuit 114-1, an example of using the phase-detection means 1813-1 described in the above described thirteenth embodiment is shown, and to an input of the measuring means 614-1, n phase-detection-means 1814-1 . . . 1814-n, averaging means 1914-1 . . . 1914-n corresponding thereto respectively and DC voltage measuring means DC1 . . . DCn are connected. As described in the thirteenth embodiment, in the phase-detection means, frequencies other than reference signals can be removed, and thus, effects similar to those of the filter fc1 . . . fcn can be obtained based on the phase-detection means 1814-1 . . . 1814-n. Further, a DC voltage proportional to a capacitance of each of Cx1 . . . Cxn can be obtained based on the averaging means 1914-1 . . . 1914-n connected to the respective phase-detection means 1814-1 . . . 1814-n.

In the CM circuit 114-1, an example is shown in which a plurality of averaging means and a plurality of DC voltage measuring means corresponding to respective phase-detection means are used, but one (or less than n) DC voltage measuring means may be used by switching to it, or one (or less than n) averaging means and DC voltage measuring means may be used by switching there between.

How thus obtained information on a capacitance corresponding to each of a plurality of drive electrodes can be used as an electrostatic capacitive displacement meter will be described at or after a twenty-first embodiment.

In a CM circuit 114-2 in FIG. 19, drive signal generating means 201 generates a drive signal waveform of a frequency f and the waveform is supplied to a drive electrode 314. Here, n is an arbitrary natural number of two or more. Each of filters fc1 . . . fun and phase-detection means 1814-1 . . . 1814-n extracts a frequency component of a frequency f.

The CM circuit 114-2 includes a drive electrode 314, detection electrode 414-1 . . . 414-n, signal detection means 514, and measuring means 614-2. Inter electrode capacitances Cx1 . . . Cxn are formed between the drive electrode 314 and each of detection electrodes 414-1 . . . 414-n. The signal detection means 514 includes a plurality of signal detection means 501 previously described in the first embodiment and inputs of the signal detection means 501 are connected to the detection electrodes 414-1 . . . 414-n respectively on a one-to-one basis. Measuring means 614-2 includes filters fc1 . . . fcn and AC voltage measuring means AC1 . . . ACn and the filters fc1 . . . fcn and the AC voltage measuring means AC1 . . . ACn form a plurality of sets, each set including a single filter and a single AC voltage measuring means. The plurality of sets including the filters and the AC voltage measuring means are connected to a plurality of outputs of the signal detection means 501 on a one-to-one basis. A set of phase-detection means, averaging means, and DC voltage measuring means may be used instead of a set of a filter and AC voltage measuring means.

An inter electrode capacitance between a drive electrode 314 and a first detection electrode 414-1 is defined as Cx1, the signal detection means 514 to which the first detection electrode 414-1 is connected includes a feedback capacitance Cf1 and an amplifier U1 and supplies a frequency component of a frequency f to AC voltage measuring means AC1 via a filter fc1 for extracting the frequency component of the frequency f. Hereinafter, a first to n—the components have the same configuration.

When comparing a CM circuit 114-2 in FIG. 19 with a CM circuit 114 in FIG. 18A, a difference resides in that while the number of drive signal generating means 214-1 . . . 214-*n* can be reduced from n to one, the number of amplifier U and feedback capacitance Cf included in the signal detection means 501 increases from one to n, and thus, one of them suitable for actual use can be selected.

FIG. 20A to FIG. 23B illustrate a modified example of simplifying signal detection means and measuring means by adding a signal source and switching means.

ACM circuit 114-3 in FIG. 20A is a modified example in which the heterodyne detection means described in the above thirteenth embodiment is configured by adding a signal source 2214 and a multiplier 2314 and accordingly the signal detection means 501 and the measuring means 614 are simplified from the CM circuit 114.

As already represented in the above Equation 6 and Equation 7, when two frequency components are multiplied, the sum and difference of the frequency components can be obtained. When a frequency of the signal source 2214 is fh, and a frequency of a drive signal supplied to a first drive electrode 314-1 is f1, at an output of the multiplier 2314, a frequency component of (f1±fh) can be obtained.

In the CM circuit 114-3, if the signal source frequency fh is selected such that the frequency fc extracted by the filter fc is one of f1±fh, the filter fc extracts the frequency f1 supplied to the first drive electrode 314-1. If the AC voltage measuring means AC in the measuring means 614-3 measures an amplitude of the thus selected frequency f1, the inter electrode capacitance Cx1 between the first drive electrode 314-1 and the detection electrode 414 can be informed. By switching signal source frequencies fh, each of a first inter electrode capacitance to an n-th inter electrode capacitance Cxn can be informed in the same manner.

In the case of the CM circuit 114-3, frequencies are selected such that frequencies from f1±fh to fn±fh are separated to the extent that they can be extracted by a filter. (As one example, frequencies are selected so as not to be frequencies of f1±fh≈f2·fh.)

A CM circuit 114-4 in FIG. 20B is an example obtained by simplifying the measuring means 614-1 from the CM circuit 114-1 by adding a changeover switch 2614. Phase-detection means 1814 functions to attenuate components other than frequencies of a reference signal and operates as one type of bandpass filter. In the CM circuit 114-4, a waveform obtained by superimposing respective frequency components of drive signal frequencies f1 to fn is supplied from signal detection means 501 to measuring means 614-4.

If a drive signal frequency f1 is selected as a reference signal of the phase-detection means 1814, the phase-detection means 1814 extracts only components of a drive signal frequency f1 supplied from the first drive electrode 314-1. For this reason, at an output of the averaging means 1914, a DC voltage proportional to the inter electrode capacitance Cx1 between the detection electrode 414 and the first drive electrode 314-1 can be obtained. By selecting drive signal frequencies by using the changeover switch 2614, in the similar manner, each of the second inter electrode capacitance Cx2 to the n-th inter electrode capacitance Cxn can be known.

A CM circuit 114-5 in FIG. 21 is an example obtained by simplifying the drive signal generating means 201, the drive electrode 314, and the measuring means 614-5 by adding a changeover switch 2714 that is one example of the switching means. In the CM circuit 114-5, a plurality of sets of detection electrodes and signal detection means are used, and a plurality of points are measured by switching with the changeover switch 2714 of the measuring means 614-5.

First, in the CM circuit 114-5, one drive signal generating means 201 outputs only one frequency. The measuring means 614-5 in the CM circuit 114-5 may include only one set of the phase-detection means 1814 and the DC voltage measuring means DC. The CM circuit 114-5 is the same as the CM circuit 114-2 in that a plurality of sets of the detection electrodes 414-1 . . . 414-*n* and the signal detection means 501 are used.

Although in the CM circuit 114-5, the measuring means 614-5 including the phase-detection means 1814 and the DC voltage measuring means DC is exemplified, the present invention is not limited to this. The CM circuit 114-5 may include the measuring means 612 including the filter fc and the AC signal measurement means AC shown in the twelfth embodiment for example.

A CM circuit 114-6 in FIG. 22 shows an example of simplifying the drive signal generating means 201, the detection electrode 414, the signal detection means 501, and the measuring means 601 by adding the changeover switch 2715 that is one example of the switching means and switching a drive electrode.

In the CM circuit 114-6, a plurality of drive electrodes are used, and a drive signal is supplied to any one of drive electrodes by switching between the drive electrode and the drive signal generating means 201 with the changeover switch 2715. It is possible to know each of the inter electrode capacitance Cx1 to the inter electrode capacitance Cxn by switching sequentially from the drive electrode 314-1 to the drive electrode 314-*n*.

Sixth example, FIG. 56A and FIG. 56B described later will illustrate a specific example of an electrostatic capacitive displacement meter applied with the CM circuit 114-6 in FIG. 22.

ACM circuit 114-7 in FIG. 23A is an example obtained by simplifying the drive signal generating means 201, the drive electrode 314, the signal detection means 501, and the measuring means 601 by adding a changeover switch 2716 that is one example of switching means and switching a detection electrode.

In the CM circuit 114-7, a plurality of detection electrodes are used, and one of the detection electrodes and the signal detection means 501 are connected by switching between the detection electrode and the signal detection means 501 with the changeover switch 2716.

By sequentially switching from the detection electrode 414-1 to the detection electrode 414-*n*, it is possible to know each of the inter electrode capacitance Cx1 to the inter electrode capacitance Cxn.

ACM circuit 114-8 in FIG. 23B is a modified example of the CM 114-7 in FIG. 23A. Connection of a single detection electrode and signal detection means 501 in the CM circuit 114-7 and the CM circuit 114-8 may be hereinafter abbreviated as "selection".

In the CM circuit 114-7, detection electrodes other than selected detection electrodes among a plurality of detection electrodes are electrically floated. On the other hand, in the CM circuit 114-8, detection electrodes other than the selected detection electrodes are grounded. This allows using grounded electrodes other than the selected detection electrodes for shaping lines of electric force. (Details of the above are described later as a guard electrode in a second example described later.)

In FIG. 23B, only the detection electrode 414-1 is select and connected to the signal detection means 501 by changeover switch 2717-1. Other detection electrodes 414-2 (unillustrated) to 414-*n* are connected to a reference potential (grounded) via the changeover switches 2717-2 (unillustrated) to 2717-*n*.

When an unillustrated detection electrode 414-2 is selected and connected to the signal detection means 501 by an unillustrated changeover switch 2717-2, other detection electrodes 414-1 and 414-3 (unillustrated) to 414-*n* are grounded via changeover switches 2717-1 and 2717-3 (unillustrated) to 2717-*n*.

Each of the first inter electrode capacitance Cx1 to the n-th inter electrode capacitance Cxn can be known by similarly switching from the changeover switch 2717-1 to the changeover 2717-*n* and sequentially selecting from the detection electrodes 414-1 to 414-*n*.

A sixth example, FIG. 57A, FIG. 57B, and FIG. 58 described later illustrate a specific example of an electrostatic capacitive displacement meter applied with the CM circuit 114-8 in FIG. 23B.

Although the fourteenth embodiment shows an example of applying the twelfth embodiment and the thirteenth embodiment, other embodiments can be also applied when necessary.

The CM circuits 114-3, 114-4, 114-5, 114-6, 114-7, and 114-8 are modified examples obtained by simplifying the measuring means and adding a signal source and switching means, these are merely representative examples, and the present invention is not limited to these. As exemplified in the above described embodiments, there are various implementation means for each of drive signal generating means, a drive electrode, a detection electrode, signal detection means, and measuring means and depending on combinations, many modified examples of simplifying the signal detection means and the measuring means by adding the switching means and a signal source can be considered.

Fifteenth Embodiment

Figure 24:
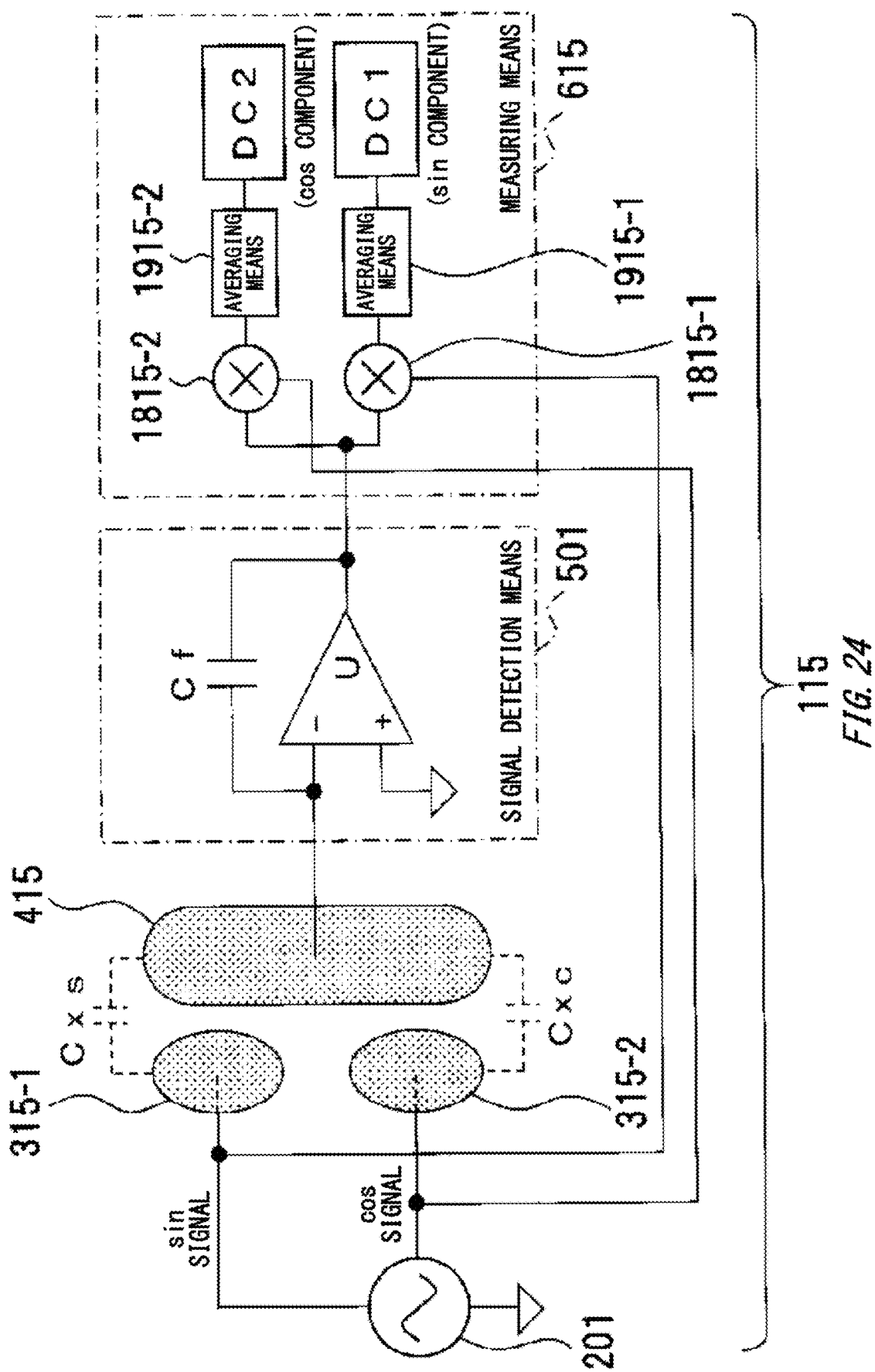
FIG. 24 illustrates one example of a CM circuit according to the fifteenth embodiment.

The fifteenth embodiment shows an example of measuring two points by using drive signal generating means that can generate two signals having 90 degrees phase difference and two drive electrodes corresponding to the means. In the fifteenth embodiment, it is sufficient that the number of detection electrode is one, the number of signal detection means is one, and the number of measuring means is one. FIG. 24 illustrates one example of a CM circuit according to the fifteenth embodiment. The same reference numerals are denoted to the same parts as those in FIG. 1, FIG. 2, FIG. 3A, FIG. 5A and FIG. 5B. Descriptions of the same parts as those in any of the first embodiment to the fourth embodiment and the thirteenth embodiment are omitted.

In a CM circuit 115 according to the fifteenth embodiment, as similar to the thirteenth embodiment described above, as examples of two signals having 90 degrees phase difference, a sin signal and a cos signal are exemplified, but the present invention is not limited to this as long as two signals having 90 degrees phase difference are provided in the circuit.

In the CM circuit 115, one drive signal generate by the drive signal generating means 201 (sin signal) is supplied to one drive electrode 315-1 and the other drive signal (cos signal) is supplied to the other drive electrode 315-2. An inter electrode capacitance between the detection electrode 415 and a sin signal side drive electrode 315-1 is defined as Cxs and an inter electrode capacitance between the detection electrode 415 and a cos signal side drive electrode 315-2 is defined as Cxc.

The measuring means 615 includes phase-detection means 1815-1 that receives a sin signal as a reference signal, phase-detection means 1815-2 that receives a cos signal as a reference signal, and averaging means 1915-1 and 1915-2 corresponding to the phase-detection means 1815-1 and the phase-detection means 1815-2 respectively. From an output of the averaging means 1915-1 connected to the phase-detection means 1815-1 that receives a sin signal as a reference signal, a DC voltage proportional to an inter electrode capacitance Cxs can be obtained. From an output of the averaging means 1915-2 connected to the phase-detection means 1815-2 that receives a cos signal as a reference signal, a DC voltage proportional to the inter electrode capacitance Cxc can be obtained. In the CM circuit 115, an example is shown in which two DC voltage measuring means DC1 and DC2 corresponding to the phase-detection means 1815-1 and 1815-2 respectively are used, but a single DC voltage measuring means may be used by switching to it.

In the fifteenth embodiment, a signal having 90 degrees phase difference is used. Signals having 90 degrees phase difference orthogonal to each other have properties of not affecting each other, and thus, two points can be measured independently.

Depending on an object present between the drive electrodes 315-1 and 315-2 and the detection electrode 415, a relative dielectric constant may change when frequencies are different, i.e., a frequency characteristic is provided, and thus, if a plurality of frequencies are used as in FIG. 18A, FIG. 18B, FIG. 20A, and FIG. 20B according to the fourteenth embodiment, the frequency characteristic of the relative dielectric constant may become an error factor. On the other hand, the fifteenth embodiment has an advantage that a frequency characteristic of a relative dielectric constant does not become an error factor because only a single frequency is required by using a phase difference.

Similarly, when signal detection means and measuring means have frequency characteristics also, the advantage of the fifteenth embodiment can be obtained by requiring only a single frequency.

In the fifteenth embodiment, an example of applying the thirteenth embodiment is described, but other embodiments can also be applied when necessary.

Sixteenth Embodiment

The sixteenth embodiment, FIG. 25A, FIG. 25B, FIG. 25C, and FIG. 26 illustrate an example of detecting a position of a detection electrode using a CM circuit of the present disclosure, and illustrate an example of performing the object detection for detecting a specific position. In FIG. 25A, FIG. 25B, FIG. 25C, and FIG. 26, a circle symbol attached to an end of a lead wire of a detection electrode represents a point connected to signal detection means (unillustrated) and illustration of measuring means is omitted.

Figure 25A:
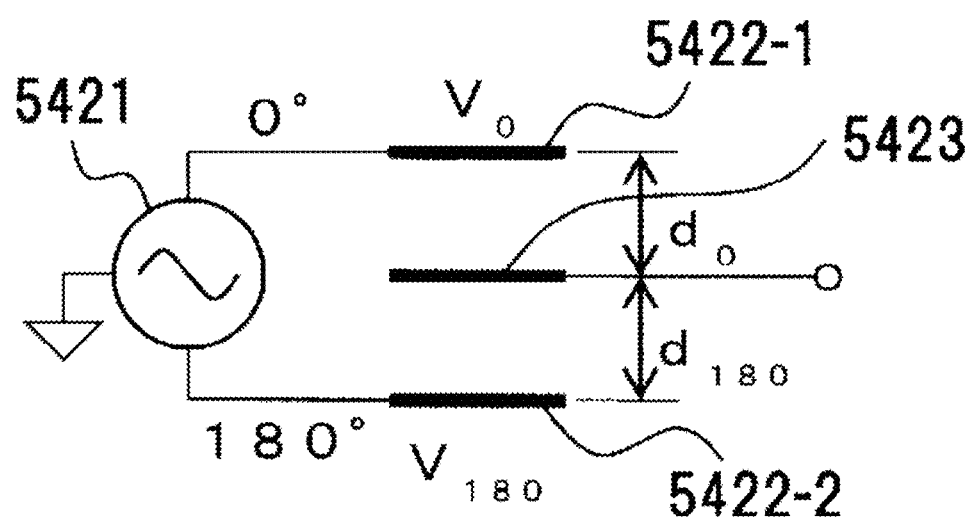
FIG. 25A illustrates an example of position detection according to the sixteenth embodiment.

In an example of FIG. 25A, drive signal generating means 5421 generates different drive signals having 180 degrees phase difference, the signals are applied to two drive electrodes 5422-1 and 5422-2 and the detection electrode 5423 is provided between drive electrodes 5422-1 and 5422-2 in a movable manner. One of drive signals is defined as 0°, a voltage thereof is defined as V0, and an inter electrode distance between a corresponding drive electrode 5422-1 and a detection electrode 5423 is defined as $d_0$. The other drive signal is defined as 180°, a voltage thereof is defined as $V_{180}$, and an inter electrode distance between the corresponding drive electrode 5422-2 and the detection electrode 5423 is defined as $d_{180}$.

If the detection electrode 5423 is moved and when the voltage V0 is equal to voltage $V_{180}$, the inter electrode distance $d_o$ and the inter electrode distance $d1_{80}$ are equal and two drive signals cancel each other, and accordingly, an output amplitude Vout of signal detection means of a CM circuit becomes zero. That is, it is possible to know a fact that the detection electrode 5423 reaches the center of two drive electrodes 5422-1 and 5422-2.

If the detection electrode 5423 is moved when the voltage V0 and the voltage $V_{180}$ are different, two drive signals cancel each other when Equation 10 is satisfied, and as a result, an output amplitude Vout of signal detection means becomes zero. That is, it is possible to know an arbitrary position between two drive electrodes 5422-1 and 5422-2 based on two drive signal voltages.

[Equation 10]

$$\frac{d_0}{d_{180}} = \frac{V_0}{V_{180}} \quad (10)$$

Figure 25B:
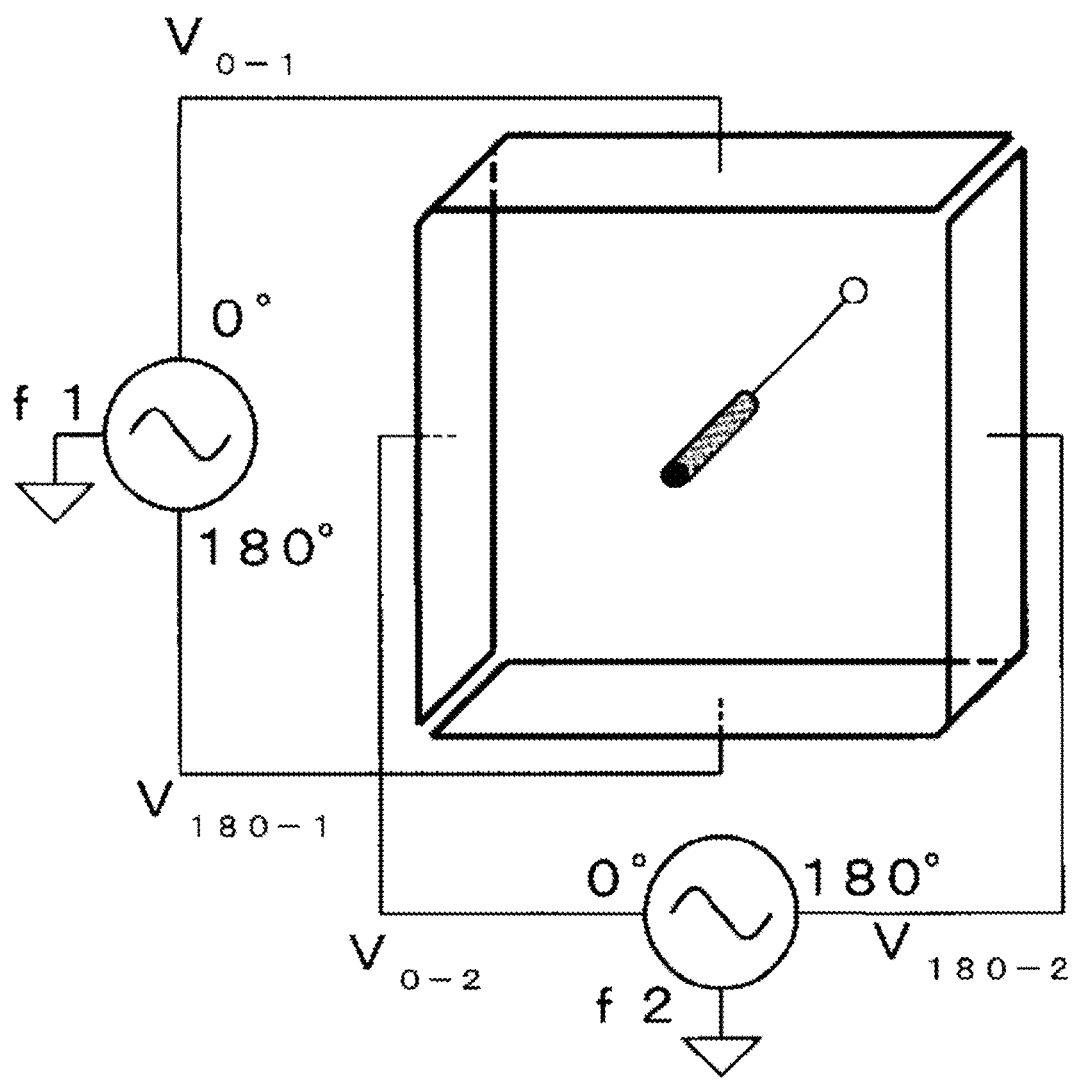
FIG. 25B illustrates an example of position detection according to the sixteenth embodiment.
Figure 25C:
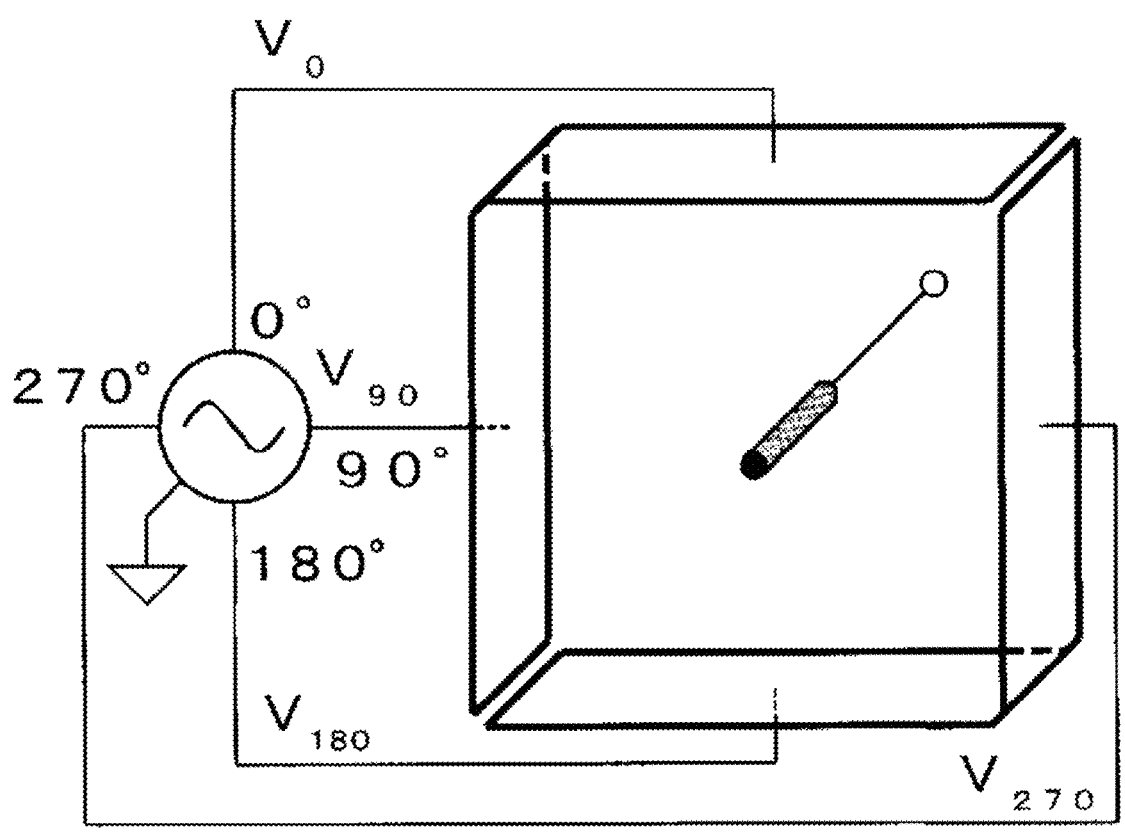
FIG. 25C illustrates an example of position detection according to the sixteenth embodiment.

While FIG. 25A illustrates one-dimensional position detection, FIG. 25B and FIG. 25C illustrate two-dimensional position detection.

FIG. 25B realizes two-dimensional position detection by providing two sets of one-dimensional position detection in FIG. 25A vertically and horizontally. By provision of different frequencies with a drive signal frequency for a vertical position detection as f1 and a drive signal frequency for a horizontal position detection as f2, if methods as in FIG. 18A, FIG. 18B, FIG. 20A, FIG. 20B and FIG. 22 according to the fourteenth embodiment are applied, a position detection in a vertical direction can be performed based on f1 and a position detection in a horizontal direction can be performed based on f2, and thus, it is possible to realize two-dimensional position detection. In FIG. 25B, three-dimensional position detection can also be realized if another set of one-dimensional position detection is added in the front-back direction and a further different frequency f3 is used.

FIG. 25C also realizes two-dimensional position detection by providing two sets of one-dimensional position detection in FIG. 25A vertically and horizontally. In FIG. 25C, vertical position detection is 0 degree and 180 degrees and horizontal position detection is 90 degrees and 270 degrees, and thus, the vertical and horizontal phase difference is 90 degrees. In this case, two-dimensional position detection can be realized with a single frequency because both vertical and horizontal position detections are possible by adopting a method as in FIG. 24 according to the fifteenth embodiment.

FIG. 25B and FIG. 25C illustrate a cylindrical detection electrode such that both the vertical direction and the horizontal direction do not have directivities. A shape of a drive electrode is not limited to a planar shape, but for example four drive electrodes in arc shape of less than 90 degrees may be arranged to form an electrode shape close to a cylinder, and a shape of an electrode may be freely deformed according to an application.

Figure 26:
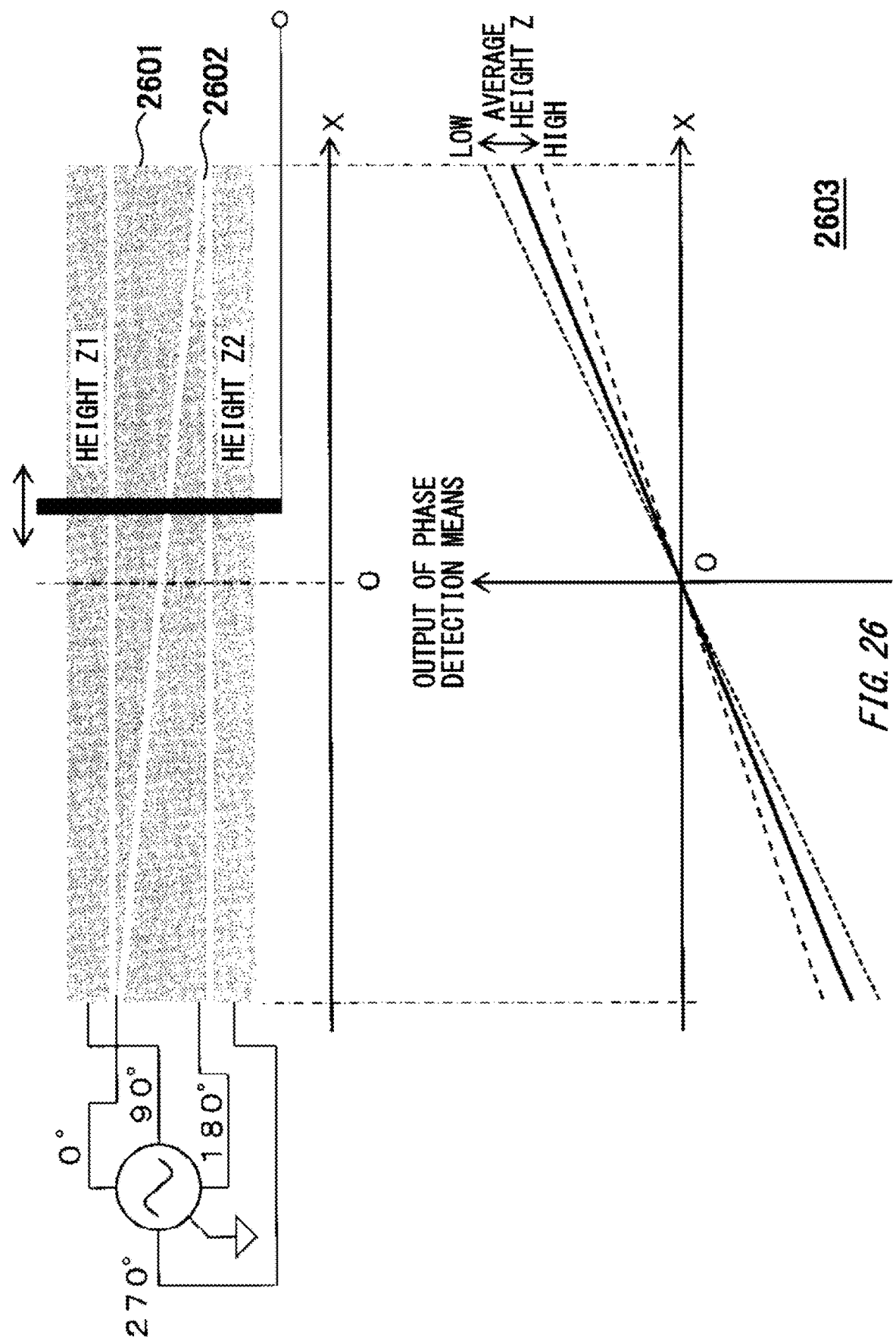
FIG. 26 illustrates an example of position detection according to the sixteenth embodiment.

From a modified example in FIG. 26, it is possible to know a position of a detection electrode in an X direction in a figure, a height of the detection electrode (position in Z direction), and a parallelism relative to a drive electrode.

Two drive signals having 180 degrees phase difference are respectively supplied to an electrode 2601 and an electrode 2602 having right triangle shapes as in FIG. 26. Amplitudes of these two drive signals are assumed to be equal. A case where an elongate detection electrode is provided parallel to a drive electrode plane in a high direction and is movable in left and right directions in a figure is considered. When a detection electrode is at a left side in a figure, a 180 degrees component becomes large, when the detection electrode is at a right side, a zero degree component becomes large, and when the detection electrode is at the center, the zero degree component and the 180 degrees component cancel each other, and accordingly an output voltage of signal detection means becomes zero.

When using phase-detection means that uses a zero degree drive signal as a reference signal as measuring means of a CM circuit, an output of phase-detection means becomes a negative value for a 180 degrees component and the output becomes a positive value for a zero degree component. If a horizontal axis represents a position of a detection electrode present in left and right directions of a drive electrode so that positions of the electrode correspond to the horizontal axis, an output voltage of phase-detection means that uses zero degree drive signal as a reference signal is represented by a solid line in a graph 2603 in FIG. 26.

When a detection electrode is not parallel to a drive electrode plane in a high direction, that is when the detection electrode is inclined so as to be close to one of an electrode 2601 and an electrode 2602 having right triangle shapes and to be far from the other electrode, an output voltage of phase-detection means that uses a zero degree drive signal as a reference signal has an error with respect to a solid line in a graph 2603 in FIG. 26. To maintain a parallelism of a detection electrode so as not to cause such an error, following methods are used in combination.

As illustrated in FIG. 26, supplied to rectangular electrodes respectively are a 90 degrees drive signal and a 270 degrees drive signal having 90 degrees phase difference relative to drive signals supplied to an electrode 2601 and an electrode 2602 having right triangle shapes. When an elongate detection electrode is parallel to a drive electrode plane in a high direction, that is, when a height Z1 and a height Z2 in a figure are equal, a 90 degrees drive signal and a 270 degrees drive signal cancel each other, and as a result, an output voltage of signal detection means that uses a 90 degrees drive signal as a reference signal becomes zero. If the electrode does not become parallel in a high direction, an output voltage of phase-detection means that uses a 90 degrees drive signal as a reference signal becomes a positive or negative value, and thus, an angle of a detection electrode is corrected such that the output voltage becomes zero.

If an average value of highs Z1 and Z2, that is an average height of detection electrodes is defined as Z, depending on whether the average height Z is high or low, an output voltage of phase-detection means that uses a 0 degree drive signal as a reference signal changes as in a graph 2603 in FIG. 26.

An example is shown in which a drive signal having a phase difference of every 90 degrees is used and the phase-detection means separates and measures 0 degree drive signal/180 degrees drive signal and a 90 degrees drive signal/270 degrees drive signal, but the present invention is not limited to this. For example, instead of a pair of 90 degrees and 270 degrees in FIG. 26, a pair of drive signals may have a different frequency from a pair of 0 degree and 180 degrees and have a phase difference of 180 degrees. Instead of a 90 degrees drive signal side and a 270 degrees drive signal side in FIG. 26, if different frequencies are used respectively it is possible to know highs Z1 and Z2 independently. When it is not necessary to know an inclination of a detection electrode, one of rectangular electrodes and a drive signal corresponding thereto can be omitted. When it is not necessary to know a high of a detection electrode, both rectangle electrodes and drive signals thereof can be omitted.

Seventeenth Embodiment

Figure 27:
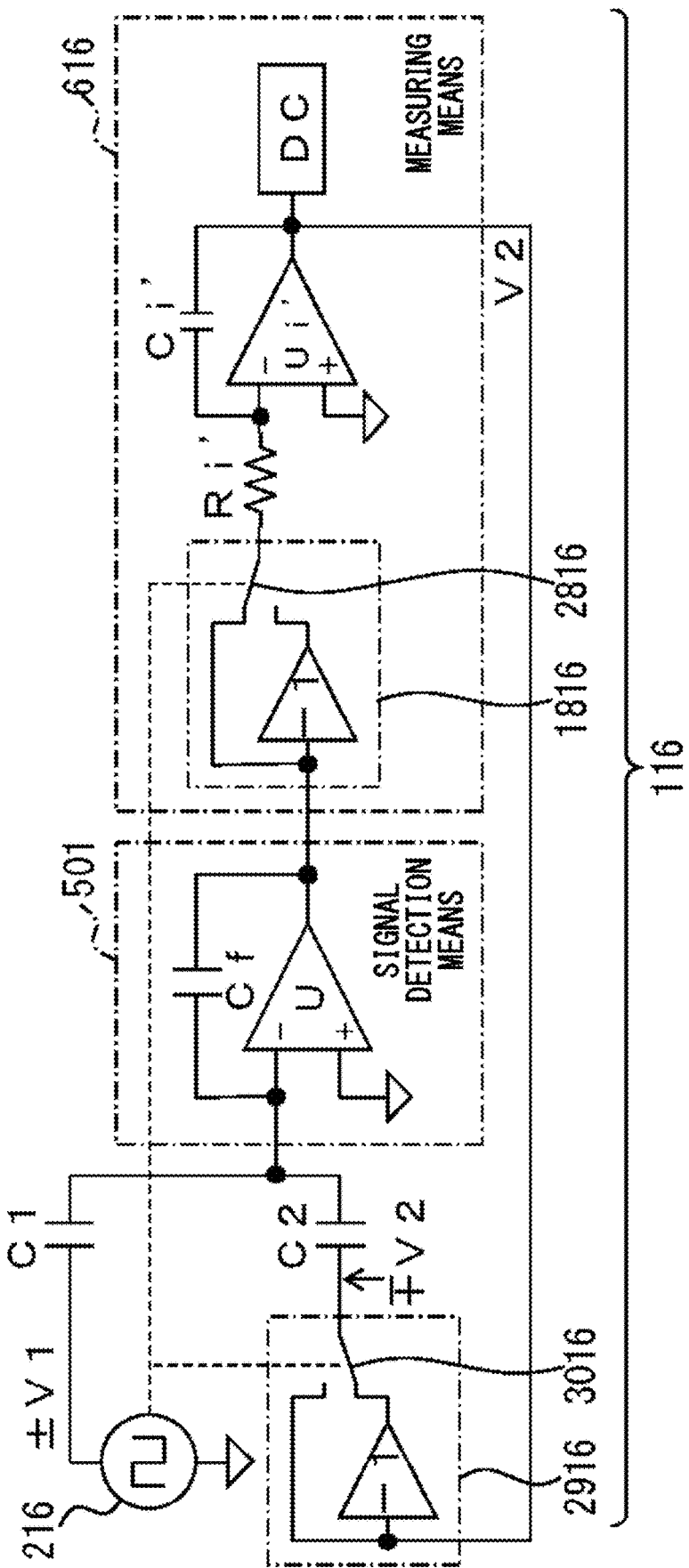
FIG. 27 illustrates one example of a CM circuit according to the seventeenth embodiment.

The seventeenth embodiment shows an application example of obtaining a DC voltage proportional to one of capacitances and inversely proportional to the other capacitance. FIG. 27 illustrates one example of a CM circuit according to the seventeenth embodiment. The same reference numerals are denoted to the same parts as those in FIG. 1, FIG. 2, FIG. 3A, FIG. 5A and FIG. 5B. Descriptions of the same parts as those in any of the first embodiment to the fourth embodiment are omitted.

When as an inversely proportional side capacitance, a reference capacitance is used and a proportional side capacitance is measured as an inter electrode capacitance between a drive electrode and a detection electrode, effects similar to those in the above described embodiments can be obtained.

When as the proportional side capacitance, the reference capacitance is used and the inversely proportional side capacitance is measured as the inter electrode capacitance, a DC voltage inversely proportional to an inter electrode capacitance can be obtained. When an influence of an edge effect of a parallel plate is small, an inter electrode capacitance is substantially inversely proportional to an inter electrode distance, and thus, a DC voltage substantially proportional to an inter electrode distance can be obtained.

In the above described first embodiment, an expression "functional relation" is used, because as in the seventeenth embodiment, not only a DC voltage proportional to a capacitance but also a DC voltage inversely proportional to a capacitance can be obtained.

A configuration and an operation of a CM circuit 116 in FIG. 27 are described in details below.

Drive signal generating means 216 generates a square wave of an amplitude of ±V1 at a drive electrode and is connected to an input of signal detection means 501 via a capacitance C1 that is one example of a first capacitance. The drive signal generating means 216 further generates a changeover switch signal synchronized with a square wave and switches and drives a switch 2816 and a switch 3016.

In the above described thirteenth embodiment, as an example of realizing phase-detection means with an analog circuit, a circuit has been described in which a reference signal supplied from drive signal generating means is a square wave and thereby positive/negative of again is switched. Phase-detection means in measuring means 616 of the seventeenth embodiment is one example of first phase-detection means, phase-detection means using such analog circuit is exemplified, and the above described changeover switch signal is a reference signal to switch positive/negative of a gain. A triangle symbol "−1" in the phase-detection means 1816 represents an inverting amplifier circuit having a gain of one time and an output of an inverting amplifier is supplied to one of contacts of a switch 2816 in the phase-detection means 1816. Although an input of the phase-detection means 1816 is directly supplied to the other contact of the switch 2816, a non-inverting amplifier circuit having a gain of one time may be used when necessary. If an inverting amplifier circuit having a gain absolute value larger than one and a non-inverting amplifier circuit having the same gain absolute value are used, high sensitivity similar to that in the above described tenth embodiment can be realized.

An output of the phase-detection means 1816, that is a common contact of the switch 2816 is connected to an input of an integrating circuit. The integrating circuit is one example of averaging means, includes an amplifier Ui', an integrator resistance Ri', and an integral capacity Ci', and converts an output of the phase-detection means 1816 into a direct current. This DC voltage is V2.

The DC voltage V2 is connected to an input of the DC voltage measuring means DC and an input of a circuit 2916 similar to that in the phase-detection means 1816. The circuit 2916 is one example of second phase-detection means, and the DC voltage V2 is directly supplied to one of contacts of a switch 3016 in a circuit 2916 and a DC voltage −V2 obtained by inverting DC voltage V2 is supplied to the other contact. The switch 3016 is switched and driven by the above described changeover switch signal and operates such that when a voltage of a drive electrode is +V1, a contact of a switch of a DC voltage −V2 side and a common contact are connected and when a voltage of a drive electrode is −V1, a contact of a switch of a DC voltage V2 side and a common contact are connected. The common contact of the switch is connected to an input of the signal detection means 501 via a capacitance C2 that is one example of a second capacitance.

A circuit in FIG. 27 operates so as to satisfy Equation 11 below.

[Equation 11]

$$V1 \cdot C1 = V2 \cdot C2 \tag{11}$$

Equation 12 can be obtained by modifying Equation 11.

[Equation 12]

$$V2 = V1 \frac{C1}{C2} \tag{12}$$

Here, V1 is a known value. Equation 12 shows that the DC voltage V2 is proportional to the capacitance C1 and inversely proportional to the capacitance C2.

If a capacitative element that makes C2 a reference capacitance is used and C1 is operated as an inter electrode capacitance, as similar to the above described embodiments, a DC voltage V2 proportional to the inter electrode capacitance C1 can be obtained.

On the other hand, if a capacitative element that makes C1 a reference capacitance is used and C2 is operated as an inter electrode capacitance, a DC voltage V2 inversely proportional to the inter electrode capacitance C2 can be obtained. When an edge effect of a parallel plate electrode is in a negligible level, an inter electrode capacitance and an inter electrode distance are substantially inversely proportional, and thus, as a DC voltage V2, a DC voltage substantially proportional to an inter electrode distance can be obtained.

In the seventeenth embodiment also, other embodiments can be applied when necessary.

Eighteenth Embodiment

Figure 28A:
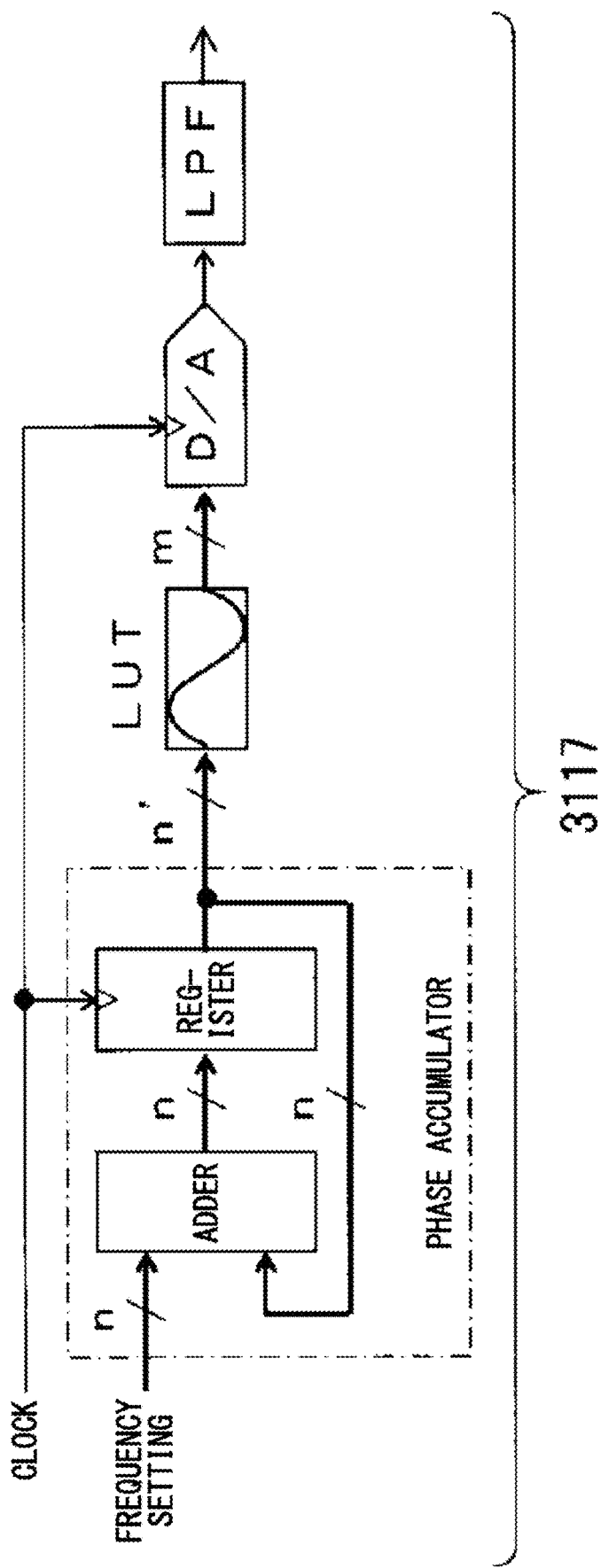
FIG. 28A illustrates one example of DDS according to the eighteenth embodiment.
Figure 28B:
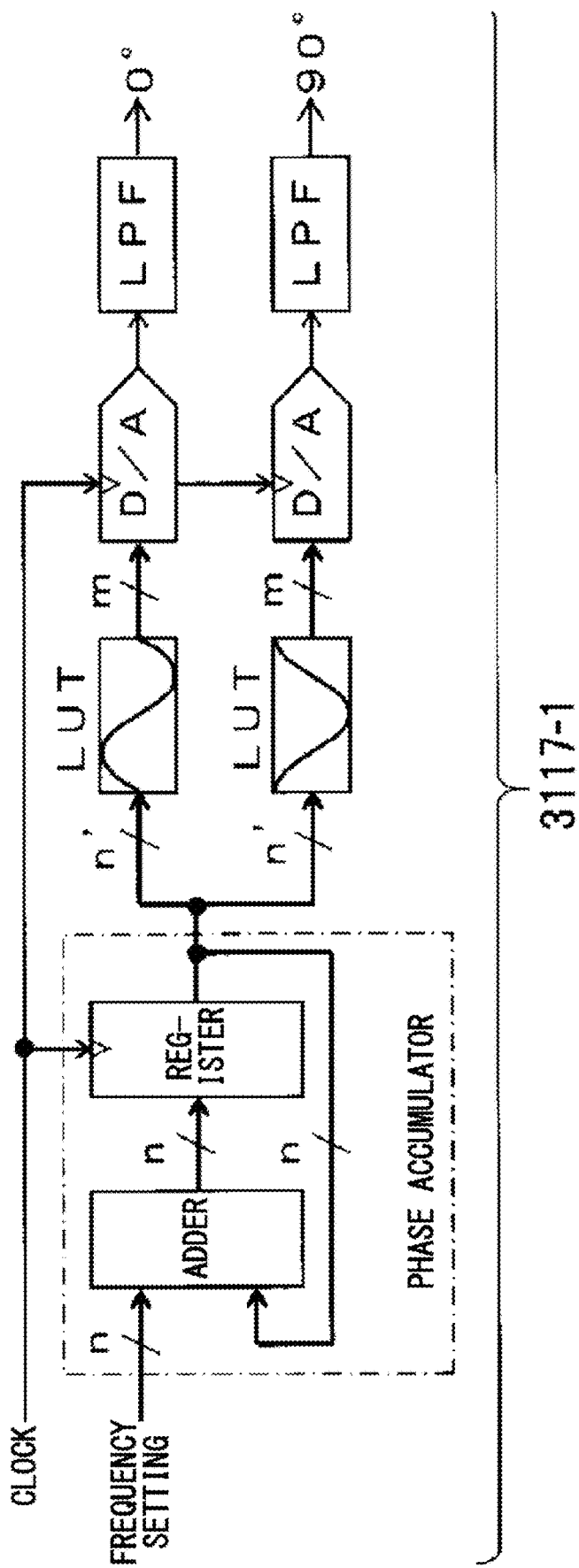
FIG. 28B illustrates one example of DDS according to the eighteenth embodiment.

The eighteenth embodiment shows an example of using DDS as drive signal generating means. That is, the embodiment shows an example of using drive signal generating means including DDS. FIG. 28A and FIG. 28B illustrate one example of DDS according to the eighteenth embodiment.

ADDS 3117 in FIG. 28A includes a phase accumulator, an LUT (lookup table), a D/A converter (D/A), and an LPF (low-pass filter). A phase accumulator including an adder and a register (latch, D-F/F) increases values by a frequency setting value every clock (that is phase advances) and outputs a frequency proportional to the frequency setting value. More specifically when a clock frequency is $f_{CLK}$, an adder and a register are each n bits (binary), and frequency setting value is fset, an output frequency fout of the DDS 3117 is expressed as Equation 13, and an output frequency fout of a frequency proportional to a frequency setting value fset is obtained.

[Equation 13]

$$fout = \frac{f_{CLK}}{2^n} fset \qquad (13)$$

If a D/A conversion is directly applied to an output of a phase accumulator, a saw-tooth wave is obtained. A sine wave is obtained by converting n' bits of output n bits of the phase accumulator (n≥n') into digital data corresponding to a sine wave by a $2^{n'}$ word LUT and applying a D/A conversion to the data. An LUT is usually configured by an ROM (Read-Only Memory), but may be configured from an RAM (Random-Access Memory).

Depending on data contents of the LUT, arbitrary waveform data other than a sine wave can be generated. A waveform including a plurality of frequency components can be generated by storing, in the LUT, for example waveform data including a plurality of frequency components of frequencies f1 to fn.

When an m bit D/A converter is used, m bits out of an output of the LUT are supplied to a D/A converter. In this case, the number of output bits of the LUT needs to be m bits or more, and when the number of output bits is less than m bits, a part of resolution of a D/A converter is wasted.

Figure 29A:
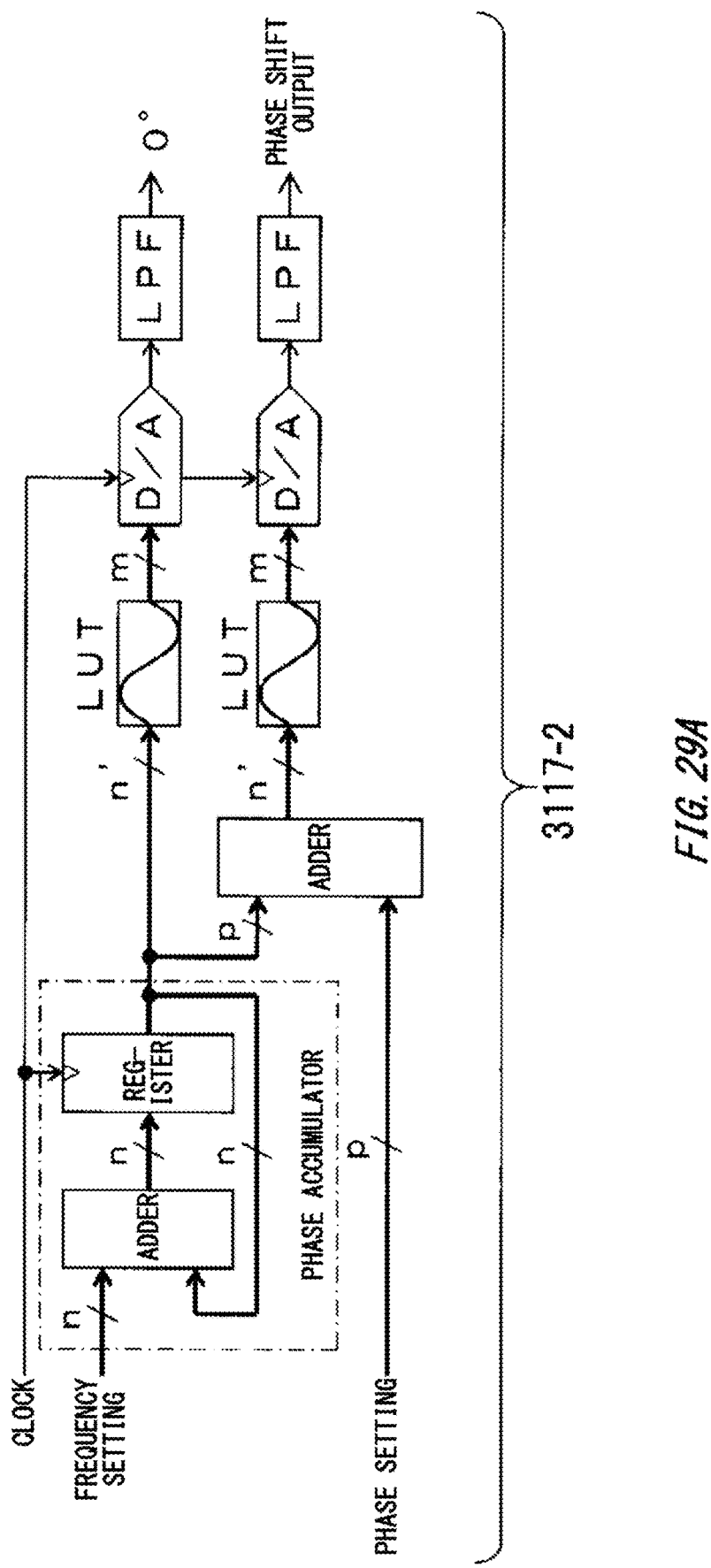
FIG. 29A illustrates one example of DDS according to the eighteenth embodiment.

When a transient state such as a delay time of a digital circuit is in unnegligible level, a register is provided in front of a D/A converter to retrieve waveform data every clock, and accordingly, an excellent D/A conversion result can be obtained. FIG. 28A, FIG. 28B, and FIG. 29A illustrate a DA converter incorporating such register.

An output of a D/A converter is a stepped-wave like analog waveform and contains an unnecessary frequency component, and thus, a desired waveform is obtained by removing an unnecessary frequency component (spurious) by using an LPF. When a sine wave of a single frequency is output, a spurious performance can be further improved by using a BPF (bandpass filter).

The DDS is a well-known technique, and thus, more detailed descriptions of the DDS are omitted.

FIG. 28B illustrates a DDS 3117-1 and one example of a method of obtaining a waveform having the same frequency and different phases, and a waveform having different phases is obtained by storing waveform data having different phases in the LUT. That is, 0 degree output side LUT store sine wave (sin) data, 90 degrees output side LUT stores cosine wave (cos) data, and the same DDS output is supplied to an input of the LUT.

In the above described sixteenth embodiment, 180 degrees waveform that is an inverted waveform of 0 degree waveform and 270 degrees waveform that is an inverted waveform of 90 degrees waveform may be used. When four LUTs, DA converters, and LPFs are used, 180 degrees waveform can be obtained by storing inverted sine wave data in the LUT and 270 degrees waveform can be obtained by using the inverted cosine wave data. Further, 180 degrees waveform and 270 degrees waveform can be obtained by inverting 0 degree waveform and 90 degrees waveform by using an inverting amplifier.

Here, an example of storing phase difference data of 90 degrees unit in the LUT is shown, but the present invention is not limited to this as long as a method is related to an LUT, and a waveform having an arbitrary phase difference can be obtained by storing free phase difference data.

When data contents stored in the LUT are fixed, for example, if only an LUT storing sine wave (sin) data can be used, phases can be changed by a digital adder. By an adder added to a DDS 3117-2 in FIG. 29A, a phase shift output in which a phase advances by a phase setting value is obtained by adding the phase setting value to an output of a phase accumulator. When bit number of a phase accumulator is n and bit number of a phase setting value is p, n≥p needs to be satisfied. (when n<p, a part of a phase resolution by an adder is wasted.) A phase accumulator and an adder are connected such that their MSBs (Most Significant Bits) match and when n>p, a fixed value (generally zero) is given to extra lower bits. The phase resolution at this time is 360°÷2p.

In the above described thirteenth embodiment and fifteenth embodiment, a drive signal having a 90 degrees phase difference is used. Further, in the above described sixteenth embodiment, 180 degrees waveform that is an inverted waveform of 0 degree waveform and 270 degrees waveform that is an inverted waveform of 90 degrees waveform may be used. If a phase difference is multiple of 90 degrees, an adder for obtaining a waveform having different phases can be simplified, and thus, such configuration will be described below.

The n bits output of the phase accumulator takes values of 0 to $2^n-1$. On the other hand, to obtain an output having 180 degrees phase difference, $2^{n-1}$ may be added to an output of a phase accumulator, and this corresponds to adding one to MSB, that is inversion of MSB. In this case, bits other than MSB do not change, and thus, values thereof may be used as they are.

Similarly, to advance a phase by 90 degrees, $2^{n-2}$ may be added to an output of a phase accumulator, but this corresponds to adding one to values of upper 2 bits of the phase accumulator. To delay a phase by 90 degrees, $2^{n-2}$ may be subtracted from an output of a phase accumulator, but this corresponds to subtracting one from values of upper 2 bits of a phase accumulator. In this case, bits other than upper 2 bits do not change, and thus, values thereof may be used as they are.

A truth table in FIG. 29A represents values of upper 2 bits including MSB. For example, when upper 2 bits of 0 degree are 00, at 90 degrees upper 2 bits are 01, at 180 degrees, upper 2 bits are 10, and at 270 degrees, upper 2 bits are 11.

To satisfy the truth table in the case of 90 degrees, the exclusive OR (XOR) may be applied to upper 2 bits of 0 degree to obtain 90 degrees MSB and the logic negation (NOT) may be applied to second bit from top of 0 degree to obtain second bit from a top of 90 degrees. For 180 degrees, 0 degree MSB may be inverted and second bit from a top may be used as it is. Similarly, for 270 degrees, 90 degrees MSB may be inverted and second bit from a top of 90 degrees may be used as it is. Logical operation symbols below the truth table in FIG. 29A indicate such processes.

If such method is used to obtain a drive signal having a phase difference of 90 degrees units, a phase can be shifted with a simple logic circuit without using a multi-bit adder, and thus, the DDS can be realized at a lower cost. If characteristics of a D/A converter and an LPF of each phase and a timing of the D/A conversion match, a signal having an accurate phase difference of 90 degrees unit can be obtained.

In an example of realizing phase-detection means by using an analog circuit as described in the above described thirteenth embodiment and illustrated in the seventeenth embodiment, positive/negative of a gain is switched by a square wave reference signal. For a reference signal of this case, each MSB supplied to a LUT of each phase can be used.

Nineteenth Embodiment

Figure 30:
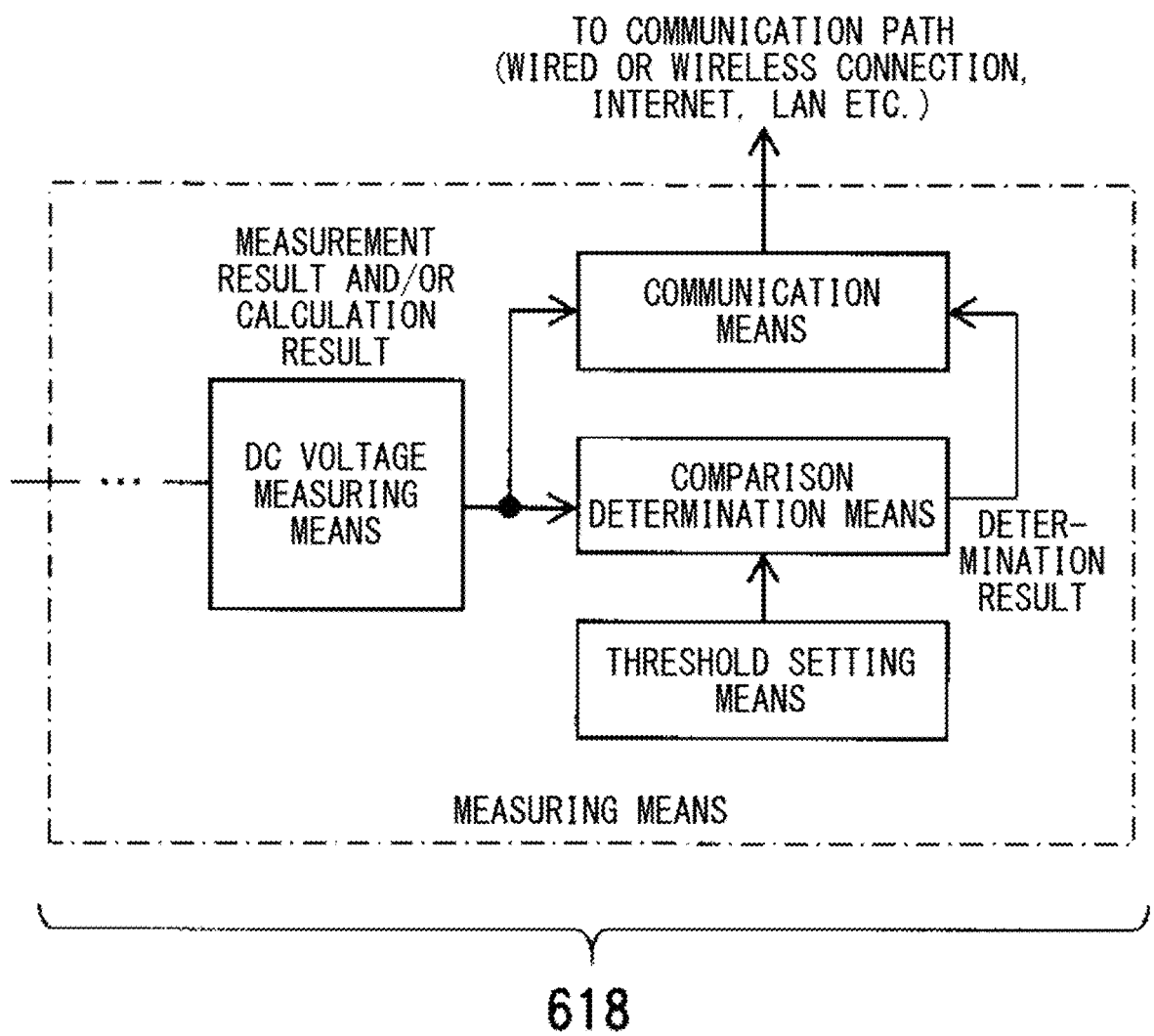
FIG. 30 illustrates one example of measuring means according to the nineteenth embodiment.

The nineteenth embodiment shows a modified example of adding comparison determination means and threshold setting means in measuring means and adding communication means in the measuring means. FIG. 30 illustrates one example of measuring means according to the nineteenth embodiment.

Measuring means of a CM circuit of the present disclosure can obtain various measurement results such as an output amplitude Vout of signal detection means, an inter electrode capacitance Cx, an inter electrode distance, and an object state. Various determinations can be performed by providing the various measurement results to comparison determination means when necessary.

Such comparison determination means may use an analog comparator for a voltage value or may perform a comparative determination based on a digital value in the case of digital processes. The threshold setting means provides a threshold for the comparison determination means to the comparison determination means.

Most simply, a single comparison determination means can determine as normal when a measurement result exceeds a certain value and as abnormal when a measurement result is equal to or less than a certain value (or as abnormal when a measurement result exceeds a certain value and as normal when a measurement result is equal to or less than a certain value). If two comparison determination means are used, as one example, the means can determine as normal if a result is within a certain range (for example, higher than a threshold of comparison determination means 1 and equal to or lower than a threshold of comparison determination means 2), as abnormal 1 if a result is lower than the certain range (for example, lower than a threshold of comparison determination means 1), and as abnormal 2 if a result is higher than the certain range (for example, higher than a threshold of comparison determination means 2). If necessary, arbitrary comparative determination such as a plurality of range determinations may be performed by using more comparison determination means.

Similarly, the comparison determination means can determine a rise time of a measurement result, a fall time, a time holding at or below a certain value, a time holding at or above a certain value and the like. Further, the comparison determination means can determine a magnitude and a ratio of these various times. A fourth example described later, and FIG. 51A to FIG. 53B illustrate one example of a specific application of such determination.

Information such as a measurement result and a determination result obtained by comparison determination means of a CM circuit of the present disclosure can be transmitted to a computer or the like via various types of communication, and a computer or the like can store data and perform appropriate information processing. For example, the present invention can be applied to so called IoT (Internet of Things) in which by connecting to the Internet via a wired or wireless connection, information is transmitted to an appropriate destination (including remote place), and appropriate information processing is performed. Of course, information can be transmitted to a computer or the like in a factory by a LAN (Local Area Network) or another communication means.

Such comparison determination means, threshold setting means, and communication means are included in the measuring means. Measuring means 618 illustrated in FIG. 30 is an example of including all of comparison determination means, threshold setting means, and communication means. The measuring means 618 may include only the comparison determination means and the threshold setting means, or may include only the communication means, or may not include both the comparison determination means and the threshold setting means.

As one example of a specific application, when a CM circuit of the present disclosure is used as an electrostatic capacitive displacement meter for performing the object detection, if the CM circuit is used such that the comparison determination means detects moving an object close to/moving an object away from between electrodes, the CM circuit can be used as "proximity sensor". Further in this case, if the comparison determination means determines whether a measurement result exceeds a threshold, the comparison determination means can be used as a "proximity switch" for determining whether an object is close to between electrodes more than the certain extent.

Twentieth Embodiment

Figure 31A:
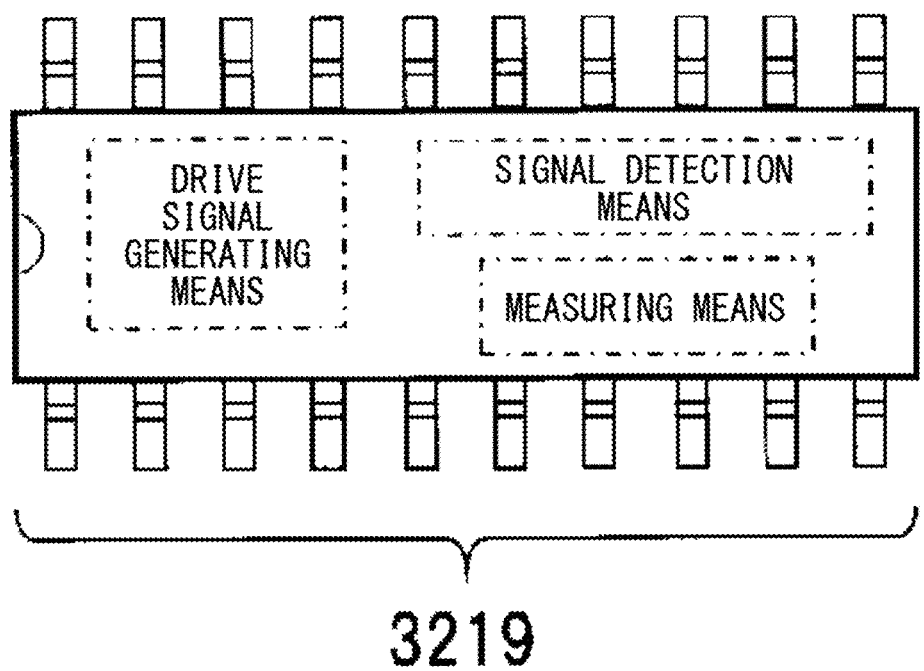
FIG. 31A illustrates one example of a CM circuit according to the twentieth embodiment.
Figure 31B:
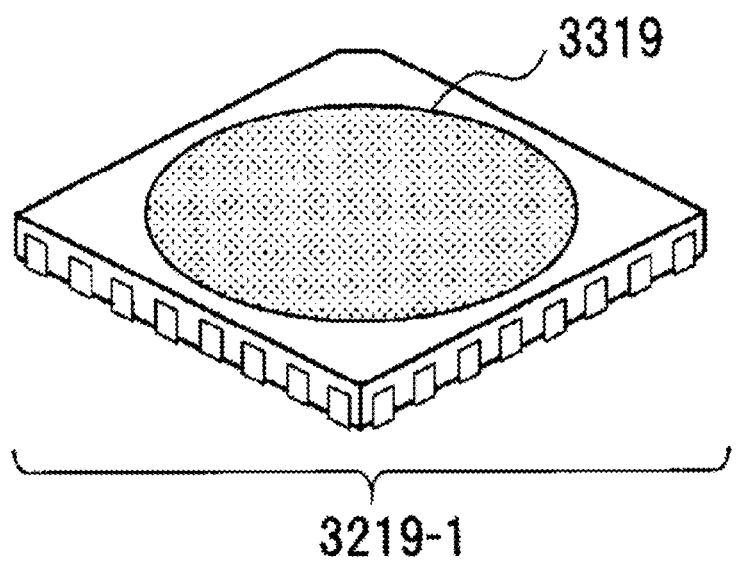
FIG. 31B illustrates one example of a CM circuit according to the twentieth embodiment.
Figure 31C:
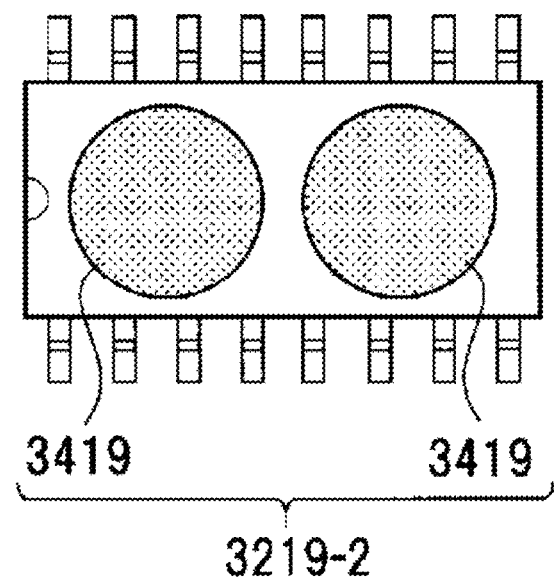
FIG. 31C illustrates one example of a CM circuit according to the twentieth embodiment.
Figure 31D:
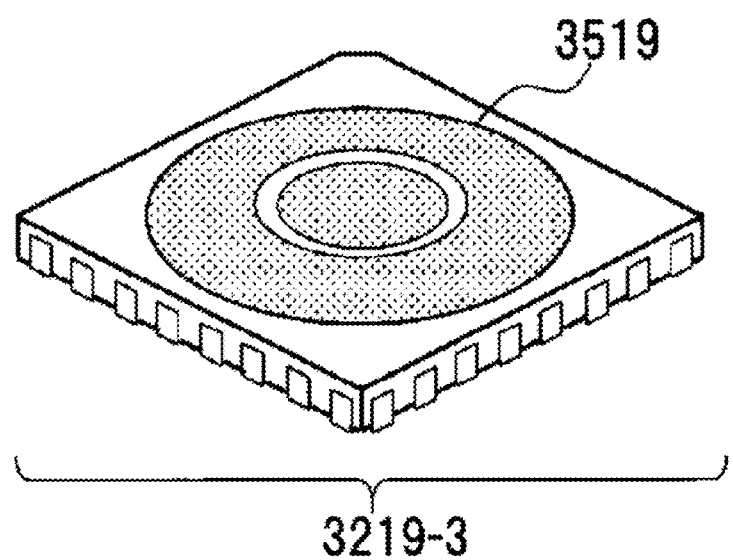
FIG. 31D illustrates one example of a CM circuit according to the twentieth embodiment.
Figure 32:
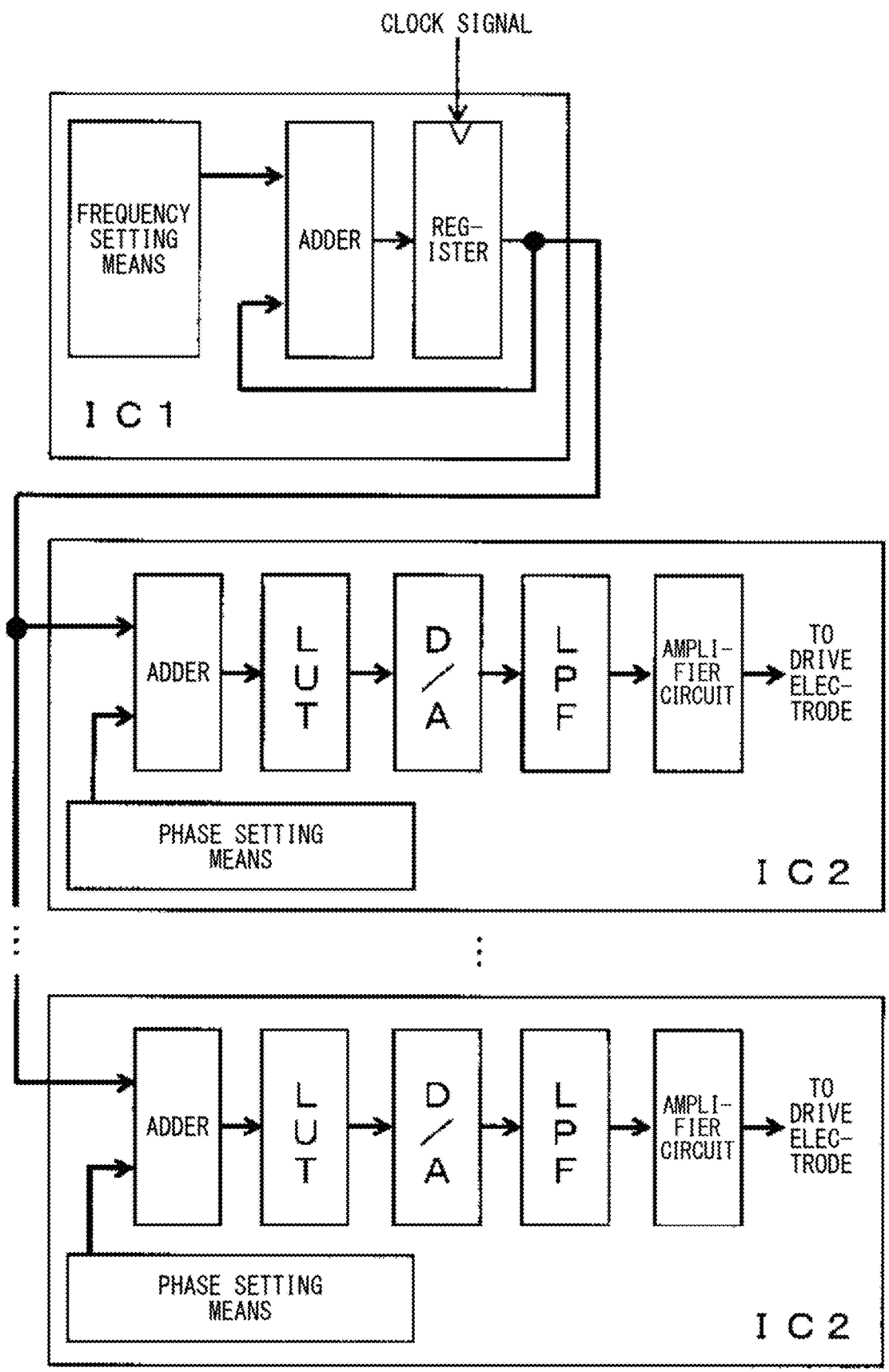
FIG. 32 illustrates one example of a CM circuit according to the twentieth embodiment.

The twentieth embodiment shows an example of mounting drive signal generating means, a drive electrode, a detection electrode, signal detection means, and/or measuring means on an IC. FIG. 31A to FIG. 32 illustrate one example of a CM circuit according to the twentieth embodiment.

It is beneficial to mount, on an IC, basic components in a CM circuit of the present disclosure, that are some of five component: drive signal generating means, a drive electrode, a detection electrode, signal detection means, and measuring means. Here, an IC includes a wide range of ICs such as monolithic ICs and hybrid ICs regardless of the form of the package.

For example, as illustrated in FIG. 31A, all or part of electrical circuits such as drive signal generating means, signal detection means, and measuring means are mounted on an IC 3219, and accordingly a CM circuit of the present disclosure and an electrostatic capacitive displacement meter using it can be small in size and low in price.

The above described fourteenth embodiment shows an example of using a plurality of pairs of drive signal generating means and drive electrodes and using a plurality pairs of detection electrodes and signal detection means. If used in such form, an IC 3219-1 as in FIG. 31B in which an electrode 3319 such as a drive electrode is integrated on a surface of a package of an IC including drive signal generating means, and an IC 3219-1 in which a detection electrode is integrated on a surface of a package of an IC including at least signal detection means are especially effective. An electrode can be provided on a back surface of an IC package when necessary.

As an electrostatic capacitive displacement meter for performing the object detection, if a relative positional relationship between a drive electrode and a detection electrode may be fixed, it is effective to provide both a drive electrode and a detection electrode on a surface or the like of a package of an IC to form an IC together with an electrical circuit. In such a case, as illustrated in FIG. 31C and FIG. 31D, a parallel electrode 3419 or a concentric electrode 3519 described in a first example described later may be provided on packages of ICs 3219-2 and 3219-3.

In the ICs 3219-1, 3219-2, and 3219-3, circular electrodes are exemplified, but a shape and a dimension of an electrode can be freely selected when necessary.

It is possible to mount some of components of a CM circuit of the present disclosure on an IC. For example, considered is a case where a DDS as in the eighteenth embodiment is used as drive signal generating means and a plurality of drive signals having a phase difference in units of 90 degrees are obtained. FIG. 32 illustrates one example of dividing drive signal generating means by a DDS into two types of ICs.

An IC 1 includes frequency setting means, an adder, and a register supplied with a clock signal, and an output of a phase accumulator by the adder and the register is output to the outside.

In an IC 2, a phase is shifted by the adder receiving an output of the IC 1 and a value of phase setting means, a waveform is generated via an LUT, a D/A converter, and an LPF, the waveform is amplified to a necessary voltage at an amplifier circuit, and the voltage is supplied to a drive electrode. In the IC 2, as in FIG. 31B, an IC package may include an electrode.

Figure 29B:
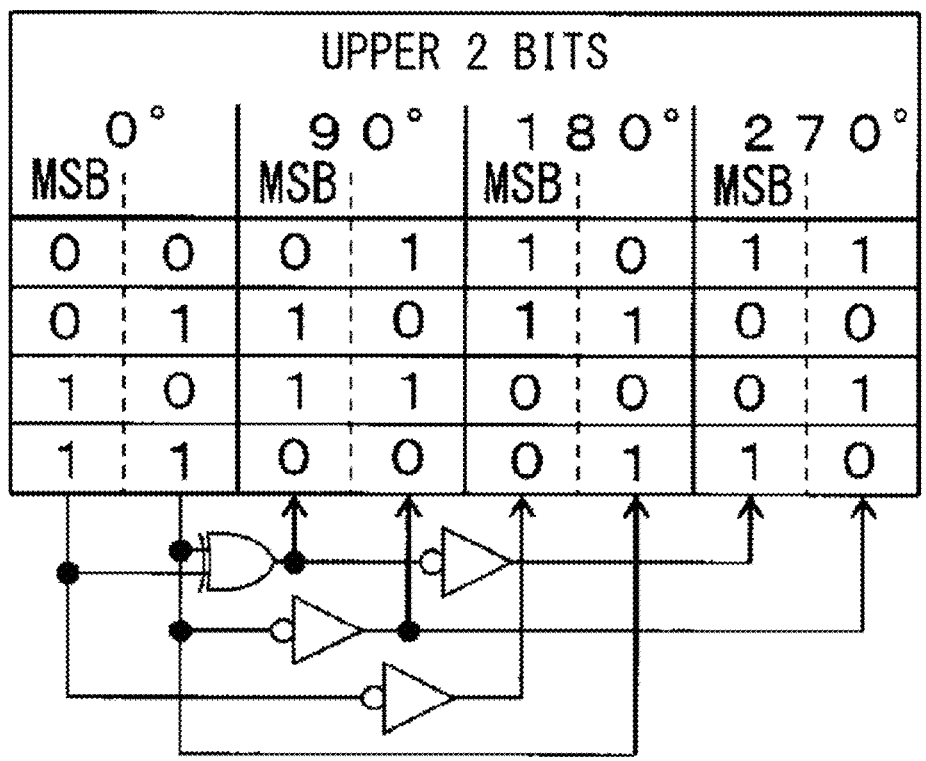
FIG. 29B illustrates one example of a truth table of DDS according to the eighteenth embodiment.

When the IC 1 and the IC 2 are applied to the CM circuit of the present disclosure, it is sufficient if the circuit has a phase difference in units of 90 degrees, and thus, phase shift means by upper 2 bits as in FIG. 29A of the eighteenth embodiment may be used instead of the adder. In this case, phase selection means may select 0 degree, 90 degrees, 180 degrees, or 270 degrees and may switch circuits as illustrated below a table in FIG. 29B by a selector.

If both 0 degree signal and 90 degree signal are necessary, one IC 1 and two ICs 2 may be used. If four signals that are 0 degree signal, 90 degree signal, 180 degree signal, and 270 degree signal are necessary one IC 1 and four ICs 2 may be used. An output of the IC 1 is a multi-bit width digital signal, and wiring can be simplified by applying a parallel-serial conversion to the output of the IC 1 and applying serial-parallel conversion to an input of the IC 2.

An example was shown in which the DDS of the drive signal generating means is divided into two types of ICs and each IC becomes a part of the drive signal generating means.

As the measuring means 614 and 614-2 of the fourteenth embodiment, when measuring means includes a plurality of sets of filters fc1 . . . fcn and AC voltage measuring means AC1 . . . ACn, it is effective to make a combination of a filter and AC voltage measuring means into one IC. Similarly as in the measuring means 614-1 of the fourteenth embodiment, if measuring means includes a plurality of sets of phase-detection means 1814-1 . . . 1814-n, averaging means 1914-1 . . . 1914-n, and DC voltage measuring means DC1 . . . DCn, it is effective to make all or part of combines of phase-detection means, averaging means, and DC voltage measuring means into one IC. The fourteenth embodiment also shows an example of using a plurality of signal detection means 501, and thus the signal detection means 501 can be made into an IC. In this case, it is more effective if an IC includes a detection electrode.

In this manner, which part of components on the CM circuit of the present disclosure is to be mounted on an IC can be freely selected when necessary.

Twenty-First Embodiment

The twenty-first embodiment shows an electrostatic capacitive displacement meter applied with the CM circuit as in the above described embodiments. Main applications of an electrostatic capacitive displacement meter can be roughly divided into distance measurement and the object detection for knowing a state of an object affecting a capacitance.

Figure 33A:
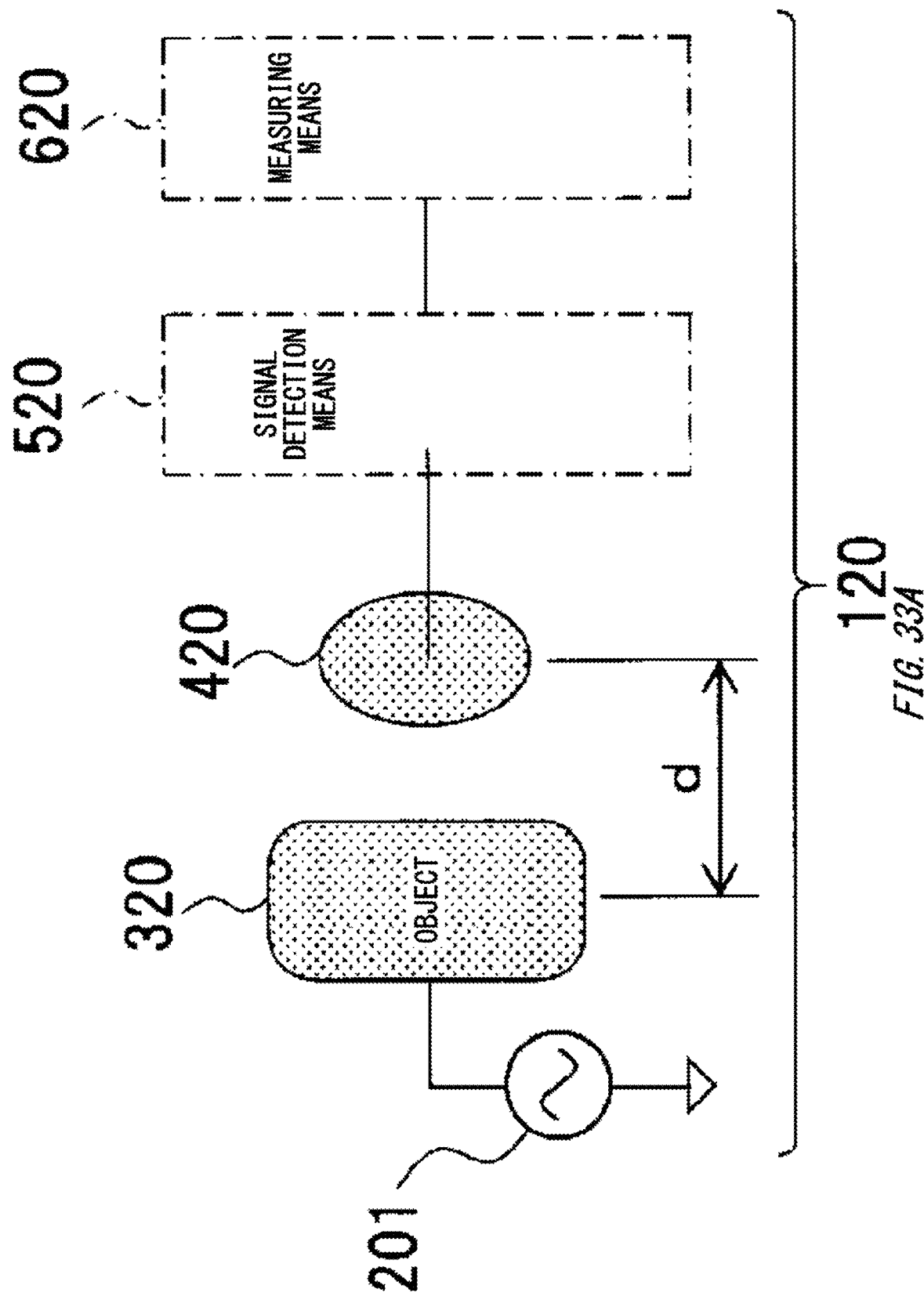
FIG. 33A illustrates an example in which an electrostatic capacitive displacement meter according to the twenty-first embodiment is used for the distance measurement.
Figure 33B:
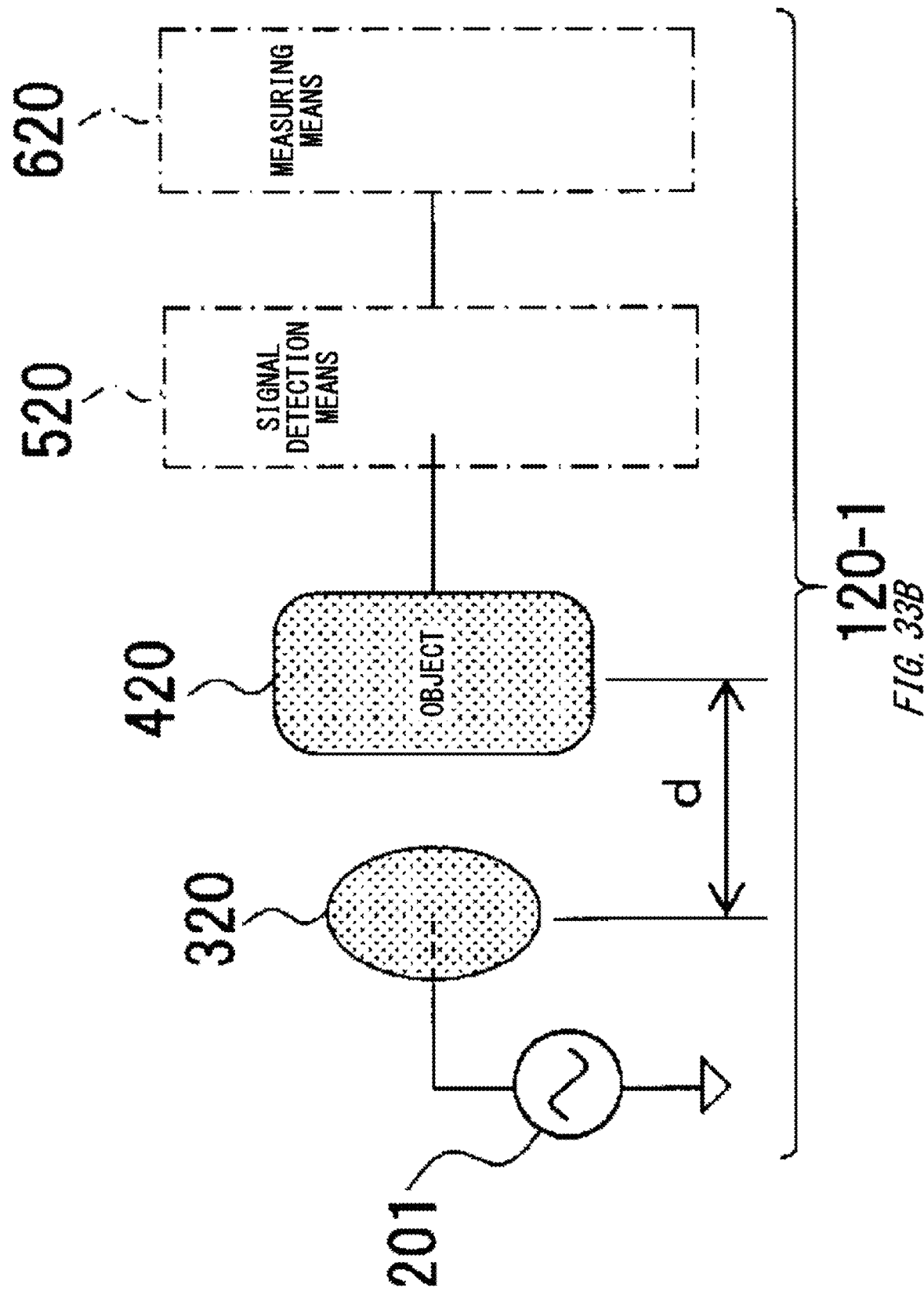
FIG. 33B illustrates an example in which an electrostatic capacitive displacement meter according to the twenty-first embodiment is used for the distance measurement.
Figure 33C:
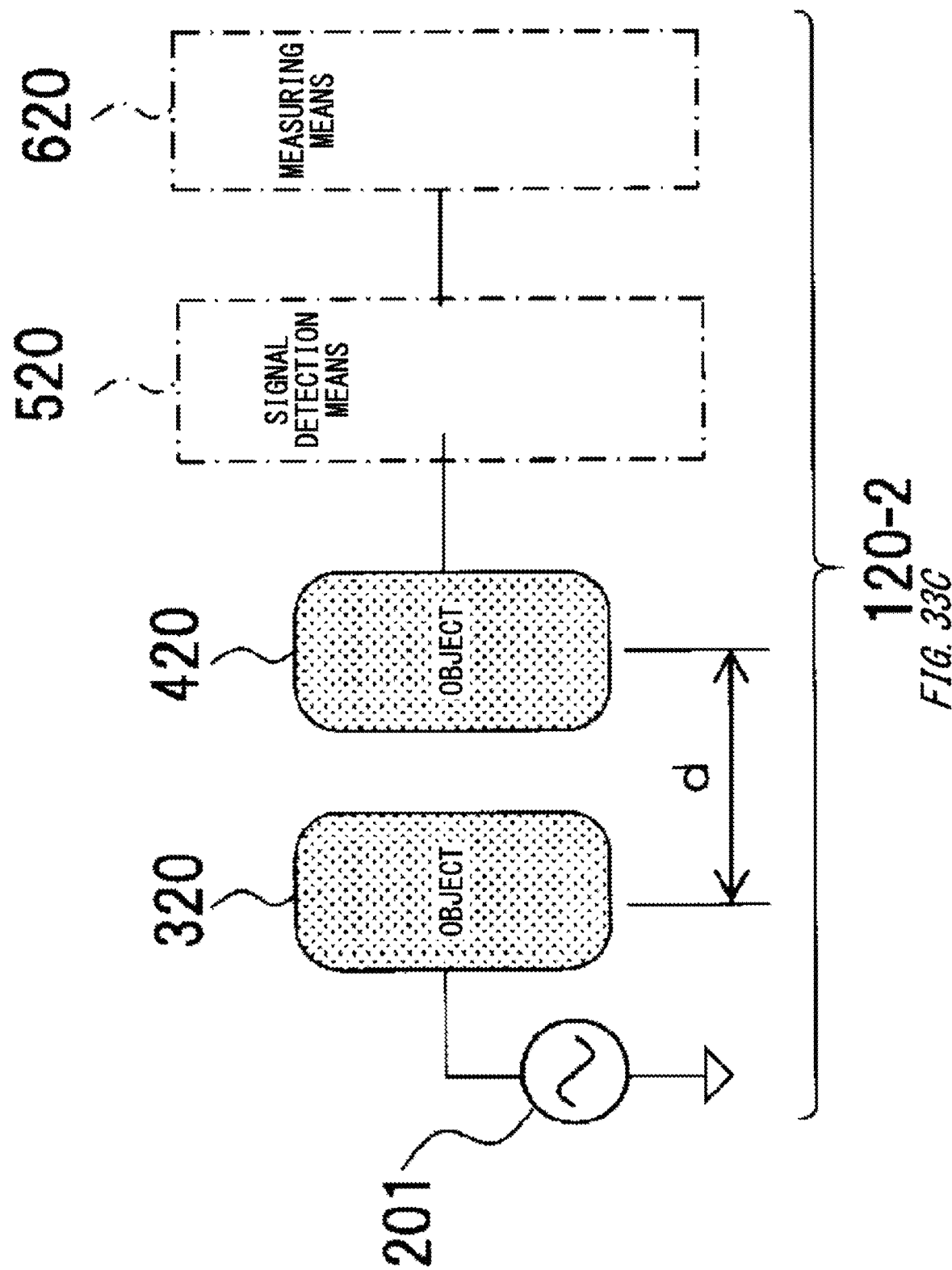
FIG. 33C illustrates an example in which an electrostatic capacitive displacement meter according to the twenty-first embodiment is used for the distance measurement.

FIG. 33A to FIG. 33C illustrate a case where electrostatic capacitive displacement meters 120, 120-1, and 120-2 are used for distance measurement. The same reference numerals are denoted to the same parts as those in FIG. 1, FIG. 2, FIG. 3A, FIG. 5A and FIG. 5B. Descriptions of the same parts as those in any of the first embodiment to the fourth embodiment are omitted. Each of the electrostatic capacitive displacement meters 120, 120-1, and 120-2 includes a drive electrode 320, a detection electrode 420, signal detection means 520, and measuring means 620. The drive electrode 320 is the above described drive electrode 301 or an object and the detection electrode 420 is the above described detection electrode 401 or an object. A combination of the signal detection means 520 and the measuring means 620 may be any of combinations of signal detection means and measuring means described above in the first embodiment to the twentieth embodiment.

There are following three types of distance measurement: (1) a case where a drive electrode 320 is regarded as an object and an inter electrode distance d between the object and a detection electrode 420 is measured (FIG. 33A), (2) a case where a detection electrode 420 is regarded as an object and an inter electrode distance d between a drive electrode 320 and the object is measured (FIG. 33B), and (3) a case where both a drive electrode 320 and a detection electrode 420 are regarded as objects, and an inter electrode distance d between the objects is measured (FIG. 33C). These specific examples will be described in a first example to a third example.

When an object is not a conductor, distance measurement can be performed similarly by attaching (for example affix) an electrode to the object.

Figure 34A:
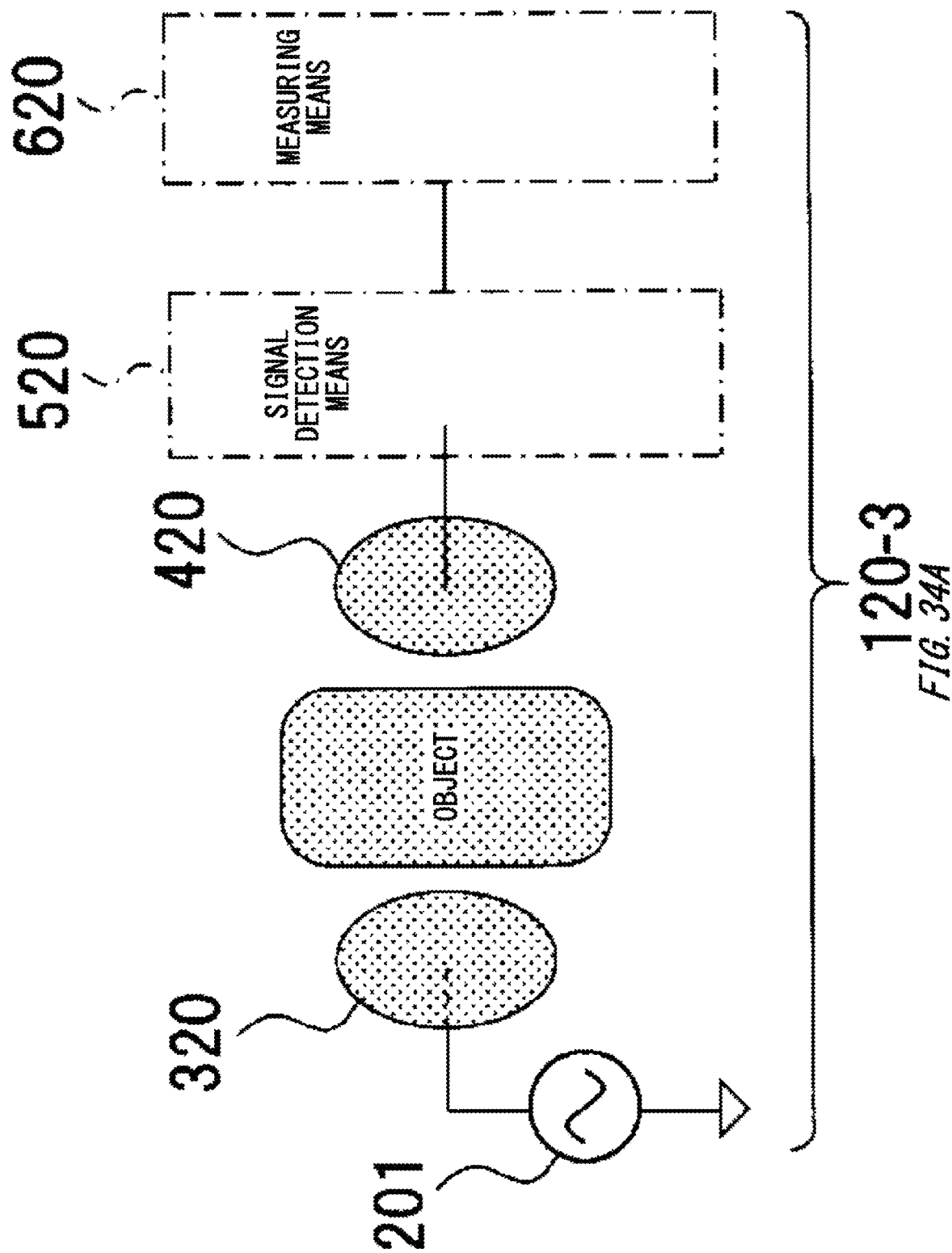
FIG. 34A illustrates an example in which an electrostatic capacitive displacement meter according to the twenty-first embodiment is used for the object detection.
Figure 34B:
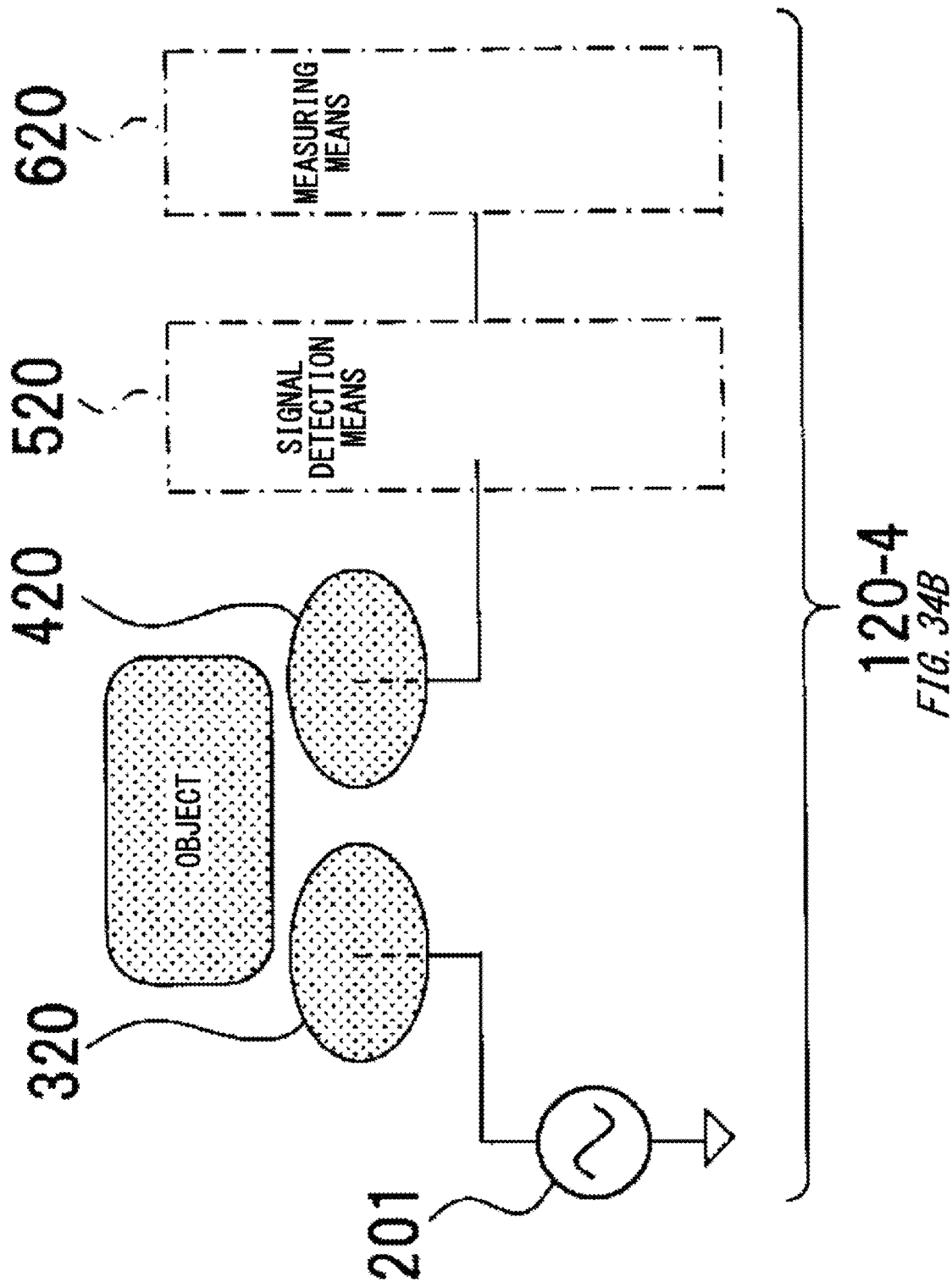
FIG. 34B illustrates an example in which an electrostatic capacitive displacement meter according to the twenty-first embodiment is used for the object detection.

FIG. 34A and FIG. 34B illustrate a case where electrostatic capacitive displacement meters 120-3 and 120-4 are used for the object detection. The same reference numerals are denoted to the same parts as those in FIG. 1, FIG. 2, FIG. 3A, FIG. 5A and FIG. 5B. Descriptions of the same parts as those in any of the first embodiment to the fourth embodiment are omitted. Each of electrostatic capacitive displacement meters 120-3 and 120-4 includes a drive electrode 320, a detection electrode 420, signal detection means 520 and measuring means 620. The drive electrode 320 is the above described drive electrode 301 and the detection electrode 420 is the above described detection electrode 401. A combination of the signal detection means 520 and the measuring means 620 may be any of combinations of signal detection means and measuring means described in the first embodiment to the twentieth embodiment.

When the object detection is performed, neither the drive electrode 320 nor the detection electrode 420 is regarded as an object, and a state of an object affecting an inter electrode capacitance Cx is known from an inter electrode capacitance Cx (FIG. 1). The most representative example of the object detection by electrostatic capacitive displacement meters 120-3 and 120-4 is a case of knowing a state of an object between the drive electrode 320 and the detection electrode 420 as illustrated in FIG. 34A. For example, when an object is a liquid container, the inter electrode capacitance Cx changes depending on an amount of liquid (usually having larger relative dielectric constant than air) in the container, and thus, an amount of liquid in the container can be known from the inter electrode capacitance Cx. In the case of the object detection by the electrostatic capacitive displacement meters 120-3 and 120-4, the drive electrode 320 and the detection electrode 420 do not need to face each other as illustrated in FIG. 34A, but the drive electrode 320 and the detection electrode 420 may be adjacent to each other as illustrated in FIG. 34B for example, and direction, arrange and the like of an electrode can be freely selected depending on an application. Specific examples of the object detection are described in the fourth example to the sixth example described later.

Twenty-Second Embodiment

For example, in electrostatic capacitive displacement meters 120, 120-1 and 120-2 of the twenty-second embodiment, a relationship between an inter electrode distance d (FIG. 33A to FIG. 33C) and an inter electrode capacitance Cx is approximated by a function and is reversely corrected, and accordingly a more accurate inter electrode distance d ca be known.

For example, in electrostatic capacitive displacement meters 120-3 and 120-4 of the twenty-second embodiment, a relationship between a state of an object (FIG. 34A and FIG. 34B) and an inter electrode capacitance Cx is approximated by a function and is reversely corrected, and accordingly a more accurate state of an object can be known.

Figure 35:
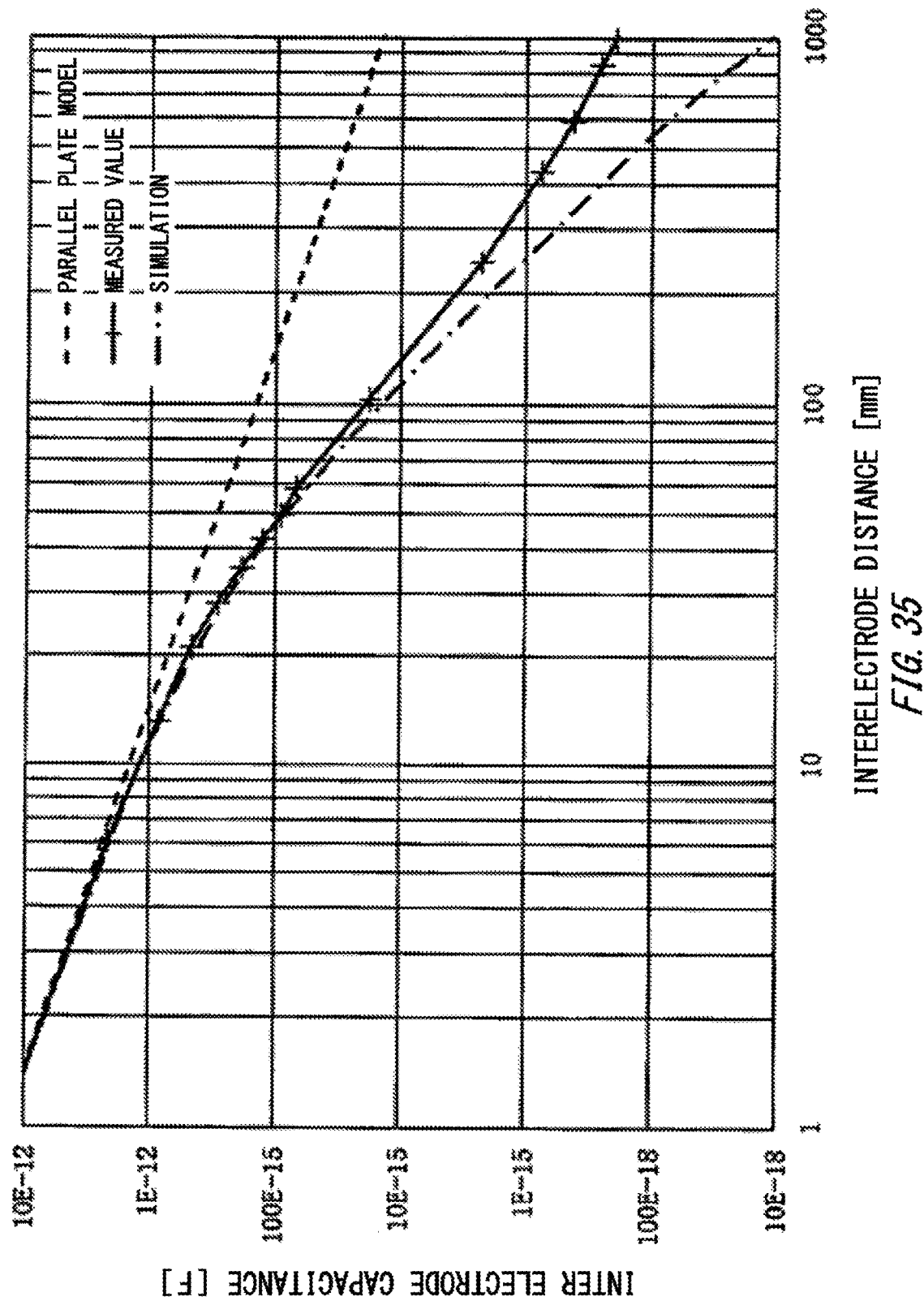
FIG. 35 illustrates one example of a graph for explaining the twenty-second embodiment.

FIG. 35 illustrates one example of a graph for explaining distance measurement of the twenty-second embodiment, and a horizontal axis represents an inter electrode distance d and a vertical axis represents an inter electrode capacitance Cx. FIG. 35 illustrates a case where a drive electrode and a detection electrode use square parallel plates, and an area of each of the drive electrode and the detection electrode is $1.6 \times 10^{-3}$ m$^2$ (40 mm×40 mm).

An electrostatic capacitance C [F] of a parallel flat plate capacitor based on a parallel plate model in air is represented as Equation 14 if an area of each parallel plate electrode is S[m$^2$], an inter electrode distance of a parallel plate electrode is d[m], and a dielectric constant of air is equal to dielectric constant ε0[F/m] of vacuum, and an electrostatic capacitance C is inversely proportional to an inter electrode distance d of a parallel plate electrode.

[Equation 14]

$$C = \varepsilon_0 \frac{S}{d} \quad (14)$$

One example of this relationship is shown as "parallel plate model" in FIG. 35.

However, Equation 14 is satisfied in a region where an edge effect is in a negligible level, (dimension of parallel plate electrode is sufficiently larger than inter electrode distance of parallel plate). If an inter electrode distance of a parallel plate becomes larger and an electrostatic capacitance C becomes smaller relative to a dimension of a parallel plate electrode, an electrostatic capacitance C becomes smaller than Equation 14 due to an edge effect.

If an appropriate electromagnetic field simulator is used, a relationship between an electrostatic capacitance of a parallel flat plate capacitor and an inter electrode distance of a parallel plate taking an edge effect into consideration can be obtained. The "simulation" in FIG. 35 shows an example of a relationship in the case of a sine wave having an amplitude: 20Vp–p and a frequency: 1 MHz. In FIG. 35, as an electromagnetic field simulator, a high frequency electromagnetic field simulator SonnetLite manufactured by Sonnet Giken Co., Ltd. is used.

The "measured value" in FIG. 35 shows a measured value by an electrostatic capacitive displacement meter using a CM circuit of the present disclosure. An amplitude and a frequency of a measurement condition of actual measurement are similar as in an electromagnetic field simulator. The above described embodiments are appropriately applied to a CM circuit of an electrostatic capacitive displacement meter used at the time of actual measurement. The measurement value is obtained by interpolating an inter electrode capacitance Cx in the appropriate number of inter electrode distances that are actually measured.

According to a graph in FIG. 35, the inter electrode distance d when the inter electrode capacitance Cx is several pF or more that is when the inter electrode distance d is several mm or less, a parallel plate model, simulation, and a measured value are almost match with one another. In the inter electrode distance d where the inter electrode capacitance Cx is less than several pF, due to an edge effect, the simulation and the measured value are smaller than the parallel plate model in an inter electrode capacitance Cx. In the case of an inter electrode distance d where an inter electrode capacitance Cx is less than several tens of fF that is when an inter electrode distance d is several tens of mm or more, the simulations is smaller than the measurement value in the inter electrode capacitance Cx.

In the twenty-second embodiment, first, a measured value as illustrated in FIG. 35 is obtained and a relationship between an inter electrode capacitance and an inter electrode distance is approximated by a function. As a function for approximation, various known functions such as a polynomial equation and an exponent function can be used. Further, as an approximation method, various known methods such as a least-square method can be used. Descriptions of the known function and method are omitted.

A result obtained by a relationship being approximated by several types of functions was tried to be illustrated in FIG. 35, but a difference was not found because the result overlaps with a plot of a measured value in FIG. 35, and thus illustration of approximation results in FIG. 35 is omitted.

At the time of an actual measurement, a capacitance value actually measured in a CM circuit of an electrostatic capacitive displacement meter is applied to an adopted approximate function, and accordingly it is possible to realize an electrostatic capacitive displacement meter that can know a more accurate inter electrode distance.

In the above, an example of approximation to a measured value is described, but when actual measurement in advance is difficult, approximation by a function based on a simulation result is possible. Even when such simple method is adopted, it is possible to know an inter electrode distance more accurate than at least a parallel plate model.

In the above, an example of knowing an inter electrode distance by application to distance measurement by an electrostatic capacitive displacement meter is described, but application to the object detection by an electrostatic capacitive displacement meter is also possible.

Figure 36:
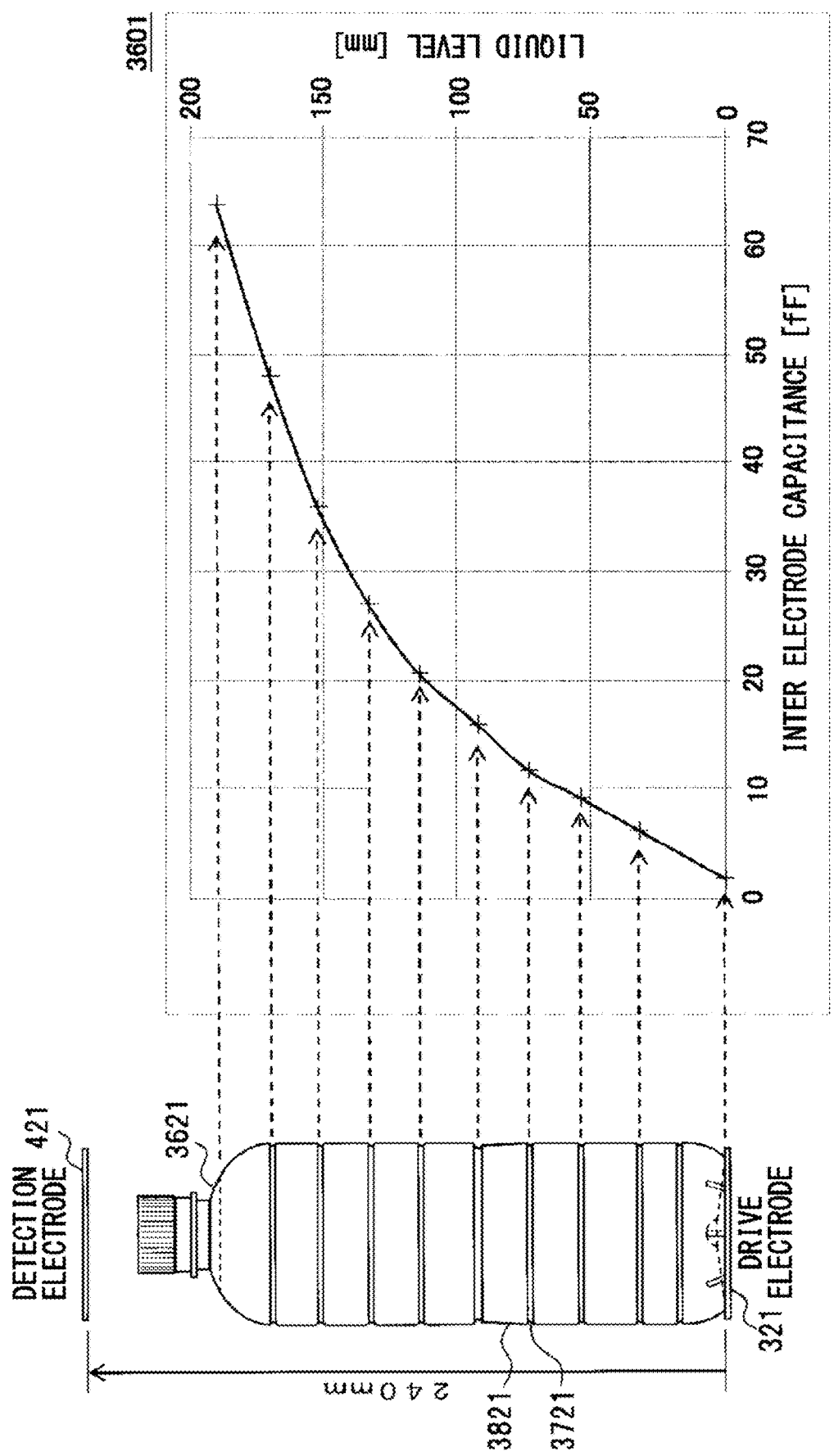
FIG. 36 illustrates one example of a graph for explaining the twenty-second embodiment.

A graph 3601 in FIG. 36 shows one example of a graph of measured values for explaining the object detection of the twenty-second embodiment, and a vertical axis represents a liquid level in a PET bottle 3621 and a horizontal axis represents an inter electrode capacitance Cx. The liquid level in the PET bottle 3621 represents a capacitance of liquid also. FIG. 36 also illustrates a positional relationship between a drive electrode and a detection electrode and a shape of the PET bottle 3621 to be tested in association with the liquid level. In this example, a circle drive electrode 321 having a diameter of 60 mm, a detection electrode 421 having a diameter of 30 mm, and a guard electrode having a diameter of 60 mm around the detection electrode 421 (unillustrated, see the second example described later) are used. As a drive signal, a drive signal amplitude: 20Vp–p, a drive signal frequency: 1 MHz, and a drive signal waveform: sine wave are used. As illustrated in FIG. 36, the PET bottle 3621 used as an object to be tested has grooves 3721 and constrictions 3821 and an inter electrode capacitance Cx is measured based on the liquid level corresponding to each of the grooves 3721 and a rating capacitance of the PET bottle 3621.

In the case of application to the object detection by an electrostatic capacitive displacement meter, a relationship between a state of an object to be measured and an inter electrode capacitance Cx is approximated by a function in advance based on a measured value and a simulation value. At the time of actual measurement, a more accurate state f an object can be known by applying an actually measured inter electrode capacitance Cx to an adopted approximate function. As one example, when a capacitance of liquid in a container is detected, as shown in an example of FIG. 36, a relationship between an inter electrode capacitance Cx of a drive electrode and a detection electrode and a capacitance of liquid in a container and a liquid level is known in advance and the relationship is approximated by a function, and at the time of an actual measurement, an electrostatic capacitive displacement meter can be realized in which an accurate capacitance of liquid in a container can be known by applying the measured capacitance to the approximate function.

Twenty Third Embodiment

In the electrostatic capacitive displacement meter of the present disclosure, an electrode and an object to be measured can be moved. Here, "movement" includes a wide range of movements such as rotation.

In the above described fourteenth embodiment, distance measurement and the object detection at a plurality of locations are possible by providing either a plurality of drive electrodes or a plurality of detection electrodes.

The electrostatic capacitive displacement meter of the present disclosure can sequentially perform the distance measurement and the object detection at a plurality of locations by allowing either one of or both of an electrode and an object to be measured (hereinafter referred to as "electrode and the like") to be moved. Further, the above described fourteenth embodiment can be used in combination and an effect of measurement at a shorter time can be obtained.

When the electrostatic capacitive displacement meter of the present disclosure performs the distance measurement, the electrostatic capacitive displacement meter regards one of or both of a drive electrode and a detection electrode as an object and measures an inter electrode distance. A specific example of distance measurement in which both electrodes can be moved is shown in a first example-2 (FIG. 38) described later and a specific example of distance measurement in which one of the electrodes can be moved is shown in the first example-4 (FIG. 40B and FIG. 40C), the second example-2 (FIG. 43A to FIG. 43D) or the third example-3 (FIG. 46) described later. The second example-2 (FIG. 43A to FIG. 43D) and the third example-3 (FIG. 46) show an example of using the fourteenth embodiment in combination.

With respect to the object detection by the electrostatic capacitive displacement meter of the present disclosure, a specific example of the object detection in which an electrode is moved is shown in the sixth example-5 (FIG. 60A) described later and a specific example of moving an object affecting an inter electrode capacitance is shown in the fourth example-1 (FIG. 48), the fourth example-4 (FIG. 51A and FIG. 51B), the fourth example-5 (FIG. 53A and FIG. 53B), the sixth example-4 (FIG. 59), and the sixth example-5 (FIG. 62A and FIG. 62B) described later.

INDUSTRIAL APPLICABILITY

According to the CM circuit of the present disclosure, a micro capacitance can be measured, and thus, the long distance measurement can be realized. Therefore, the circuit can be applied in a wide range including not only a measurement application using an electrostatic capacitive displacement meter but also a measurement application realized by a laser displacement meter and an eddy current displacement meter.

The electrostatic capacitive displacement meter of the present disclosure can be applied in a wide range of applications such as the object detection of an object that is present at an inner part of a packing box and may not be seen from the outside and the object detection at a long distance.

When the electrostatic capacitive displacement meter of the present disclosure performs the distance measurement and the object detection at a plurality of locations, some of electrodes and circuits can be simplified, and thus, the electrostatic capacitive displacement meter has an effect that the distance measurement and the object detection can be realized at a low cost and the electrostatic capacitive displacement meter can be applied to a wide range of applications in this point.

Below, specific examples when the electrostatic capacitive displacement meter of the present disclosure performs the distance measurement and the object detection are shown.

First Example

The first example shows one example by a set of drive electrodes and detection electrodes used for distance measurement among specific examples of the distance measurement by the electrostatic capacitive displacement meter.

FIG. 37 to FIG. 40C illustrate a specific example of a set of drive electrodes and detection electrodes used for distance measurement by the electrostatic capacitive displacement meter. In FIG. 37 to FIG. 63B, circle symbols attached to ends of lead wires indicate points where the drive signal generating means or the signal detection means of the present disclosure is connected to a drive electrode or a detection electrode shown in each figure. When connection between the drive signal generating means and one of the electrodes is illustrated, the electrode becomes a drive electrode and the remaining electrode becomes a detection electrode.

First Example-1

Figure 37:
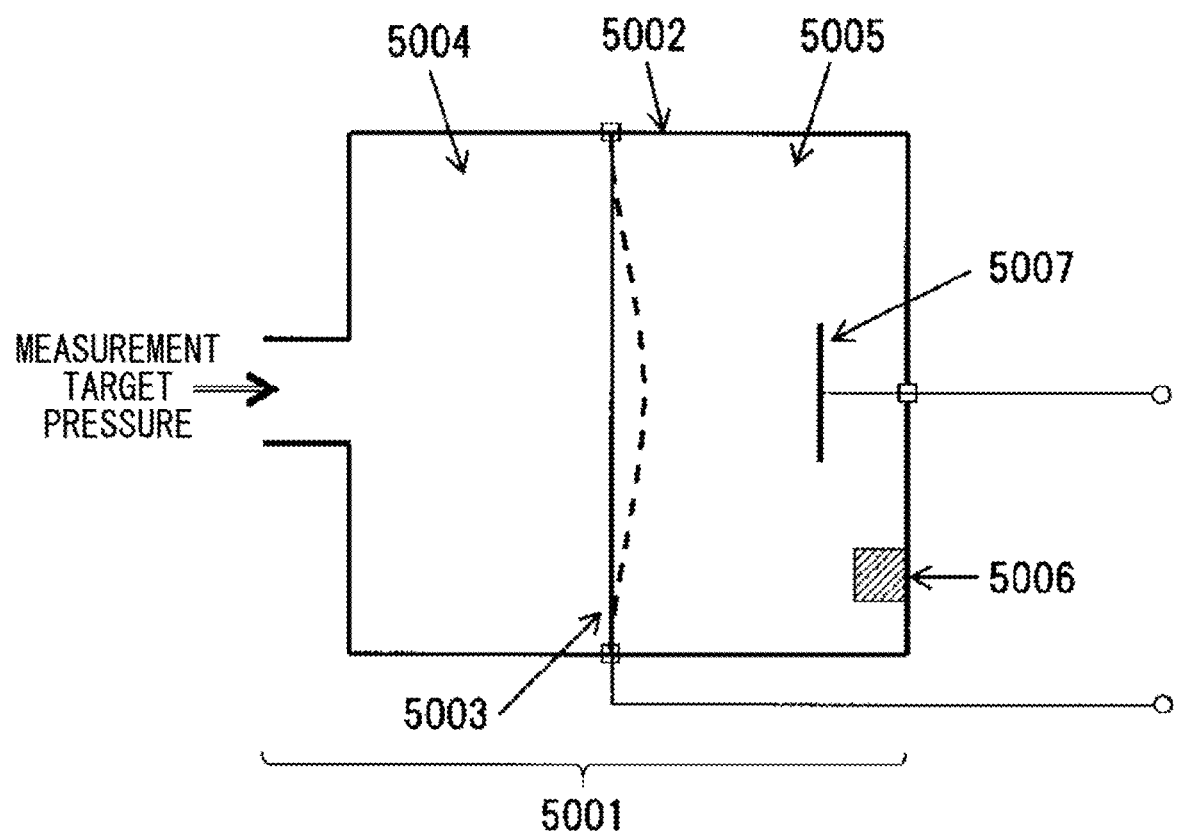
FIG. 37 illustrates a specific example of a set of drive electrodes and detection electrodes used for the distance measurement.

FIG. 37 illustrates a diaphragm gauge 5001. A main body 5002 of the diaphragm gauge 5001 is hermetically separated into a measurement chamber 5004 and a reference chamber 5005 via a diaphragm 5003 and the reference chamber 5005 is kept in a vacuum. A getter agent 5006 is used for keeping a degree of vacuum. A fixed electrode 5007 is provided on a surface of the reference chamber 5005 opposite from the diaphragm 5003. When a measurement target pressure supplied to the measurement chamber 5004 is high, as indicated by a broken line, the diaphragm 5003 moves close to the fixed electrode 5007 and alternatively when the measurement target pressure is low, as indicated by a solid line, the diaphragm 5003 moves away from the fixed electrode 5007. As a result, a capacitance between the diaphragm 5003 and the fixed electrode 5007 changes by being almost inversely proportional to an inter electrode distance between the diaphragm 5003 and the fixed electrode 5007, and thus, a measurement target pressure can be known from a capacitance. In this example, the diaphragm 5003 may correspond to either a drive electrode or a detection electrode and also the fixed electrode 5007 may correspond to either a drive electrode or a detection electrode vice versa.

More preferable results will be obtained if the diaphragm 5003 (object) is a drive electrode, the fixed electrode 5007 is a detection electrode, the main body 5002 is grounded, and the fixed electrode 5007 is provided at a position close to the main body 5002. In the case of an electrostatic capacitive displacement meter using the CM circuit of the present disclosure, a detection electrode is virtually grounded by signal detection means. For this reason, when the main body 5002 is grounded, lines of electric force from a peripheral part of the diaphragm 5003 are mainly spread on a side surface of the measurement chamber 5004 and lines of electric force from a central part of the diaphragm 5003 are mainly reached to the fixed electrode 5007 positioned at an opposite surface of the reference chamber 5005. The central part of the diaphragm 5003 is a portion that moves most largely by a measurement target pressure, and thus, by the above connection, the central part can have high sensitivity. The grounded main body 5002 functions as a shield, and thus, the diaphragm gauge 5001 has an advantage of not easily receiving an influence of ambient noise or the like.

As already described in the twenty-second embodiment, in FIG. 37, a relationship between a capacitance between the diaphragm 5003 and the fixed electrode 5007 and a measurement target pressure is measured in advance and the relationship is approximated by an appropriate function, and accordingly, a more accurate measurement target pressure can be known.

First Example-2

Figure 38:
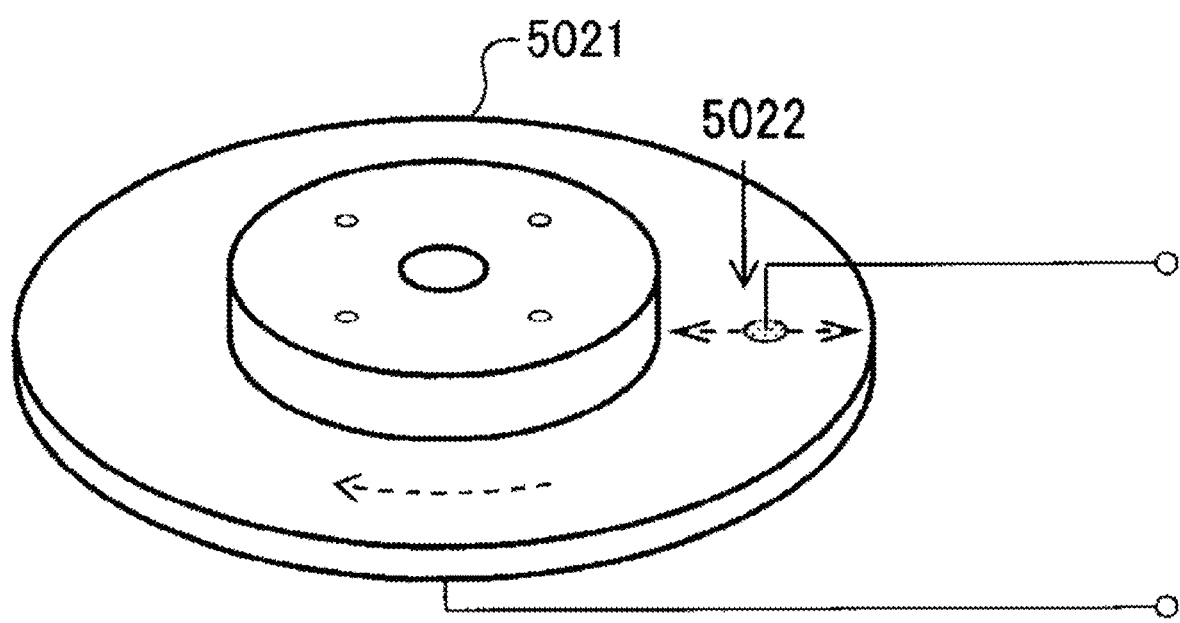
FIG. 38 illustrates a specific example of a set of drive electrodes and detection electrodes used for the distance measurement.

FIG. 38 illustrates an example of testing a surface deflection, an surface asperity, a flatness and the like (hereinafter referred to as "surface deflection and the like") of a brake disc of an automobile or the like (hereinafter referred to as "disc"). The disc 5021 (object) is rotatable, can be a drive electrode or a detection electrode, and is for example, provided horizontally. A moving electrode 5022 is provided at a position slightly away from the disc 5021 and can be moved in parallel to the disc 5021 in a diameter direction of the disc 5021. If the disc 5021 has no surface deflection at all, an inter electrode distance between the disc 5021 and the moving electrode 5022 becomes constant even if the disc 5021 is rotated regardless of a position of a moving electrode 5022. If the disc 5021 has a surface deflection and the like, an inter electrode distance changes in response to a rotation of the disc 5021, and thus, a distance change can be known through an electrostatic capacitive displacement meter. If a moving electrode 5022 is moved as shown by an arrow in the figure, a difference in a surface deflection and the like of an outer peripheral surface and an inner peripheral surface of the disc 5021 can be known. Although FIG. 38 illustrates an example of providing a moving electrode 5022 to one surface of the disc 5021, the moving electrode 5022 may be provided to an opposite surface or moving electrodes 5022 may be provide to both surfaces.

In the case of the disc 5021 of FIG. 38, there is an advantage of hardly receiving an influence of a hum or ambient noise because a detection electrode can be made relatively small by causing a larger disc 5021 (object) to be a drive electrode and a smaller moving electrode 5022 to be a detection electrode. An influence of a hum or ambient noise can be reduced by, providing a shield electrode to a surface opposite from the disc 5021 in a detection electrode or using shielding wire for wiring between a detection electrode and signal detection means. Reversely if the disc 5021 is a detection electrode and a moving electrode 5022 is a drive electrode, there is an advantage of suppressing a radiation wave radiated from a drive electrode because the drive electrode is small.

A drive electrode and a detection electrode can be selected appropriately by considering shapes or the like of an object and an electrode in this manner. The same applies to other examples described later. In examples described later, more preferable combinations may be shown, but the present invention is not limited to the shown combination.

First Example-3

In examples of a diaphragm gauge 5001 or a surface deflection and the like of a disc 5021, one is an electrode and the other is an object, which corresponds to a pair of a drive electrode 320 and a detection electrode 420 in FIG. 33A or FIG. 33B. A vertical deflection plate 5042 and a horizontal deflection plate 5043 of a cathode-ray tube (CRT) in FIG. 39 respectively correspond to a pair of a drive electrode 320 and a detection electrode 420 in FIG. 33C, and thus, FIG. 39 illustrates an example in which both a drive electrode and a detection electrode are objects.

Figure 39:
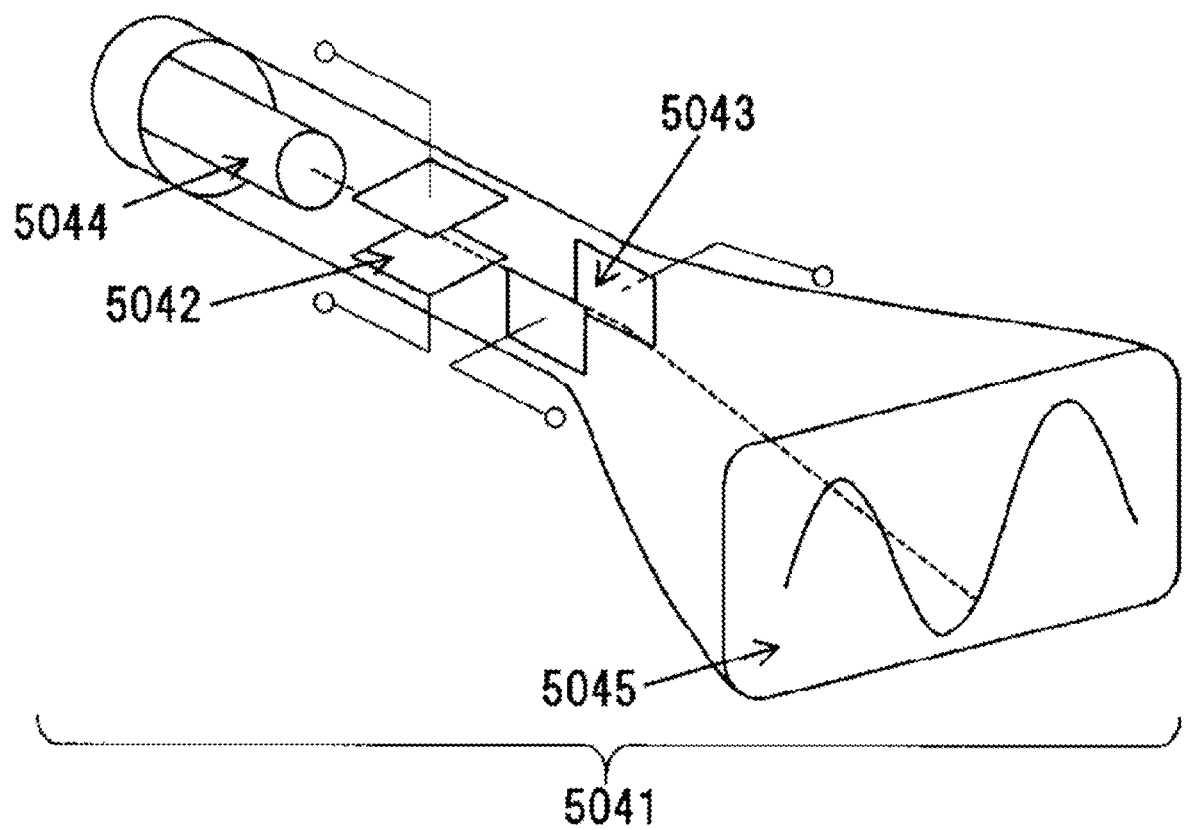
FIG. 39 illustrates a specific example of a set of drive electrodes and detection electrodes used for the distance measurement.

FIG. 39 illustrates an example of performing the distance measurement between deflection plates of the CRT 5041. In FIG. 39, a broken line indicates a trajectory of an electron beam. An electron beam emitted from an electron gun 5044 deflects in a vertical direction by a voltage between vertical deflection plates 5042, deflects left and right directions by a voltage between horizontal deflection plates 5043, and then reaches a phosphor screen 5045. As a representative application example of an oscilloscope, a horizontal axis can be set to a time axis by applying a saw-tooth wave to a horizontal deflection plate 5043 and a vertical axis can be set to an input voltage axis by amplifying an input voltage waveform and applying the amplified waveform to a vertical deflection plate 5042. In an XY mode of an oscilloscope, a voltage waveform of an X input can be amplified and the amplified waveform can be applied to the horizontal deflection plate 5043 and a voltage waveform of a Y input can be amplified and the amplified waveform can be applied to a vertical deflection plate 5042.

While shapes of a vertical deflection plate 5042 and a horizontal deflection plate 5043 have known values with small errors, an error in a distance between combined deflection plates tends to be large, and thus, it is necessary to measure a distance between deflection plates to determine the quality of a production of a combined deflection plates.

Two vertical deflection plates 5042 (both of which are objects) have the same shape, and thus, it is free to determine which is a drive electrode and which is a detection electrode. The same applies to two horizontal deflection plates 5043 (both of which are objects).

In an electrostatic capacitive displacement meter of a prior art, one needs to be a dedicated electrode and the other needs to be a grounded conductor, and thus, the electrostatic capacitive displacement meter may not be applied to an application as in this example. The same applies to following examples in which two or more objects are set as electrodes.

First Example-4

Figure 40A:
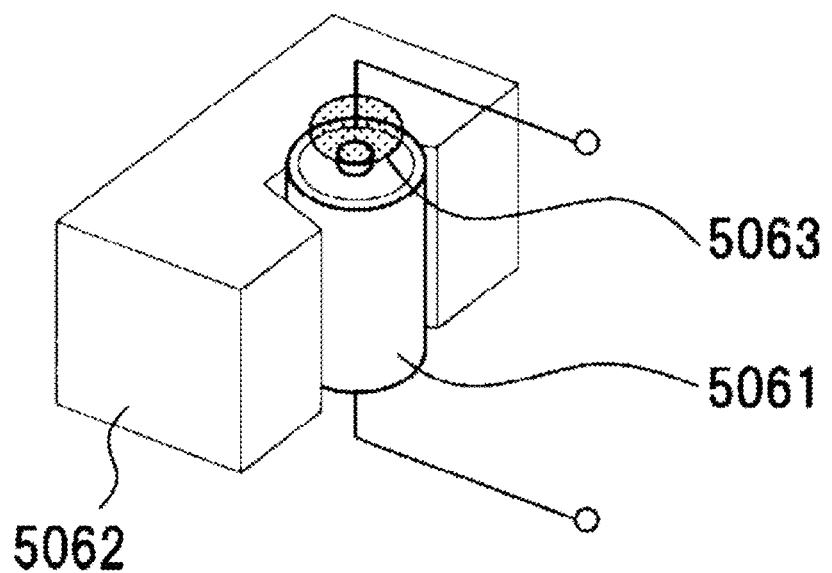
FIG. 40A illustrates a specific example of a set of drive electrodes and detection electrodes used for the distance measurement.
Figure 40B:
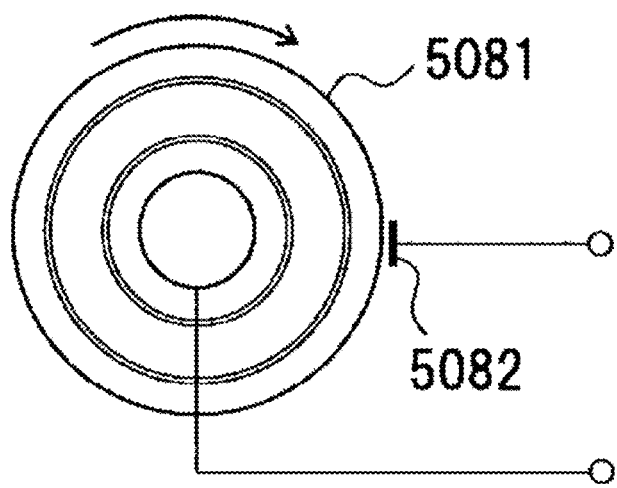
FIG. 40B illustrates a specific example of a set of drive electrodes and detection electrodes used for the distance measurement.
Figure 40C:
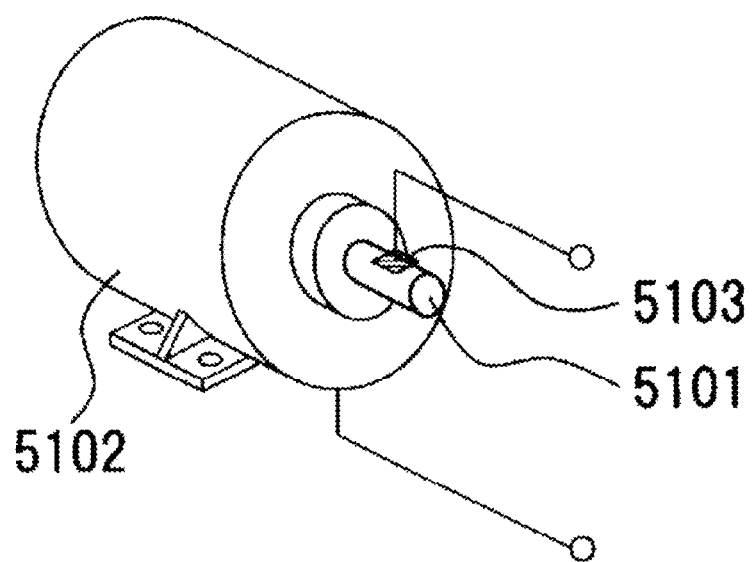
FIG. 40C illustrates a specific example of a set of drive electrodes and detection electrodes used for the distance measurement.

FIG. 40A to FIG. 40C illustrate another specific application example using a set of a drive electrode and a detection electrode among specific examples of a distance measurement by an electrostatic capacitive displacement meter of the present disclosure.

As one example of measuring the high of an object, FIG. 40A illustrates an example of performing the distance measurement between electrodes of a dry battery. In FIG. 40A, the distance measurement is performed by pressing a dry battery 5061 against a positioning gauge 5062 for fixing, setting a lower electrode of the dry battery 5061 to be, for example, a drive electrode, setting an electrode 5063 fixed at a position slightly away from an upper part of the dry battery 5061 to be a detection electrode, and measuring a capacitance between an upper electrode of the dry battery 5061 and the electrode 5063. (It is assumed that an impedance between an upper electrode and a lower electrode of the dry battery 5061 is sufficiently low.) The lower side and the upper side for the drive electrode and the detection electrode may be reversed or a vertical direction of the dry battery 5061 may be reversed from the figure. (If the vertical direction of the dry battery 5061 is reversed, a capacitance with a flat electrode plane of the dry battery 5061 is measured, and thus, a more preferable result may be obtained.) Such measurement of the high is applicable to various objects.

FIG. 40B illustrates an example of measuring a roundness of a bearing, an axis of a metal bearing 5081 (object) is fixed to be one electrode, and the other electrode 5082 is fixed slightly outside the bearing 5081. If the bearing 5081 has a complete roundness, an inter electrode capacitance does not change even if the bearing 5081 is rotated. If an inter electrode capacitance changes depending on a rotation of the bearing 5081, it is possible to know a change in the inter electrode distance therefrom, and accordingly, a roundness of the bearing 5081 can be known.

FIG. 40C illustrates an example of measuring a center deflection of a motor shaft, and in the figure, a main body 5102 conducted to a motor shaft 5101 is set to be one electrode and the other electrode 5103 is fixed to a slightly outside the motor shaft 5101. If an inter electrode capacitance changes depending on a rotation of a motor shaft 5101, a change in an inter electrode distance can be known therefrom, and accordingly, the degree of the center deflection of the motor shaft 5101 can be known.

First Example—Other

In the electrostatic capacitive displacement meter of the present disclosure, a distance measurement using a set of a drive electrode and a detection electrode can be used to other various applications, and thus, those are listed below.

A measurement of thicknesses of a film, paper, rubber, resin and the like by sandwiching an object between a drive electrode and a detection electrode. (By knowing in advance a relative dielectric constant of an object, a thickness of an inter electrode distance=object is known based on the measured inter electrode capacitance.)

Positioning of an actuator or the like (an actuator may be one electrode or one electrode may be attached to an actuator.)

A measurement of gap between two objects (each object may be an electrode or an electrode may be attached to each object.)

In applications as shown in a first example, when the distance measurement among a plurality of locations is performed, methods as shown in a second example and a third example described later can be applied.

Second Example

The second example and FIG. 41A to FIG. 43D illustrate specific application examples of performing the distance measurement between two places by using two drive electrodes or two detection electrodes in specific examples of performing the distance measurement by using the electrostatic capacitive displacement meter of the present disclosure.

FIG. 41A to FIG. 41D illustrate an example of measuring an inter electrode distance between an electrode positioned between two conductors (both of which are objects) and each conductor. FIG. 42A to FIG. 42C illustrate an example of measuring inter electrode distances between one conductor (object) and two electrodes respectively. FIG. 43A to FIG. 43D illustrate an example of measuring a squareness of a cylindrical metal part.

Second Example-1

Figure 41A:
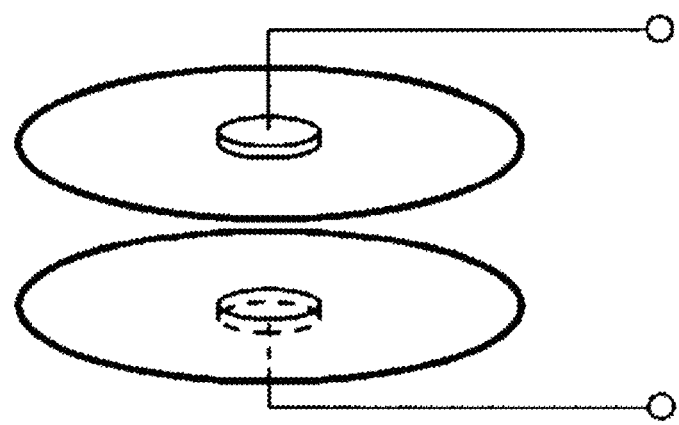
FIG. 41A illustrates an example of measuring the distance between two conductors.
Figure 42A:
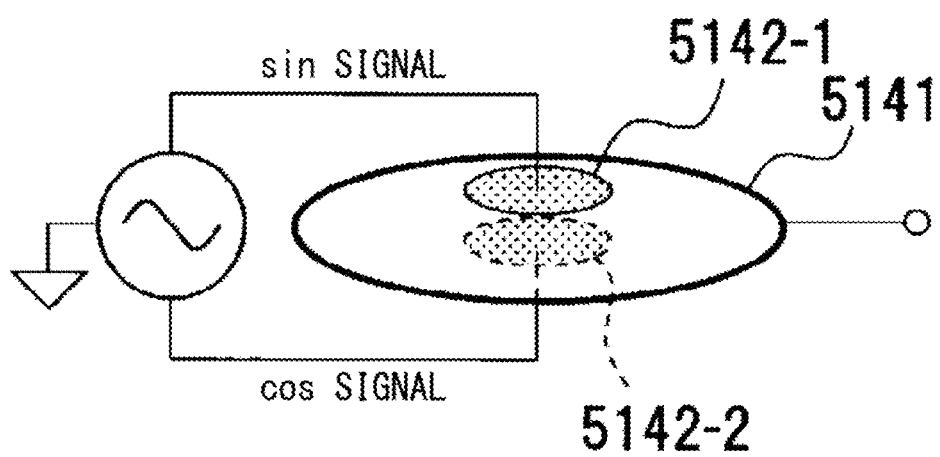
FIG. 42A illustrates an example of measuring the distance between two conductors.
Figure 42B:
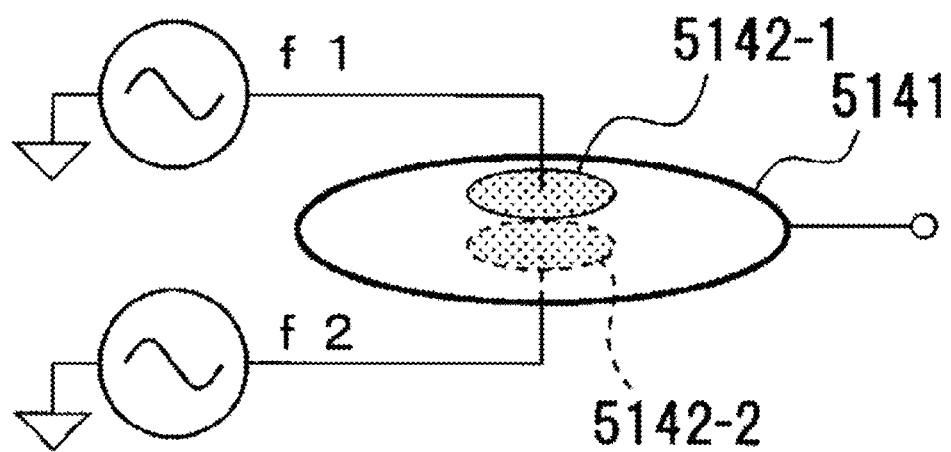
FIG. 42B illustrates an example of measuring the distance between two conductors.
Figure 42C:
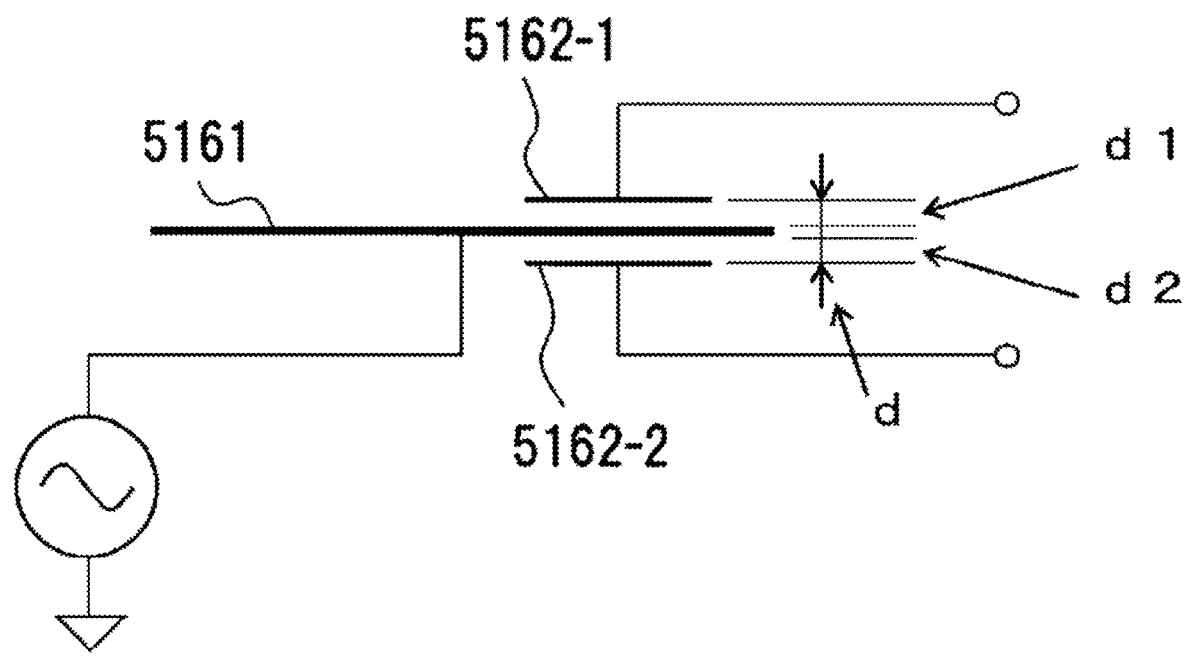
FIG. 42C illustrates an example of measuring the distance between two conductors.

FIG. 41A illustrates an example in which one of two conductors is set to be a drive electrode and the other conductor is set to be a detection electrode, is a reference example included in the first example, and is outside the scope of the second example.

Figure 41B:
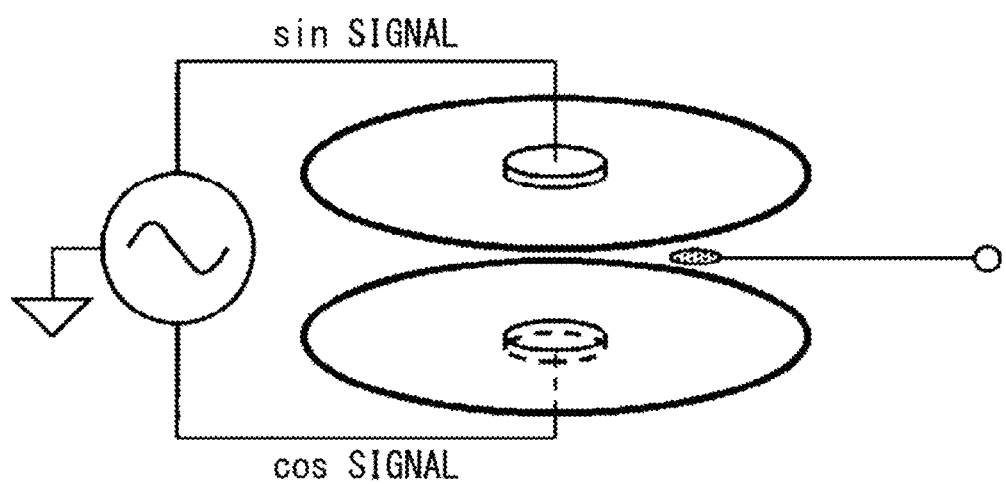
FIG. 41B illustrates an example of measuring the distance between two conductors.

In FIG. 41B, an inter electrode distance between an electrode positioned between two conductors and each conductor is measured based on a method of using two drive signals having 90 degrees phase differences as show in the fifteenth embodiment described above. A sin signal as a drive signal is given to one conductor, a cos signal as a drive signal is given to the other conductor, and an inter electrode distance between each of two conductors and an electrode can be known by phase-detection means as described in the fifteenth embodiment. As a result, a distance between two conductors can be known by (an inter electrode distance between one conductor and an electrode+an inter electrode distance between the other conductor and an electrode+a thickness of an electrode).

Figure 41C:
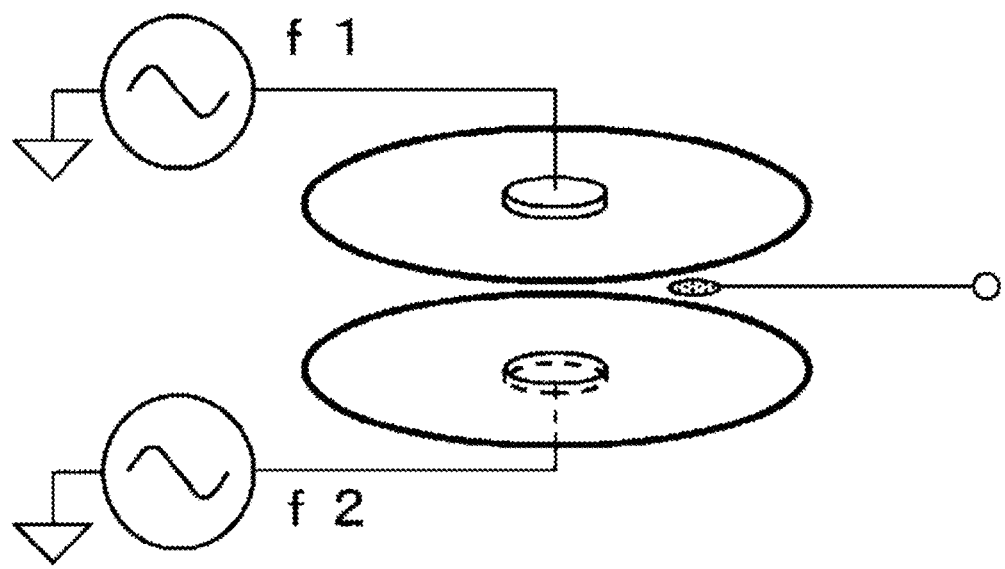
FIG. 41C illustrates an example of measuring the distance between two conductors.

In FIG. 41C, an inter electrode distance between an electrode positioned between two conductors and each conductor is measured individually based on the method of using a plurality of (two) frequencies as shown in FIG. 18A and FIG. 18B of the fourteenth embodiment described above. A drive signal having a frequency f1 is given to one conductor, a drive signal having a frequency f2 is given to the other conductor, and two drive electrodes are provided. This allows knowing an inter electrode distance between each of two conductors and an electrode as described in the fourteenth embodiment. As a result, a distance between two conductors can be known by (an inter electrode distance between one conductor and an electrode+an inter electrode distance between the other conductor and an electrode+a thickness of an electrode). A method of using a plurality of frequencies will be described in the third example described later by using a further specific example.

Figure 41D:
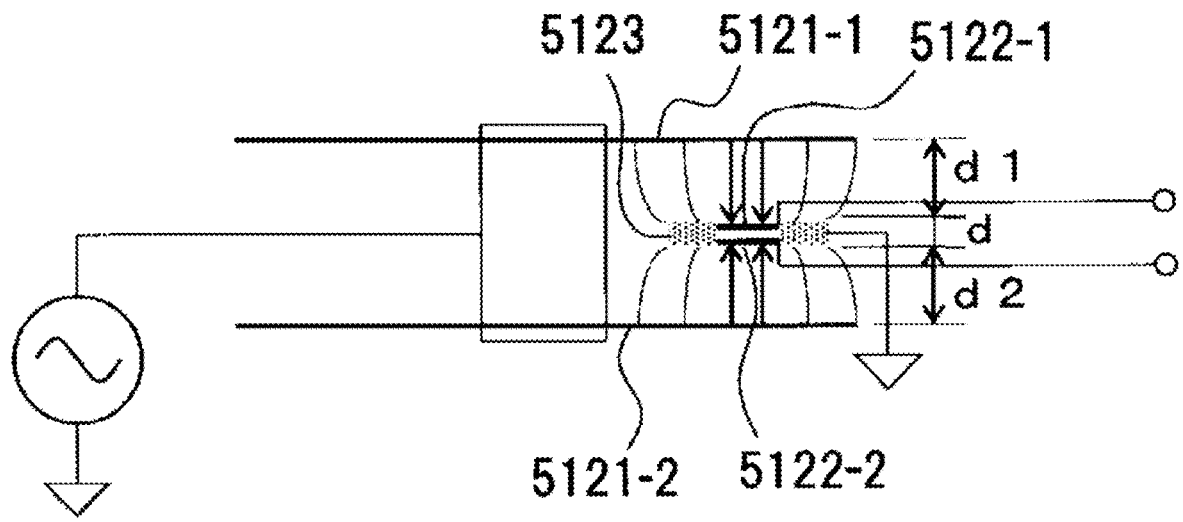
FIG. 41D illustrates an example of measuring the distance between two conductors.

In FIG. 41D, an inter electrode distance between an electrode positioned between two conductors and each conductor is measured individually based on a method shown in FIG. 19 as in the fourteenth embodiment described above and a method of using switching as shown in FIG. 21, FIG. 23A and FIG. 23B. (Although FIG. 19 illustrates an example of using filters fc1 . . . fcn and AC voltage measuring means AC . . . ACn, phase-detection means, averaging means, and DC voltage measuring means can be used as measuring means.)

In FIG. 41D, two conductors 5121-1 and 5121-2 are connected in common and receive a drive signal. In this example, two conductors 5121-1 and 5121-2 form a drive electrode and two detection electrodes 5122-1 and 5122-2 are provided there between. One detection electrode 5122-1 measures an inter electrode distance d1 with one conductor 5121-1 and the other detection electrode 5122-2 measures an inter electrode distance d2 with the other conductor 5121-2. If it is assumed that a thickness of the two detection electrodes 5122-1 and 5122-2 is d, a distance between two conductors can be known from d1+d+d2.

If the electrode 5123 grounded around the two detection electrodes 5122-1 and 5122-2 is added, for example, lines of electric force as illustrated in FIG. 41D are generated and lines of electric force between the conductors 5121-1 and 5121-2 and the detection electrodes 5122-1 and 5122-2 become parallel, and thus, it is likely to match with an equation of the electrostatic capacitance of the parallel flat plate capacitor by the parallel plate model (Equation 14) described above. In this manner, an electrode provided for appropriately shaping or deforming lines of electric force is collectively referred to as a guard electrode.

Lines of electric force in the figure are simple for easy understanding and are not based on an accurate calculation. (The same applies to lines of electric force in other figures.)

Although FIG. 41B to FIG. 41D illustrate an example of measuring a distance between two conductors, it is possible to measure a thickness of a conductor by applying this as illustrated in FIG. 42A to FIG. 42C. By this method, a thickness of a semiconductor silicon wafer can be measured as one example.

In FIG. 42A, an inter electrode distance between one conductor 5141 (object detection electrode) and two drive electrodes 5142-1 and 5142-2 are respectively measured by a method of using two drive signals having 90 degrees phase differences as shown in the fifteenth embodiment described above. If a distance between two fixed drive electrodes is defined as d, an inter electrode distance between a conductor and one detection electrode is defined as d1, and a distance between a conductor and the other detection electrode is defined as d2, a thickness of a conductor can be known from d−d1−d2. (The same applies to FIG. 42B.) (See FIG. 42C for a relationship between distance d, d1, d2 and a thickness of a conductor. However, a drive electrode and a detection electrode in FIG. 42C are reversed from those in FIG. 42A and FIG. 42B.)

In FIG. 42B, a thickness of a conductor 5141 is measured by measuring an inter electrode distance between one conductor 5141 and two drive electrodes 5142-1 and 5142-2 respectively based on a method of using a plurality of (two) frequencies illustrated in FIG. 18A and FIG. 18B of the fourteenth embodiment described above.

In FIG. 42C, a thickness of a conductor 5161 is measured by measuring an inter electrode distance between one conductor 5161 and two detection electrodes 5162-1 and 5162-2 respectively based on a method illustrated in FIG. 19 of the fourteenth embodiment described above.

In this manner, it is possible to simultaneously measure an inter electrode distance between a vertical deflection plate 5042 and a horizontal deflection plate 5043 of a CRT 5041 as illustrated in FIG. 39 for example by applying a method of using two drive signals having a 90 degrees phase difference, a method of using a plurality of (two) frequencies, and a method as illustrated in FIG. 19 of the fourteenth embodiment described above.

Second Example-2

FIG. 43A to FIG. 43D illustrate a further specific example of simultaneously perform two distance measurements. FIG. 43A to FIG. 43D illustrate an example of inspecting a squareness of a cylindrical metal part. Although a method of using two drive signals (sin signal and cos signal) having a 90 degrees phase difference is exemplified, as same as a method illustrated in FIG. 41A to FIG. 42C, it is possible to apply a method of using a plurality of (two) frequencies, a method as illustrated in FIG. 19 of the fourteenth embodiment described above, a method using switching as illustrated in FIG. 21, FIG. 23A and FIG. 23B and the like.

Figure 43A:
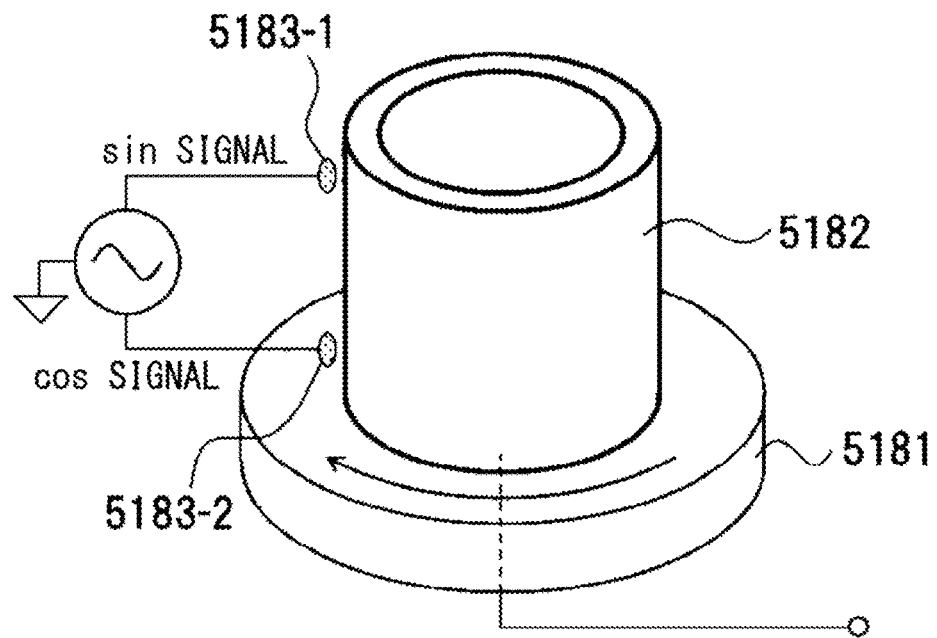
FIG. 43A illustrates an example of the squareness measurement of a cylindrical metal part by the distance measurement.
Figure 43B:
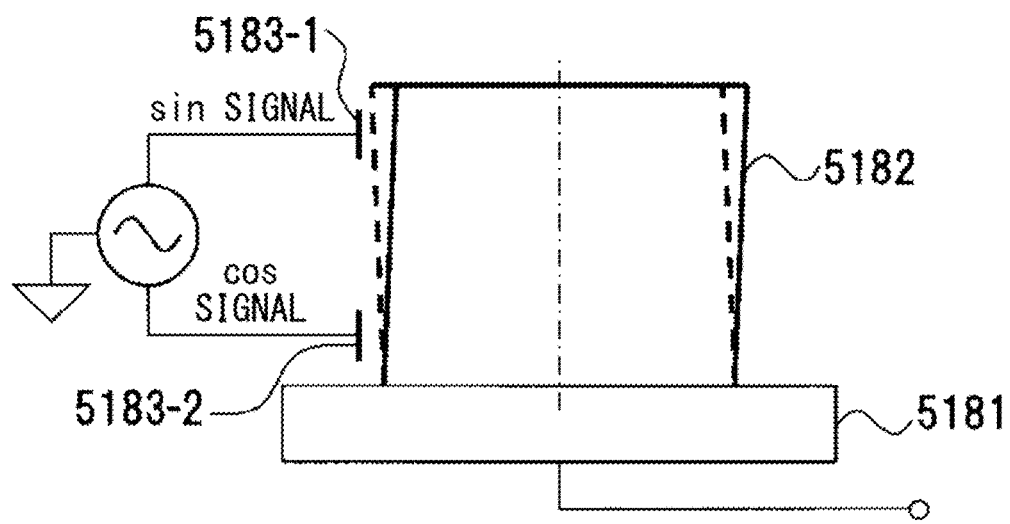
FIG. 43B illustrates an example of the squareness measurement of a cylindrical metal part by the distance measurement.

In FIG. 43A, a cylindrical metal part 5182 is placed on an accurate turntable 5181 having no surface deflection, and in the vicinity of the metal part 5182, two drive electrodes 5183-1 and 5183-2 are fixed at two points in a substantially vertical direction. The turntable 5181 is electrically connected to the metal part 5182 by contacting with it and is integrated with the metal part 5182 to form a detection electrode. If a rotation state of the turntable 5181 is viewed from the side when a squareness of the metal part 5182 is not complete (that is, slightly declined) and the center of the metal part matches with the center of the turntable 5181 (that is, there is no misalignment), the metal part 5182 moves as indicated by vertical solid line and broken line of the metal part 5182 as illustrated in FIG. 43B. A capacitance between a drive electrode of a sin signal side and the metal part 5182 is defined as Csin and a capacitance between a drive electrode of a cos signal side and the metal part 5182 is defined as Ccos.

Figure 43C:
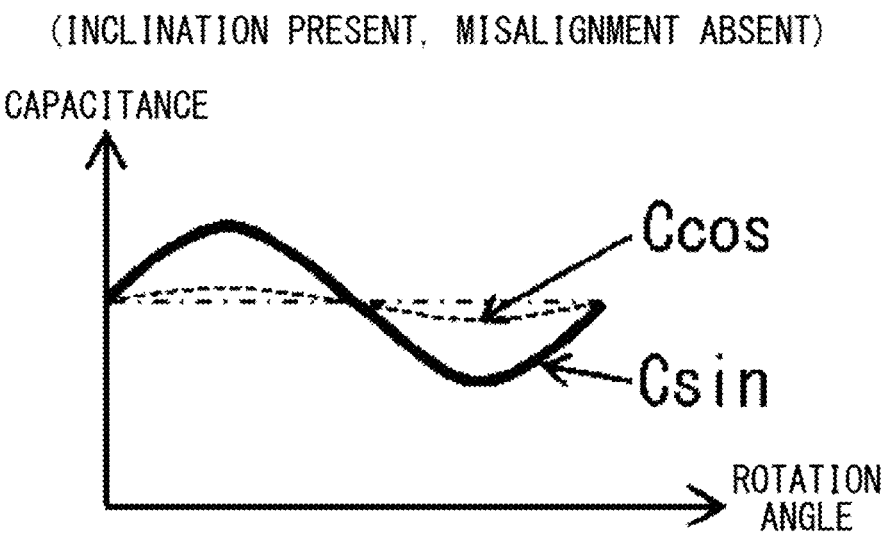
FIG. 43C illustrates an example of the squareness measurement of a cylindrical metal part by the distance measurement.

When the metal part 5182 is inclined without having the misalignment in FIG. 43A and FIG. 43B, the metal part changes as illustrated in FIG. 43C in which a horizontal axis represents a rotation angle of the turntable 5181 and a vertical axis represents a capacitance Csin of a sin signal side and a capacitance Ccos of a cos signal side. The squareness of the metal part 5182 can be known from a difference in a capacitance change between the capacitance Csin and the capacitance Ccos.

Figure 43D:
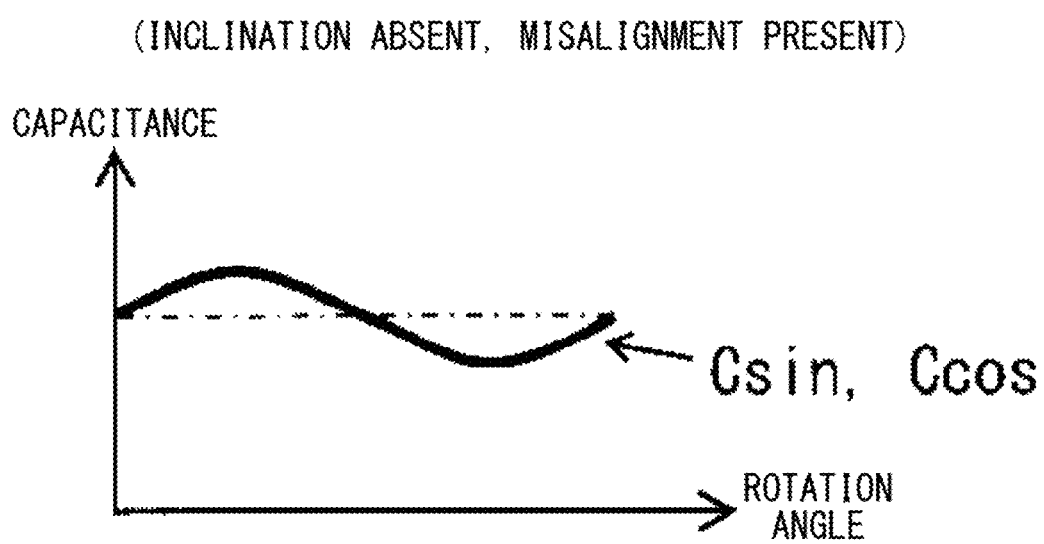
FIG. 43D illustrates an example of the squareness measurement of a cylindrical metal part by the distance measurement.

When the squareness of the metal part 5182 is complete although the center of the cylindrical metal part 5182 is deviated from the center of the turntable 5181, as illustrated in FIG. 43D, capacitances of Csin and Ccos change in the same manner. In this case, a difference in a change of capacitances of Csin and Ccos is zero, and thus, the squareness of the metal part is complete.

In the second example, a method of using two drive signals having a 90 degrees phase difference, a method of using a plurality of (two) frequencies, and a method illustrated in FIG. 19 of the fourteenth embodiment described above are described as specific examples, but the present invention is not limited to these. For example, an electrostatic capacitive displacement meter according to an application and a requirement performance may be realized by appropriately using heterodyne detection means and switching means described in the fourteenth embodiment for example.

Third Example

The third example and FIG. 44 to FIG. 47 illustrate a specific example of performing the distance measurement of three places or more in the distance measurement by the electrostatic capacitive displacement meter of the present disclosure.

Figure 44:
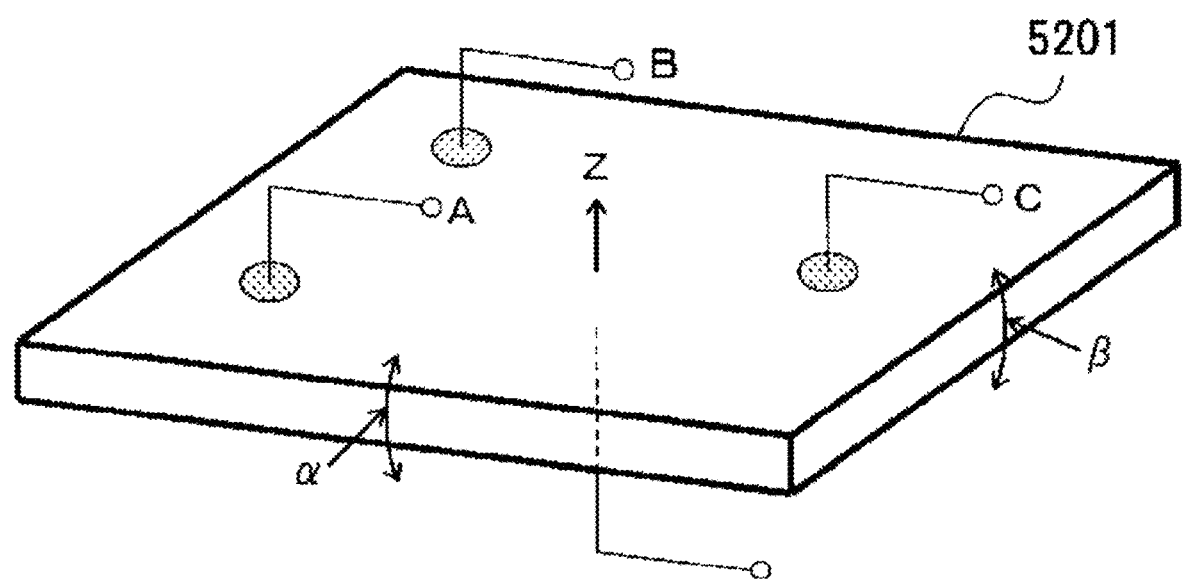
FIG. 44 illustrates a specific example of the distance measurement of three places or more.
Figure 45:
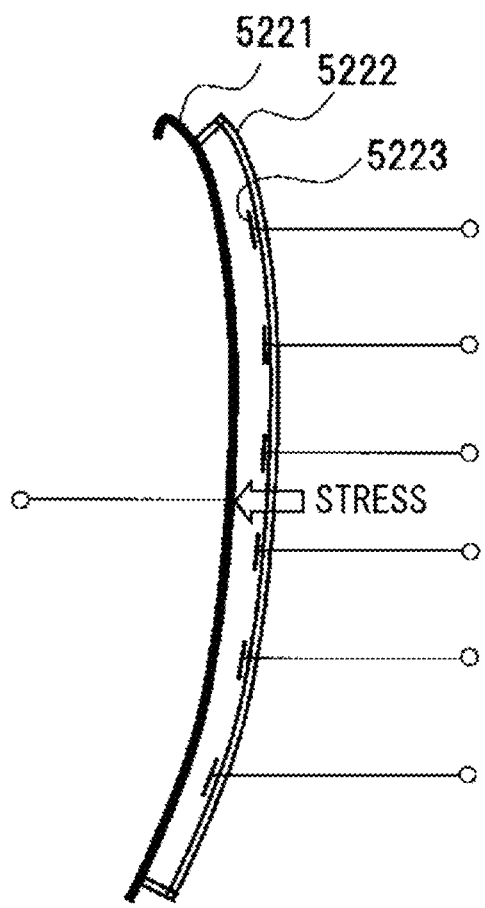
FIG. 45 illustrates a specific example of the distance measurement of three places or more.
Figure 46:
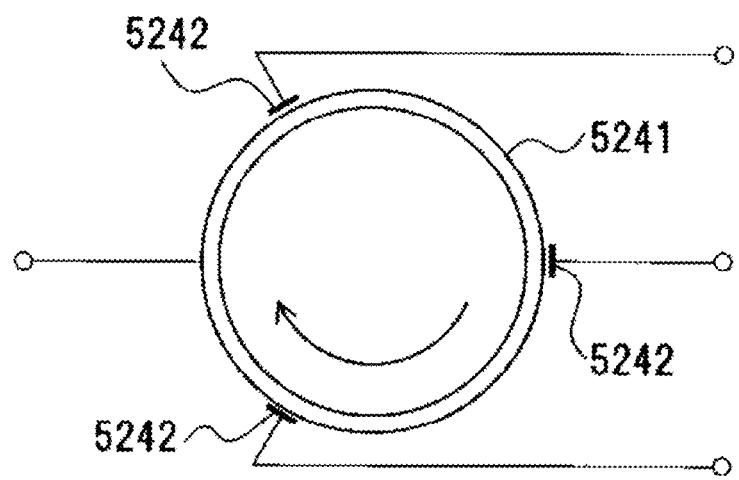
FIG. 46 illustrates a specific example of the distance measurement of three places or more.

FIG. 44 illustrates an example of measuring an inclination angle and a vertical position of a metallic plate 5201, FIG. 45 illustrates an example of measuring a stress strain of an automotive door, and FIG. 46 illustrates an example of measuring a roundness based on a 3-point method.

When the distance measurement of three places or more is performed, a method of using a plurality of (two) frequencies shown in the fourteenth embodiment, a method illustrated in FIG. 19 of the fourteenth embodiment described above, the heterodyne detection means and the switching means can be appropriately used.

In each specific example, although descriptions of various methods of performing the distance measurement of three places or more and the connection method of electrodes are omitted, both the measurement method and the connection method shown in the fourteenth embodiment can be appropriately used.

Third Example-1

FIG. 44 illustrates an example of measuring an inclination angle and a vertical position of the metallic plate 5201 by the distance measurement of three places. One of drive electrode/detection electrode is a metallic plate 5201 (object) and the other is an electrode A, B, or C. An inter electrode distance between each of the electrodes A, B, and C and the metallic plate 5201 is measured. An inter electrode distance between each of the electrodes A, B, and C and the metallic plate 5201 is referred to as the distance A, B, and C.

A distance between the electrode A and the electrode B is known, and thus, an inclination a can be known if the distance A and the distance B are informed. For example, if the distance A>the distance B, it can be known that the metallic plate is inclined in a downward arrow direction of a in FIG. 44. A distance between the electrode C and the center between the electrode A and the electrode B is known, and thus, an inclination β can be known if the distances A, B, and C are informed. For example, if an average value of the distance A and the distance B>the distance C, it can be known that the metallic plate is inclined in an upward arrow direction of B in FIG. 44. If an average value of the distances A, B, and C is known, a vertical position Z can be known. For example, if an average value of the distances A, B, and C is smaller than a reference value, it is possible to know that the metallic plate 5201 is raised in an arrow direction of Z in FIG. 44.

Although an example of knowing an inclination and a vertical position by the distance measurement of three places is described, the twisting of the metallic plate 5201 can be known by the distance measurement of four places for example 4, and the flatness of the metallic plate 5201 can be known by the distance measurement of further places.

Third Example-2

FIG. 45 illustrates an example of measuring a stress strain of an automotive door by the distance measurement of more than three places. In FIG. 45, the automotive door 5221 (object) is one of the drive electrode/detection electrode. The other of the drive electrode/detection electrode is a plurality of electrodes 5223 provided to a jig 5222 for electrode positioning.

First, in a state where a stress is not applied to the automotive door 5221, an inter electrode distance between each electrode 5223 and the automotive door 5221 is measured and the distance is used as a reference value. If the stress is applied to a predetermined position of the automotive door 5221, with an electrode 5223 in the vicinity of a position to which the stress is applied as the center, an inter electrode distance between the respective electrodes 5223 increases. This allows knowing the degree of deformation/strain of the automotive door 5221 due to the stress and to what extent the strain is spread. It is possible to sequentially change a position to which the stress is applied for measurement and perform a pass/fail judgment by comparing the degree of deformation/strain with a master (reference object).

Third Example-3

FIG. 46 illustrates an example of measuring a roundness of a metal cylinder (metal column is also possible) based on a 3-point method. In FIG. 46, one of the drive electrode/detection electrode is a metal cylinder 5241 (object) itself provided so as to be rotatable and the other of the drive electrode/detection electrode is three electrodes 5242 arranged at a reference position around the metal cylinder 5241. Although a method for allowing a metal cylinder 5241 to be rotatable and a method for connecting to one of the drive electrode/detection electrode are not illustrated, for example a turntable 5181 as illustrated in FIG. 43A may be used. Although a roundness measurement based on a 3-point method is a method of measuring the roundness by rotating an object to be measured and measuring a displacement of an object to be measured at three places, since the method is known, detailed descriptions thereof are omitted.

Third Example-4

Figure 47:
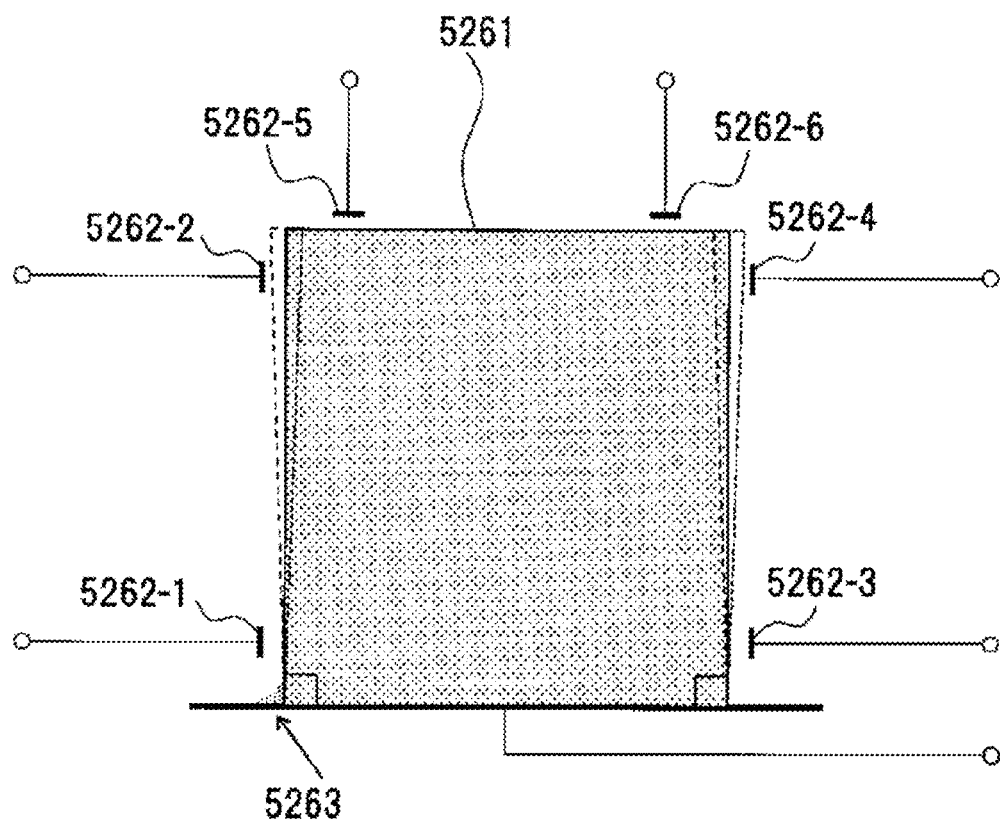
FIG. 47 illustrates a specific example of the distance measurement of three places or more.

FIG. 47 illustrates an example of measuring a squareness, a parallelism, and a size of a steel plate. In FIG. 47, one of drive electrode/detection electrode is a square steel plate 5261 (object) itself and the other of the drive electrode/detection electrode is electrodes 5262-1, 5262-2, 5262-3, 5262-4, 5262-5, and 5262-6 provided in the vicinity of the steel plate 5261. A position of the steel plate 5261 is determined by a positioning guide 5263. Inter electrode distances between electrodes 5262-1, 5262-2, 5262-3, 5262-4, 5262-5, and 5262-6 and the steel plate 5261 are respectively referred to as a first distance, a second distance, a third distance, a fourth distance, a fifth distance and a sixth distance.

The first distance to the sixth distance are measured individually by using a master steel plate having an accurate squareness and size. At this time, electrode positions may be adjusted such that inter electrode distances of respective electrodes 5262-1, 5262-2, 5262-3, 5262-4, 5262-5, and 5262-6 become the same. Next, the first distance to the sixth distance are measured individually by using the steel plate 5261 of an object.

An inclination of a steel plate side surface of a side of an electrode 5262-1 and an electrode 5262-2 (relative value with respect to master, the same applies hereinafter) can be known by knowing a difference between the first distance and the second distance, and an inclination of a steel plate side surface of a side of an electrode 5262-3 and an electrode 5262-4 can be known by knowing a difference between the third distance and the fourth distance. A lower size of the steel plate 5261 (width in FIG. 47) can be known from the first distance and the third distance and an upper size of the steel plate 5261 can be known from the second distance and the fourth distance. A size in the vicinity of the center of the steel plate 5261 can be estimated also based on (an average value of the first distance and the second distance) and (an average value of the third distance and the fourth distance.)

The parallelism between a lower surface and an upper surface of the steel plate 5261 can be known by knowing a difference between the fifth distance and the sixth distance. A size in the vicinity of a left side surface of the steel plate 5261 (vertical width in FIG. 47) can be known from the fifth distance, a size in the vicinity of a right side surface can be known from the sixth distance, and a size in the vicinity of the center of the steel plate 5261 in the left and right directions can be known from an average value of the fifth distance and the sixth distance.

Fourth Example

The fourth example and FIG. 48 to FIG. 53B illustrate a specific example when a set of drive electrodes and detection electrodes is used in the object detection by the electrostatic capacitive displacement meter of the present disclosure. A specific example illustrated in each figure is merely a representative example, and in the case of using a set of drive electrodes and detection electrodes also, the object detection by the electrostatic capacitive displacement meter of the present disclosure can be applied to a wide range of applications.

Fourth Example-1-1

Figure 48:
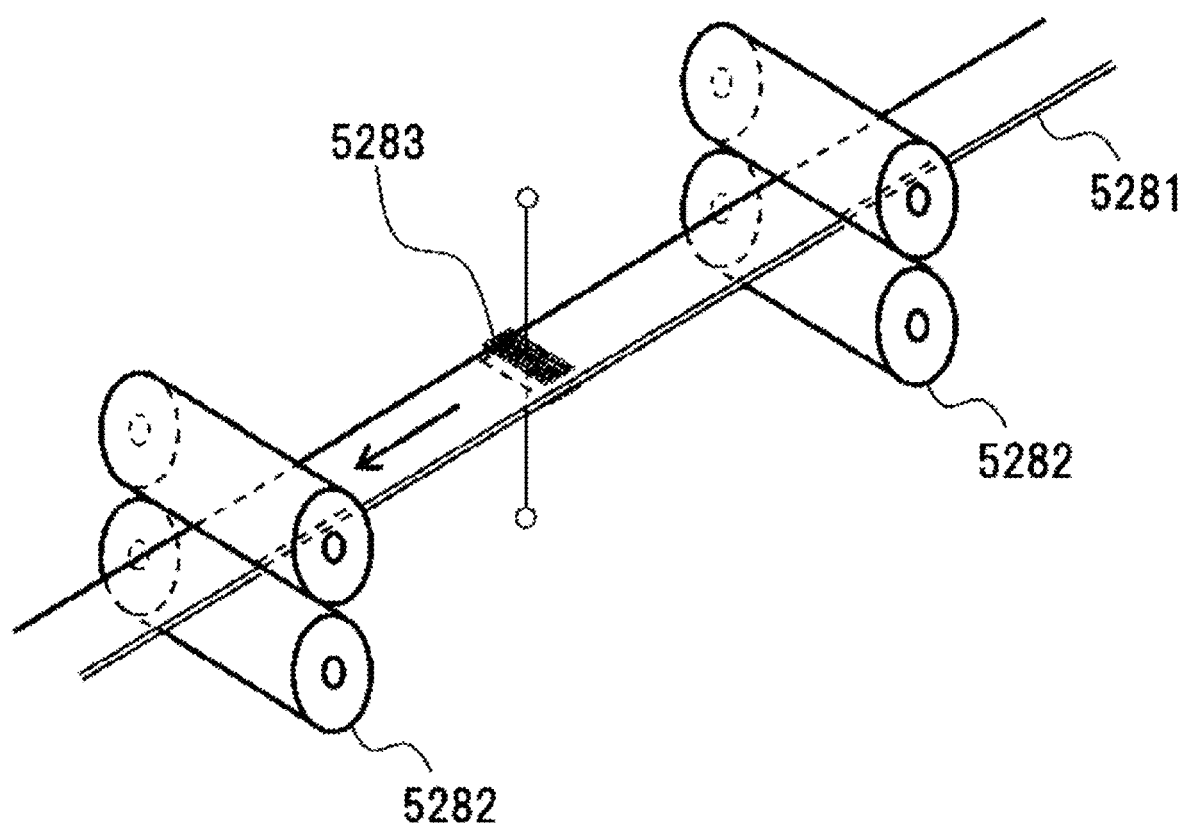
FIG. 48 illustrates a specific example of using a set of drive electrodes and detection electrodes for the object detection.

FIG. 48 illustrates an example of measuring a thickness of a tape like object such as a tape or a belt (hereinafter referred to as "tape") 5281 on a production line. A tape 5281 is sent in an arrow direction via rollers 5282 and sets of drive electrodes and detection electrodes 5283 are provided so as to sandwich the tape 5281 in a non-contact manner. The tape 5281 has a larger relative dielectric constant than air, and thus, an inter electrode capacitance Cx becomes larger than when there is no tape 5281 and the inter electrode capacitance Cx increases as the tape 5281 is thicker. Since an inter electrode distance is constant, the inter electrode capacitance Cx does not change even if the tape 5281 is moved in a vertical direction in the figure, and thus, a thickness of the tape 5281 can be known from the inter electrode capacitance Cx.

It is preferable to determine whether a thickness of the tape 5281 is normal (inter electrode capacitance Cx is between minimum value and maximum value), whether the tape 5281 is too thick (inter electrode capacitance Cx is maximum value or above), and whether the tape 5281 is too thin (inter electrode capacitance Cx is minimum value or less) by performing two comparisons, in FIG. 48, i.e., a comparison between the measured inter electrode capacitance Cx and an upper limit value of a thickness of the tape 5281 (maximum value of inter electrode capacitance Cx) and a comparison between the measured inter electrode capacitance Cx and a lower limit value of a thickness of the tape 5281 (minimum value of inter electrode capacitance Cx).

FIG. 48 illustrates an example of measuring a thickness of a tape like object having a small width by using a set of drive electrodes and detection electrodes. However, even in the case of objects having large widths such as sheets, paper, fabrics, and films, a set of drive electrodes and detection electrodes is applicable in the case where it is sufficient if a thickness of the object at a specific position is knows and when a width and an average thickness of an entire surface are known. A set of drive electrodes and detection electrodes is applicable to, for example, a paper feeding mechanism that detects that papers are fed in an overlapping manner at a specific position.

Fourth Example-2

Figure 49:
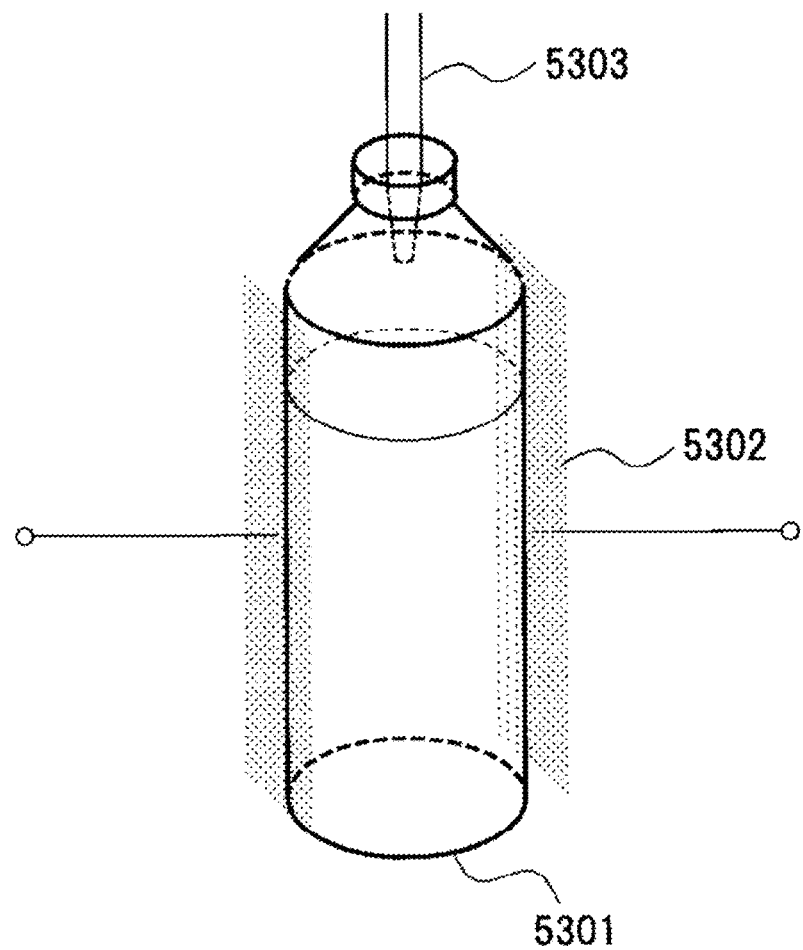
FIG. 49 illustrates a specific example of using a set of drive electrodes and detection electrodes for the object detection.

FIG. 49 illustrates an example of measuring an amount of liquid injected to a liquid container. Sets of drive electrodes and detection electrodes 5302 are provided to side surfaces of the liquid container 5301 as illustrated in the figure. A relative dielectric constant of liquid injected in the liquid container 5301 or a container is larger than a relative dielectric constant of air. For this reason, an inter electrode capacitance Cx become the smallest when the liquid container 5301 is not present between electrodes, becomes a little large when the empty liquid container 5301 is present, and becomes the largest when the maximum amount liquid is filled. This allows knowing an amount of liquid in the liquid container 5301 from the inter electrode capacitance Cx.

An inter electrode capacitance increases slightly if, for example, the liquid container 5301 fed by a belt conveyor is stopped between electrodes, and accordingly it can be detected that the liquid container 5301 is stopped at a predetermined position. When a nozzle 5303 comes down from an upper part of a container and an injection of liquid is started, as the liquid increases, an inter electrode capacitance Cx increases. When a capacitance reaches an inter electrode capacitance Cx corresponding to a predetermined amount of liquid, an injection of liquid is terminated, the nozzle 5303 is pulled upward, and then, the container is changed to a next liquid container 5301.

In the case of this example, a threshold for determine the presence or absence of the liquid container 5301 can be compared with a threshold corresponding to a predetermined amount of liquid. When a difference in an electrostatic capacitance due to an individual difference such as a thickness of the liquid container 5301 itself is in in unnegligible level, with an electrostatic capacitance when the liquid container 5301 is empty as a reference value, it can be known that an amount of liquid reaches a predetermined amount from an increase in an electrostatic capacitance.

Although FIG. 49 illustrates an example of providing sets of drive electrodes and detection electrodes 5302 that are planar electrodes to both side surfaces of the liquid container 5301, the more high sensitivity can be achieved by using electrode curved along the liquid container 5301. In this case further, the liquid container 5301 is positioned by moving curved electrodes to sandwich the liquid container 5301, and accordingly a variation in the measurement can be reduced.

As illustrated in FIG. 36 described above, electrodes provided upward and downward a liquid container can be used. In this case, a nozzle 5303 may be passed through a hole provided to an electrode of an inlet side of a container.

Fourth Example-3

In the electrostatic capacitive displacement meter of the present disclosure, individual inter electrode capacitances in a plurality of frequencies can be obtained by the object detection using a set of drive electrodes and detection electrodes and based on the capacitances, a frequency characteristic such as a dielectric constant of an object can be known.

As one example, when an object is a mixture and a frequency characteristic of a dielectric constant changes depending on a mixing ratio, it is possible to know a mixing ratio of an object and/or judge the quality of a mixture by knowing frequency characteristics of several points at characteristic frequencies.

FIG. 34A and FIG. 34B according to the twenty-first embodiment is referred.

First, drive signal generating means 201 generates a drive signal including a plurality of frequency components. As this drive signal, a frequency superposition waveform can be used. A square wave, a saw-tooth wave, and a triangular wave having a plurality of harmonic components can be used, and these waveforms can be easily generated by a commonly used technique. (Although it is possible to use a waveform having more frequency components such as white noise and pink noise, since a frequency component of each waveform is small, an S/N ratio may not be expected that much.)

Measuring means 620 is configured to be able to know each of a plurality of frequencies required. As one example, the measuring means 620 may have a configuration similar to that of measuring means 614 in FIG. 18A according to the fourteenth embodiment and measuring means 614-3 in FIG. 20A.

When frequency superposition waveforms of n frequencies of f1 . . . fn are used as drive signals, frequency characteristics of n points of f1 . . . fn can be known. When a square wave and a saw-tooth wave are used as drive signals, a frequency characteristic for a necessary frequency component of a fundamental wave and a harmonic can be known.

A frequency superposition waveform is likely to have a larger amplitude than a sine wave of a single frequency and an output of an amplifier of signal detection means is more likely to be saturated. To reduce this possibilities, individual frequencies to be superimposed may be selected appropriately phases of individual frequency components to be superimposed may be adjusted respectively and an adjustment may be made such that a peak voltage of a frequency superposition waveform becomes minimum or becomes small as much as necessary. When frequencies to be superimposed are known in advance, each phase through which a peak voltage becomes small can be obtained by calculation or simulation.

Figure 50A:
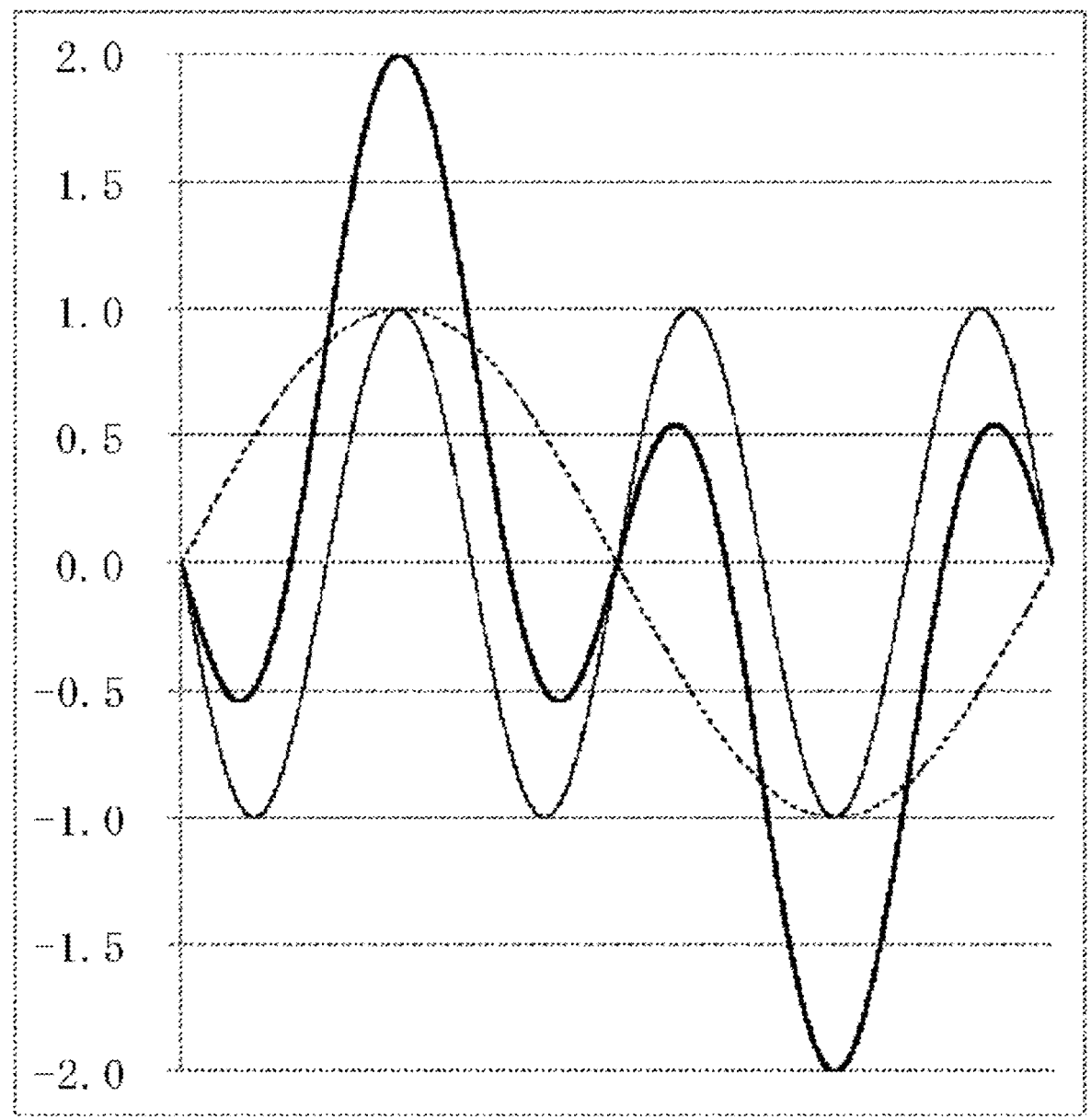
FIG. 50A illustrates an example of a relationship between a frequency superposition waveform and a phase.
Figure 50B:
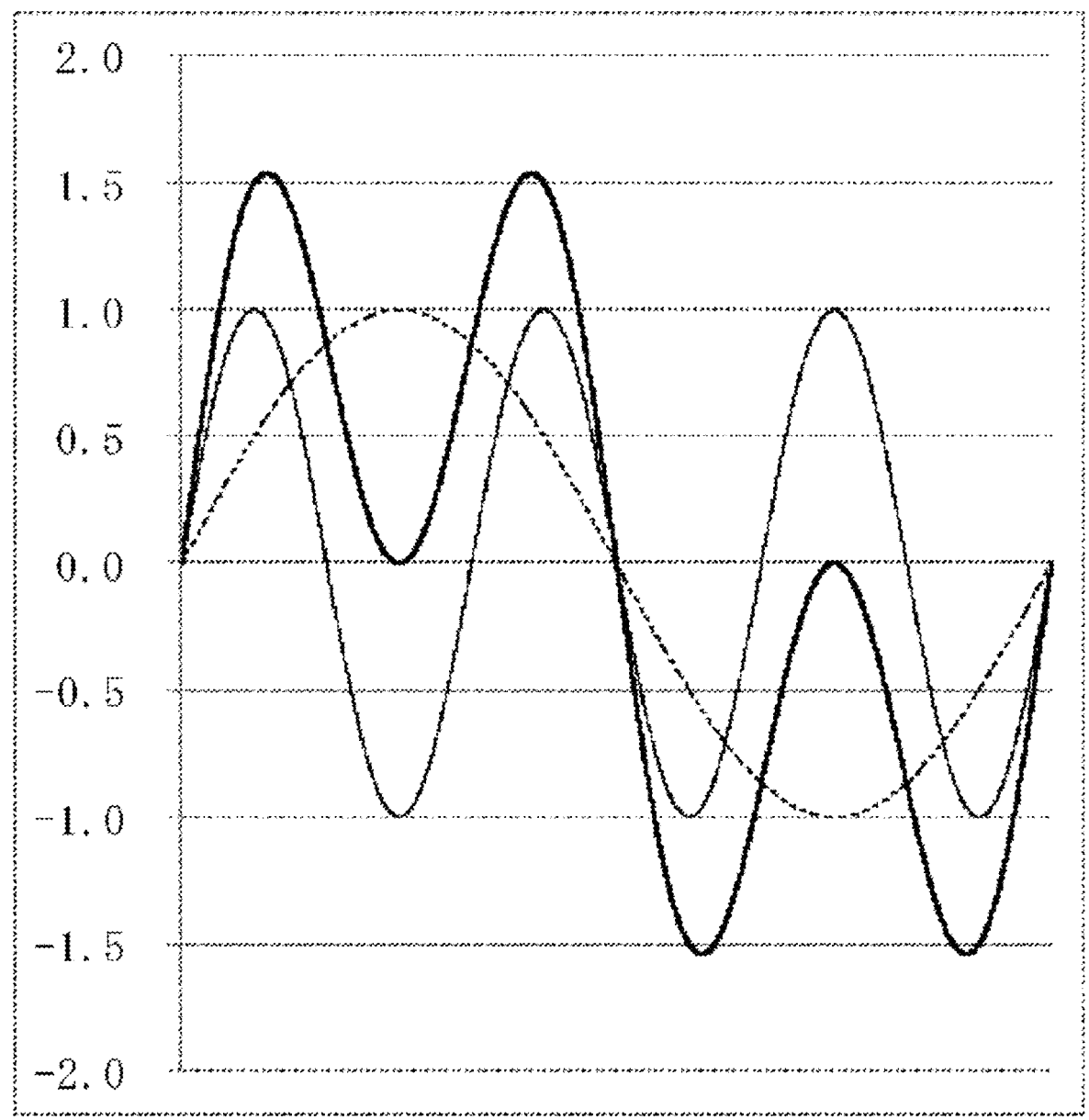
FIG. 50B illustrates an example of a relationship between a frequency superposition waveform and a phase.

FIG. 50A and FIG. 50B illustrate, as one example, an example when sine waves of 1 kHz and 3 kHz are superimposed. FIG. 50A illustrates the case where a phase of 3 kHz (thin solid line) is 180 degrees when a phase of 1 kHz (dotted line) is 0 degree. A peak value of the frequency superposition waveform in this case (thick solid line) is twice a peak value of a sine wave of 1 kHz or a sine wave of 3 kHz. FIG. 50B illustrates the case where a phase of 3 kHz (thin solid line) is also 0 degree when a phase of 1 kHz (dotted line) is 0 degree. A peak value of the frequency superposition waveform (thick solid line) of this case is about 1.54 times a sine wave of 1 kHz or 3 kHz. That is, in this case, a peak voltage can be reduced to nearly 80% by selecting phases of frequency components to be superimposed.

As another method of knowing a frequency characteristic, a method of sweeping a drive signal frequency can be used, and in this case, for example, an electrostatic capacitive displacement meter using CM circuits of FIG. 17A to FIG. 17C is used.

In drive signal generating means 213 in FIG. 17A or drive signal generating means 201 in FIG. 17B or FIG. 17C, frequencies to be measured are sequentially generated (frequencies are swept). As measuring means 620, measuring means 613 in FIG. 17A, measuring means 613-1 in FIG. 17B, and measuring means 613-2 in FIG. 17C are used individually. For configurations, operations, features and the like of the means in FIG. 17A to FIG. 17C, please refer to relevant parts of descriptions in the fourteenth embodiment and further descriptions are omitted here.

Fourth Example-4

FIG. 51A to FIG. 52B illustrate an example of instructing a device to perform some sort of operations by moving a part of a human body (a finger is illustrated) close to/away from between electrodes and an example of using the electrostatic capacitive displacement meter of the present disclosure as a proximity sensor.

Figure 51A:
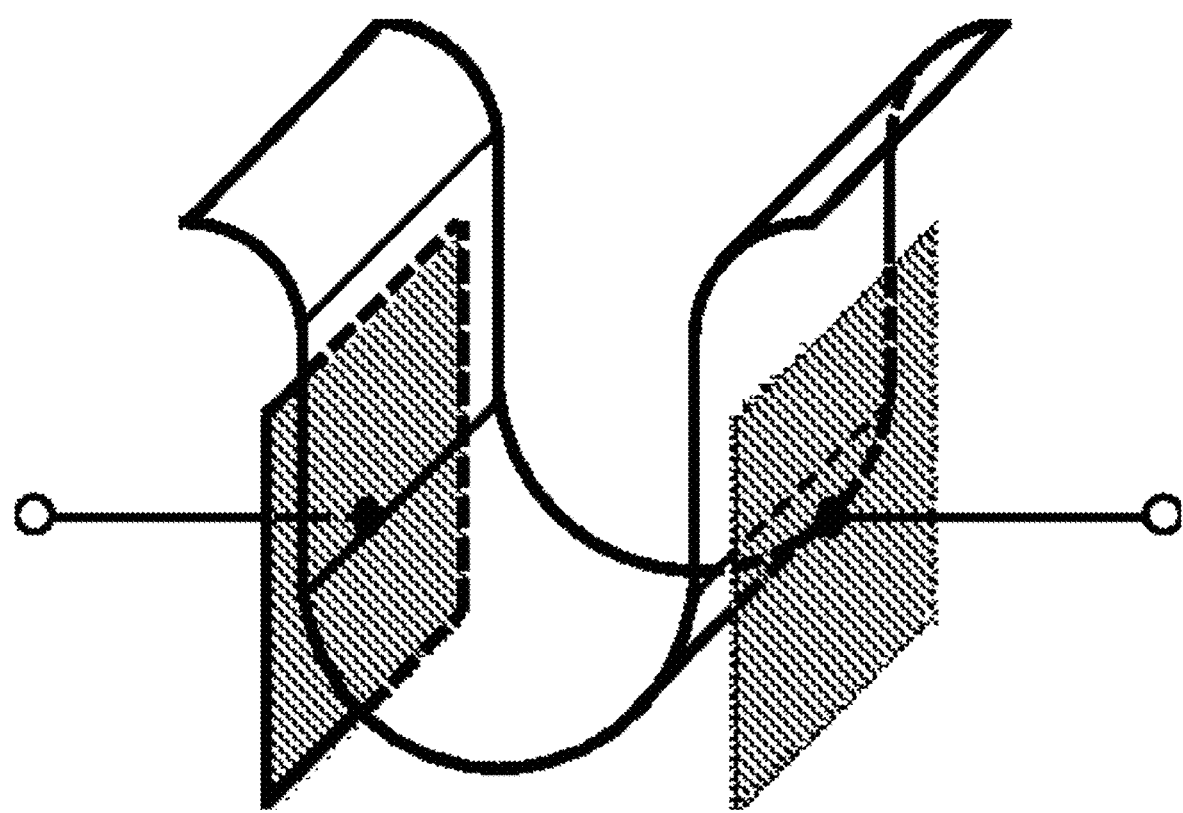
FIG. 51A illustrates a specific example of using a set of drive electrodes and detection electrodes for the object detection.
Figure 51B:
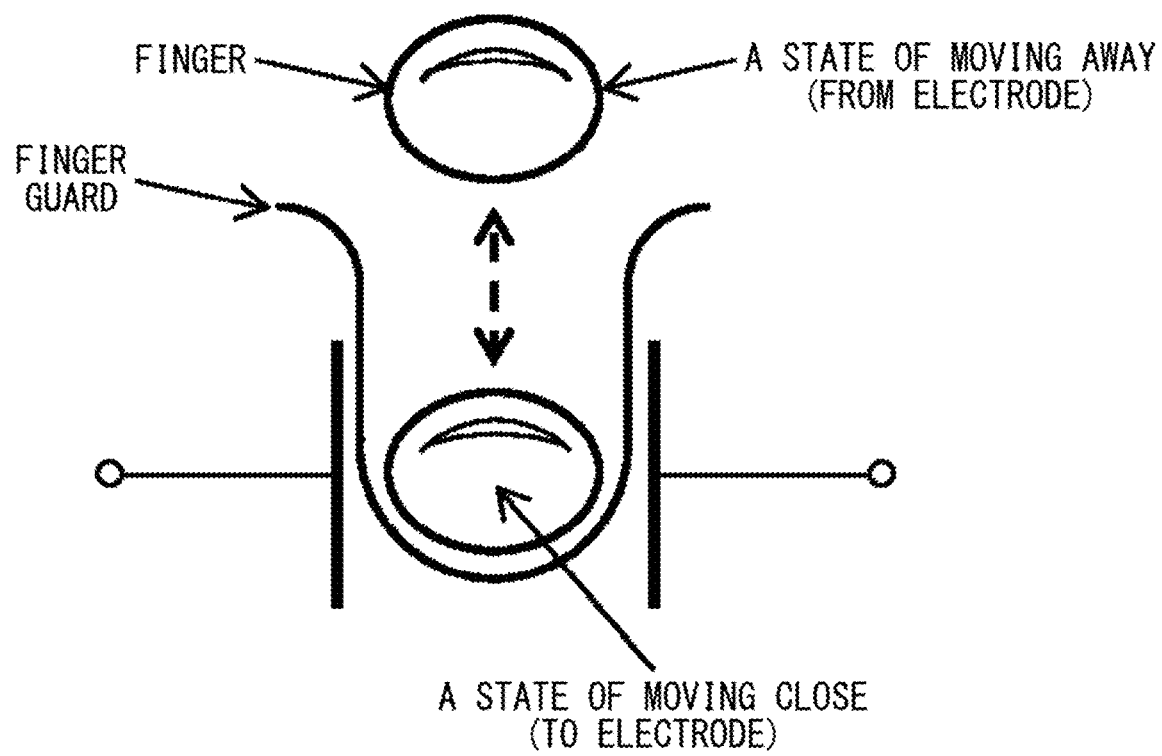
FIG. 51B illustrates a specific example of using a set of drive electrodes and detection electrodes for the object detection.

FIG. 51A is a perspective view showing an example of a positional relationship between an electrode and a finger guard and FIG. 51B is a front view illustrating an example of a positional relationship between an electrode and a finger guard and also illustrates moving close/moving away state of a finger. A finger guard has functions to restrict a movable range of a finger and to prevent a finger from directly touching an electrode.

Figure 52A:
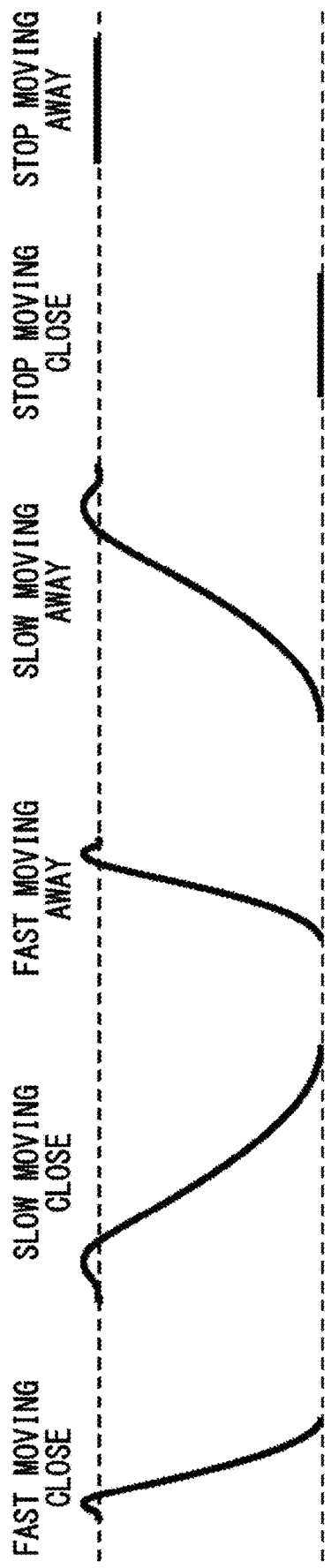
FIG. 52A illustrates a specific example of using a set of drive electrodes and detection electrodes for the object detection.
Figure 52B:
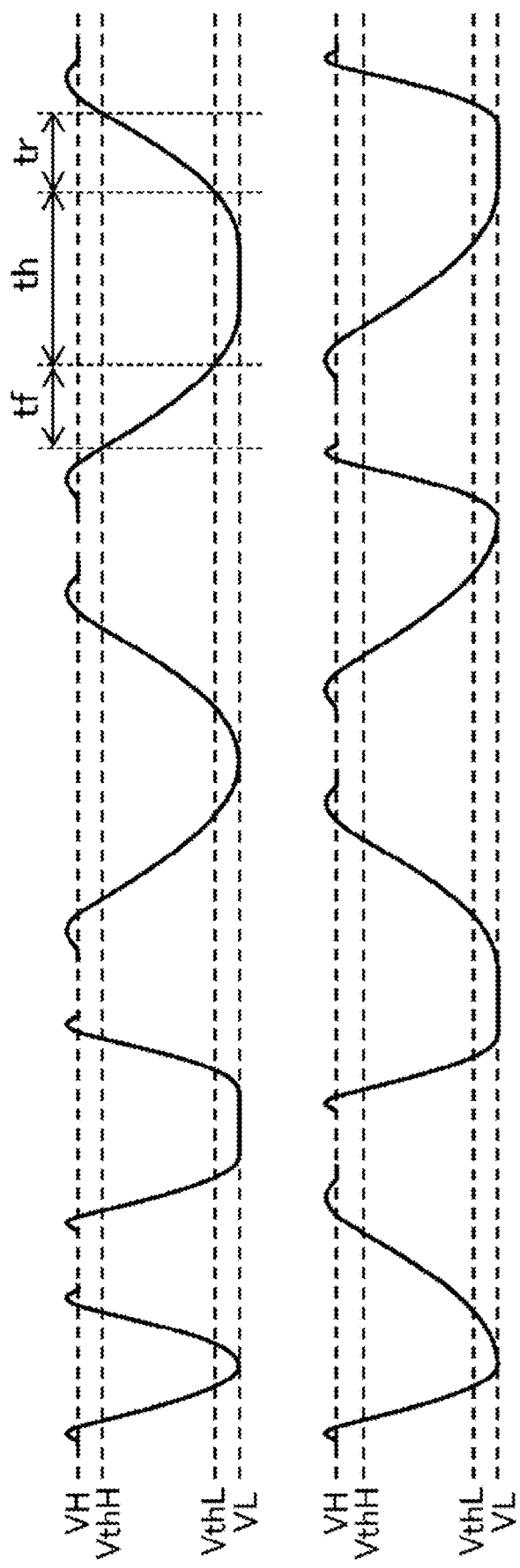
FIG. 52B illustrates a specific example of using a set of drive electrodes and detection electrodes for the object detection.

FIG. 52A and FIG. 52B illustrate examples of output voltages of the electrostatic capacitive displacement meter of the present disclosure when a finger is moved close or away in FIG. 51A and FIG. 51B. For the electrostatic capacitive displacement meter of the present disclosure, generally, a human body behaves like a grounded conductor, and thus, if a finger is moved close to an electrode, an inter electrode capacitance decreases, and if a finger is moved away from an electrode, a state of an inter electrode capacitance returns to an original state.

FIG. 52A illustrates examples of patterns of moving close/away a finger in FIG. 51A and FIG. 51B and examples of output voltages of the electrostatic capacitive displacement meter of the present disclosure corresponding to individual patterns. When a state of a finger is shifted quickly from a moving away state to a moving close state, an output voltage deceases rapidly to exhibit a "fast moving close state". When a state of a finger is shifted slowly from a moving away state to a moving close state, an output voltage decreases slower to exhibit a "slow moving close state". When a state of a finger is shifted quickly from a moving close state to a moving away state, an output voltage is raised rapidly to exhibit a "fast moving away state". When a state of a finger is shifted slower from a moving close state to a moving away state, an output voltage is raised slowly to exhibit a "slow moving away state". When a finger is stopped at a moving close state, an output voltage remains decreased to exhibit "stop moving close" and when a finger is stopped at a moving away state, an output voltage remains raised to exhibit "stop moving away".

FIG. 52B illustrates a combination of six patterns of moving close/away a finger illustrated in FIG. 52A. An upper left end part indicates an output voltage when fast moving close and fast moving away are continuously generated. An upper left middle part indicates an output voltage when a finger is sopped at a moving close state after fast moving close and then moving away quickly. An upper right middle part indicates a state where slow moving close and slow moving away are continuously generated and an upper right end part indicates an output voltage when stop/slow moving away is generated in a slow moving close/moving close state. A lower left end part indicates a state where fast moving close and slow moving away are continuously generated an a lower left middle part indicates an output voltage when stop/slow moving away is generated in a fast moving close/moving close state. A lower right middle part indicates a state where slow moving close and fast moving away are continuously generated and a lower right end part indicates an output voltage when stop/fast moving away is generate in a slow moving close/moving close state. That is, FIG. 52B illustrates that eight patterns can be obtained from a combination of six patterns in FIG. 52A.

In FIG. 52B, an output voltage in a moving away state is VH and an output voltage in a moving close state is VL. A high level threshold voltage VthH and a low level threshold voltage VthL are set between VH and VL as illustrated in the figure. As one example, a voltage lower than VH by 10% of a voltage difference between VH and VL can be set as a high level threshold voltage VthH and a voltage higher than VL by 10% of a voltage difference between VH and VL can be set as a low level threshold voltage VthL.

An output voltage VH when a finger is in a moving away state is hardly affected by a size and the like of a finger. On the other hand, an output voltage VL when a finger is in a moving close state is highly likely to differ depending on a size and the like of a finger. In such a case, for example, a difference in a size and the like of a finger can be absorbed by setting an output voltage that becomes the lowest in a moving close state as an output voltage VL in a moving close state.

A time during which an output voltage decreases from a high level threshold voltage VthH to a low level threshold voltage VthL is set as a fall time tf, a time during which an output voltage is lower than a low level threshold voltage VthL is set as a stop time th, and a time during which an output voltage is raised from a low level threshold voltage VthL to a high level threshold voltage VthH is set as a rise time tr.

If a fall time tf is shorter than a predetermined fall time threshold, a finger is in a "fast moving close state" and if a fall time tf is equal to or greater than a fall time threshold, a finger is in a "slow moving close state". If a stop time th is shorter than a predetermined stop time threshold, it is determined that moving close and stop are continuously generated and if a stop time th is equal to or greater than a stop time threshold, it can be determined that a finger is stopped from moving close. If a rise time tr is shorter than a predetermined rise time threshold, it can be determined that a finger is in a "fast moving away state" and if a rise time tr is equal to or greater than a rise time threshold, it can be determined that a finger is in a "slow moving away state". To make such a determination, comparison determination means described in the nineteenth embodiment described above can be used.

Eight patterns in FIG. 52B can be used as eight types of operation instructions by identifying the patterns. As one example, in an automobile, the continuation of slow moving close and slow moving away can be set as an instruction to lock a door, the continuation of fast moving close and fast moving away can be set as an instruction to unlock a door, the continuation of slow moving close and fast moving away can be set as an instruction to open a window, and the continuation of fast moving close and slow moving away as an instruction to close a widow. When a finger is stopped in a moving close state, an open/close speed of a window is decreased and when a finger is not stopped, an open/close speed of a window is increased.

Although sizes of a finger vary from person to person, to make it available to everyone, as one example, a width of a finger guard in FIG. 51A is about 30 mm and an inter electrode distance is further increased. This makes it difficult to apply an electrostatic capacitive displacement meter of prior art configured to measure short distance for such application.

Fourth Example-5

Figure 53A:
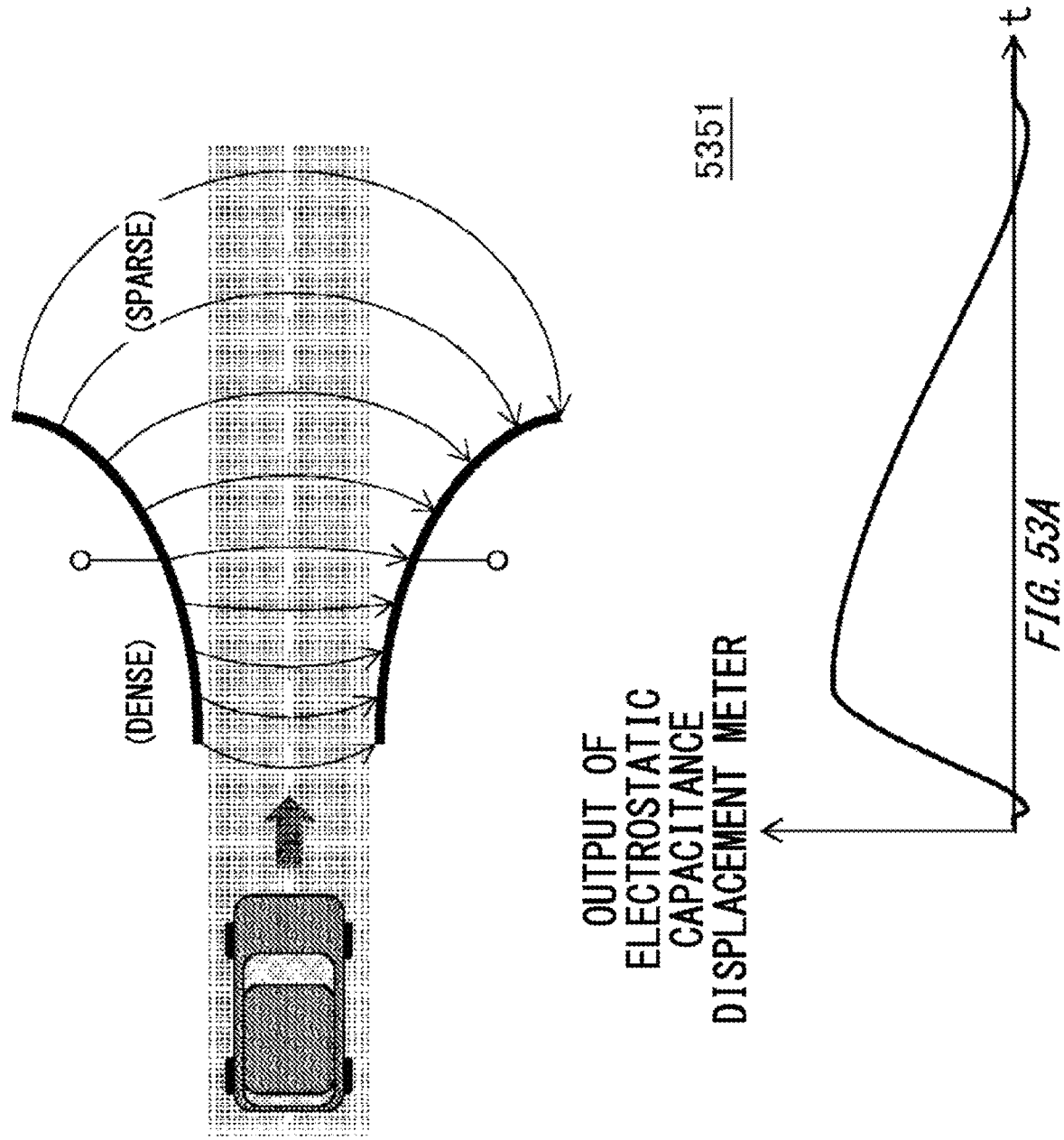
FIG. 53A illustrates a specific example of using a set of drive electrodes and detection electrodes for the object detection.
Figure 53B:
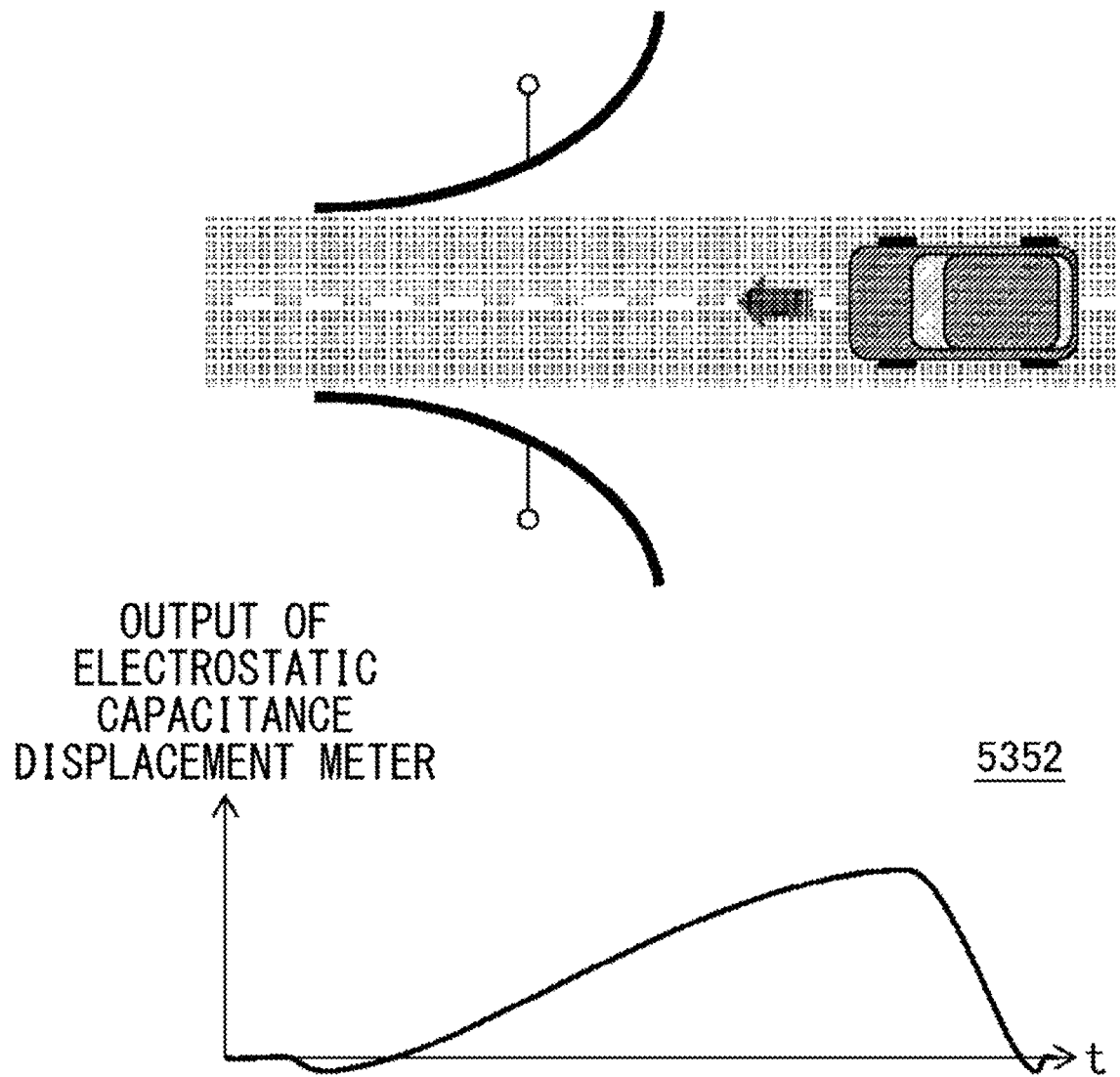
FIG. 53B illustrates a specific example of using a set of drive electrodes and detection electrodes for the object detection.

FIG. 53A and FIG. 53B illustrate an example of an electrostatic capacitive displacement meter that allows knowing a movement direction of an object that moves between electrodes.

FIG. 53A illustrates an example in the case where an object moves from left to right and an example of an output voltage waveform of an electrostatic capacitive displacement meter at that time. FIG. 53B illustrates an example in the case where an object moves from right to left and an example of an output voltage waveform of an electrostatic capacitive displacement meter at that time.

FIG. 53A and FIG. 53B illustrate a state where an automobile that is one example of an object to be measured travels on a road. An illustrated automobile is a floating conductor and when an automobile travels between electrodes, an inter electrode capacitance increases.

In FIG. 53A and FIG. 53B, in a left direction of the figure, a distance between electrodes is short and in a right direction of the figure, a distance between electrodes is long. In such a case, as illustrated in FIG. 53A, a density of a line of electric force is high at a place where a distance between electrodes is short and a density of a line of electric force is low at a place where a distance between electrodes is long.

In a process of an automobile traveling from left to right between electrodes as illustrated in FIG. 53A, an output voltage of an electrostatic capacitive displacement meter increases rapidly when an automobile travels an area where a density of lines of electric force is high and an output voltage of an electrostatic capacitive displacement meter decreases slowly when an automobile travels an area where a density of lines of electric force is low. On the other hand, in a process of an automobile traveling from right to left as illustrated in FIG. 53B, an output voltage of an electrostatic capacitive displacement meter increases slowing when an automobile travels an area where a density of lines of electric force is low and an output voltage of an electrostatic capacitive displacement meter decreases rapidly when an automobile travels an area where a density of lines of electric force is high.

When a traveling speed of an automobile is fast, an output voltage of an electrostatic capacitive displacement meter increases/decreases more rapidly and when a traveling speed is slow, an output voltage of an electrostatic capacitive displacement meter increases/decreases more slowly.

That is, a traveling direction of an automobile can be known based on whether a rise time is longer or shorter than a fall time of an output voltage of an electrostatic capacitive displacement meter. Further, a traveling speed of an automobile can be known based on a sum of a rise time and a fall time.

An output voltage of an electrostatic capacitive displacement meter when an automobile travels from left to right as illustrated in FIG. 53A changes as shown in a graph 5351 in FIG. 53A and an output voltage when an automobile travels from right to left as illustrated in FIG. 53B changes as shown in a graph 5352 in FIG. 53B. (Although in FIG. 53B, an automobile travels from right to left, in a graph 5352 in FIG. 53B, a time axis extends in a right direction, and thus, an output voltage changes from left to right in the figure.)

Fourth Example—Others

The object detection by the electrostatic capacitive displacement meter of the present disclosure by using a set of drive electrodes and detection electrodes can be used for other various applications, and thus, those are listed below.

A mixing ratio of drugs and the like and the alcohol concentration in alcoholic beverages are obtained based on a relative dielectric constant of an object.

Water volumes of soils, sands, and concrete blocks are obtained based on a relative dielectric constant of an object The presence or absence, an amount and the like of cream in a cream puff are obtained based on a relative dielectric constant of an object.

An amount of foods in a tray is obtained based on a relative dielectric constant of an object.

An amount, a type and the like of contents in a container are obtained based on a relative dielectric constant of an object.

The number, types and the like of accessories and the like in a container are inspected without contact.

The amount of liquid and powder in a tank and a case and a water level in the bath are detected/controlled.

Bubbles in tires, rubber, resin parts and the like are obtained based on a relative dielectric constant of an object.

Metal pieces adhered to a film and the like are detected.

A state of an object is known from a shape change of an object such as a battery or an electrolytic capacitor that expands when it is deteriorated.

A thickness and a relative dielectric constant of a copper-clad laminate whose electrostatic capacitance is determined based on a product of an area, a thickness, and a dielectric constant are known.

An inter-pattern capacitance of a printed circuit board is known. (A micro capacitance can be also measured by the CM of the present disclosure.)

Entries of people and vehicles into a no entry area such as a museum are detected.

An entry into a hazardous area due to an operation of an industrial robot is prevented.

The object detection can be widely applied to the detection and the like of the presence or absence of an object and the proximity of an object.

In applications shown in the fourth example, modified examples of shapes and positional relationships of electrodes as in the fifth example described later can be applied.

In applications shown in the fourth example, when the object detection is performed at a plurality of locations, a method as in the sixth example described later can be applied.

Fifth Example

The fifth example and FIG. 54A to FIG. 55C illustrate modified examples of shapes and positional relationships of electrodes in the object detection by the electrostatic capacitive displacement meter of the present disclosure by using a set of drive electrodes and detection electrodes.

For example, FIG. 48 and FIG. 49 according to the fourth example illustrate an example of arranging a drive electrode and a detection electrode to face with each other. On the other hand, FIG. 54A to FIG. 54D according to the fifth example illustrate an example of arranging a drive electrode and a detection electrode in parallel. FIG. 55A to FIG. 55C according to the fifth example illustrate an example of arranging a drive electrode and a detection electrode concentrically.

Fifth Example-1

Figure 54A:
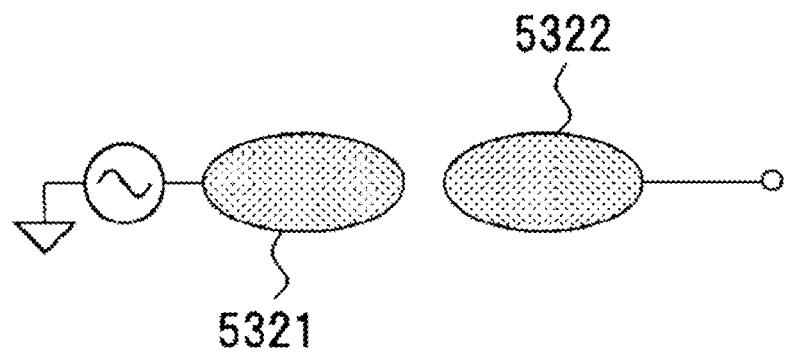
FIG. 54A illustrates a modified example of a shape or a positional relationship of an electrode used for the object detection.
Figure 55A:
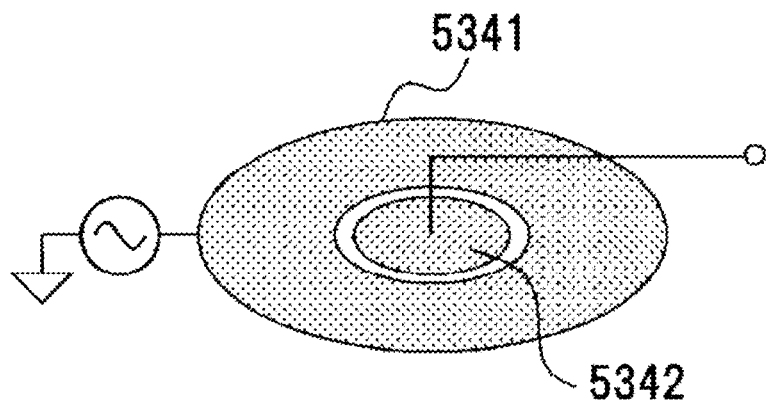
FIG. 55A illustrates a modified example of a shape or a positional relationship of an electrode used for the object detection.
Figure 55B:
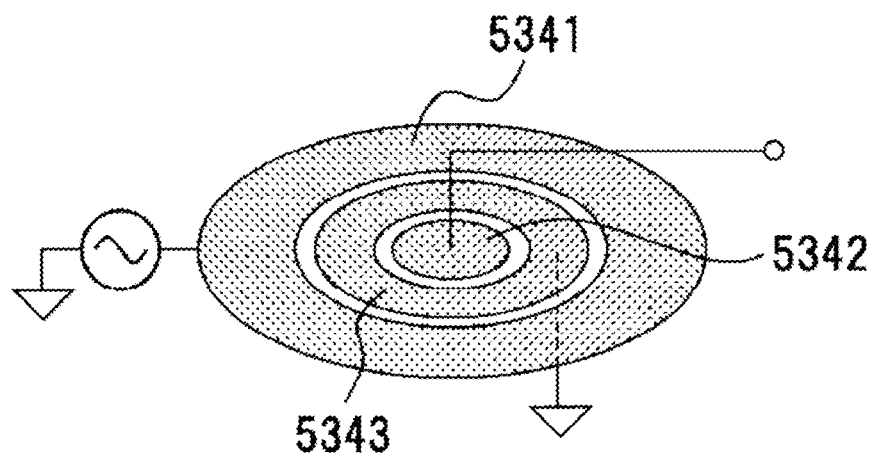
FIG. 55B illustrates a modified example of a shape or a positional relationship of an electrode used for the object detection.
Figure 55C:
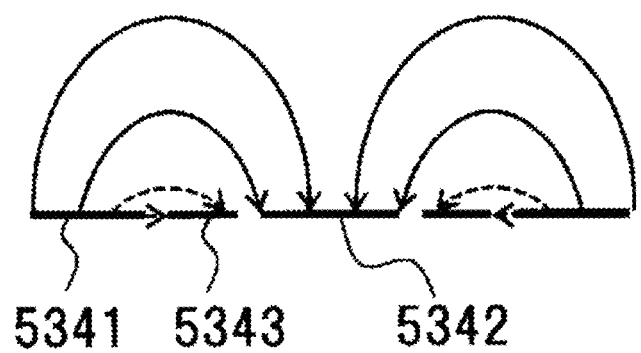
FIG. 55C illustrates a modified example of a shape or a positional relationship of an electrode used for the object detection.

FIG. 54A illustrates an example of arranging horizontally a circular drive electrode 5321 and a circular detection electrode 5322 on the same plane surface (that is, parallel arrangement). A shape or an arrangement of an electrode is one example and it can be selected freely depending on an application. For example, electrodes may be rectangular and may be arranged to have different highs or to have inclinations.

Figure 54B:
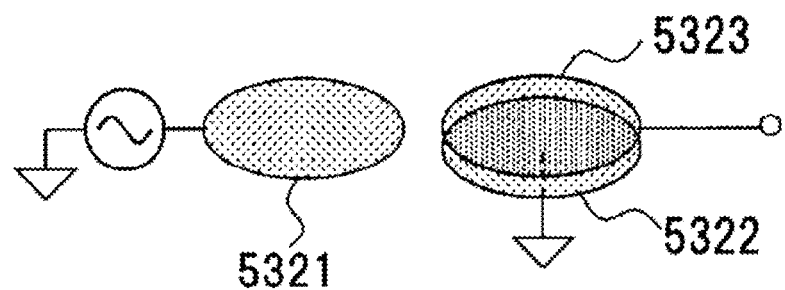
FIG. 54B illustrates a modified example of a shape or a positional relationship of an electrode used for the object detection.

FIG. 54B illustrates an example of providing a shield electrode 5323 in the vicinity of a detection electrode 5322. Similarly, a shield electrode 5323 can be provided relative to a drive electrode 5321. Although no problem is caused even if a shield electrode 5323 has a different size from a detection electrode 5322 and a drive electrode 5321, the shield electrode 5323 is preferably set to be a little large. It is also possible to provide a common large shield electrode 5323 in the vicinity of a detection electrode 5322 and a drive electrode 5321. Electrode using printed circuit boards as described in the sixth embodiment are suitable for the parallel arrangement.

Figure 54C:
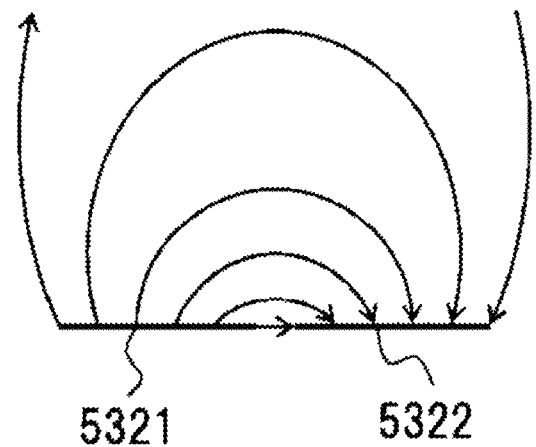
FIG. 54C illustrates a modified example of a shape or a positional relationship of an electrode used for the object detection.

FIG. 54C illustrates only lines of electric force of one side among lines of electric force between a drive electrode 5321 and a detection electrode 5322 arranged in parallel.

Figure 54D:
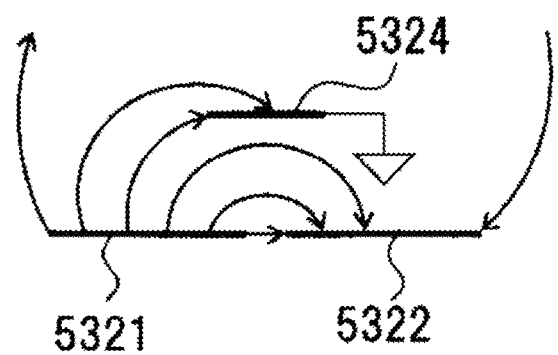
FIG. 54D illustrates a modified example of a shape or a positional relationship of an electrode used for the object detection.

FIG. 54D illustrates an example of lines of electric force when a ground conductor 5324 is close in the vicinity of a drive electrode 5321 and a detection electrode 5322 arranged in parallel. In this case, an inter electrode capacitance Cx decreases because a part of lines of electric force from a drive electrode 5321 does not reach a detection electrode 5322 by reaching to a grounded conductor 5324. For example, the object detection of detecting the proximity of a grounded conductor can be performed by detecting a decrease in such an inter electrode capacitance Cx.

On the other hand, when an object having a larger dielectric constant than air (for example, liquid) (not illustrated) and a floating conductor (not illustrated) are close in the vicinity of a drive electrode 5321 and a detection electrode 5322 arranged in parallel, an inter electrode capacitance Cx increases. For example, the object detection of detecting the proximity of a liquid container, an automobile and the like can be performed by detecting an increase in such an inter electrode capacitance Cx.

Fifth Example-2

FIG. 55A illustrates examples of a donut shaped drive electrode 5341 and a circular detection electrode 5342 located at a portion corresponding to the hole of a donut. Such a shape/arrangement of an electrode is referred to as a concentric arrangement.

FIG. 55B illustrates an example of providing a donut shaped guard electrode 5343 between a drive electrode 5341 and a detection electrode 5342 and FIG. 55C illustrates lines of electric force in such a case. When the guard electrode 5343 is present, lines of electric force generated close (low) to a surface on which an electrode is arranged from a drive electrode 5341 reach a guard electrode 5343 and only lines of electric force generate far (high) from a surface on which an electrode is arranged reach a detection electrode 5342. This allows expecting to function as an electrode arrangement suitable for a detection of an object farther from an electrode plane.

In a concentric arrangement of electrodes also, a shape, an arrangement and the like of electrodes can be freely selected, and it is possible to change a ratio of a diameter of each electrode, change a shape of an electrode from circle to square, and appropriately add a guard electrode. Electrodes using printed circuit boards as described in the sixth embodiment are suitable for a concentric arrangement. A drive electrode and a detection electrode may be replaced for usage.

A decrease in an electrostatic capacitance due to the proximity of a grounded conductor or an increase in an electrostatic capacitance due to the proximity of an object having a higher relative dielectric constant than air and a floating conductor is similar to that in the above described parallel arrangement, and thus descriptions thereof are omitted.

Such a parallel arrangement, a concentric arrangement and the like of electrodes are suitable for the detection of moving close/away of an object (proximity switch or proximity sensor) and the detection of an increase or the like in a dielectric constant of a close object (for example, detection of the presence or absence or an amount of contents). In such a case, it is particularly preferable to make a determination for the object detection by using an appropriate threshold. An arrangement of electrodes in such a case is not limited to a parallel arrangement or a concentric arrangement. Various other electrode arrangements that can realize similar functions are conceivable, and a parallel arrangement and a concentric arrangement are merely representative examples of the arrangements.

Sixth Example

The sixth example and FIG. 56A to FIG. 63B illustrate an example of the object detection of multiple objects by using a plurality of detection electrodes, or a plurality of drive electrodes, or a plurality of detection electrodes and a plurality of drive electrodes in the object detection by the electrostatic capacitive displacement meter of the present disclosure.

Sixth Example-1

Figure 56A:
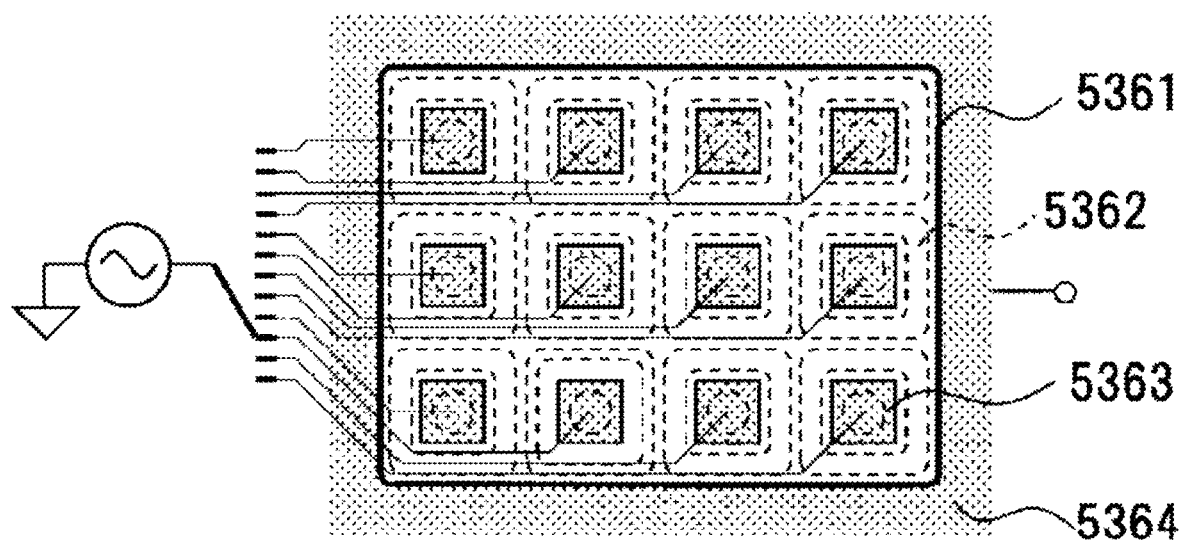
FIG. 56A illustrates an example of performing the object detection of multiple objects.
Figure 56B:
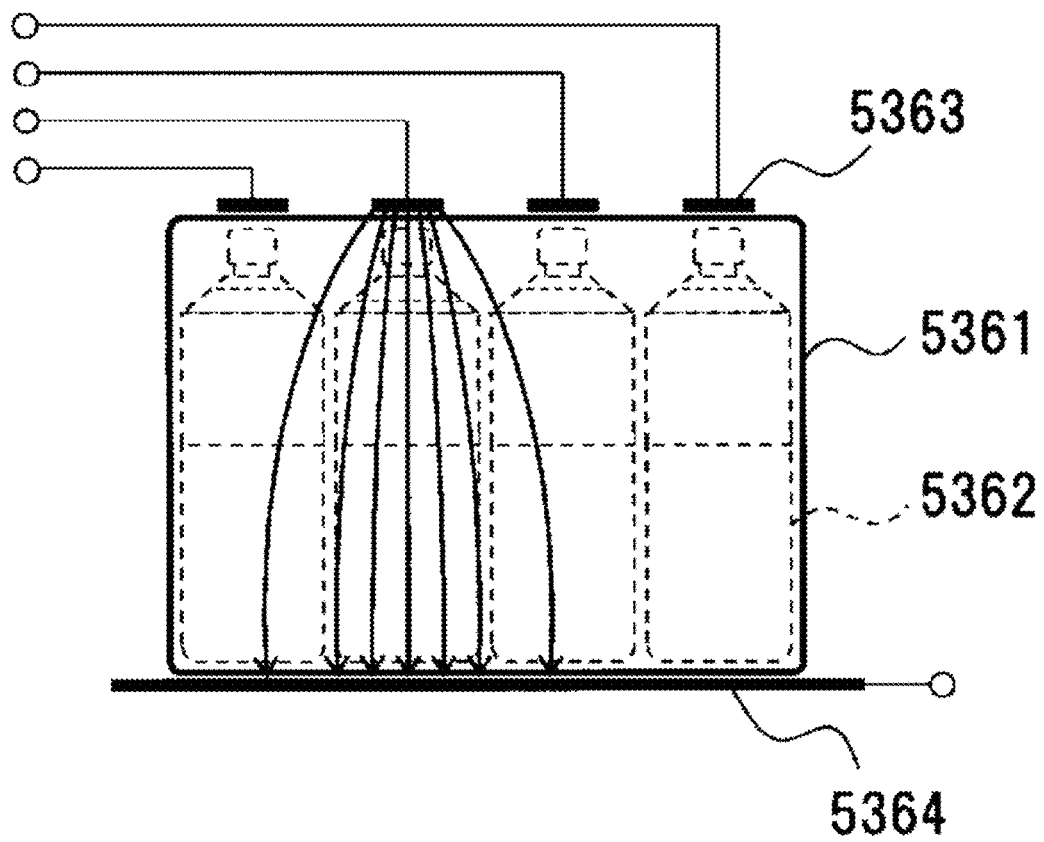
FIG. 56B illustrates an example of performing the object detection of multiple objects.

As an example of performing the object detection of multiple objects, FIG. 56A and FIG. 56B illustrate an example of inspecting contents in each of a plurality of PET bottles 5362 in a packing box 5361. A PET bottle 5362 (object) in a packing box 5361 may not be seen from an outside and does not allow laser light to be passed through, and thus, an inner capacity may not be inspected by a laser displacement meter. Further, an eddy current displacement meter may not be applied to such object because the object is not metal. With respect to a height of a PET bottle 5362, a height of a 500 milliliter PET bottle is about 200 mm and a height of 1.5 liter PET bottle or 2 liter PET bottle is over 300 mm. For this reason, a content inspection of a PET bottle in a packing box becomes possible for the first time by the electrostatic capacitive displacement meter using the CM circuit of the present disclosure.

FIG. 56A is a top view of electrodes of a packing box 5361 including a PET bottle 5362 in a packed state and FIG. 56B is a side view of a packing box 5361 or electrodes. A PET bottle 5362 in a packing box 5361 is indicated by a broken line. FIG. 56A illustrates an example of providing a square drive electrode 5363 on an upper part of each PET bottle 5362 (upper part of packing box) to match with square cross sections of illustrated PET bottles 5362. FIG. 56A illustrates an example of providing a detection electrode 5364 larger than a packing box 5361 to a lower part of a packing box 5361. A shape, a size and the like of a drive electrode 5363 and a detection electrode 5364 are not limited to these.

Although FIG. 56A illustrates an example of switching a drive electrode 5363 by using a method in FIG. 22 of the above described fourteenth embodiment, the present invention is not limited to the method. Various methods of measuring capacitances at a plurality of locations as shown in the fourteenth embodiment can be appropriately applied and these can be appropriately combined for applications.

FIG. 56B illustrates the case where an inner capacity of a second PET bottle 5362 from the left is small among PET bottles 5362. FIG. 56B illustrates one example of lines of electric force from an upper drive electrode 5363 to a lower detection electrode 5364 of one of PET bottles 5362. Most of lines of electric force is directed from a drive electrode 5363 to a detection electrode 5364, and thus, an inter electrode capacitance Cx is dominantly determined by an inner capacity of a PET bottle 5362 positioned immediately below a drive electrode 5363. Some lines of electric force pass through a PET bottle 5362 around a drive electrode 5363, and thus, if some or all inner capacity of a PET bottle 5362 around the electrode is extremely different, some influence may occur. However, it is possible to know that an inner capacity of the PET bottle 5362 is extremely different when a drive electrode 5363 provided to an upper part of the PET bottle 5362 is driven for measurement, and thus, an influence on the surrounding may be corrected by calculation. If it is detected that an inner capacity of even one of PET bottles 5362 in a packing box 5361 is extremely different, PET bottles 5362 fail inspection in a unit of a packing box 5361 thereof, and it becomes necessary to replace a PET bottle 5362, and an influence of a surrounding condition to a measurement result by state does not become a big problem.

Sixth Example-2

Figure 57A:
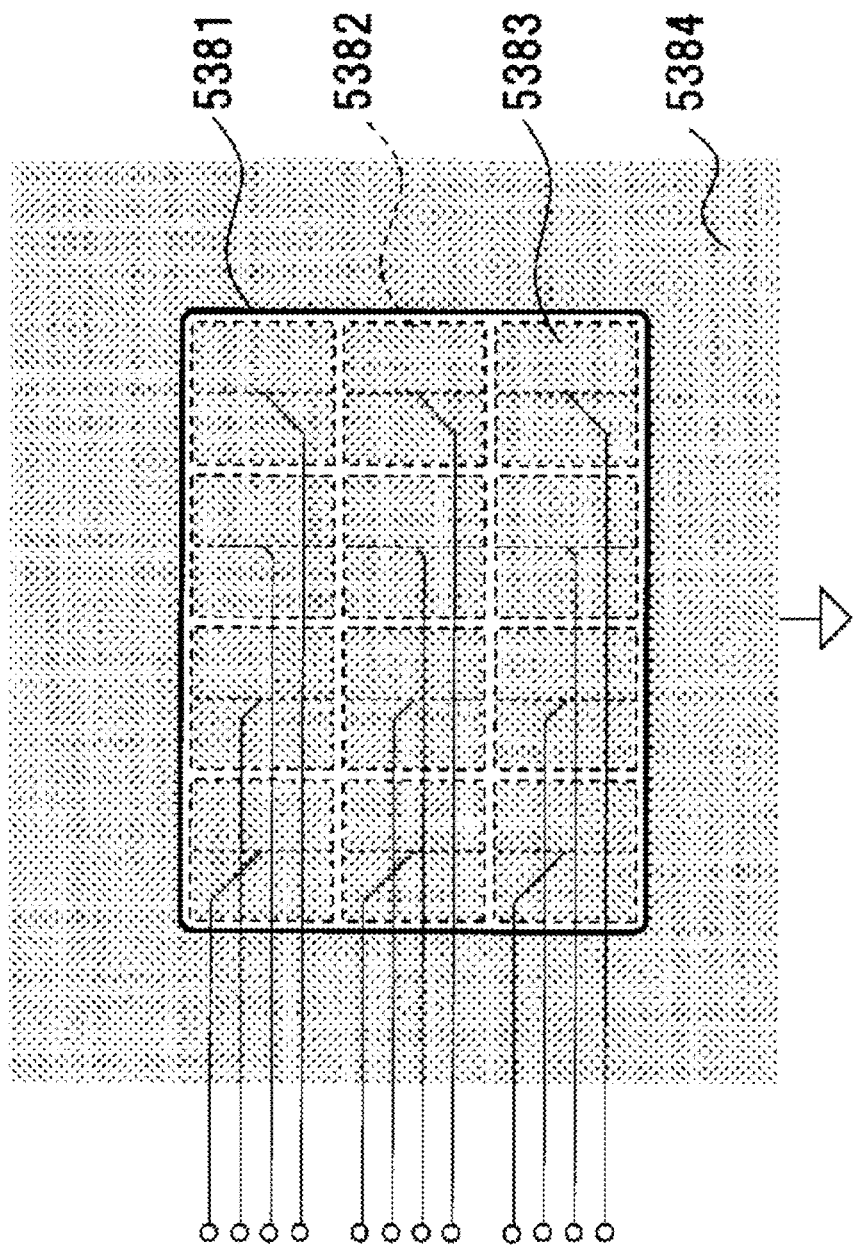
FIG. 57A illustrates an example of performing the object detection of multiple objects.
Figure 57B:
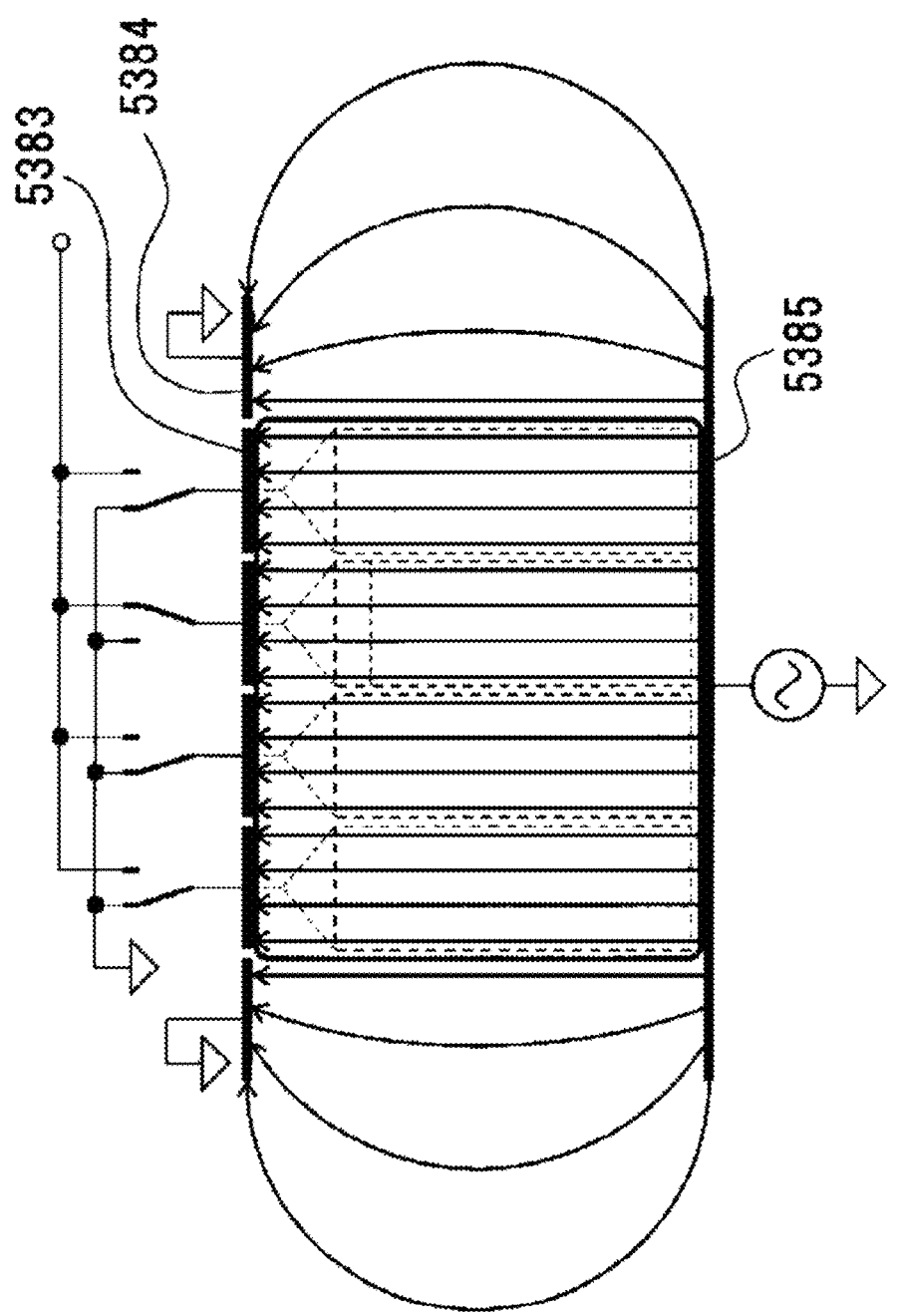
FIG. 57B illustrates an example of performing the object detection of multiple objects.

As an example of performing the object detection of multiple objects, FIG. 57A and FIG. 57B illustrate an example of inspecting a content amount of a plurality of milk packs 5382 in a packing box 5381. An inspection of contents in a milk pack 5382 (object) in a packing box 5381 becomes possible for the first time by the electrostatic capacitive displacement meter using the CM circuit of the present disclosure also. (Even if a milk pack 5382 is not in a packing box 5381, a milk pack 5382 does not allow laser light to be passed through, and thus, a laser displacement meter may not be applied to an inspection of contents. A representative high of 1 liter milk pack 5382 is 194 mm.)

FIG. 57A and FIG. 57B illustrate an example of switching a detection electrode although FIG. 56A and FIG. 56B illustrate an example of switching a drive electrode. FIG. 57A is an example of a top view for illustrating an arrangement of detection electrodes and FIG. 57B is an example of a side view.

As illustrated in FIG. 57A, a square electrode 5383 having a size close to a milk pack 5382 is provided to each of upper parts of the milk pack 5382 (3 rows×4 columns=12). A grounded guard electrode 5384 is provided around a packing box 5381. A drive electrode 5385 (unillustrated) having a size that is about the same as that of an outer shape of a guard electrode 5384 is provided on an entire surface below a packing box 5381.

FIG. 57B illustrates an example of a guard electrode 5384 and a drive electrode 5385 and an example of switching of an electrode 5383. Switching of an electrode 5383 is exemplified by a method in FIG. 23B of the fourteenth embodiment described above. Although in an example in FIG. 57B, only four electrodes 5383 in one row for switching are illustrated, actually 12 changeover switches of 3 rows×4 columns=12 are provided. Only one of 12 changeover switches connects an electrode 5383 to signal detection means and the remaining electrodes 5383 are connected to the ground.

An electrode connected to signal detection means also is ground potential by virtually ground at an input of signal detection means, and thus, 12 electrodes 5383 provided to an upper part of a packing box and a guard electrode 5384 function as similar to a large planar electrode that is grounded entirely. On the other hand, a drive electrode 5385 is a planar electrode having a size that is about the same as this, and thus, as a whole, the electrode functions as a parallel flat plate capacitor. This is exemplified by lines of electric force in FIG. 57B.

As illustrated in FIG. 57B, lines of electric force in a peripheral part tend to expand outside an electrode (edge effect), but are substantially parallel at a portion where a milk pack 5382 is present. That is, a guard electrode 5384 shapes lines of electric force so as to be parallel at a portion where a milk pack 5382 is present. As a result, even if an inner capacity of whichever milk pack 5382 is detected and measured, the pack is hardly affected by the inner capacity of the surrounding milk packs 5382.

If one is intending to receive a less influence of surrounding objects, it is advantageous to provide a guard electrode 5384 as described above and switch a detection electrode. However, in this case, an inter electrode capacitance of a changeover switch connected to a ground side becomes a stray capacitance relative to the connection to a detection electrode. However, in the CM circuit of the present disclosure, a stray capacitance added to a detection electrode does not become a problem that much.

If it is desired to further reduce an influence of a stray capacitance, it is possible to switch an electrode by measuring means by using a plurality of signal detection means as illustrated in FIG. 21 of the fourteenth embodiment. In this case also, 12 electrodes 5383 provided to an upper part of a packing box and a guard electrode 5384 function similarly to a large electrode that is ground entirely and a drive electrode 5385 also has a size that is about the same as the large electrode, and thus, as a whole, the electrode functions as a parallel flat plate capacitor.

As other solution methods when an influence of a stray capacitance is intended to be reduced further, a method of switching a drive electrode as illustrated in FIG. 56A and FIG. 56B may be selected or an active shield shown in the sixth embodiment may be used. That is, which of a detection electrode and a drive electrode is switched is selectable depending on an application.

Sixth Example-3

Figure 58:
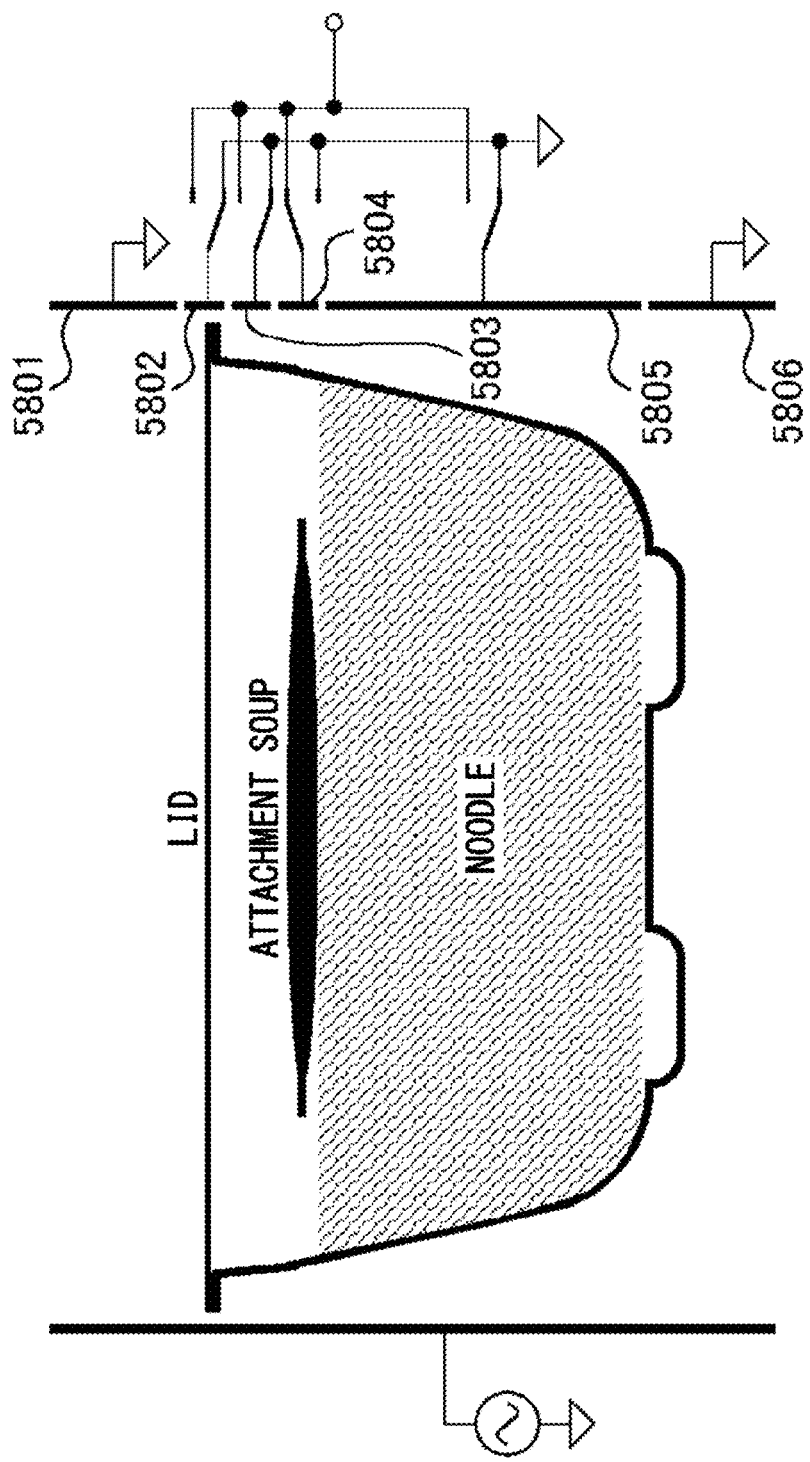
FIG. 58 illustrates an example of performing the object detection of multiple objects.

FIG. 58 illustrates an example of inspecting an inner state of a cup noodles such as a lid, attachment soup, and noodle as an example of performing the object detection of multiple objects. In FIG. 58, an electrode illustrated in a left side of the figure is a drive electrode and electrodes illustrated in a right side of the figure are a detection electrode 5802, a detection electrode 5803, a detection electrode 5804, a detection electrode 5805, a guard electrode 5801, and a guard electrode 5806. A shape of an electrode can be selected freely, and a planar electrode or an arc-shaped electrode so as to surround a cup noodles may be adopted.

A guard electrode 5801 and a guard electrode 5806 are grounded. A detection electrode 5802 is provided at the height of a lid of cup noodles. A detection electrode 5804 is provided at the height of an attachment soup placed on noodles, and a detection electrode 5803 is provided between the detection electrode 5802 and a detection electrode 5804. The detection electrode 5805 is provided in a portion corresponding to noodles in a cup noodles container.

By a method in FIG. 23B of the above described fourteenth embodiment, an electrode changeover switch connects any one of the detection electrode 5802, the detection electrode 5803, the detection electrode 5804 and the detection electrode 5805 to signal detection means, and the remaining electrodes are grounded. (In FIG. 58, the detection electrode 5804 is connected to signal detection means and the remaining detection electrodes are grounded.)

It is assumed that a lid of cup noodles is formed by stacking plastic and aluminum foil. Plastic is a dielectric and an aluminum foil is a floating conductor, and thus, both increase an inter electrode capacitance. In a state where the detection electrode 5802 is connected to the signal detection means, when a lid is not attached or when cup noodles are not provided between electrodes, a capacitance is small than an assumed inter electrode capacitance, and thus, it is possible to detect a non-attachment of a lid and the absence of cup noodles. If an appropriate threshold is applied, it may be possible to distinguish a non-attachment of a lid from the absence of cup noodles.

It is assumed that attachment soup (powder or liquid) placed on noodles in a cup is in a bag formed by stacking plastic and an aluminum foil. Plastic and soup are dielectrics and an aluminum foil is a floating conductor, and thus, both increase an inter electrode capacitance. In a state where the detection electrode 5804 is connected to the signal detection means, when attachment soup is not in a cup or when attachment soup is not placed at a normal high, an capacitance is smaller than an assumed inter electrode capacitance, and thus, the above situation may be detected.

In a state where the electrode 5803 is connected to signal detection means, when a capacitance is larger than an assumed inter electrode capacitance, it is possible to detect a possibility that a foreign matter (dielectric or floating conductor) is present between attachment soup or noodles and a lid. Reversely, when a capacitance is smaller than an assumed inter electrode capacitance, a case where cup noodles are not placed between electrodes is assumed, and the case can be detected.

In a state where the detection electrode 5805 is connected to signal detection means, when a capacitance is larger than an assumed inter electrode capacitance, it is possible to detect that an amount of noodles (dielectrics) is larger than a specified amount and noodles are highly dense. Reversely, when a capacitance is smaller than an assumed inter electrode capacitance, it is possible to detect that an amount of noodles (dielectrics) is smaller a specified amount and noodles are lowly dense. When an inter electrode capacitance is significantly small, a case where noodles are not in a cup and a case where cup noodles are not place between electrodes are assumed, and the cases can be detected.

Although FIG. 58 illustrates an example of switching the detection electrode 5082, the detection electrode 5083, the detection electrode 5084, and the detection electrode 5085 by a switch, a state of cup noodles can be known in a shorter time by knowing inter electrode capacitances simultaneously by using a plurality of signal detection means and measuring means. In addition, it is possible to know inter electrode capacitances of a plurality of locations by various methods shown in the fourteenth embodiment.

Sixth Example-4

Figure 59:
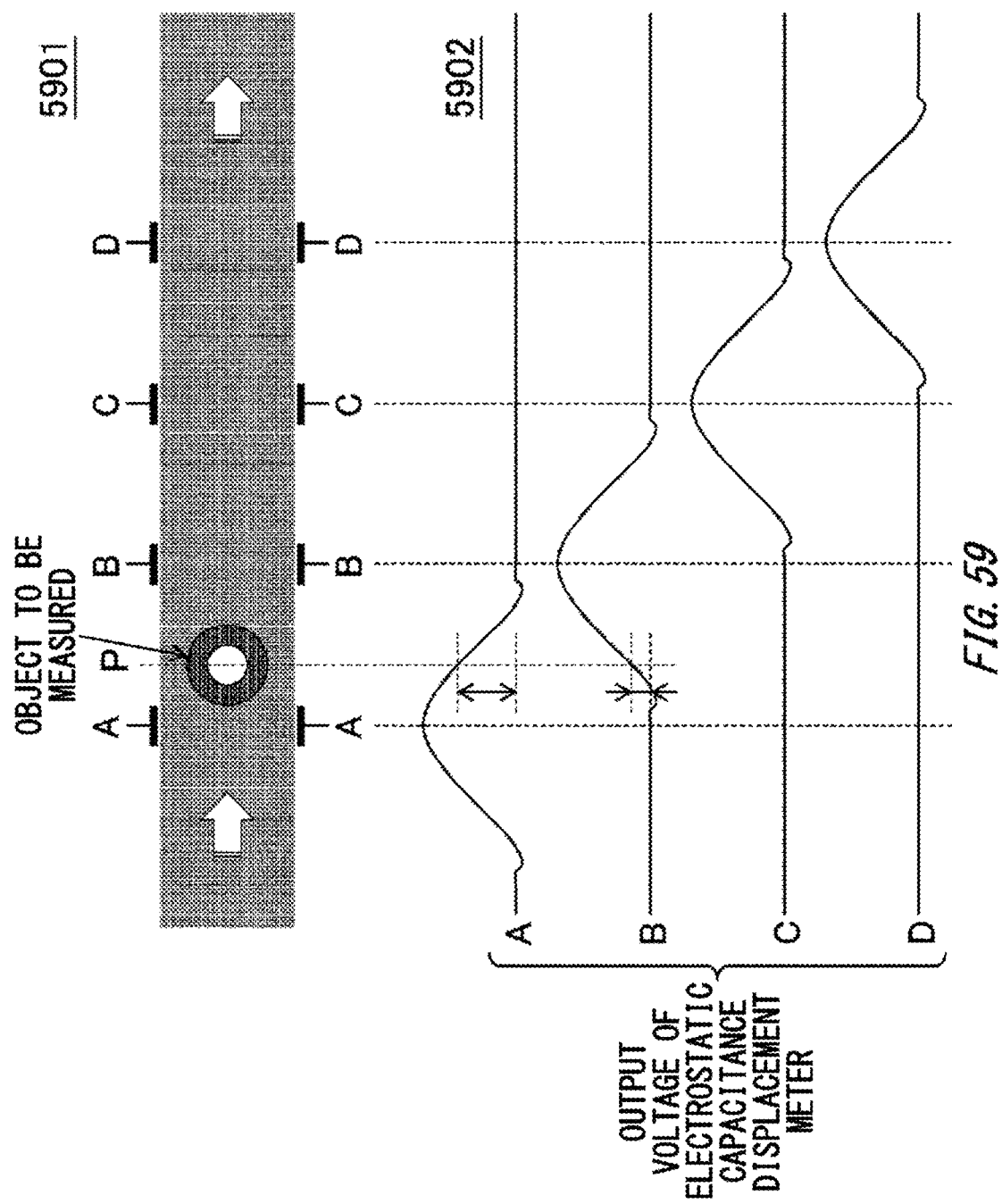
FIG. 59 illustrates an example of performing the object detection of multiple objects.

FIG. 59 illustrates an example of estimating a position of an object to be measured by using a plurality of electrodes. An arrange 5901 in FIG. 59 illustrates a case where, for example, an object to be measured (as one example, beverage in PET bottle) moves from left to right via a belt conveyor. Each of A, B, C, and D in the arrange 5901 in FIG. 59 is a proximity sensor or a proximity switch for detecting an object to be measured. A, B, C, and D in a graph 5902 in FIG. 59 are examples of output voltages when the electrostatic capacitive displacement meter of the present disclosure is used as a proximity sensor. A horizontal axis in a graph in FIG. 59 exhibits positions of an object to be measured in the arrangement 5901 in FIG. 59 and examples of output voltages of an electrostatic capacitive displacement meter when an object to be measured moves from left to right are illustrated. (An object to be measured is a dielectric, and exemplified is a case where if an object to be measured enters between electrodes, an inter electrode capacitance increases and an output voltage of an electrostatic capacitive displacement meter increases.)

Considered is a case where, as a conventionally used proximity switch, photoelectronic sensors (light-shielding type or reflective type) are used for A, B, C, and D in the arrangement 5901 in FIG. 59. By using a photoelectronic sensor, although whether an object to be measured is at a predetermined position may be known by turning on/off an output of the photoelectronic sensor, whether an object to be measured is close or far may not be known.

When an object to be measured moves to a position P, an output of a sensor A is turned on/off once, and it is possible to know that the object has passed the sensor A. After turning on/off of an output of the sensor A, an output of a sensor B is not turned on/off yet. In this state, although it is possible to detect that an object to be measured is present between a sensor A and a sensor B, it is not possible to detect where an object to be measured is present between a sensor A and a sensor B.

Considered is a case where the electrostatic capacitive displacement meter of the present disclosure is used as a proximity sensor. In this case, each of A, B, C, and D in the arrangement 5901 in FIG. 59 is a set of a drive electrode and a detection electrode of the electrostatic capacitive displacement meter of the present disclosure.

When an object to be measured is at position P, an output voltage of an electrostatic capacitive displacement meter corresponding to an electrode A is a voltage of up and down arrows indicated in A of a graph 5902 in FIG. 59. (In a graph 5902 in FIG. 59, a voltage when an object to be measured is away, that is, a flat portion of a voltage is set as a reference voltage. The same applies below.) At this time, an output voltage of an electrostatic capacitive displacement meter corresponding to an electrode B is a voltage of up and down arrows indicated in B of a graph 5902 in FIG. 59. Both output voltages of C and D are reference voltages.

A voltage of up and down arrows in A is relatively large and a voltage of up and down arrows in B is relatively small. From this, it can be known that an object to be measured is located closer to A than B and is away from C and D. As one example in this case, a position of an object to be measured may be estimated based on a ratio of a voltage A to a voltage B.

If a relationship between a position of an object to be measured relative to each electrode and an output voltage of an electrostatic capacitive displacement meter is known in advance as in a graph 5902 in FIG. 59, a more accurate position of an object to be measured can be estimated from an output voltage of an electrostatic capacitive displacement meter corresponding to each electrode.

To know an electrostatic capacitance of each of a plurality of electrodes exemplified by the arrangement 5901 in FIG. 59, various methods of the fourteenth embodiment may be selected freely for use.

Sixth Example-5

FIG. 60A to FIG. 63B illustrate inspections of automotive tires (hereinafter referred to as "tire") 5401 as one example of performing the object detection of a larger number of places. An object to be inspected is not limited to an automotive tire. For example, if bubbles are included in rubber and the like configuring a tire 5401, the strength may deteriorate or if a part of bubbles appears outside due to wear, it is likely that an appearance may deteriorate. A relative dielectric constant of bubbles that is air is lower than a relative dielectric constant of rubber, and thus, an inter electrode capacitance of a portion where bubbles are included decreases, so as to enable detecting bubbles.

FIG. 60A to FIG. 61B illustrate a configuration of an electrode as viewed from a cross section direction of a tire and FIG. 62A to FIG. 63B illustrate a configuration of an electrode as viewed from a side surface direction of a tire.

Figure 60A:
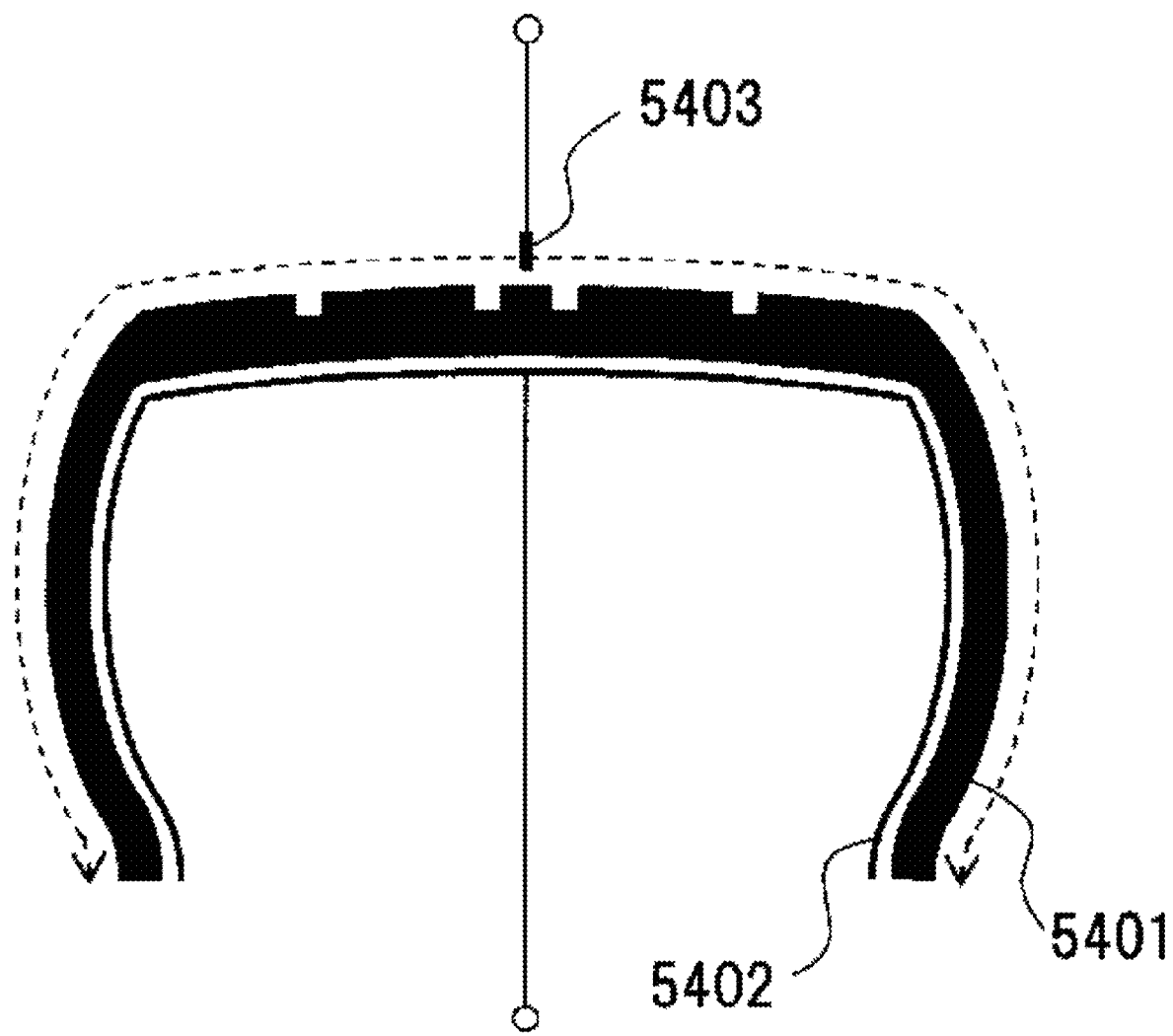
FIG. 60A illustrates an example of performing the object detection of multiple objects.

FIG. 60A illustrates an example of inspecting a tire by a pair of drive electrodes and detection electrodes. A drive electrode 5402 is provided on an entire inner side of a tire 5401 and a small detection electrode 5403 is provided on an outer side a tire 5401. (A relationship between the drive electrode 5402 and the detection electrode 5403 is one example and they may be positioned reversely. The same applies to descriptions in FIG. 60A to FIG. 63B.) To provide a drive electrode 5402 at an entire inner side of the tire 5401 as in the figure, it is necessary to electrically connect a plurality of electrodes after dividing an electrode and putting the divided electrodes into an inner part of the tire 5401, but illustrations thereof are omitted. (The same applies below.)

An outer electrode is movable outside the tire 5401 as indicated by a dotted arrow in the figure. The electrode may enter a groove portion of the tire 5401 if necessary. After an outer electrode moving around an outside of the tire 5401 once as indicated by a dotted arrow, the tire 5401 is rotated by a necessary amount and inspections are repeated similarly. As one example, the rotation of the tire 5401 may be realized as in FIG. 62A and FIG. 62B described later. Although FIG. 60A has an advantage that only a pair of drive electrodes and detection electrodes are required, means for moving an outer electrode along the tire 5401 and means for rotating the tire 5401 are necessary and it may take long time for measurement.

Although FIG. 60A illustrates a case where an electrode provided inside the tire 5401 is fixed, an electrode provided outside the tire 5401 and an electrode provided inside may be paired so as to be movable. (Not illustrated.)

Figure 60B:
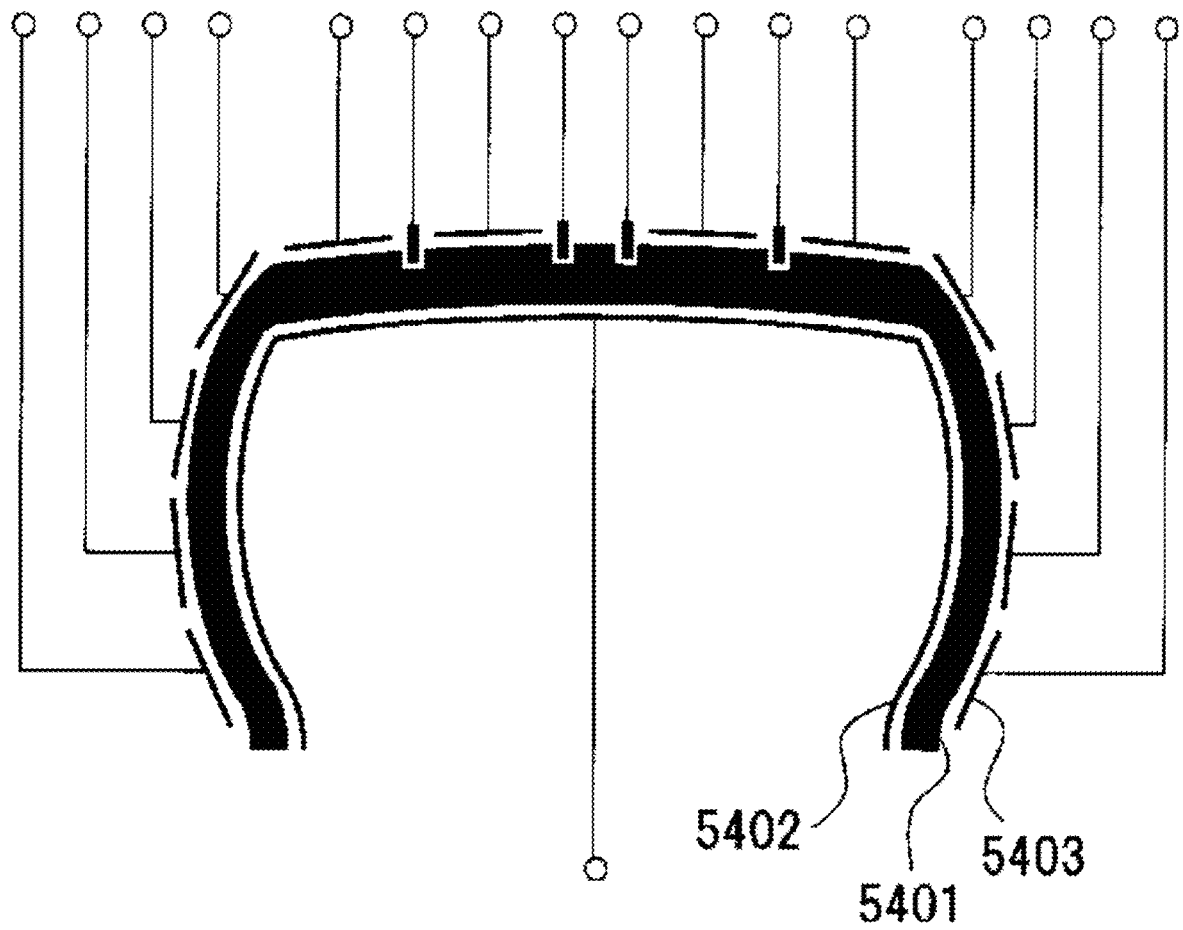
FIG. 60B illustrates an example of performing the object detection of multiple objects.

FIG. 60B illustrates an example of inspecting a tire by using a single drive electrode and a plurality of detection electrodes. A drive electrode 5402 is provided on an entire inner side of a tire 5401 and a plurality of detection electrodes 5403 divided appropriately are provided on an outer side of the tire 5401. If signal detection means and measuring means are provided to each of a plurality of detection electrodes 5403, although the measurement time may be reduced, a cost increases. The measurement time and the cost may be selected by using the above described fourteenth embodiment or a combination thereof, and thus, they may be selected appropriately depending on an application.

Figure 61A:
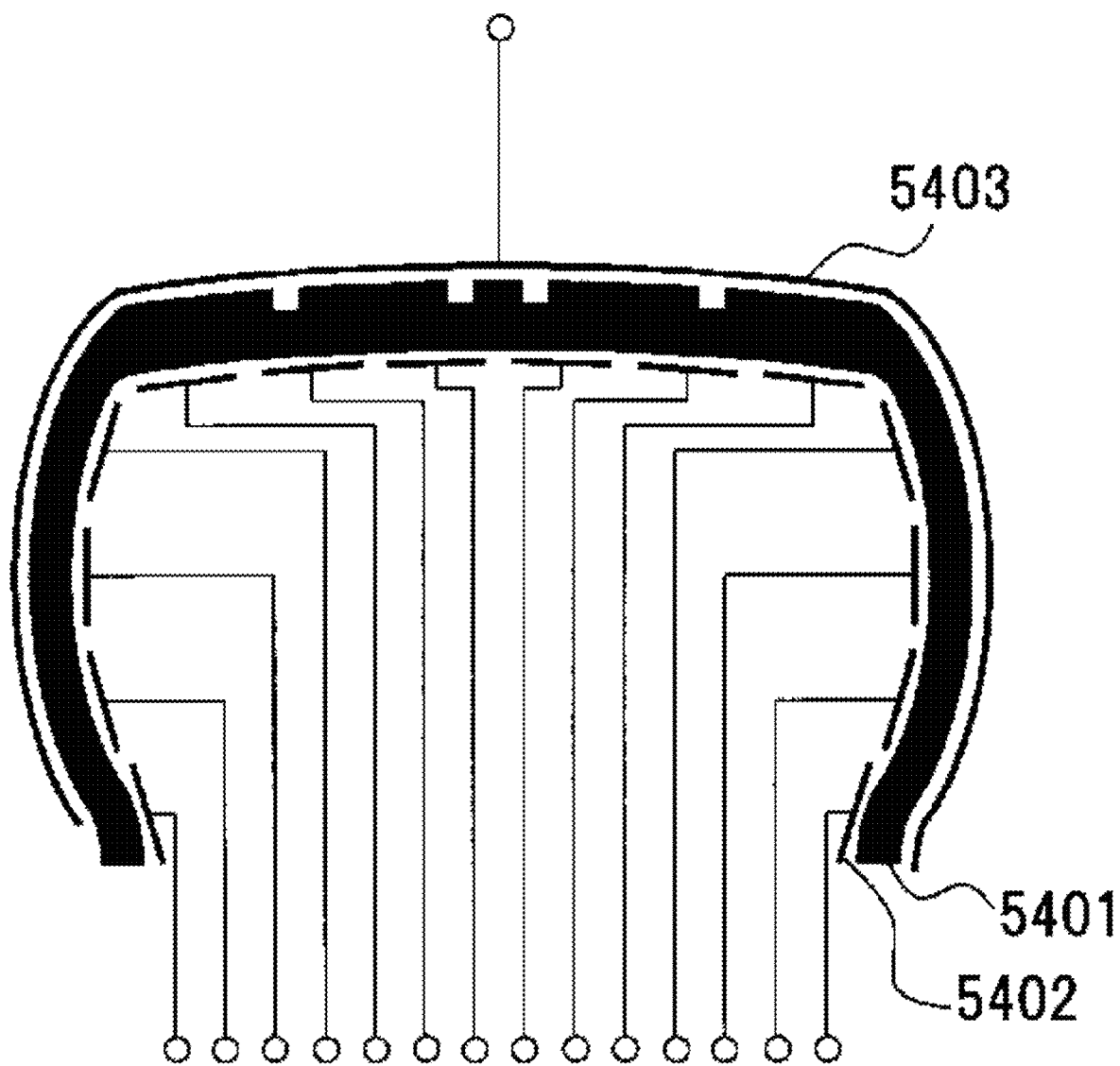
FIG. 61A illustrates an example of performing the object detection of multiple objects.

Reversely from FIG. 60B, in FIG. 61A, a detection electrode 5403 is provided on an entire outer side of the tire 5401 and a plurality of drive electrodes 5402 divided appropriately are provide on an inner side of the tire 5401. When a detection electrode 5403 is provided on an entire outer side of the tire 5401 as in the figure, it is necessary to, for example, electrically connect a plurality of electrodes after dividing an electrode into three parts, that are a ground surface and both side surfaces and providing them on an outer side of a tire, but illustration thereof are omitted. (The same applies below.) A selection of a plurality of electrodes or the measurement time and the cost is similar to that in FIG. 60B, and thus, descriptions thereof are omitted.

Figure 61B:
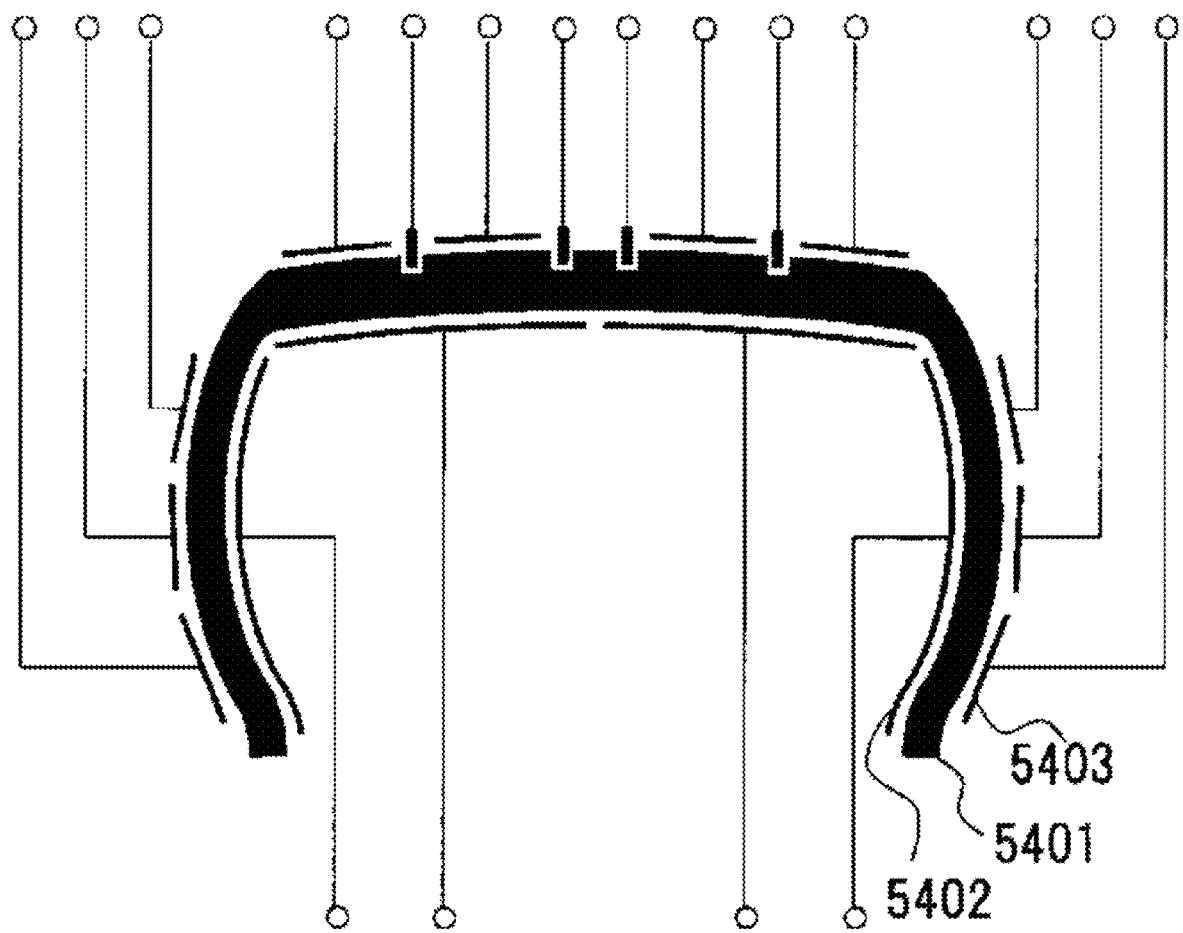
FIG. 61B illustrates an example of performing the object detection of multiple objects.

FIG. 61B illustrates an example of dividing an electrode provided on an inner side of a tire in FIG. 60B. To optimize the measurement time and the cost, it is possible to divide appropriately an electrode provided on an inner side of the tire 5401 in this manner. It is also possible to appropriately divide an electrode provided on an outer side of the tire 5401 as illustrated in FIG. 61A.

Figure 62A:
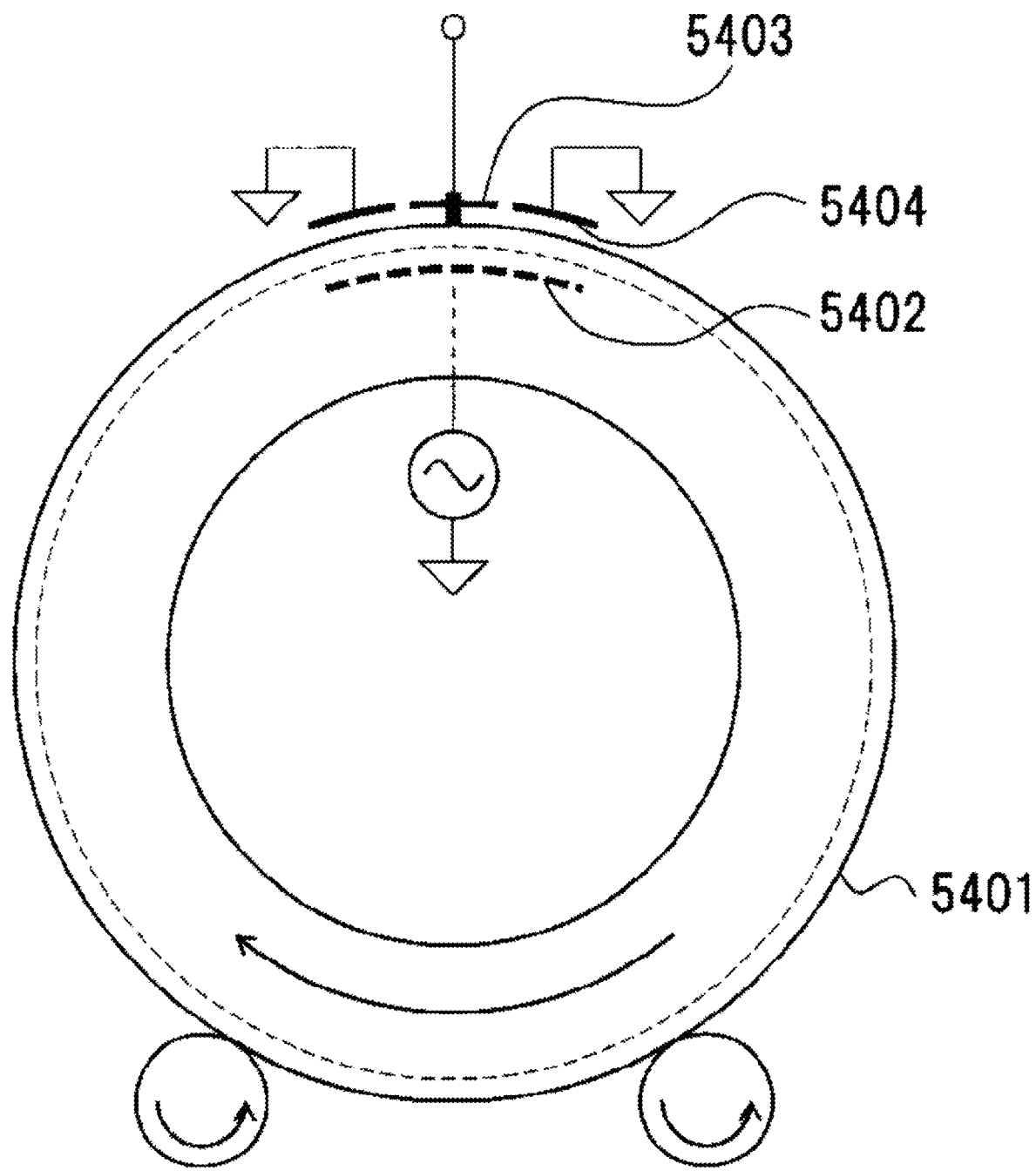
FIG. 62A illustrates an example of performing the object detection of multiple objects.
Figure 62B:
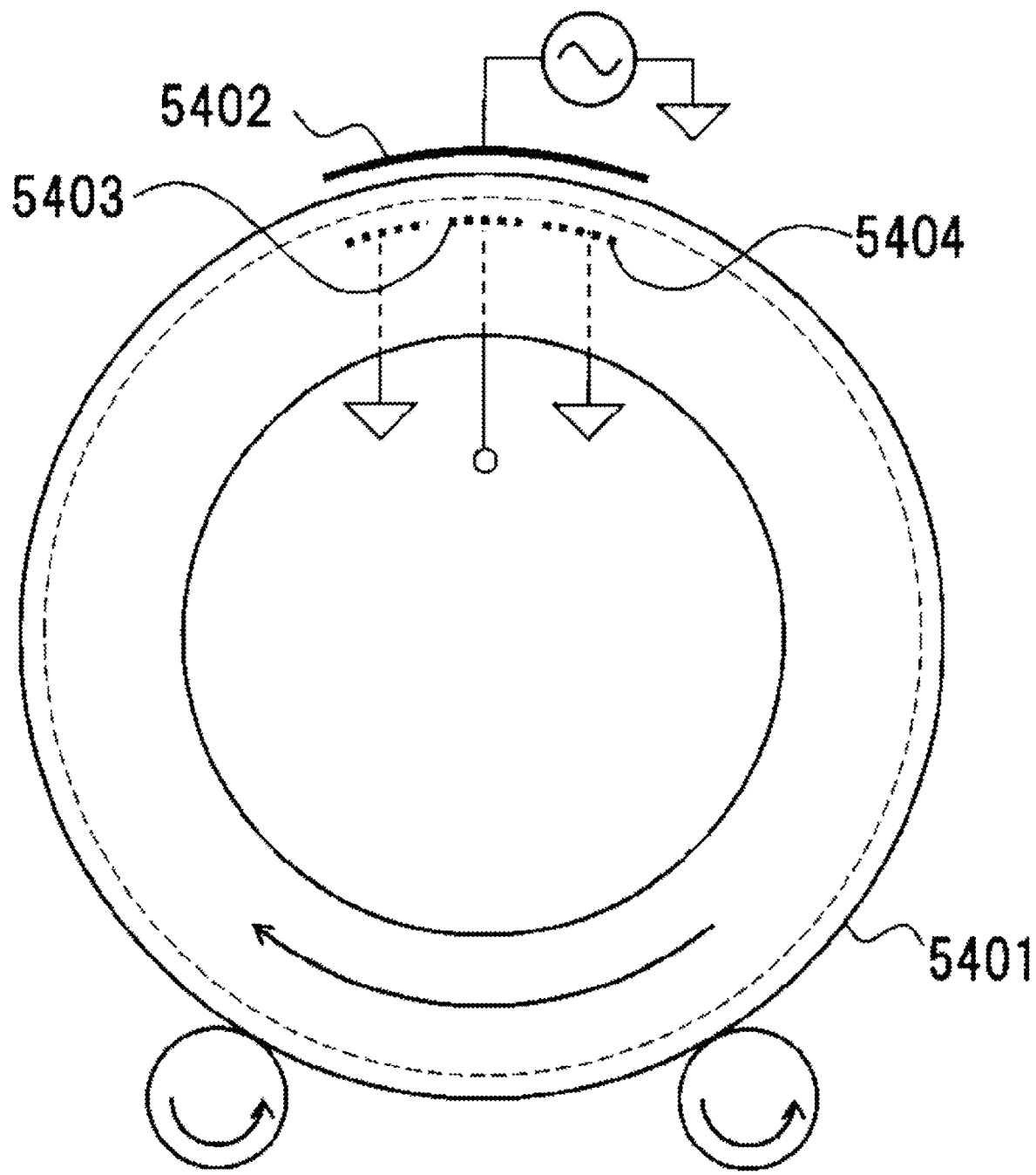
FIG. 62B illustrates an example of performing the object detection of multiple objects.

FIG. 62A and FIG. 62B illustrate an example of inspecting a tire by rotating the tire. FIG. 62A illustrates an example of providing a drive electrode 5402 on an inner side of the tire 5401 and providing a detection electrode 5403 on an outer side, and it may be applied to examples of FIG. 60A and FIG. 60B and an example of FIG. 61B. Reversely FIG. 62B illustrates an example of providing a drive electrode 5402 on an outer side of the tire 5401 and providing a detection electrode 5403 on an inner side, and it may be applied to FIG. 61A. An example is illustrated in which, as same as in FIG. 57B, a guard electrode 5404 around a detection electrode 5403 is provided to make lines of electric force from a drive electrode 5402 to a detection electrode 5403 parallel, and the guard electrode 5404 is an optional element that can be provided when necessary.

Figure 63A:
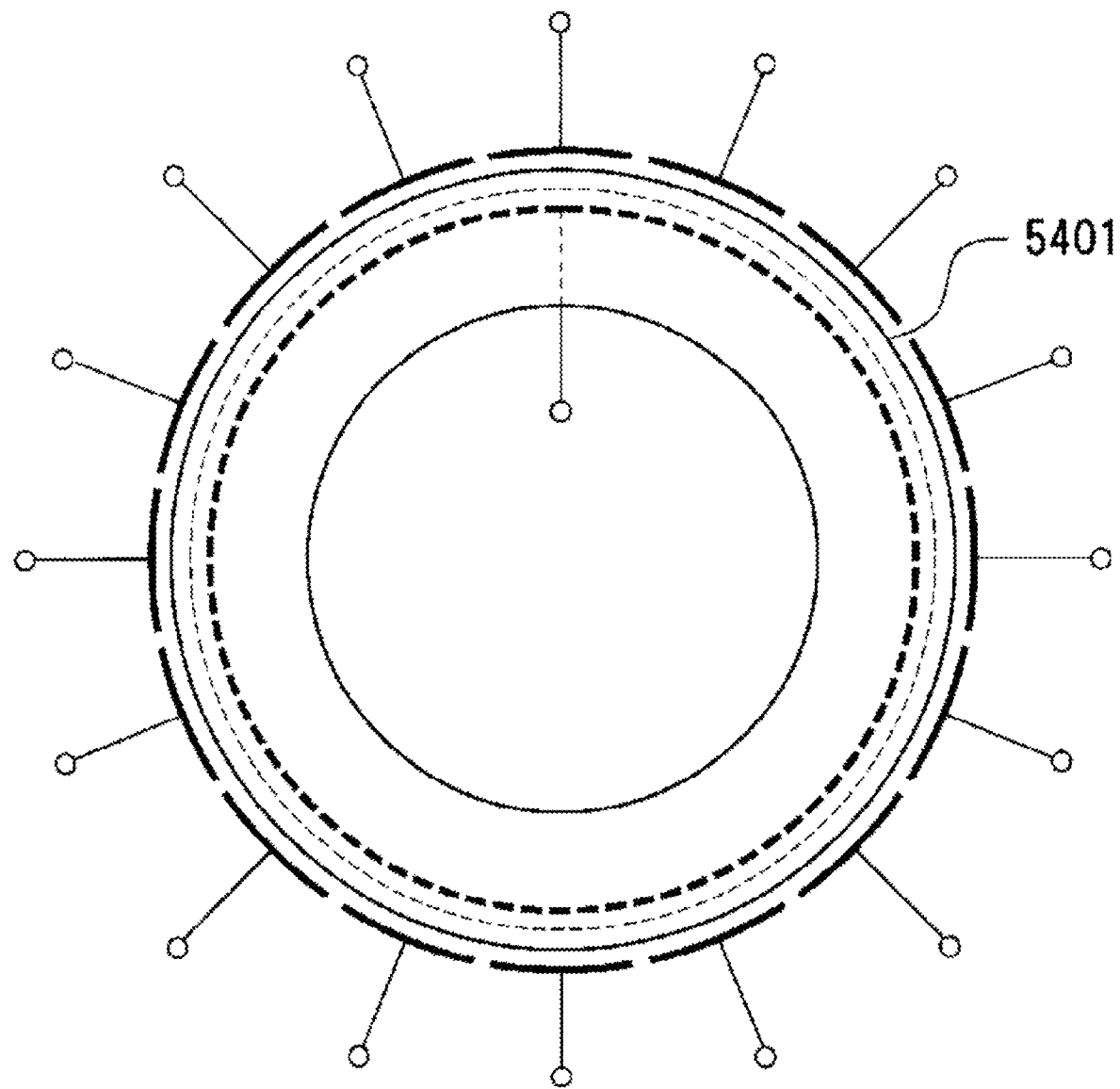
FIG. 63A illustrates an example of performing the object detection of multiple objects.
Figure 63B:
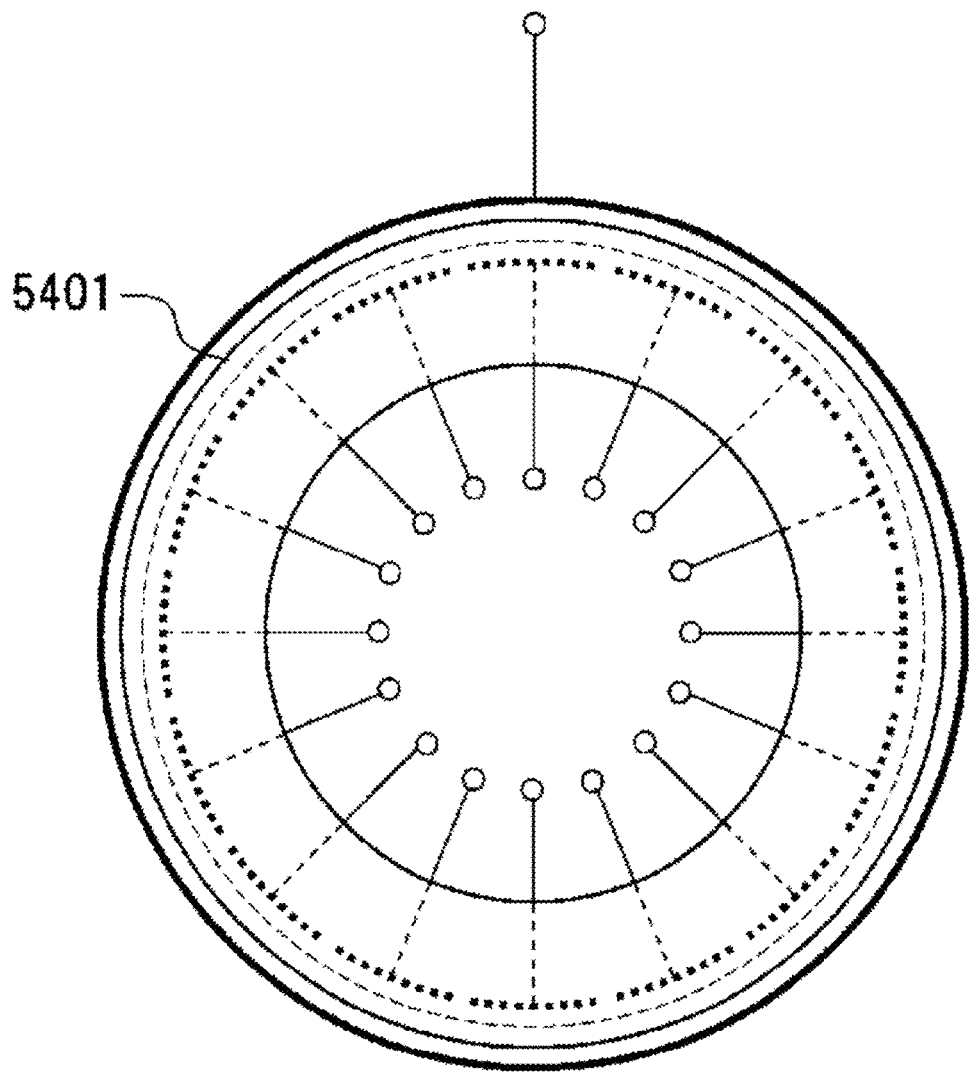
FIG. 63B illustrates an example of performing the object detection of multiple objects.

When it takes too long to measure a tire 5401 while rotating and stopping it, as illustrated in FIG. 63A and FIG. 63B, the parallelism and an increase in speed of the measurement may be achieved by dividing appropriately an electrode in a circumferential direction of the tire 5401. FIG. 63A and FIG. 63B illustrate an example of dividing an electrode so as not to require the rotation of the tire 5401. When the tire 5401 is not rotated, the tire 5401 may be measured while being in contact with an electrode.

Both a more detailed inspection and reduction in measurement time may be achieved by using an electrode smaller than an electrode illustrated in the figure and rotating the tire 5401 slightly (within (angle of 360 degrees/the number of divisions)).

As described above, although most preferable embodiments, specific examples and the like of the present disclosure have been described, the present invention is not limited to the above description, and needless to say that various modifications and changes can be made by a person skilled in the art based on the gist of the present disclosure recited in claims or disclosed in the specification, and such modification and changes are included in the scope of the present invention.

EXPLANATION OF REFERENCES

101: CM circuit; 120: electrostatic capacitive displacement meter; 201; drive signal generating means; 301: drive electrode; 401: detection electrode; 501; signal detection means; 601: measuring means; 701: negative feedback unit; 904: DC compensation circuit; 1005: noise elimination circuit; 1106: shield electrode 1206: shielding wire; 1306: printed circuit board; 1406: connector; 1507: parallel resonance circuit; 1607: series resonant circuit; 1710: amplifier circuit; 1813: phase-detection means.

What is claimed is:

1. A capacitance measuring circuit for measuring an electrostatic capacitance formed between at least one first conductor that receives an AC signal and at least one second conductor, the capacitance measuring circuit comprising:
    signal detection means including:
        an amplifier including an input and an output;
        a negative feedback unit that has a feedback capacitance and applies a negative feedback from the output of the amplifier to the input of the amplifier; and
        a DC compensation circuit, wherein
        the input of the amplifier is connected to the at least one second conductor and is virtually grounded by the negative feedback unit, and the signal detection means outputs an AC signal of an amplitude in a functional relation with the electrostatic capacitance; and
    measuring means that is connected to an output of the signal detection means and has a function of measuring at least the amplitude of the AC signal output from the signal detection means, wherein
    the DC compensation circuit includes an integrating circuit having an input connected to the output of the amplifier and a feedback resistance connected to an output of the integrating circuit and the input of the amplifier, and stabilizes a DC component and a low frequency component in an output signal of the amplifier in a direct current manner by applying a negative feedback to the input of the amplifier.

2. The capacitance measuring circuit according to claim 1, wherein
    the DC compensation circuit further includes at least one low-pass filter, the at least one low-pass filter being provided either between the output of the amplifier and the input of the integrating circuit or between the output of the integrating circuit and the feedback resistance.

3. The capacitance measuring circuit according to claim 1, wherein
    the measuring means further includes one or more comparison determination means and threshold setting means corresponding to the one or more comparison determination means; and a result obtained by the measuring by the measuring means is determined.

4. The capacitance measuring circuit according to claim 3, wherein
the measuring means further includes communication means, via which one or both of the result and a result obtained by determining the result is transmitted.

5. The capacitance measuring circuit according to claim 1, wherein
the measuring means further includes communication means, via which a result obtained by the measuring by the measuring means is transmitted.

6. The capacitance measuring circuit according to claim 1, further comprising:
a shield provided at least one of between the at least one second conductor and the signal detection means, near the at least one second conductor, or near the at least one first conductor; wherein
the shield is grounded.

7. The capacitance measuring circuit according to claim 1, further comprising:
a shield provided at least one of between the at least one second conductor and the signal detection means, near the at least one second conductor, or near the at least one first conductor; and
a second buffer amplifier including an input and an output; wherein
the input of the second buffer amplifier is connected to an input of the signal detection means, the output of the second buffer amplifier is connected to the shield, and the shield is driven by an output signal of the second buffer amplifier.

8. The capacitance measuring circuit according to claim 1, wherein
either one of the at least one first conductor and the at least one second conductor, or both the at least one first conductor and the at least one second conductor are formed by a printed circuit board.

9. The capacitance measuring circuit according to claim 1, wherein
the measuring means includes a filter at an input side; and
the filter attenuates a frequency component other than a frequency to be measured by the measuring means.

10. The capacitance measuring circuit according to claim 1, wherein
the measuring means includes phase-detection means; and
the phase-detection means suppresses an influence of a frequency component other than a frequency to be measured by the measuring means.

11. The capacitance measuring circuit according to claim 9, further comprising:
a plurality of drive signal generating means each outputs an AC signal of a different frequency and generates the AC signal input to the at least one first conductor; wherein
the at least one first conductor includes a plurality of first conductors;
the plurality of first conductors are each connected to one of the plurality of drive signal generating means corresponding to the AC signal of the different frequency;
the at least one second conductor is a single second conductor; and
the signal detection means or the measuring means measures the electrostatic capacitance between the at least one first conductor and the at least one second conductor by separating the frequencies.

12. The capacitance measuring circuit according to claim 10, further comprising:
a plurality of drive signal generating means each outputs an AC signal of a different frequency and generates the AC signal input to the at least one first conductor; wherein
the at least one first conductor includes a plurality of first conductors;
the plurality of first conductors are each connected to one of the plurality of drive signal generating means corresponding to the AC signal of the different frequency;
the at least one second conductor is a single second conductor; and
the signal detection means or the measuring means measures the electrostatic capacitance between the at least one first conductor and the at least one second conductor by separating the frequencies.

13. The capacitance measuring circuit according to claim 9, wherein;
the at least one first conductor is a single first conductor;
the at least one second conductor includes a plurality of second conductors and each of the plurality of second conductors is connected to the signal detection means and the measuring means corresponding to one of the plurality of second conductors; and
the signal detection means or the measuring means measures the electrostatic capacitance between the at least one first conductor and each of the plurality of second conductors.

14. The capacitance measuring circuit according to claim 10, wherein;
the at least one first conductor is a single first conductor;
the at least one second conductor includes a plurality of second conductors and each of the plurality of second conductors is connected to the signal detection means and the measuring means corresponding to one of the plurality of second conductors; and
the signal detection means or the measuring means measures the electrostatic capacitance between the at least one first conductor and each of the plurality of second conductors.

15. The capacitance measuring circuit according to claim 9, further comprising:
switching means that switches a connection between two among drive signal generating means that generates the AC signal input to the at least one first conductor, the at least one first conductor, the at least one second conductor, the signal detection means and the measuring means.

16. The capacitance measuring circuit according to claim 10, further comprising:
switching means that switches a connection between two among drive signal generating means that generates the AC signal input to the at least one first conductor, the at least one first conductor, the at least one second conductor, the signal detection means and the measuring means.

17. The capacitance measuring circuit according to claim 10, wherein
the at least one first conductor includes two first conductors that receive two respective AC signals having a 90 degrees phase difference;
the at least one second conductor is a single second conductor; and
the measuring means measures the electrostatic capacitance between the at least one second conductor and each of the first conductors by separating the two AC signals based on a phase difference.

18. The capacitance measuring circuit according to claim 1, wherein
moving close/away of an object affecting the electrostatic capacitance is detected based on the electrostatic capacitance.

19. An electrostatic capacitive displacement meter comprising:
the capacitance measuring circuit according to claim 1; wherein
the measuring means detects a state of an object affecting the electrostatic capacitance between the at least one first conductor and the at least one second conductor.

20. The electrostatic capacitive displacement meter according to claim 19, wherein
the measuring means approximates an electrostatic capacitance-state of the object relationship by a curve function; and
a relationship between the electrostatic capacitance and a state of an object is obtained by a correction based on the curve function.

21. The electrostatic capacitive displacement meter according to claim 19, wherein
one or more of the at least one first conductor, the at least one second conductor, and an object affecting the electrostatic capacitance is movable.

22. An electrostatic capacitive displacement meter comprising:
the capacitance measuring circuit according to claim 1; wherein
the at least one first conductor or the at least one second conductor is an object to be measured; or
each of the at least one first conductor and the at least one second conductor is another object; and
the measuring means measures a distance between the at least one first conductor and the at least one second conductor.

23. The electrostatic capacitive displacement meter according to claim 22, wherein
the measuring means approximates an electrostatic-capacitance-distance relationship by a curve function; and
a relationship between the electrostatic capacitance and the distance is obtained by a correction based on the curve function.

24. The electrostatic capacitive displacement meter according to claim 22, wherein
either one of or both the at least one first conductor and the at least one second conductor are movable.

25. A capacitance measuring circuit for measuring an electrostatic capacitance formed between a first conductor that receives an AC signal and a second conductor, the capacitance measuring circuit comprising:
signal detection means including:
an amplifier including an input and an output; and
a negative feedback unit that has a feedback capacitance and applies a negative feedback from the output of the amplifier to the input of the amplifier, wherein
the input of the amplifier is connected to the second conductor and is virtually grounded by the negative feedback unit, and the signal detection means outputs an AC signal of an amplitude in a functional relation with the electrostatic capacitance; and
measuring means that is connected to an output of the signal detection means and has a function of measuring at least the amplitude of the AC signal output from the signal detection means, wherein
the negative feedback unit includes:
a feedback resistance connected in parallel to the feedback capacitance, with an inter-terminal capacitance being formed between terminals of the feedback resistance; and
a cancel circuit or an attenuator connected in series to the feedback resistance.

26. The capacitance measuring circuit according to claim 25, wherein
the negative feedback unit further includes a first buffer amplifier between the feedback resistance and the cancel circuit or the attenuator.

27. A capacitance measuring circuit for measuring an electrostatic capacitance formed between a first conductor that receives an AC signal and a second conductor, the capacitance measuring circuit comprising:
signal detection means including:
an amplifier including an input and an output; and
a negative feedback unit that has a feedback capacitance and applies a negative feedback from the output of the amplifier to the input of the amplifier, wherein
the input of the amplifier is connected to the second conductor and is virtually grounded by the negative feedback unit, and the signal detection means outputs an AC signal of an amplitude in a functional relation with the electrostatic capacitance;
measuring means that is connected to an output of the signal detection means and has a function of measuring at least the amplitude of the AC signal output from the signal detection means; and
a noise elimination circuit provided between the second conductor and the signal detection means and including either a first resonance circuit or a second resonance circuit or both the first resonance circuit and the second resonance circuit; wherein
the first resonance circuit resonates at a frequency component of the AC signal input to the first conductor; and
the second resonance circuit resonates at a frequency component to be removed.

* * * * *